US008030775B2

(12) United States Patent
Lin

(10) Patent No.: US 8,030,775 B2
(45) Date of Patent: Oct. 4, 2011

(54) WIREBOND OVER POST PASSIVATION THICK METAL

(75) Inventor: Mou-Shiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 102 days.

(21) Appl. No.: 12/198,899

(22) Filed: Aug. 27, 2008

(65) Prior Publication Data

US 2009/0206486 A1 Aug. 20, 2009

Related U.S. Application Data

(60) Provisional application No. 60/968,082, filed on Aug. 27, 2007.

(51) Int. Cl.
*H01L 23/52* (2006.01)
*H01L 23/48* (2006.01)
*H01L 29/40* (2006.01)
*H01L 23/485* (2006.01)

(52) U.S. Cl. .... 257/758; 257/759; 257/781; 257/E23.02

(58) Field of Classification Search .................. 257/758, 257/759, 781, E23.02
See application file for complete search history.

(56) References Cited

U.S. PATENT DOCUMENTS 4,685,998 A 8/1987 Quinn
4,789,647 A 12/1988 Peters
5,083,187 A 1/1992 Lamson
5,226,232 A 7/1993 Boyd
5,264,712 A * 11/1993 Murata et al. .................. 257/71
5,384,488 A 1/1995 Golshan
5,468,984 A 11/1995 Efland
5,532,512 A 7/1996 Fillion
5,659,201 A 8/1997 Wollesen
5,665,989 A 9/1997 Dangelo
5,691,248 A 11/1997 Cronin
5,792,594 A 8/1998 Brown
5,834,844 A 11/1998 Akagawa
5,854,513 A 12/1998 Kim
5,854,740 A 12/1998 Cha
5,883,435 A 3/1999 Geffken
5,892,273 A 4/1999 Iwasaki
5,952,726 A 9/1999 Liang
5,969,424 A 10/1999 Matsuki (Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Luan C Thai

(74) *Attorney, Agent, or Firm* — McDermott Will & Emery, LLP

(57) ABSTRACT

A chip assembly includes a semiconductor chip and a wirebonded wire. The semiconductor chip includes a passivation layer over a silicon substrate and over a thin metal structure, a first thick metal layer over the passivation layer and on a contact point of the thin metal structure exposed by an opening in the passivation layer, a polymer layer over the passivation layer and on the first thick metal layer, and a second thick metal layer on the polymer layer and on the first thick metal layer exposed by an opening in the polymer layer. The first thick metal layer includes a copper layer with a thickness between 3 and 25 micrometers. The wirebonded wire is bonded to the second thick metal layer.

37 Claims, 113 Drawing Sheets

U.S. PATENT DOCUMENTS

| | | | | |
|---|---|---|---|---|
| 5,994,766 | A | 11/1999 | Shenoy | |
| 6,011,314 | A | 1/2000 | Leibovitz | |
| 6,022,792 | A | 2/2000 | Ishii | |
| 6,066,877 | A | 5/2000 | Williams | |
| 6,077,726 | A | 6/2000 | Mistry | |
| 6,144,100 | A | 11/2000 | Shen | |
| 6,184,143 | B1 * | 2/2001 | Ohashi et al. | 438/697 |
| 6,187,680 | B1 | 2/2001 | Costrini | |
| 6,229,221 | B1 | 5/2001 | Kloen | |
| 6,288,447 | B1 | 9/2001 | Amishiro | |
| 6,300,234 | B1 | 10/2001 | Flynn | |
| 6,359,328 | B1 | 3/2002 | Dubin | |
| 6,362,087 | B1 | 3/2002 | Wang | |
| 6,383,916 | B1 | 5/2002 | Lin | |
| 6,410,435 | B1 | 6/2002 | Ryan | |
| 6,429,120 | B1 | 8/2002 | Ahn | |
| 6,472,745 | B1 | 10/2002 | Iizuka | |
| 6,476,506 | B1 | 11/2002 | O'Connor | |
| 6,476,507 | B1 | 11/2002 | Takehara | |
| 6,515,373 | B2 | 2/2003 | Barth | |
| 6,573,170 | B2 * | 6/2003 | Aoyagi et al. | 438/612 |
| 6,593,222 | B2 | 7/2003 | Smoak | |
| 6,593,649 | B1 | 7/2003 | Lin | |
| 6,614,091 | B1 | 9/2003 | Downey | |
| 6,639,299 | B2 | 10/2003 | Aoki | |
| 6,646,347 | B2 | 11/2003 | Mercado | |
| 6,653,563 | B2 | 11/2003 | Bohr | |
| 6,680,544 | B2 | 1/2004 | Lu | |
| 6,683,380 | B2 | 1/2004 | Efland | |
| 6,693,020 | B2 | 2/2004 | Mui et al. | |
| 6,707,124 | B2 | 3/2004 | Wachtler | |
| 6,756,295 | B2 | 6/2004 | Lin | |
| 6,762,115 | B2 | 7/2004 | Lin | |
| 6,780,748 | B2 | 8/2004 | Yamaguchi | |
| 6,798,050 | B1 | 9/2004 | Homma | |
| 6,800,555 | B2 | 10/2004 | Test | |
| 6,844,631 | B2 | 1/2005 | Yong | |
| 6,861,740 | B2 | 3/2005 | Hsu | |
| 6,927,156 | B2 | 8/2005 | Mathew | |
| 6,943,440 | B2 | 9/2005 | Kim | |
| 6,963,136 | B2 | 11/2005 | Shinozaki | |
| 6,979,647 | B2 | 12/2005 | Bojkov | |
| 7,060,607 | B2 | 6/2006 | Efland | |
| 7,230,340 | B2 | 6/2007 | Lin | |
| 7,239,028 | B2 | 7/2007 | Anzai | |
| 7,271,489 | B2 | 9/2007 | Lin | |
| 7,288,845 | B2 | 10/2007 | Sutardja | |
| 7,319,277 | B2 * | 1/2008 | Lin | 257/781 |
| 7,355,282 | B2 | 4/2008 | Lin | |
| 7,372,161 | B2 | 5/2008 | Lin | |
| 7,381,642 | B2 | 6/2008 | Lin | |
| 7,385,289 | B2 * | 6/2008 | Suzuki | 257/758 |
| 7,405,149 | B1 | 7/2008 | Lin | |
| 7,416,971 | B2 | 8/2008 | Lin | |
| 7,423,346 | B2 | 9/2008 | Lin | |
| 7,468,545 | B2 | 12/2008 | Lin | |
| 7,470,927 | B2 * | 12/2008 | Lee et al. | 174/524 |
| 7,470,997 | B2 | 12/2008 | Lin | |
| 7,473,999 | B2 | 1/2009 | Lin | |
| 7,508,059 | B2 | 3/2009 | Lin | |
| 7,521,812 | B2 | 4/2009 | Lee et al. | |
| 7,582,556 | B2 | 9/2009 | Lin | |
| 7,582,966 | B2 | 9/2009 | Lin | |
| 2001/0023965 | A1 * | 9/2001 | Ikeda et al. | 257/368 |
| 2001/0035452 | A1 | 11/2001 | Test | |
| 2001/0051426 | A1 | 12/2001 | Pozder | |
| 2002/0000671 | A1 | 1/2002 | Zuniga | |
| 2002/0043723 | A1 | 4/2002 | Shimizu | |
| 2002/0158334 | A1 | 10/2002 | Vu | |
| 2003/0153172 | A1 * | 8/2003 | Yajima et al. | 438/612 |
| 2003/0218246 | A1 | 11/2003 | Abe | |
| 2004/0023450 | A1 | 2/2004 | Katagiri | |
| 2005/0017361 | A1 * | 1/2005 | Lin et al. | 257/756 |
| 2007/0164279 | A1 | 7/2007 | Lin | |
| 2007/0205520 | A1 | 9/2007 | Chou | |
| 2007/0212869 | A1 | 9/2007 | Chou | |
| 2007/0275503 | A1 | 11/2007 | Lin | |
| 2008/0001290 | A1 | 1/2008 | Chou | |
| 2008/0006945 | A1 | 1/2008 | Lin | |
| 2008/0042280 | A1 | 2/2008 | Lin | |
| 2008/0054441 | A1 | 3/2008 | Lin | |
| 2008/0054457 | A1 | 3/2008 | Lin | |
| 2008/0079461 | A1 | 4/2008 | Lin | |
| 2008/0080111 | A1 | 4/2008 | Lin | |
| 2008/0080112 | A1 | 4/2008 | Lin | |
| 2008/0080113 | A1 | 4/2008 | Lin | |
| 2008/0081457 | A1 | 4/2008 | Lin | |
| 2008/0081458 | A1 | 4/2008 | Lin | |
| 2008/0111242 | A1 | 5/2008 | Lin | |
| 2009/0291554 | A1 | 11/2009 | Lin | |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pgs. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/Silk™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution.Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking.Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polyimide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
Megic Corp. "MEGIC way to system solutions through bumping and redistribution," (Brochure) (Feb. 6, 2004) pp. 1-3.
Lin, M.S. "Post Passivation Technology™-MEGIC ® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

* cited by examiner

WIREBOND OVER POST PASSIVATION THICK METAL

This application claims priority to U.S. provisional application No. 60/968,082, filed on Aug. 27, 2007, which is herein incorporated by reference in its entirety.

BACKGROUND OF THE INVENTION

1. Field of the Invention

The invention relates to a chip assembly, and, more specifically, to a chip assembly having a thick metallization structure formed over a passivation layer of a chip and bonded with a wire through a wire-bonding process.

2. Brief Description of the Related Art

As known in the art, wire bonding is a technology used to attach a fine wire, usually 1 to 3 mils in diameter, from one connection pad to another, completing the electrical connection in an electronic device.

SUMMARY OF THE INVENTION

It is the objective of the invention to provide a chip assembly with a semiconductor chip having a thick metallization structure, over a passivation layer, bonded with a wire to connect to an external circuit.

In order to reach the above objective, the present invention provides a chip assembly comprising a semiconductor chip and a wirebonded wire. The semiconductor chip comprises a silicon substrate, multiple transistors in or over the silicon substrate, a thin metal structure and multiple dielectric layers over the silicon substrate, a passivation layer over the silicon substrate, over the transistors, over the thin metal structure and over the dielectric layers, and a first polymer layer on the passivation layer. A topmost metal layer of the thin metal structure comprises a first region, a second region and a third region between the first and second regions. The passivation layer is on the first and second regions, and an opening in the passivation layer is over the third region. An opening in the first polymer layer is over the third region and exposes the third region exposed by the opening in the passivation layer. The semiconductor chip further comprises a first thick metal layer on the third region and on the first polymer layer, a second polymer layer on the first thick metal layer and on the first polymer layer, a second thick metal layer on the second polymer layer and on the first thick metal layer, and a third polymer layer on the second thick metal layer. The first thick metal layer comprises an adhesion/barrier layer on the third region and on the first polymer layer, a copper seed layer on the adhesion/barrier layer, a copper layer having a thickness between 3 and 25 micrometers on the copper seed layer, and a barrier layer, such as a nickel layer or a cobalt layer, on the copper layer. The first thick metal layer is connected to the third region through the opening in the first polymer layer. An opening in the second polymer layer is over a contact point of the first thick metal and exposes the contact point. The second thick metal layer comprises an adhesion/barrier layer on the contact point exposed by the opening in the second polymer, a gold seed layer on the adhesion/barrier layer, and a gold layer having a thickness between 1 and 20 micrometers on the gold seed layer. An opening in the third polymer layer is over the second thick metal layer and exposes the second thick metal layer. The wirebonded wire is boned to the second thick metal layer through the opening in the third polymer layer.

To enable the objectives, technical contents, characteristics and accomplishments of the present invention, the embodiments of the present invention are to be described in detail in cooperation with the attached drawings below.

DETAILED DESCRIPTION OF THE INVENTION

Figure 1:
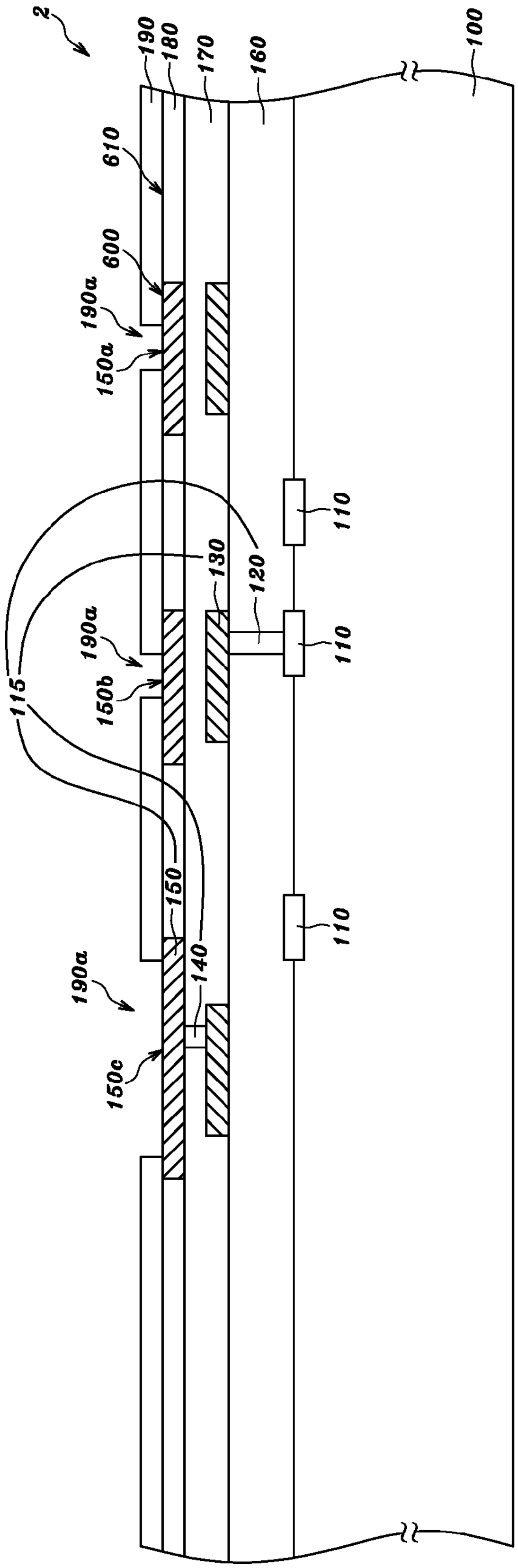
FIG. 1 is a cross-sectional view schematically showing a semiconductor wafer according to the present invention.

FIG. 1 is a schematically cross-sectional figure showing a semiconductor wafer 2 with a passivation layer 190. The semiconductor wafer 2 includes a semiconductor substrate 100, semiconductor devices 110, a metallization structure 115, dielectric layers 160, 170 and 180, and the passivation layer 190. The semiconductor substrate 100 can be a silicon substrate, a GaAs substrate, or a SiGe substrate.

The semiconductor devices 110 are formed in or over the semiconductor substrate 100. The semiconductor devices 110 may comprise a memory cell, a logic circuit, a passive device, such as a resistor, a capacitor, an inductor or a filter, or an active device, such as a transistor, a p-channel MOS device, a n-channel MOS device, a CMOS (Complementary Metal Oxide Semiconductor) device, a BJT (Bipolar Junction Transistor) device or a BiCMOS (Bipolar CMOS) device.

The metallization structure 115, connected to the semiconductor devices 110, is formed over the semiconductor substrate 100. The metallization structure 115 comprises a metal plug 120, a metal plug 140, and interconnection layers 130 and 150 having a thickness less than 3 micrometers.

The metal plug 120, a contact plug, can be formed of a tungsten layer and an adhesion/barrier layer on the bottom surface and sidewalls of the tungsten layer, wherein the adhesion/barrier layer may be a tantalum-containing layer, such as a tantalum layer or a tantalum-nitride layer, or a titanium-containing layer, such as a titanium layer, a titanium-nitride layer or a titanium-tungsten alloy layer. Alternatively, the metal plug 120 can be formed of a copper layer and an adhesion/barrier layer on the bottom surface and sidewalls of the copper layer, wherein the adhesion/barrier layer may be a tantalum-containing layer, such as a tantalum layer or a tantalum-nitride layer, or a titanium-containing layer, such as a titanium layer, a titanium-nitride layer or a titanium-tungsten alloy layer.

The interconnection layer 130 is formed on the dielectric layer 160 and on the metal plug 120. Three cases of the interconnection layer 130 are described as below.

In a first case, the interconnection layer 130, principally made of copper, can be formed of a copper layer over the dielectric layer 160 and over the metal plug 120, and an adhesion/barrier layer on the dielectric layer 160, on the metal plug 120 and on the bottom surface and sidewalls of the copper layer. The copper layer, having a thickness between 0.2 and 2 micrometers, can be formed by an electroplating process. The adhesion/barrier layer, having a thickness between 10 and 200 angstroms, can be formed by a sputtering process or a chemical vapor deposition (CVD) process, and can be a tantalum-containing layer, such as a tantalum layer or a tantalum-nitride layer, or a titanium-containing layer, such as a titanium layer, a titanium-nitride layer or a titanium-tungsten alloy layer.

In a second case, the interconnection layer 130, principally made of tungsten, can be formed of a tungsten layer over the dielectric layer 160 and over the metal plug 120, and an adhesion/barrier layer on the dielectric layer 160, on the metal plug 120 and on the bottom surface and sidewalls of the tungsten layer. The tungsten layer, having a thickness between 0.2 and 2 micrometers, can be formed by a chemical vapor deposition (CVD) process. The adhesion/barrier layer, having a thickness between 10 and 200 angstroms, can be formed by a sputtering process or a chemical vapor deposition (CVD) process, and can be a tantalum-containing layer, such as a tantalum layer or a tantalum-nitride layer, or a titanium-containing layer, such as a titanium layer, a titanium-nitride layer or a titanium-tungsten alloy layer.

In a third case, the interconnection layer 130, principally made of aluminum alloy, can be formed of an adhesion/barrier layer on the dielectric layer 160 and on the metal plug 120, and an aluminum-alloy layer, such as an aluminum-copper-alloy layer, on the adhesion/barrier layer. The aluminum-alloy layer, having a thickness between 0.2 and 2 micrometers, can be formed by a sputtering process. The adhesion/barrier layer, having a thickness between 500 and 2,000 angstroms, can be formed by a sputtering process or a chemical vapor deposition (CVD) process, and can be a tantalum-containing layer, such as a tantalum layer or a tantalum-nitride layer, or a titanium-containing layer, such as a titanium layer, a titanium-nitride layer or a titanium-tungsten alloy layer.

The metal plug 140, a via plug, is formed on the interconnection layer 130, and the interconnection layer 150 is formed on the dielectric layer 170 and on the metal plug 140.

For example, the metal plug 140 can be formed of a first adhesion/barrier layer on the interconnection layer 130, in case the interconnection layer 130 includes the metallization structure 115 illustrated in the above-mentioned second or third case, and a tungsten layer on the first adhesion/barrier layer. The first adhesion/barrier layer can be formed by a sputtering process or a chemical vapor deposition (CVD) process, and can be a tantalum-containing layer, such as a tantalum layer or a tantalum-nitride layer, or a titanium-containing layer, such as a titanium layer, a titanium-nitride layer or a titanium-tungsten alloy layer. The interconnection layer 150, principally made of aluminum alloy, can be formed of a second adhesion/barrier layer, having a thickness between 500 and 2,000 angstroms, on the dielectric layer 170 and on the metal plug 140, and an aluminum-alloy layer, such as an aluminum-copper-alloy layer, on the second adhesion/barrier layer. The aluminum-alloy layer, having a thickness between 0.2 and 3 micrometers, can be formed by a sputtering process. The second adhesion/barrier layer can be formed by a sputtering process or a chemical vapor deposition (CVD) process, and can be a tantalum-containing layer, such as a tantalum layer or a tantalum-nitride layer, or a titanium-containing layer, such as a titanium layer, a titanium-nitride layer or a titanium-tungsten alloy layer.

Figure 2A:
FIGS. 2A-2J are cross-sectional views showing a process of forming a metallization structure over a semiconductor substrate.
Figure 2B:
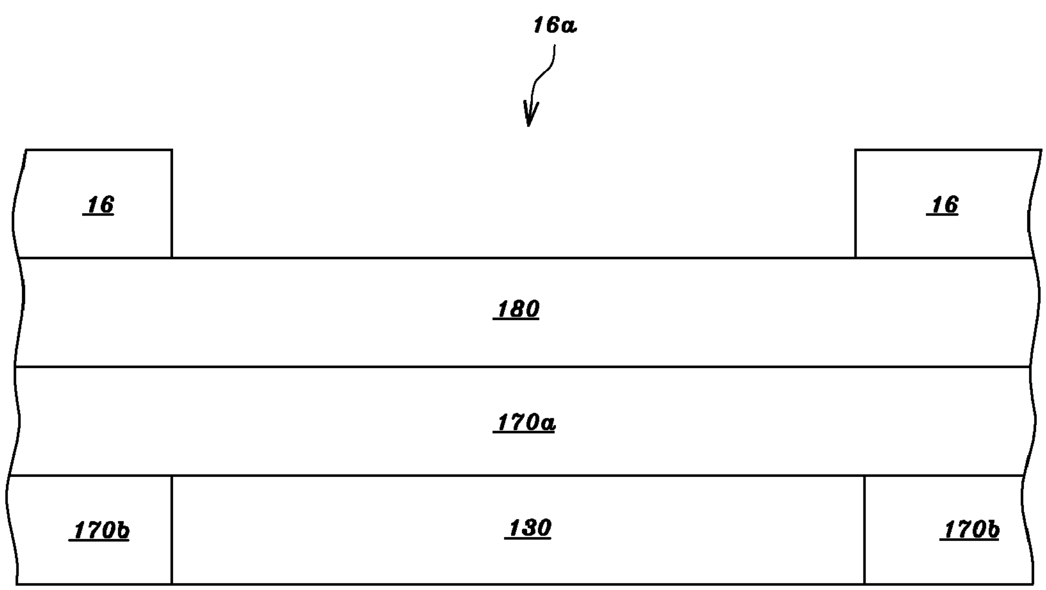
Figure 2C:
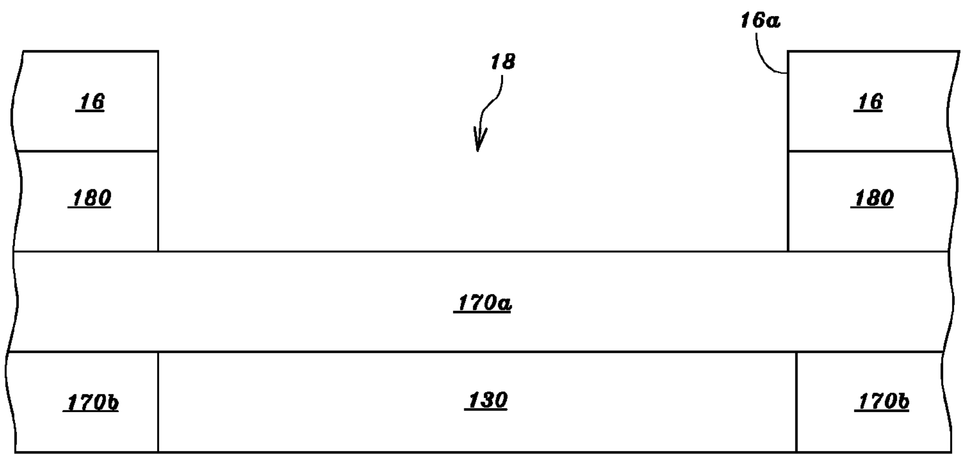
Figure 2D:
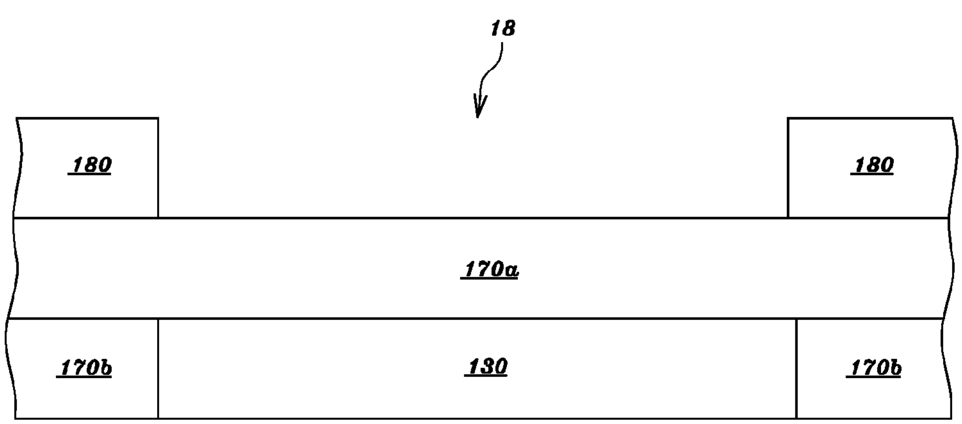
Figure 2E:
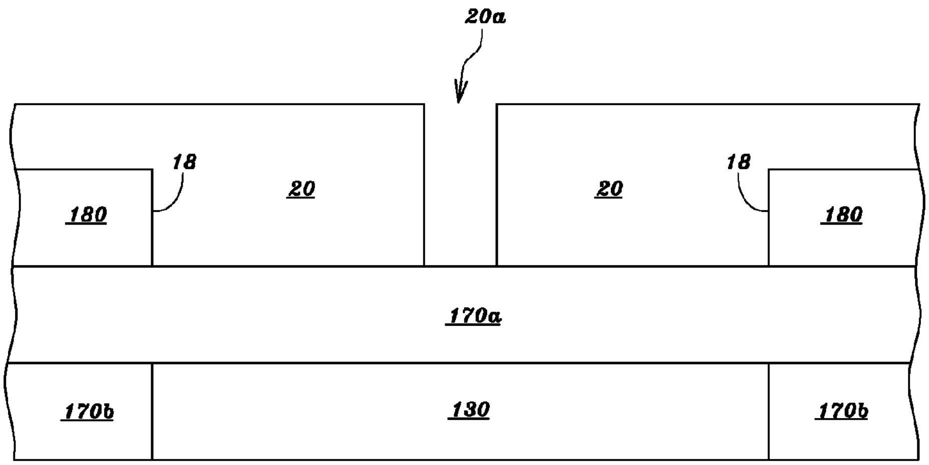
Figure 2F:
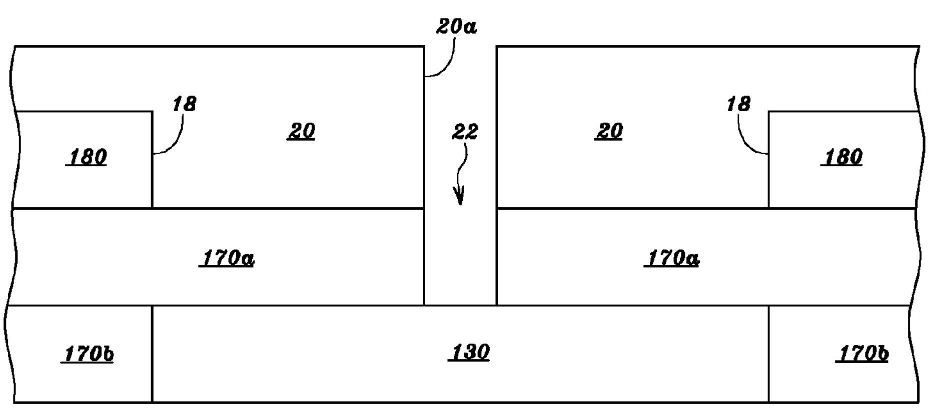
Figure 2G:
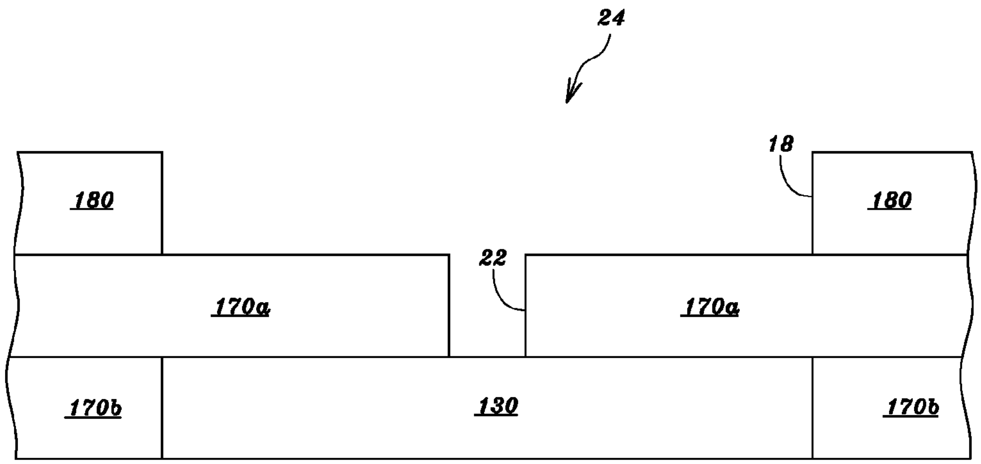
Figure 2H:
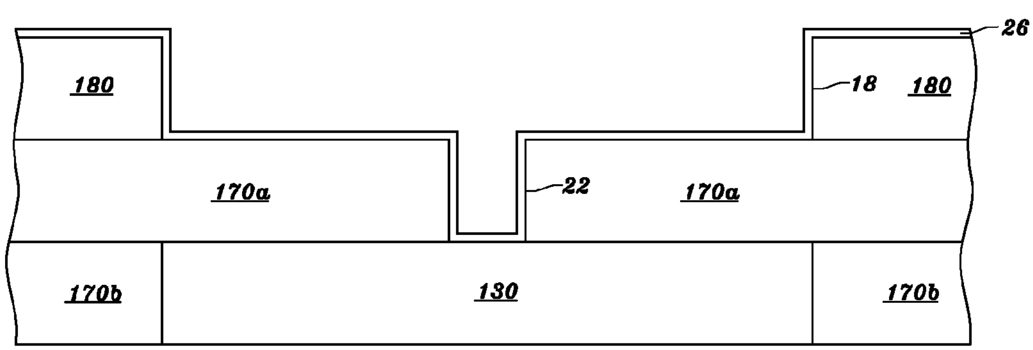
Figure 2I:
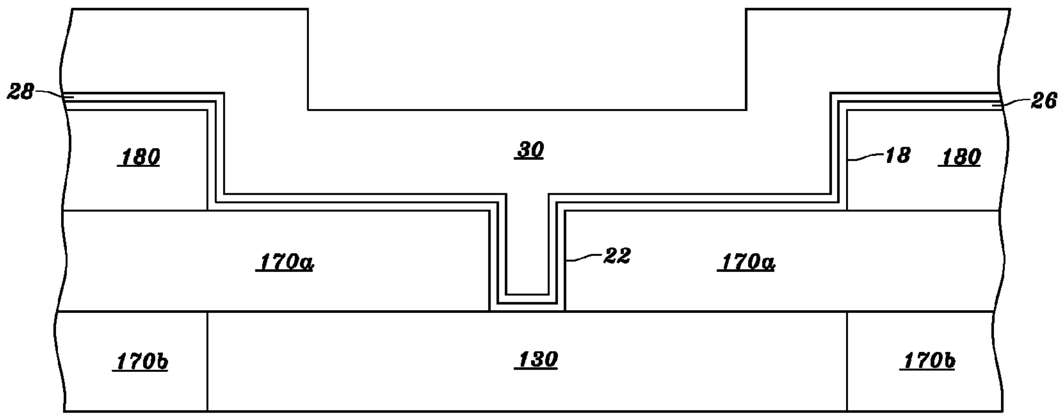
Figure 2J:
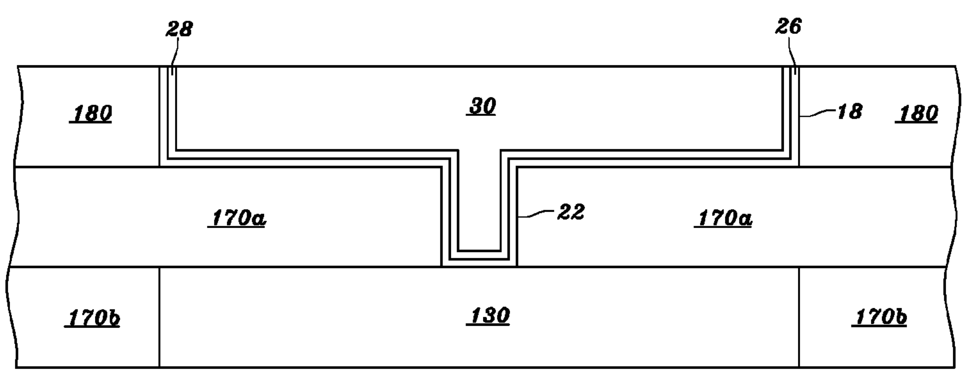

Alternatively, the interconnection layer 150 and the metal plug 140 are principally made of copper, wherein the interconnection layer 150 has a copper layer having a thickness of less than 3 micrometers, such as between 0.2 and 3 micrometers. In the following, a damascene process for forming the interconnection layer 150 and the metal plug 140 is illustrated. Referring to FIG. 2A, the dielectric layer 170 showed in FIG. 1 includes two dielectric layers 170*a* and 170*b*. The dielectric layer 180 is formed on the dielectric layer 170*a* by a chemical vapor deposition (CVD) process or a spin-on coating process, wherein each of the dielectric layers 180 and 170*a* may be composed of a low-K oxide layer with a thickness between 0.3 and 2 micrometers, and preferably between 0.5 and 1 micrometers, and an oxynitride layer on the low-K oxide layer, of a low-K polymer layer with a thickness between 0.3 and 2 micrometers, and preferably between 0.5 and 1 micrometers, and an oxynitride layer on the low-K polymer layer, of a low-K oxide layer with a thickness between 0.3 and 2 micrometers, and preferably between 0.5 and 1 micrometers, and a nitride layer on the low-K oxide layer, of a low-K polymer layer with a thickness between 0.3 and 2 micrometers, and preferably between 0.5 and 1 micrometers, and a nitride layer on the low-K polymer layer, or of a low-K dielectric layer with a thickness between 0.3 and 2 micrometers, and preferably between 0.5 and 1 micrometers, and a nitride-containing layer on the low-K dielectric layer. Next, referring to FIG. 2B, a photoresist layer 16 is formed on the dielectric layer 180, and an opening 16*a* in the photoresist layer 16 exposes the dielectric layer 180. Next, referring to FIG. 2C, the dielectric layer 180 under the opening 16*a* is removed by a dry etching method to form a trench 18 in the dielectric layer 180 exposing the dielectric layer 170*a*. Next, referring to FIG. 2D, after forming the trench 18 in the dielectric layer 180, the photoresist layer 16 is removed. Next, referring to FIG. 2E, a photoresist layer 20 is formed on the dielectric layer 180 and on the dielectric layer 170*a* exposed by the trench 18, and an opening 20*a* in the photoresist layer 20 exposes the dielectric layer 170*a* exposed by the trench 18. Next, referring to FIG. 2F, the dielectric layer 170*a* under the opening 20*a* is removed by a dry etching method to form a via 22 in the dielectric layer 170*a* exposing the interconnection layer 130. Next, referring to FIG. 2G, after forming the via 22 in the dielectric layer 170*a*, the photoresist layer 20 is removed. Thereby, an opening 24 including the trench 18 and the via 22 is formed in the dielectric layers 180 and 170*a*. Next, referring to FIG. 2H, an adhesion/barrier layer 26 having a thickness between 20 and 200 angstroms is formed on the interconnection layer 130 exposed by the opening 24, on the sidewalls of the opening 24 and on the top surface of the dielectric layer 180. The adhesion/barrier layer 26 can be formed by a sputtering process or a chemical vapor deposition (CVD) process. The material of the adhesion/barrier layer 26 may include titanium, titanium nitride, a titanium-tungsten alloy, tantalum, tantalum nitride, or a composite of the abovementioned materials. For example, the adhesion/barrier layer 26 may be formed by sputtering a tantalum layer on the interconnection layer 130 exposed by the opening 24, on the sidewalls of the opening 24 and on the top surface of the dielectric layer 180. Alternatively, the adhesion/barrier layer 26 may be formed by sputtering a tantalum-nitride layer on the interconnection layer 130 exposed by the opening 24, on the sidewalls of the opening 24 and on the top surface of the dielectric layer 180. Alternatively, the adhesion/barrier layer 26 may be formed by forming a tantalum-nitride layer on the interconnection layer 130 exposed by the opening 24, on the sidewalls of the opening 24 and on the top surface of the dielectric layer 180 by a chemical vapor deposition (CVD) process. Next, referring to FIG. 2I, a seed layer 28, made of copper, having a thickness between 50 and 500 angstroms is formed on the adhesion/barrier layer 26 using a sputtering process or a chemical vapor deposition (CVD) process, and then a copper layer 30 having a thickness between 0.5 and 5 micrometers, and preferably between 1 and 2 micrometers, is electroplated on the seed layer 28. Next, referring to FIG. 2J, the copper layer 30, the seed layer 28 and the adhesion/barrier layer 26 outside the opening 24 in the dielectric layers 180 and 170*a* are removed using a chemical mechanical polishing (CMP) process until the top surface of the dielectric layer 180 is exposed to an ambient. Thereby, the interconnection layer 150 is composed of the adhesion/barrier layer 26, the seed layer 28 and the copper layer 30 formed in the trench 18, and the metal plug 140 is composed of the adhesion/barrier layer 26, the seed layer 28 and the copper layer 30 formed in the via 22. The interconnection layer 150 can be connected to the semiconductor device 110 through the metal plug 140 inside the dielectric layer 170*a*.

Referring to FIG. 1, the dielectric layer 160 is located on the semiconductor substrate 100, and the interconnection layer 130 on the dielectric layer 160 is connected to the semiconductor devices 110 through the metal plug 120 inside the dielectric layer 160. The dielectric layer 170 is located over the semiconductor substrate 100 and between the neighboring interconnection layers 130 and 150, and the neighboring interconnection layers 130 and 150 are interconnected to each other through the metal plug 140 inside the dielectric layer 170. The dielectric layer 180 is located on the dielectric layer 170, and the interconnection layer 150 is located in the dielectric layer 180. The dielectric layers 160, 170 and 180 are commonly formed by a chemical vapor deposition (CVD) process. The material of the dielectric layers 160, 170 and 180 may include silicon oxide (such as $SiO_2$), silicon oxynitride (such as $SiO_xN_y$), TEOS (Tetraethoxysilane), a compound containing silicon, carbon, oxygen and hydrogen (such as $Si_wC_xO_yH_z$), silicon nitride (such as $Si_3N_4$), FSG (Fluorinated Silicate Glass), Black Diamond, SiLK, a porous silicon oxide, a porous compound containing nitrogen, silicon carbon nitride (such as SiCN), oxygen and silicon, BPSG (borophosphosilicate glass), a polyarylene ether, polybenzoxazole (PBO), or a material having a low dielectric constant (K) of between 1.5 and 3, for example. The dielectric layers 160, 170 and 180 each have a thickness less than 3 micrometers. For example, the dielectric layers 160 and 170 each have a thickness between 0.3 and 2.5 micrometers, and the dielectric layer 180 has a thickness between 0.3 and 3 micrometers.

The passivation layer 190 is formed over the semiconductor substrate 100, over the semiconductor devices 110, over the metallization structure 115, over the dielectric layers 160 and 170, and on the dielectric layer 180. Openings 190*a* in the passivation layer 190 expose contact points 150*a*, 150*b* and 150*c* of the interconnection layer 150.

In a case, the passivation layer 190 can be formed on a top surface 610 of the dielectric layer 180 and on a top surface 600 of the interconnection layer 150. The interconnection layer 150 comprises the topmost damascene copper layer of the semiconductor wafer 2. The top surface 600 and the top surface 610 have a same surface.

In another case, the passivation layer 190 can be formed on a topmost sub-micon metal trace, made up of the interconnection layer 150, of the semiconductor wafer 2, and the topmost sub-micon metal trace has a width smaller than 1 micrometer. A post-passivation metal trace in a bottommost metal layer, formed by the following processes in embodiments 1-9 and at least comprising an adhesion/barrier layer 210, a seed layer 220 and a copper layer 230, over the passivation layer 190 can be formed over the passivation layer 190 and on the contact points 150*a*, 150*b* and 150*c* of the interconnection layer 150, and the post-passivation metal trace has a width greater than 1 micrometer. Therefor, the passivation layer 190 can be between the topmost sub-micon metal trace 150 of the semiconductor wafer 2 and the post-passivation metal trace of the semiconductor wafer 2.

The passivation layer 190 can protect the semiconductor devices 110 and the metallization structure 115 from being damaged by moisture and foreign ion contamination. In other words, mobile ions (such as sodium ion), transition metals (such as gold, silver and copper) and impurities can be prevented from penetrating through the passivation layer 190 to the semiconductor devices 110, such as transistors, polysilicon resistor elements and polysilicon-polysilicon capacitor elements, and to the metallization structure 115. In a preferred case, the passivation layer 190 comprises a topmost inorganic layer of the semiconductor wafer 2, wherein the topmost inorganic layer can protect the semiconductor devices 110 and the metallization structure 115 from being damaged by moisture and foreign ion contamination.

The passivation layer 190 is commonly made of silicon oxide (such as $SiO_2$), PSG (phosphosilicate glass), silicon oxynitride (such as $SiO_xN_y$), silicon nitride (such as $Si_3N_4$), silicon carbon nitride (such as SiCN) or a composite of the abovementioned materials. The passivation layer 190 on the interconnection layer 150 of the metallization structure 115 typically has a thickness greater than 0.3 μm, such as between 0.3 and 1.5 micrometers. In a preferred case, the passivation layer 190 includes a topmost silicon nitride layer of the semiconductor wafer 2, wherein the topmost silicon nitride layer in the passivation layer 190 has a thickness greater than 0.2 μm, such as between 0.3 and 1.2 micrometers. Fifteen methods for forming the passivation layer 190 are described as below.

In a first method, the passivation layer 190 is formed by depositing a silicon oxide layer with a thickness between 0.2 and 1.2 micrometers using a chemical vapor deposition (CVD) method, and then depositing a silicon nitride layer with a thickness between 0.2 and 1.2 micrometers on the silicon oxide layer using a CVD method.

In a second method, the passivation layer 190 is formed by depositing a silicon oxide layer with a thickness between 0.2 and 1.2 micrometers using a CVD method, next depositing a silicon oxynitride layer with a thickness between 0.05 and 0.15 micrometers on the silicon oxide layer using a Plasma Enhanced CVD (PECVD) method, and then depositing a silicon nitride layer with a thickness between 0.2 and 1.2 micrometers on the silicon oxynitride layer using a CVD method.

In a third method, the passivation layer 190 is formed by depositing a silicon oxynitride layer with a thickness between 0.05 and 0.15 micrometers using a CVD method, next depositing a silicon oxide layer with a thickness between 0.2 and 1.2 micrometers on the silicon oxynitride layer using a CVD method, and then depositing a silicon nitride layer with a thickness between 0.2 and 1.2 micrometers on the silicon oxide layer using a CVD method.

In a fourth method, the passivation layer 190 is formed by depositing a first silicon oxide layer with a thickness between 0.2 and 0.5 micrometers using a CVD method, next depositing a second silicon oxide layer with a thickness between 0.5 and 1 micrometers on the first silicon oxide layer using a spin-coating method, next depositing a third silicon oxide layer with a thickness between 0.2 and 0.5 micrometers on the second silicon oxide layer using a CVD method, and then depositing a silicon nitride layer with a thickness between 0.2 and 1.2 micrometers on the third silicon oxide layer using a CVD method.

In a fifth method, the passivation layer 190 is formed by depositing a silicon oxide layer with a thickness between 0.5 and 2 micrometers using a High Density Plasma CVD (HDP CVD) method, and then depositing a silicon nitride layer with a thickness between 0.2 and 1.2 micrometers on the silicon oxide layer using a CVD method.

In a sixth method, the passivation layer 190 is formed by depositing an Undoped Silicate Glass (USG) layer with a thickness between 0.2 and 3 micrometers, next depositing an insulating layer of TEOS, PSG or BPSG (borophosphosilicate glass) with a thickness between 0.5 and 3 micrometers on the USG layer, and then depositing a silicon nitride layer with a thickness between 0.2 and 1.2 micrometers on the insulating layer using a CVD method.

In a seventh method, the passivation layer 190 is formed by optionally depositing a first silicon oxynitride layer with a thickness between 0.05 and 0.15 micrometers using a CVD method, next depositing a first silicon oxide layer with a thickness between 0.2 and 1.2 micrometers on the first silicon oxynitride layer using a CVD method, next optionally depositing a second silicon oxynitride layer with a thickness between 0.05 and 0.15 micrometers on the first silicon oxide layer using a CVD method, next depositing a silicon nitride layer with a thickness between 0.2 and 1.2 micrometers on the second silicon oxynitride layer or on the first silicon oxide using a CVD method, next optionally depositing a third silicon oxynitride layer with a thickness between 0.05 and 0.15 micrometers on the silicon nitride layer using a CVD method, and then depositing a second silicon oxide layer with a thickness between 0.2 and 1.2 micrometers on the third silicon oxynitride layer or on the silicon nitride layer using a CVD method.

In a eighth method, the passivation layer 190 is formed by depositing a first silicon oxide layer with a thickness between 0.2 and 1.2 micrometers using a CVD method, next depositing a second silicon oxide layer with a thickness between 0.5 and 1 micrometers on the first silicon oxide layer using a spin-coating method, next depositing a third silicon oxide layer with a thickness between 0.2 and 1.2 micrometers on the second silicon oxide layer using a CVD method, next depositing a silicon nitride layer with a thickness between 0.2 and 1.2 micrometers on the third silicon oxide layer using a CVD method, and then depositing a fourth silicon oxide layer with a thickness between 0.2 and 1.2 micrometers on the silicon nitride layer using a CVD method.

In a ninth method, the passivation layer 190 is formed by depositing a first silicon oxide layer with a thickness between 0.5 and 2 micrometers using a HDP CVD method, next depositing a silicon nitride layer with a thickness between 0.2 and 1.2 micrometers on the first silicon oxide layer using a CVD method, and then depositing a second silicon oxide layer with a thickness between 0.5 and 2 micrometers on the silicon nitride using a HDP CVD method.

In a tenth method, the passivation layer 190 is formed by depositing a first silicon nitride layer with a thickness between 0.2 and 1.2 micrometers using a CVD method, next depositing a silicon oxide layer with a thickness between 0.2 and 1.2 micrometers on the first silicon nitride layer using a CVD method, and then depositing a second silicon nitride layer with a thickness between 0.2 and 1.2 micrometers on the silicon oxide layer using a CVD method.

In a eleventh method, the passivation layer 190 is formed by depositing a single layer of silicon nitride with a thickness between 0.2 and 1.5 micrometers, and preferably between 0.3 and 1.2 micrometers, using a CVD method, by depositing a single layer of silicon oxynitride with a thickness between 0.2 and 1.5 micrometers, and preferably between 0.3 and 1.2 micrometers, using a CVD method, or by depositing a single layer of silicon carbon nitride with a thickness between 0.2 and 1.5 micrometers, and preferably between 0.3 and 1.2 micrometers, using a CVD method.

In a twelfth method, the passivation layer 190 is formed by depositing a silicon oxide layer with a thickness between 0.2 and 1.2 micrometers using a CVD method, and then depositing a silicon carbon nitride layer with a thickness 0.2 and 1.2 micrometers on the silicon oxide layer using a CVD method.

In a thirteenth method, the passivation layer 190 is formed by depositing a first silicon carbon nitride layer with a thickness between 0.2 and 1.2 micrometers using a CVD method, next depositing a silicon oxide layer with a thickness between 0.2 and 1.2 micrometers on the first silicon carbon nitride layer using a CVD method, and then depositing a second silicon carbon nitride layer with a thickness 0.2 and 1.2 micrometers on the silicon oxide layer using a CVD method.

In a fourteenth method, the passivation layer 190 is formed by depositing a silicon carbon nitride layer with a thickness between 0.2 and 1.2 micrometers using a CVD method, next depositing a silicon oxide layer with a thickness between 0.2 and 1.2 micrometers on the silicon carbon nitride layer using a CVD method, and then depositing a silicon nitride layer with a thickness between 0.2 and 1.2 micrometers on the silicon oxide layer using a CVD method.

In a fifteenth method, the passivation layer 190 is formed by depositing a silicon nitride layer with a thickness between 0.2 and 1.2 micrometers using a CVD method, next depositing a silicon oxide layer with a thickness between 0.2 and 1.2 micrometers on the silicon nitride layer using a CVD method, and then depositing a silicon carbon nitride layer with a thickness between 0.2 and 1.2 micrometers on the silicon oxide layer using a CVD method.

The openings 190*a* in the passivation layer 190 are over the contact points 150*a*, 150*b* and 150*c* of the interconnection layer 150 used to input or output signals or to be connected to a power source or a ground reference. The contact points 150*a*, 150*b* and 150*c* are at bottoms of the openings 190*a*, and the contact points 150*a*, 150*b* and 150*c* are separate in the interconnection layer 150. In a preferred case, the contact points 150*a*, 150*b* and 150*c* are provided by a topmost metal layer 150 under the passivation layer 190.

The openings 190*a* may each have a transverse dimension, from a top view, between 0.5 and 20 micrometers or between 20 and 200 micrometers. The shape of the openings 190*a* from a top view may be a circle, and the diameter of the circle-shaped openings 190*a* may be between 0.5 and 20 micrometers or between 20 and 200 micrometers. Alternatively, the shape of the openings 190*a* from a top view may be a square, and the width of the square-shaped openings 190*a* may be between 0.5 and 20 micrometers or between 20 and 200 micrometers. Alternatively, the shape of the openings 190*a* from a top view may be a polygon, such as hexagon or octagon, and the polygon-shaped openings 190*a* may have a width of between 0.5 and 20 micrometers or between 20 and 200 micrometers. Alternatively, the shape of the openings 190*a* from a top view may be a rectangle, and the rectangle-shaped openings 190*a* may have a shorter width of between 0.5 and 20 micrometers or between 20 and 200 micrometers.

Metal caps (not shown) having a thickness between 0.4 and 5 micrometers, and preferably between 0.4 and 2 micrometers, can be optionally formed on the contact points 150*a*, 150*b* and 150*c* to prevent the interconnection layer 150 from being oxidized or contaminated. The material of the metal caps may include aluminum, an aluminum-copper alloy or an Al—Si—Cu alloy.

For example, when the interconnection layer 150 is principally made of electroplated copper, the metal caps including aluminum are formed on the contact points 150*a*, 150*b* and 150*c* to protect the interconnection layer 150 from being oxidized. The metal caps may comprise a barrier layer having a thickness between 0.01 and 0.5 micrometers on the contact points 150*a*, 150*b* and 150*c*, and an aluminum-containing layer, such as an aluminum layer or an aluminum-copper-alloy layer, having a thickness between 0.4 and 3 micrometers on the barrier layer. The barrier layer may be made of titanium, titanium nitride, a titanium-tungsten alloy, chromium, tantalum or tantalum nitride.

Figure 3:
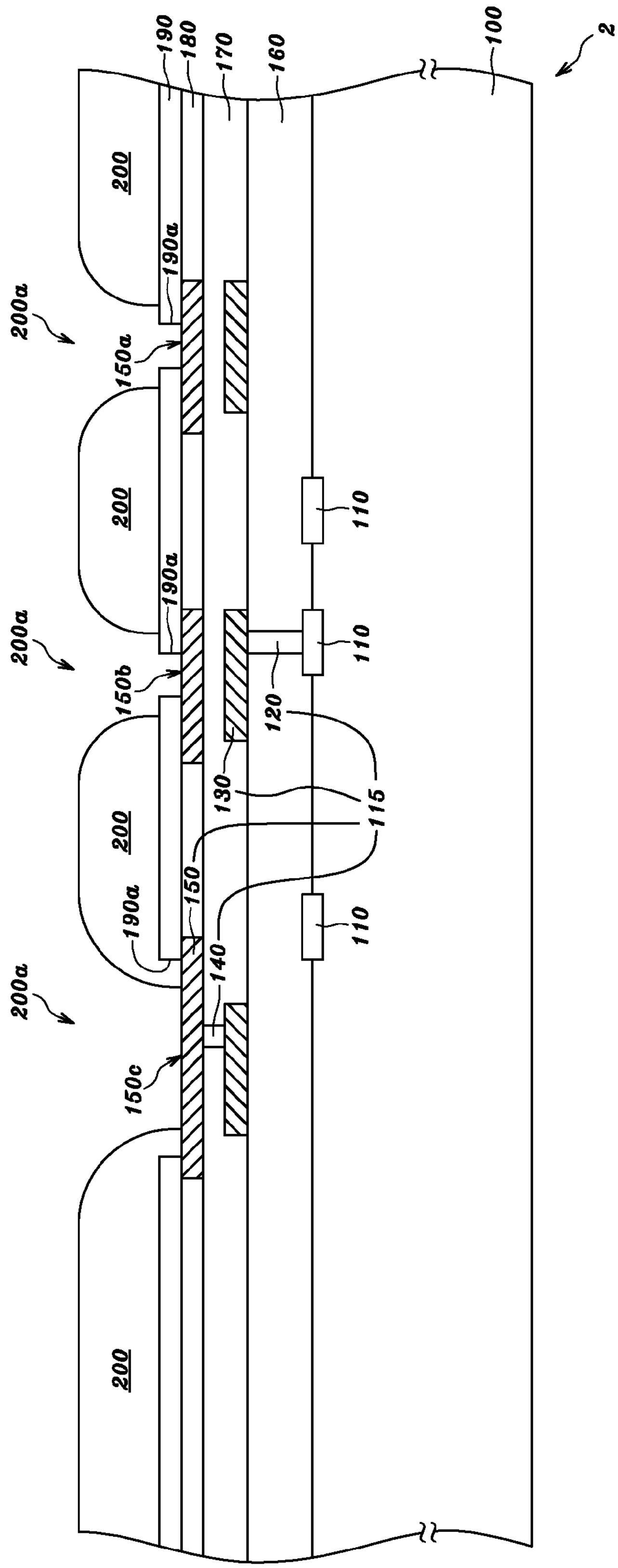
FIG. 3 is a cross-sectional view showing a polymer layer formed on a passivation layer of the semiconductor wafer shown in FIG. 1.

Referring to FIG. 3, a polymer layer 200 can be formed on the passivation layer 190 by a process including a spin-on coating process, a lamination process, a screen-printing process or a spraying process, and openings 200*a* in the polymer layer 200 are over the contact points 150*a*, 150*b* and 150*c* and expose the contact points 150*a*, 150*b* and 150*c*. The polymer layer 200 has a thickness between 3 and 25 micrometers, and preferably between 5 and 15 micrometers, and the material of the polymer layer 200 may include benzocyclobutene (BCB), polyimide (PI), polybenzoxazole (PBO) or epoxy resin.

In a case, the polymer layer 200 can be formed by spin-on coating a negative-type photosensitive polyimide layer having a thickness between 6 and 50 micrometers on the passivation layer 190 and on the contact points 150*a*, 150*b* and 150*c*, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the contact points 150*a*, 150*b* and 150*c*, then curing or heating the developed polyimide layer at a temperature between 180 and 400° C. for a time between 20 and 150 minutes in a nitrogen ambient or in an oxygen-free ambient, the cured polyimide layer having a thickness between 3 and 25 micrometers, and then removing the residual polymeric material or other contaminants from the contact points 150*a*, 150*b* and 150*c* with an $O_2$ plasma or a plasma containing fluorine of below 200 PPM and oxygen. By the way, the polymer layer 200 can be formed on the passivation layer 190, and the openings 200*a* formed in the polymer layer 200 expose the contact points 150*a*, 150*b* and 150*c*. For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient.

In another case, the polymer layer 200 can be formed by spin-on coating a positive-type photosensitive polybenzoxazole layer having a thickness of between 3 and 25 micrometers on the passivation layer 190 and on the contact points 150*a*, 150*b* and 150*c*, then baking the spin-on coated polybenzoxazole layer, then exposing the baked polybenzoxazole layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to form multiple openings exposing the contact points 150*a*, 150*b* and 150*c*, then curing or heating the developed polybenzoxazole layer at a temperature between 150 and 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient, the cured polybenzoxazole layer having a thickness of between 3 and 25 μm, and then removing the residual polymeric material or other contaminants from the contact points 150*a*, 150*b* and 150*c* with an $O_2$ plasma or a plasma containing fluorine of below 200 PPM and oxygen. By the way, the polymer layer 200 can be formed on the passivation layer 190, and the openings 200*a* formed in the polymer layer 200 expose the contact points 150*a*, 150*b* and 150*c*.

Alternatively, the step of forming the polymer layer 200 as illustrated in FIG. 3 can be omitted. For example, when the passivation layer 190 is formed by a process including a high density plasma chemical vapor deposition (HDP CVD) process, the step of forming the polymer layer 200 can be omitted.

Various metallization structures as illustrated in the following embodiments 1-9 can be formed over the passivation layer 190 and the contact points 150*a*, 150*b* and 150*c* of the above-mentioned semiconductor wafer 2.

Embodiment 1

Figure 4A:
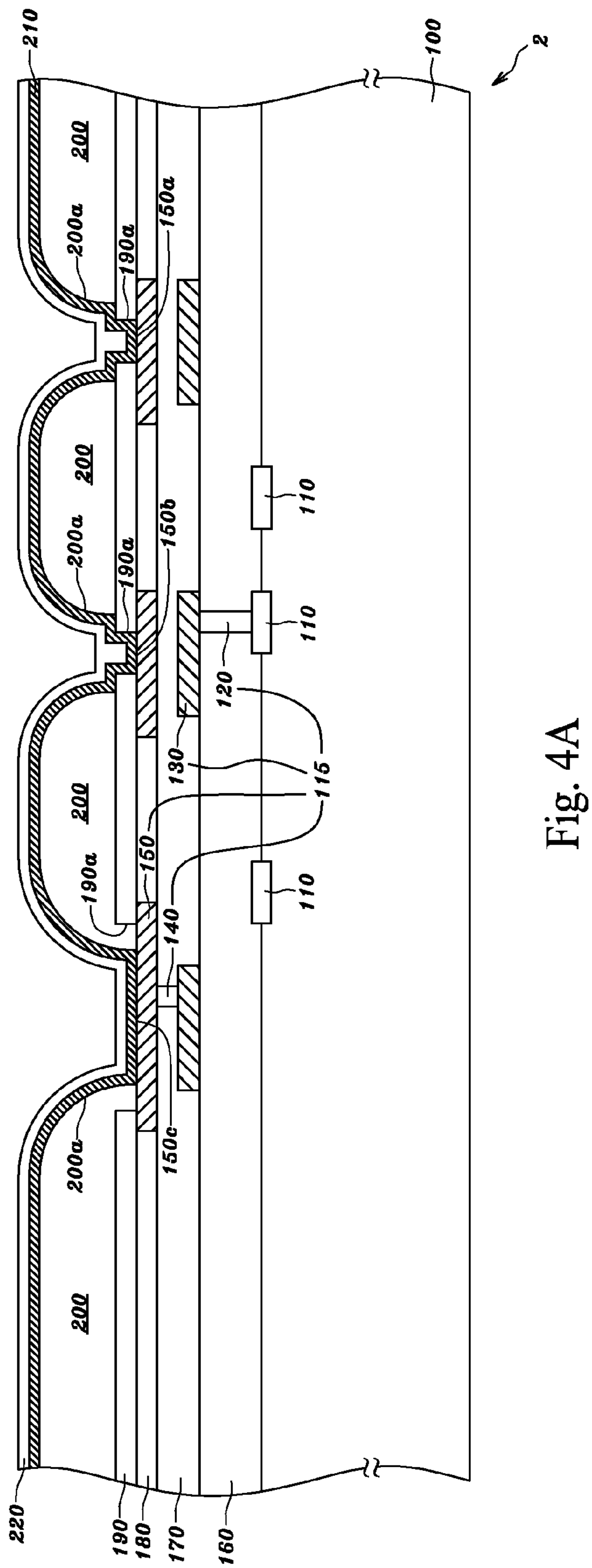
FIGS. 4A-4M are cross-sectional views showing a process for forming a semiconductor chip and bonding a wirebonded wire to the semiconductor chip according to one embodiment of the present invention.

Referring to FIG. 4A, an adhesion/barrier layer 210 having a thickness between 0.01 and 0.7 micrometers, and preferably between 0.02 and 0.5 micrometers, can be formed on the polymer layer 200 and on the contact points 150*a*, 150*b* and 150*c* exposed by the openings 200*a*. The adhesion/barrier layer 210 can be formed by a physical vapor deposition (PVD) process, such as a sputtering process or an evaporation process. The material of the adhesion/barrier layer 210 can be titanium, a titanium-tungsten alloy, titanium nitride, chromium, tantalum, tantalum nitride or a composite of the above-mentioned materials. The adhesion/barrier layer 210 is used to prevent the occurrence of interdiffusion between metal layers and to provide good adhesion between the metal layers.

For example, the adhesion/barrier layer 210 can be formed by sputtering a titanium layer, a titanium-nitride layer, a titanium-tungsten-alloy layer or a chromium layer with a thickness between 0.01 and 0.7 micrometers, and preferably between 0.02 and 0.5 micrometers, on the polymer layer 200 and on the contact points 150*a*, 150*b* and 150*c* exposed by the openings 200*a*. Alternatively, the adhesion/barrier layer 210 can be formed by sputtering a titanium layer with a thickness between 0.01 and 0.15 micrometers on the polymer layer 200 and on the contact points 150*a*, 150*b* and 150*c* exposed by the openings 200*a*, and then sputtering a titanium-tungsten-alloy layer with a thickness between 0.1 and 0.35 micrometers on the titanium layer.

Next, a seed layer 220 having a thickness between 0.1 and 1 micrometers, and preferably between 0.2 and 0.5 micrometers, is formed on the adhesion/barrier layer 210. The seed layer 220 can be formed by a physical vapor deposition (PVD) process, such as a sputtering process or an evaporation process. The material of the seed layer 220 can be copper. The seed layer 220 is beneficial to electroplating a metal layer thereon.

In a case, when the adhesion/barrier layer 210 is formed by sputtering a titanium-containing layer on the polymer layer 200 and on the contact points 150*a*, 150*b* and 150*c* exposed by the openings 200*a*, the seed layer 220 can be formed by sputtering a copper layer with a thickness between 0.1 and 1 micrometers, and preferably between 0.2 and 0.5 micrometers, on the titanium-containing layer. The above-mentioned titanium-containing layer can be a single titanium layer with a thickness between 0.01 and 0.7 micrometers, and preferably between 0.02 and 0.5 micrometers, a single titanium-tungsten-alloy layer with a thickness between 0.01 and 0.7 micrometers, and preferably between 0.02 and 0.5 micrometers, a single titanium-nitride layer with a thickness between 0.01 and 0.7 micrometers, and preferably between 0.02 and 0.5 micrometers, or a composite layer comprising a titanium layer with a thickness between 0.01 and 0.15 micrometers, and a titanium-tungsten-alloy layer, having a thickness between 0.1 and 0.35 micrometers, on the titanium layer.

In another case, when the adhesion/barrier layer 210 is formed by sputtering a chromium layer on the polymer layer 200 and on the contact points 150*a*, 150*b* and 150*c* exposed by the openings 200*a*, the seed layer 220 can be formed by sputtering a copper layer with a thickness between 0.1 and 1 micrometers, and preferably between 0.2 and 0.5 micrometers, on the chromium layer.

Figure 4B:
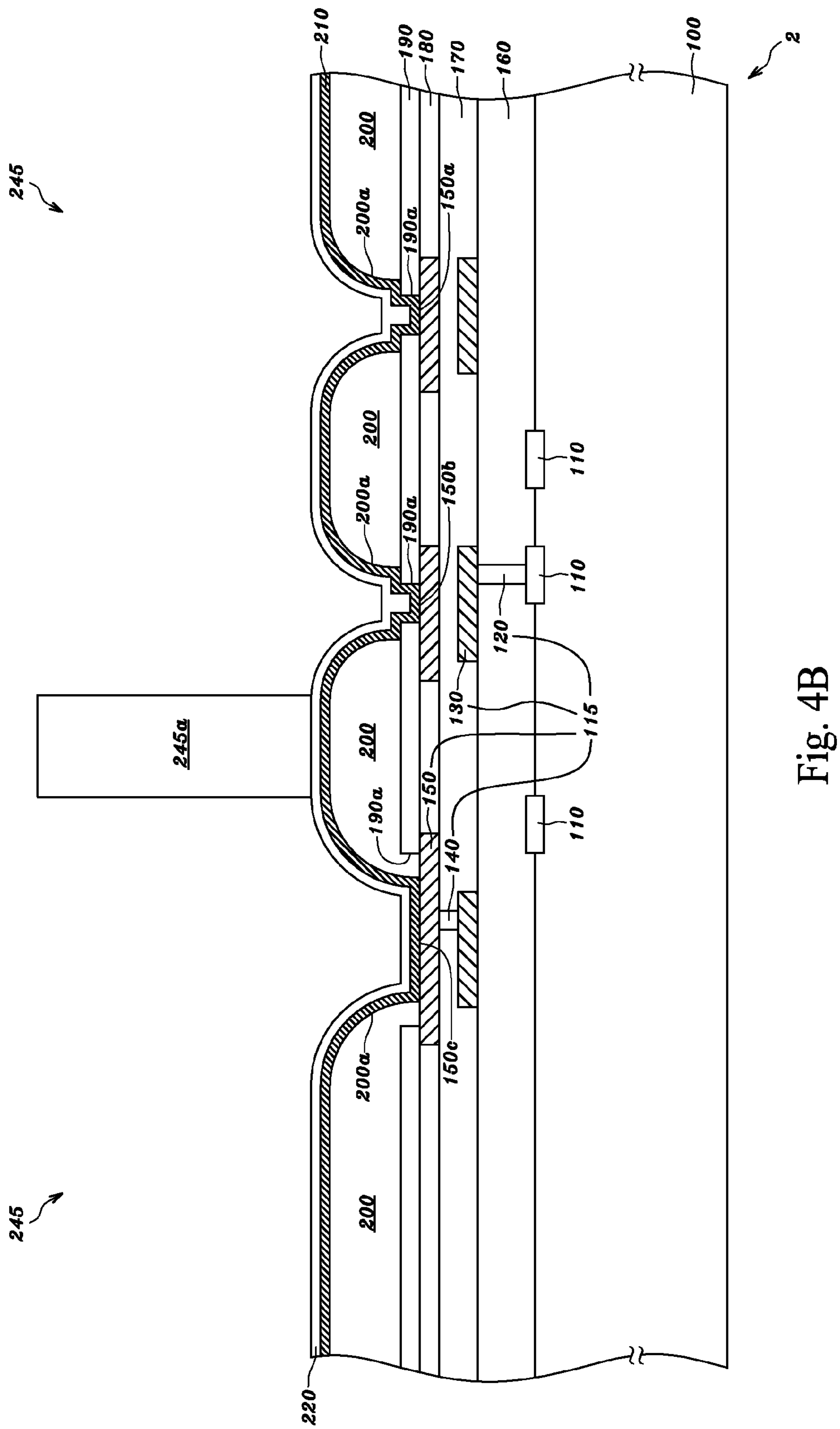

Referring to FIG. 4B, a photoresist layer 245*a*, such as a positive-type photoresist layer or a negative-type photoresist layer, having a thickness between 5 and 30 micrometers, and preferably between 10 and 25 micrometers, is formed on the seed layer 220 by a spin-on coating process, a lamination process, a screen-printing process or a spraying process. Next, the photoresist layer 245*a* is patterned with the processes of exposure and development to form openings 245 in the photoresist layer 245*a* exposing the seed layer 220. A 1× stepper or 1× contact aligner can be used to expose the photoresist layer 245*a* during the process of exposure.

For example, the photoresist layer 245*a* can be formed by spin-on coating a positive-type photosensitive polymer layer having a thickness between 5 and 30 micrometers, and preferably between 10 and 25 micrometers, on the seed layer 220, then exposing the photosensitive polymer layer using a 1× stepper or a contact aligner with at least two of G-line, H-line and I-line, wherein G-line has a wavelength ranging from 434 to 438 nm, H-line has a wavelength ranging from 403 to 407 nm, and I-line has a wavelength ranging from 363 to 367 nm, then developing the exposed polymer layer by spraying and puddling a developer on the semiconductor wafer 2 or by immersing the semiconductor wafer 2 into a developer, and then cleaning the semiconductor wafer 2 using deionized wafer and drying the semiconductor wafer 2 by spinning the semiconductor wafer 2. After development, a scum removal process of removing the residual polymeric material or other contaminants from the seed layer 220 may be conducted by using an $O_2$ plasma or a plasma containing fluorine of below 200 PPM and oxygen. By these processes, the photoresist layer 245*a* can be patterned with the openings 245 exposing the seed layer 220.

Figure 4C:
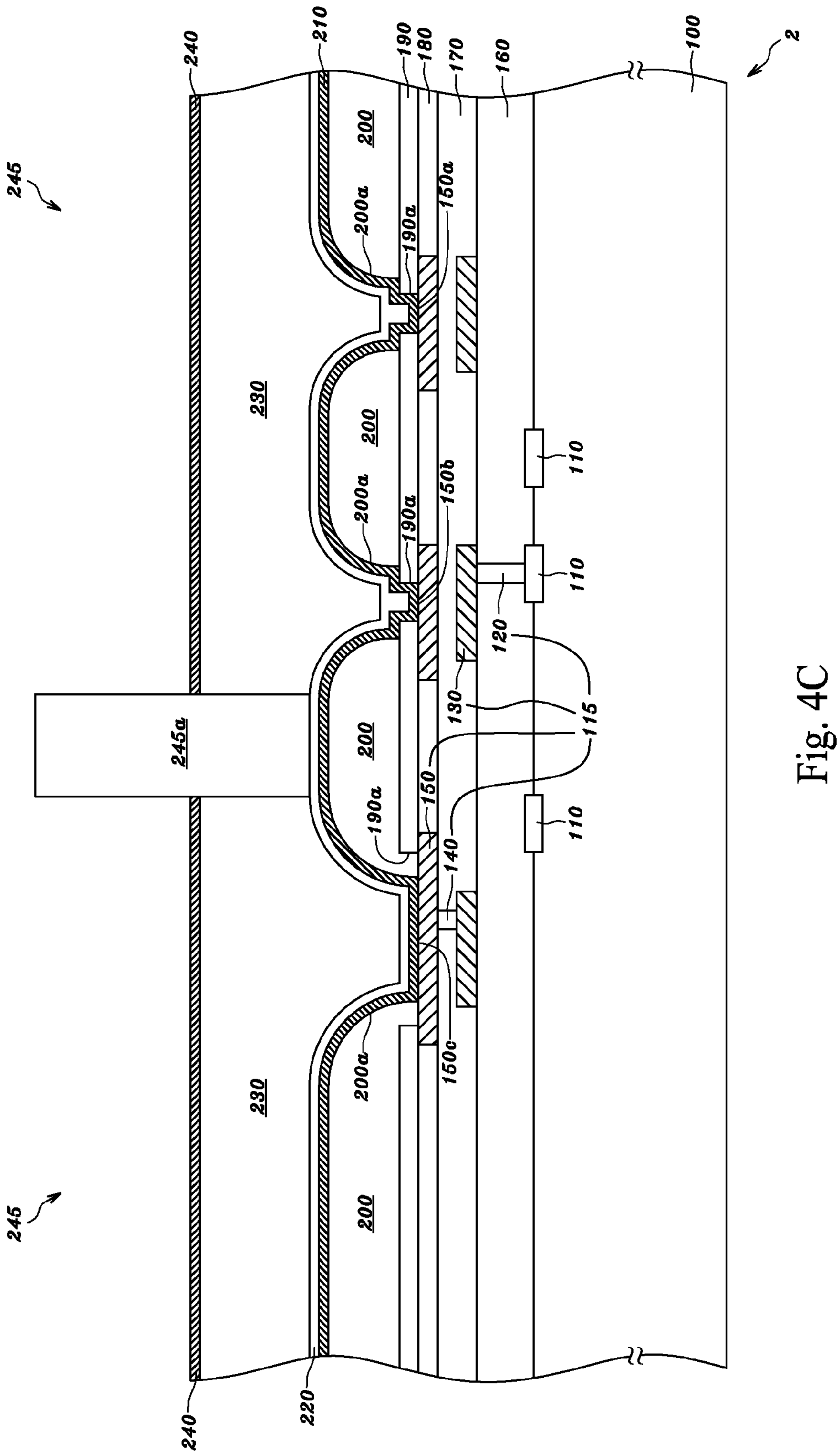

Referring to FIG. 4C, a copper layer 230 having a thickness between 3 and 25 micrometers, and preferably between 10 and 20 micrometers, can be electroplated or electroless plated on the seed layer 220 exposed by the openings 245 in the photoresist layer 245*a*. Next, a barrier layer 240 having a thickness between 0.05 and 5 micrometers, and preferably between 0.1 and 1 micrometers, can be electroplated or electroless plated on the copper layer 230 in the openings 245. The material of the barrier layer 240 can be nickel (Ni) or cobalt (Co).

In a case, when the copper layer 230 is electroplated on the seed layer 220 exposed by the openings 245 in the photoresist layer 245*a*, the barrier layer 240 can be formed by electroplating a nickel layer with a thickness between 0.05 and 5 micrometers, and preferably between 0.1 and 1 micrometers, on the copper layer 230.

In another case, when the copper layer 230 is electroplated on the seed layer 220 exposed by the openings 245 in the photoresist layer 245*a*, the barrier layer 240 can be formed by electroplating a cobalt layer with a thickness between 0.05 and 5 micrometers, and preferably between 0.1 and 1 micrometers, on the copper layer 230.

In another case, when the copper layer 230 is electroplated on the seed layer 220 exposed by the openings 245 in the photoresist layer 245*a*, the barrier layer 240 can be formed by electroless plating a nickel layer with a thickness between 0.05 and 5 micrometers, and preferably between 0.1 and 1 micrometers, on the copper layer 230.

In another case, when the copper layer 230 is electroplated on the seed layer 220 exposed by the openings 245 in the photoresist layer 245*a*, the barrier layer 240 can be formed by electroless plating a cobalt layer with a thickness between 0.05 and 5 micrometers, and preferably between 0.1 and 1 micrometers, on the copper layer 230.

Figure 4D:
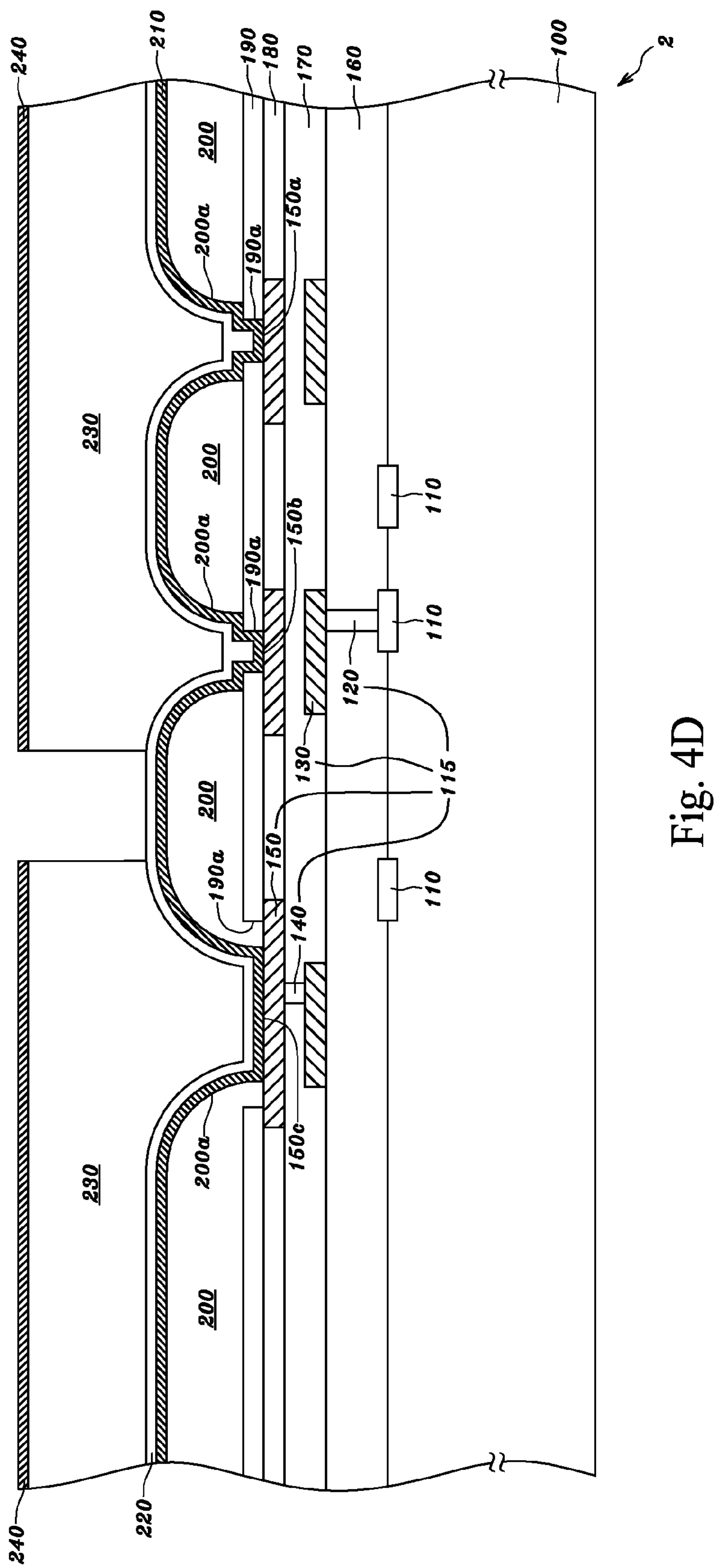

Referring to FIG. 4D, after the barrier layer 240 is formed, the photoresist layer 245*a* can be removed using an inorganic solution or using an organic solution with amide. Some residuals from the photoresist layer 245*a* could remain on the barrier layer 240 and on the seed layer 220 not under the copper layer 230. Thereafter, the residuals can be removed from the barrier layer 240 and from the seed layer 220 with a plasma, such as an $O_2$ plasma or a plasma containing fluorine of below 200 PPM and oxygen.

Figure 4E:
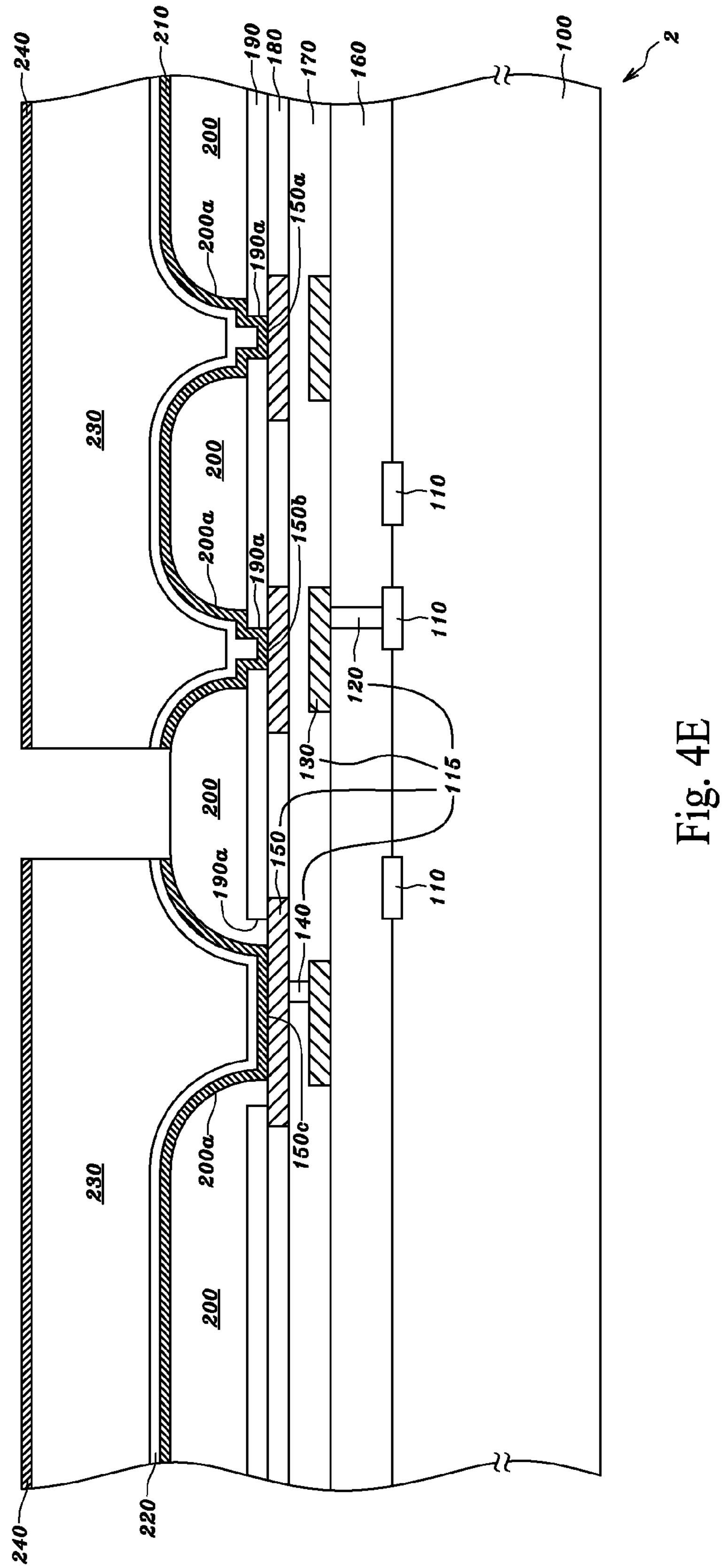

Referring to FIG. 4E, the seed layer 220 and the adhesion/barrier layer 210 not under the copper layer 230 are subsequently removed with an etching method. In a case, the seed layer 220 and the adhesion/barrier layer 210 not under the copper layer 230 can be subsequently removed by a dry etching method. As to the dry etching method, both the seed layer 220 and the adhesion/barrier layer 210 not under the copper layer 230 can be subsequently removed by an Ar sputtering etching process; alternatively, both the seed layer 220 and the adhesion/barrier layer 210 not under the copper layer 230 can be subsequently removed by a reactive ion etching (RIE) process; alternatively, the seed layer 220 not under the copper layer 230 can be removed by an Ar sputtering etching process, and the adhesion/barrier layer 210 not under the copper layer 230 can be removed by a reactive ion etching (RIE) process. In another case, the seed layer 220 and the adhesion/barrier layer 210 not under the copper layer 230 can be subsequently removed by a wet etching method. As to the wet etching method, when the seed layer 220 is a copper layer, it can be etched with a solution containing $NH_4OH$ or with a solution containing $H_2SO_4$; when the adhesion/barrier layer 210 is a titanium-tungsten-alloy layer, it can be etched with a solution containing hydrogen peroxide or with a solution containing $NH_4OH$ and hydrogen peroxide; when the adhesion/barrier layer 210 is a titanium layer, it can be etched with a solution containing hydrogen fluoride or with a solution containing $NH_4OH$ and hydrogen peroxide; when the adhesion/barrier layer 210 is a chromium layer, it can be etched with a solution containing potassium ferricyanide. In another case, the seed layer 220, such as copper, not under the copper layer 230 can be removed by a solution containing $NH_4OH$ or a solution containing $H_2SO_4$, and the adhesion/barrier layer 210 not under the copper layer 230 can be removed by a reactive ion etching (RIE) process. In another case, the seed layer 220, such as copper, not under the copper layer 230 can be removed by a solution containing $NH_4OH$ or a solution containing $H_2SO_4$, and the adhesion/barrier layer 210 not under the copper layer 230 can be removed by an Ar sputtering etching process.

Figure 4F:
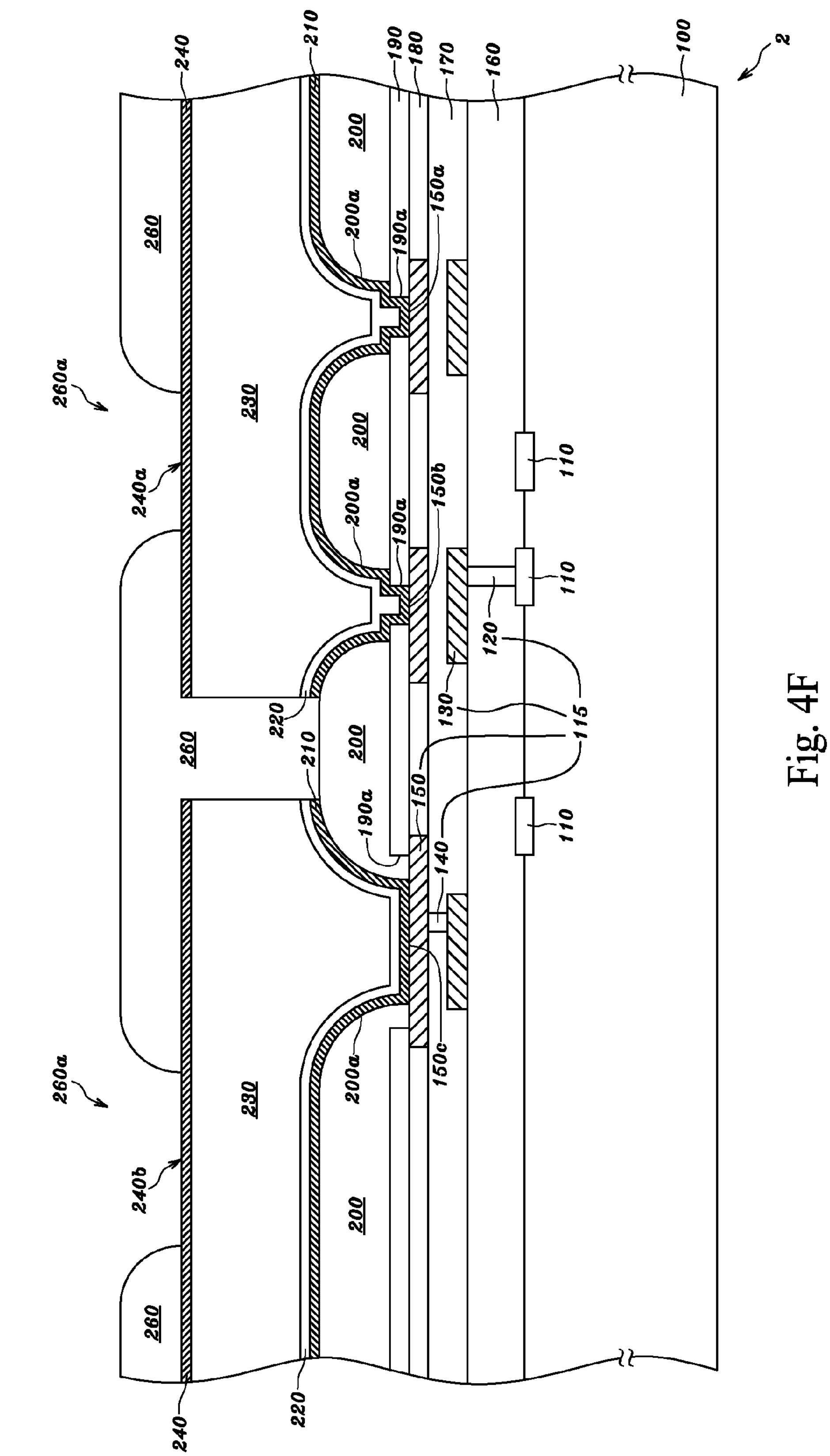

Referring to FIG. 4F, a polymer layer 260 can be formed on the barrier layer 240, on the polymer layer 200 and in the gap between neighboring metal traces provided by the adhesion/barrier 210, the seed layer 220, the copper layer 230 and the barrier layer 240 by a process including a spin-on coating process, a lamination process, a screen-printing process or a spraying process, and openings 260*a* in the polymer layer 260 are over contact points 240*a* and 240*b* of the barrier layer 240 and expose the contact points 240*a* and 240*b*. The polymer layer 260 has a thickness between 3 and 25 micrometers, and preferably between 5 and 15 micrometers, and the material of the polymer layer 260 may include benzocyclobutane (BCB), polyimide (PI), polybenzoxazole (PBO) or epoxy resin.

In a case, the polymer layer 260 can be formed by spin-on coating a negative-type photosensitive polyimide layer having a thickness between 6 and 50 micrometers on the barrier layer 240, on the polymer layer 200 and in the gap between neighboring metal traces provided by the adhesion/barrier 210, the seed layer 220, the copper layer 230 and the barrier layer 240, then baking the spin-on coated polyimide layer, then exposing the baked polyimide layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the contact points 240*a* and 240*b*, then curing or heating the developed polyimide layer at a temperature between 180 and 400° C. for a time between 20 and 150 minutes in a nitrogen ambient or in an oxygen-free ambient, the cured polyimide layer having a thickness between 3 and 25 micrometers, and then removing the residual polymeric material or other contaminants from the contact points 240*a* and 240*b* with an $O_2$ plasma or a plasma containing fluorine of below 200 PPM and oxygen. By the way, the polymer layer 260 can be formed on the barrier layer 240, on the polymer layer 200 and in the gap between neighboring metal traces provided by the adhesion/barrier 210, the seed layer 220, the copper layer 230 and the barrier layer 240, and the openings 260*a* formed in the polymer layer 260 expose the contact points 240*a* and 240*b*. For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient.

In another case, the polymer layer 260 can be formed by spin-on coating a positive-type photosensitive polybenzoxazole layer having a thickness of between 3 and 25 micrometers on the barrier layer 240, on the polymer layer 200 and in the gap between neighboring metal traces provided by the adhesion/barrier 210, the seed layer 220, the copper layer 230 and the barrier layer 240, then baking the spin-on coated polybenzoxazole layer, then exposing the baked polybenzoxazole layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to form multiple openings exposing the contact points 240_a_ and 240_b_, then curing or heating the developed polybenzoxazole layer at a temperature between 150 and 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient, the cured polybenzoxazole layer having a thickness of between 3 and 25 micrometers, and then removing the residual polymeric material or other contaminants from the contact points 240_a_ and 240_b_ with an $O_2$ plasma or a plasma containing fluorine of below 200 PPM and oxygen. By the way, the polymer layer 260 can be formed on the barrier layer 240, on the polymer layer 200 and in the gap between neighboring metal traces provided by the adhesion/barrier 210, the seed layer 220, the copper layer 230 and the barrier layer 240, and the openings 260_a_ formed in the polymer layer 260 expose the contact points 240_a_ and 240_b_.

Figure 4G:
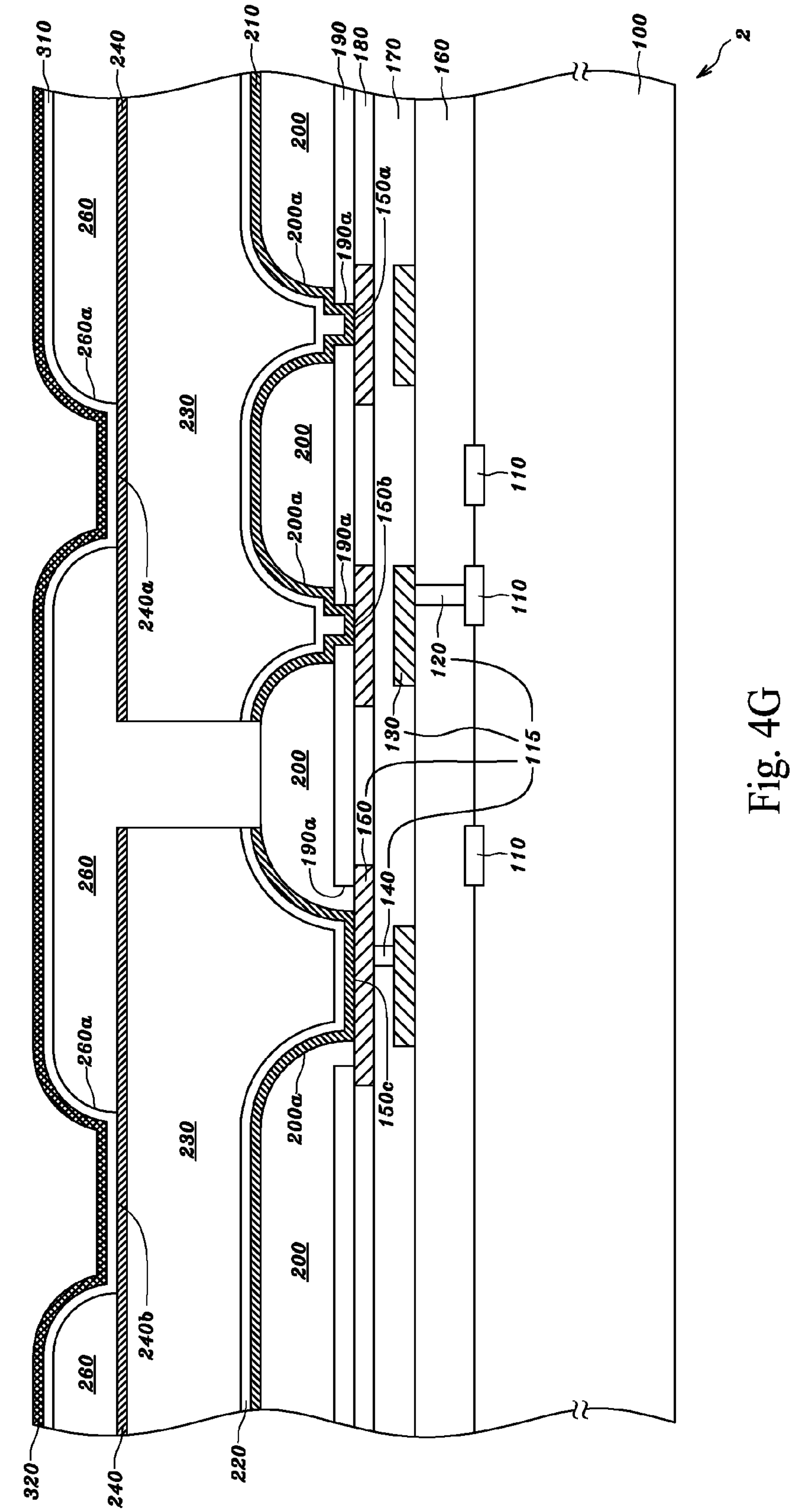

Referring to FIG. 4G, an adhesion/barrier layer 310 having a thickness between 0.02 and 0.5 micrometers, and preferably between 0.1 and 0.2 micrometers, can be formed on the polymer layer 260 and on the contact points 240_a_ and 240_b_ exposed by the openings 260_a_. The adhesion/barrier layer 310 can be formed by a physical vapor deposition (PVD) process, such as a sputtering process or an evaporation process. The material of the adhesion/barrier layer 310 can be titanium, a titanium-tungsten alloy, titanium nitride, chromium, tantalum, tantalum nitride or a composite of the above-mentioned materials.

For example, the adhesion/barrier layer 310 can be formed by sputtering a titanium layer, a titanium-nitride layer, a titanium-tungsten-alloy layer or a chromium layer with a thickness between 0.02 and 0.5 micrometers, and preferably between 0.1 and 0.2 micrometers, on the polymer layer 260 and on the contact points 240_a_ and 240_b_ exposed by the openings 260_a_. Alternatively, the adhesion/barrier layer 310 can be formed by sputtering a titanium layer with a thickness between 0.01 and 0.15 micrometers on the polymer layer 260 and on the contact points 240_a_ and 240_b_ exposed by the openings 260_a_, and then sputtering a titanium-tungsten-alloy layer with a thickness between 0.1 and 0.35 micrometers on the titanium layer.

Next, a seed layer 320 having a thickness between 0.05 and 0.5 micrometers, and preferably between 0.08 and 0.15 micrometers, is formed on the adhesion/barrier layer 310. The seed layer 320 can be formed by a physical vapor deposition (PVD) process, such as a sputtering process or an evaporation process. The material of the seed layer 320 can be gold, platinum or palladium. The seed layer 320 is beneficial to electroplating a metal layer thereon.

In a case, when the adhesion/barrier layer 310 is formed by sputtering a titanium-containing layer on the polymer layer 260 and on the contact points 240_a_ and 240_b_ exposed by the openings 260_a_, the seed layer 320 can be formed by sputtering a gold layer with a thickness between 0.05 and 0.5 micrometers, and preferably between 0.08 and 0.15 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer.

In another case, when the adhesion/barrier layer 310 is formed by sputtering a titanium-containing layer on the polymer layer 260 and on the contact points 240_a_ and 240_b_ exposed by the openings 260_a_, the seed layer 320 can be formed by sputtering a platinum layer with a thickness between 0.05 and 0.5 micrometers, and preferably between 0.08 and 0.15 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer.

In another case, when the adhesion/barrier layer 310 is formed by sputtering a titanium-containing layer on the polymer layer 260 and on the contact points 240_a_ and 240_b_ exposed by the openings 260_a_, the seed layer 320 can be formed by sputtering a palladium layer with a thickness between 0.05 and 0.5 micrometers, and preferably between 0.08 and 0.15 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer.

Figure 4H:
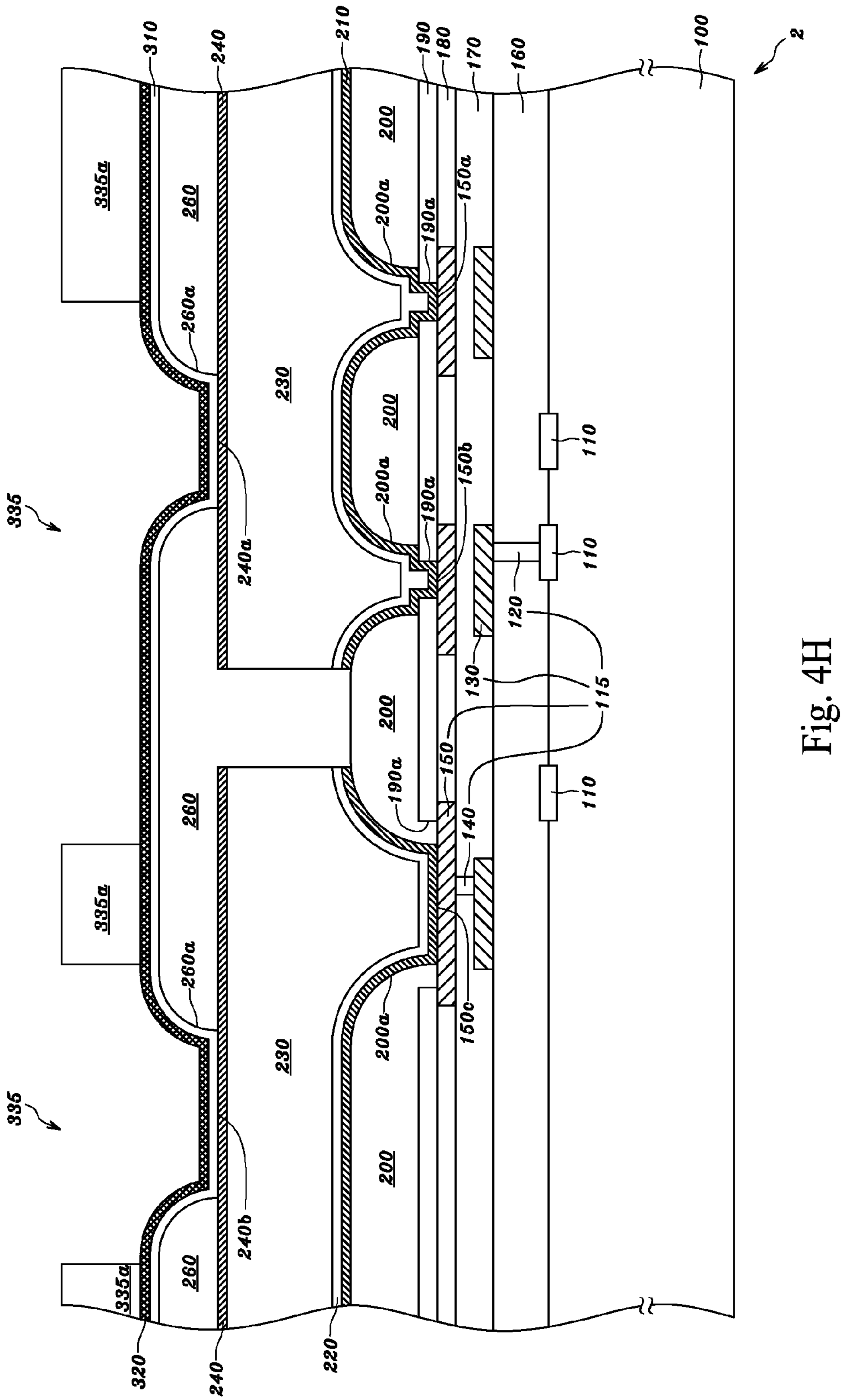

Referring to FIG. 4H, a photoresist layer 335_a_, such as a positive-type photoresist layer or a negative-type photoresist layer, having a thickness between 5 and 30 micrometers, and preferably between 10 and 15 micrometers, is formed on the seed layer 320 by a spin-on coating process, a lamination process, a screen-printing process or a spraying process. Next, the photoresist layer 335_a_ is patterned with the processes of exposure and development to form openings 335 in the photoresist layer 335_a_ exposing the seed layer 320. A 1× stepper or a 1× contact aligner can be used to expose the photoresist layer 335_a_ during the process of exposure.

For example, the photoresist layer 335_a_ can be formed by spin-on coating a positive-type photosensitive polymer layer having a thickness between 5 and 30 micrometers, and preferably between 10 and 15 micrometers, on the seed layer 320, then exposing the photosensitive polymer layer using a 1× stepper or a contact aligner with at least two of G-line, H-line and I-line, wherein G-line has a wavelength ranging from 434 to 438 nm, H-line has a wavelength ranging from 403 to 407 nm, and I-line has a wavelength ranging from 363 to 367 nm, then developing the exposed polymer layer by spraying and puddling a developer on the semiconductor wafer 2 or by immersing the semiconductor wafer 2 into a developer, and then cleaning the semiconductor wafer 2 using deionized wafer and drying the semiconductor wafer 2 by spinning the semiconductor wafer 2. After development, a scum removal process of removing the residual polymeric material or other contaminants from the seed layer 320 may be conducted by using an $O_2$ plasma or a plasma containing fluorine of below 200 PPM and oxygen. By these processes, the photoresist layer 335*a* can be patterned with the openings 335 exposing the seed layer 320.

Figure 4I:
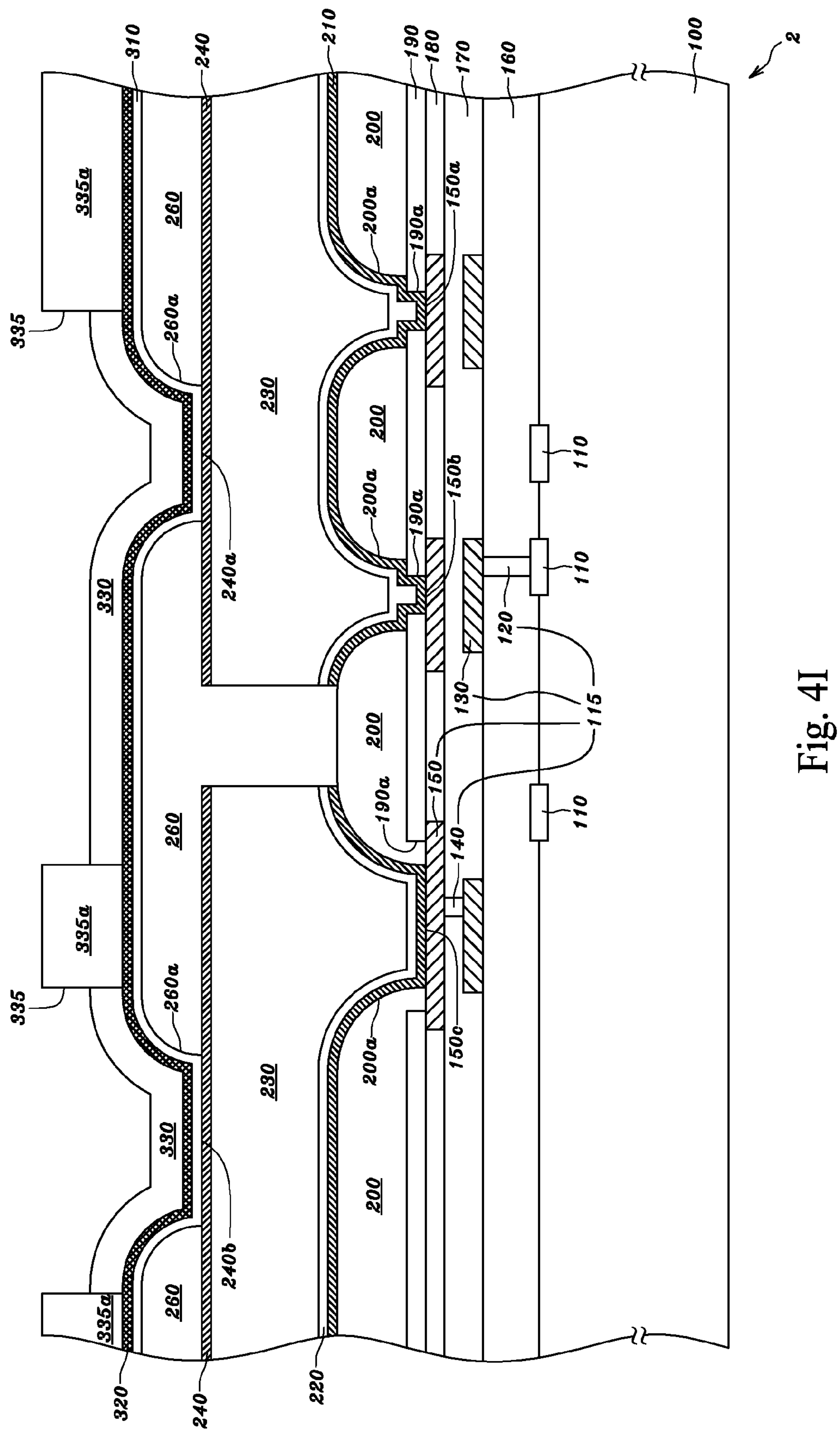

Referring to FIG. 4I, a wirebondable metal layer 330 having a thickness between 1 and 20 micrometers, and preferably between 2 and 8 micrometers, can be electroplated or electroless plated on the seed layer 320 exposed by the openings 335 in the photoresist layer 335*a*. The material of the wirebondable metal layer 330 can be gold, platinum or palladium. In a case, the wirebondable metal layer 330 can be formed by electroplating a gold layer with a thickness between 1 and 20 micrometers, and preferably between 2 and 8 micrometers, on the seed layer 320, made of gold, exposed by the openings 335 with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. In another case, the wirebondable metal layer 330 can be formed by electroplating a platinum layer with a thickness between 1 and 20 micrometers, and preferably between 2 and 8 micrometers, on the seed layer 320, made of platinum, exposed by the openings 335. In another case, the wirebondable metal layer 330 can be formed by electroplating a palladium layer with a thickness between 1 and 20 micrometers, and preferably between 2 and 8 micrometers, on the seed layer 320, made of palladium, exposed by the openings 335.

Figure 4J:
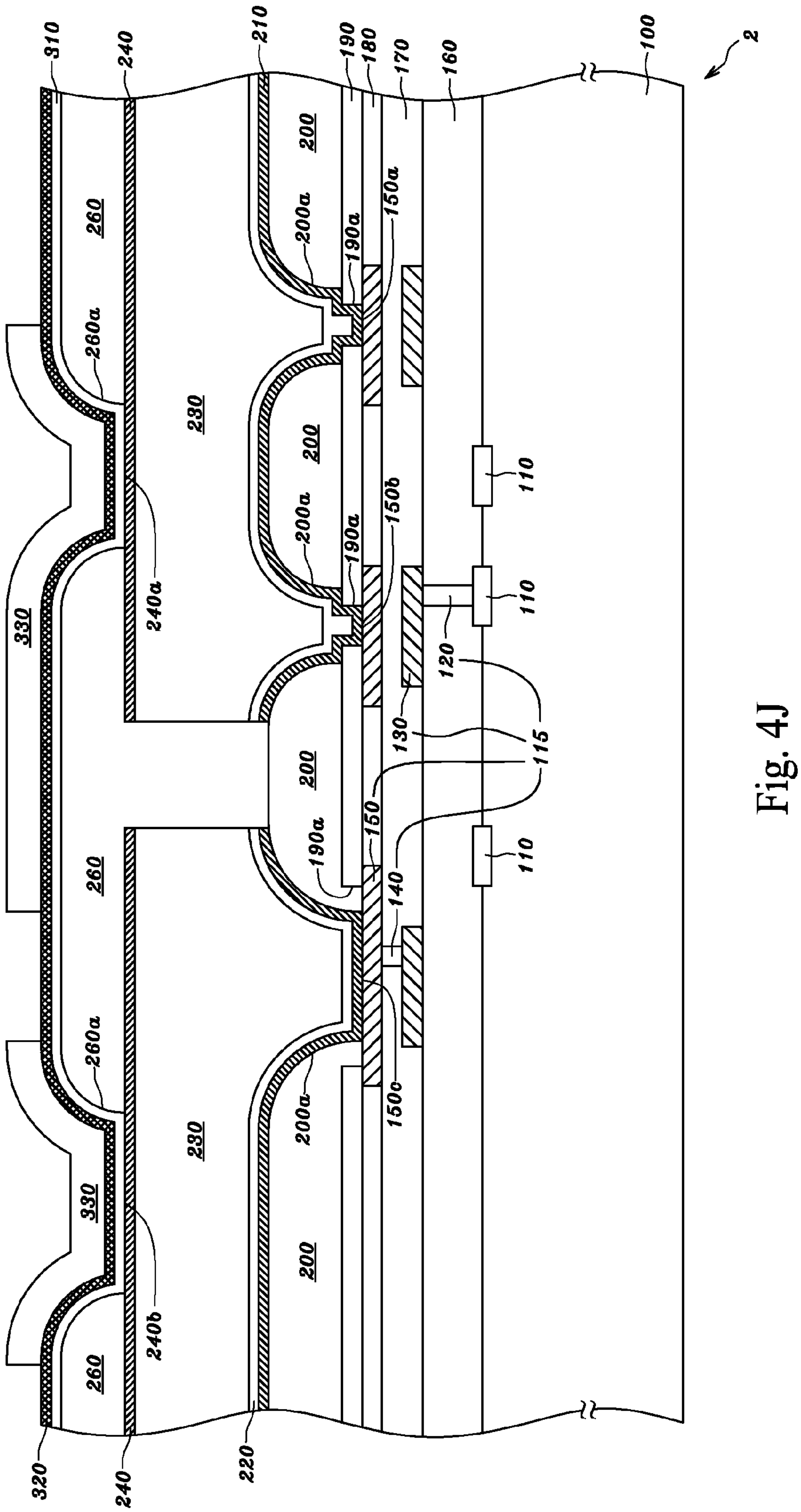

Referring to FIG. 4J, after the wirebondable metal layer 330 is formed, the photoresist layer 335*a* can be removed using an inorganic solution or using an organic solution with amide. Some residuals from the photoresist layer 335*a* could remain on the wirebondable metal layer 330 and on the seed layer 320 not under the wirebondable metal layer 330. Thereafter, the residuals can be removed from the wirebondable metal layer 330 and from the seed layer 320 with a plasma, such as an $O_2$ plasma or a plasma containing fluorine of below 200 PPM and oxygen.

Figure 4K:
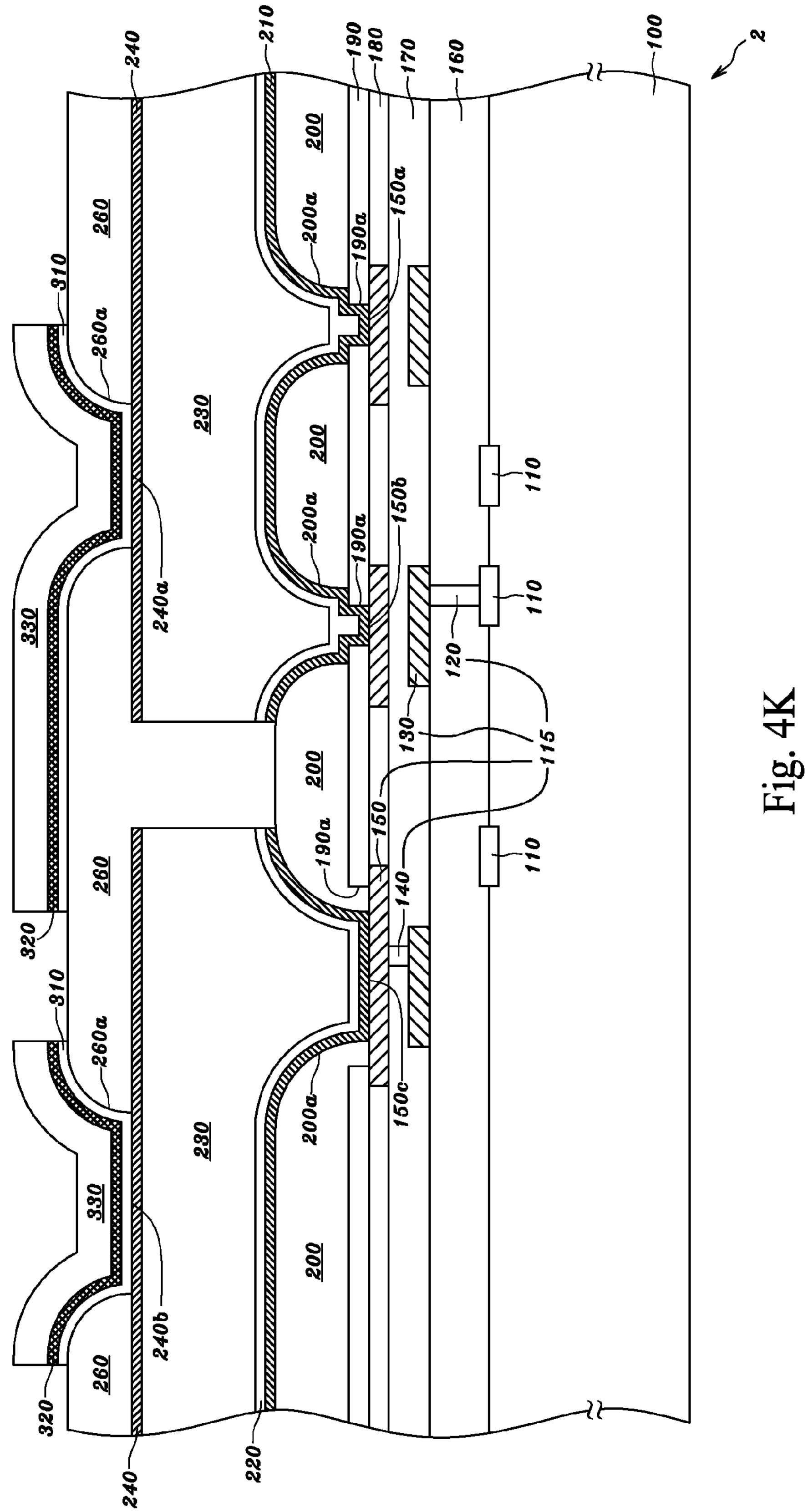

Referring to FIG. 4K, the seed layer 320 and the adhesion/barrier layer 310 not under the wirebondable metal layer 330 are subsequently removed with an etching method. In a case, the seed layer 320 and the adhesion/barrier layer 310 not under the wirebondable metal layer 330 can be subsequently removed by a dry etching method. As to the dry etching method, both the seed layer 320 and the adhesion/barrier layer 310 not under the wirebondable metal layer 330 can be subsequently removed by an Ar sputtering etching process; alternatively, both the seed layer 320 and the adhesion/barrier layer 310 not under the wirebondable metal layer 330 can be subsequently removed by a reactive ion etching (RIE) process; alternatively, the seed layer 320 not under the wirebondable metal layer 330 can be removed by an Ar sputtering etching process, and the adhesion/barrier layer 310 not under the wirebondable metal layer 330 can be removed by a reactive ion etching (RIE) process; alternatively, the seed layer 320 not under the wirebondable metal layer 330 can be removed by a reactive ion etching (RIE) process, and the adhesion/barrier layer 310 not under the wirebondable metal layer 330 can be removed by an Ar sputtering etching process. In another case, the seed layer 320 and the adhesion/barrier layer 310 not under the wirebondable metal layer 330 can be subsequently removed by a wet etching method. As to the wet etching method, when the seed layer 320 is a gold layer, it can be etched with an iodine-containing solution, such as a solution containing potassium iodide; when the adhesion/barrier layer 310 is a titanium layer, it can be etched with a solution containing hydrogen fluoride or with a solution containing $NH_4OH$ and hydrogen peroxide; when the adhesion/barrier layer 310 is a titanium-tungsten-alloy layer, it can be etched with a solution containing hydrogen peroxide or with a solution containing $NH_4OH$ and hydrogen peroxide; when the adhesion/barrier layer 310 is a chromium layer, it can be etched with a solution containing potassium ferricyanide. In another case, the seed layer 320, such as gold, not under the wirebondable metal layer 330 can be removed by an iodine-containing solution, such as a solution containing potassium iodide, and the adhesion/barrier layer 310 not under the wirebondable metal layer 330 can be removed by a reactive ion etching (RIE) process. In another case, the seed layer 320, such as gold, not under the wirebondable metal layer 330 can be removed by an iodine-containing solution, such as a solution containing potassium iodide, and the adhesion/barrier layer 310 not under the wirebondable metal layer 330 can be removed by an Ar sputtering etching process.

Figure 4L:
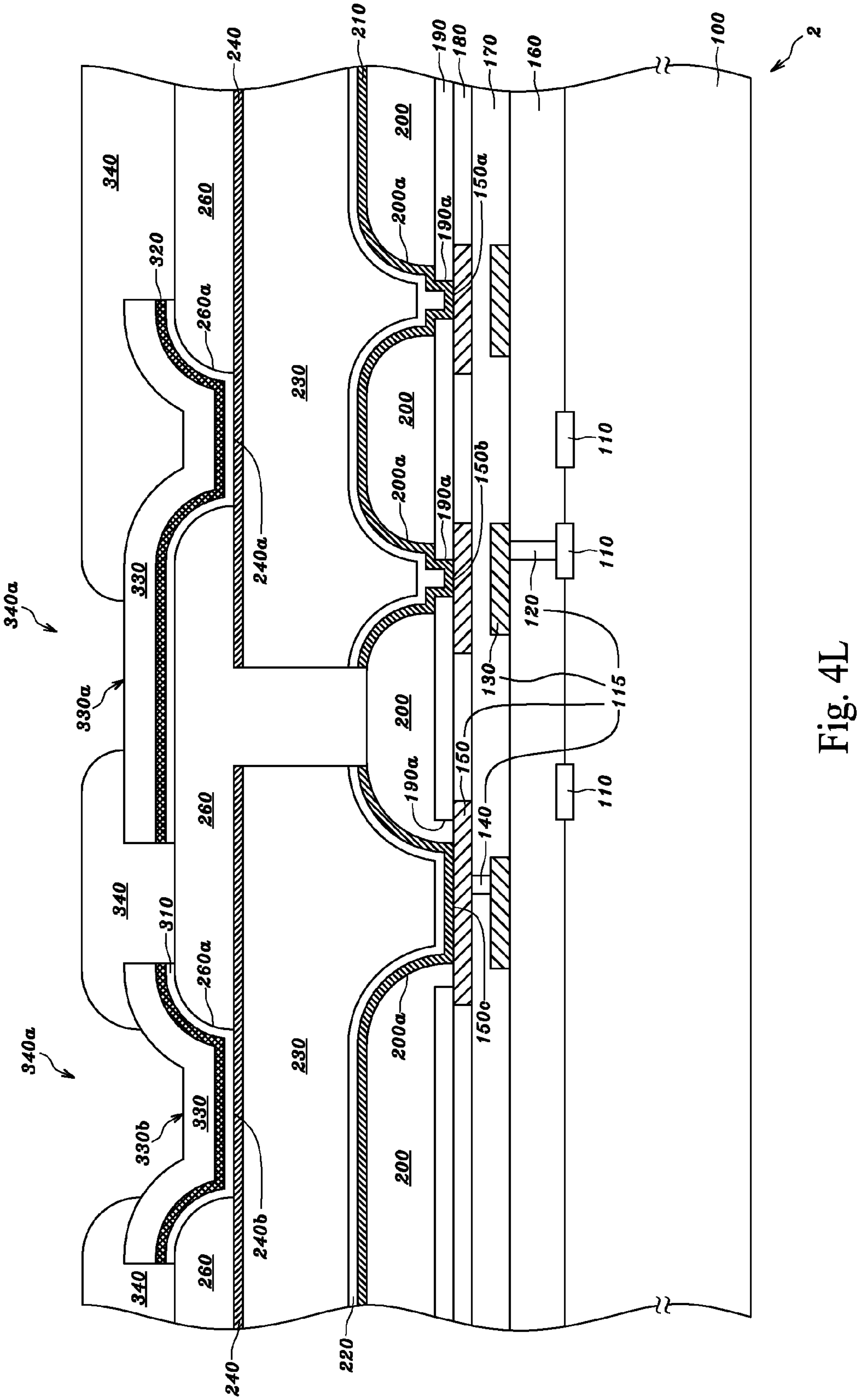

Referring to FIG. 4L, a polymer layer 340 can be formed on the wirebondable metal layer 330 and on the polymer layer 260 by a process including a spin-on coating process, a lamination process, a screen-printing process or a spraying process, and openings 340*a* in the polymer layer 340 are over contact points 330*a* and 330*b* of the wirebondable metal layer 330 and expose the contact points 330*a* and 330*b*. The polymer layer 340 has a thickness between 3 and 25 micrometers, and preferably between 5 and 15 micrometers, and the material of the polymer layer 340 may include benzocyclobutane (BCB), polyimide (PI), polybenzoxazole (PBO) or epoxy resin.

In a case, the polymer layer 340 can be formed by spin-on coating a negative-type photosensitive polyimide layer having a thickness between 6 and 50 micrometers on the wirebondable metal layer 330 and on the polymer layer 260, then baking the spin-on coated polyimide layer, then exposing the baked polyimide layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form multiple openings exposing the contact points 330*a* and 330*b*, then curing or heating the developed polyimide layer at a temperature between 180 and 400° C. for a time between 20 and 150 minutes in a nitrogen ambient or in an oxygen-free ambient, the cured polyimide layer having a thickness between 3 and 25 micrometers, and then removing the residual polymeric material or other contaminants from the contact points 330*a* and 330*b* with an $O_2$ plasma or a plasma containing fluorine of below 200 PPM and oxygen. By the way, the polymer layer 340 can be formed on the wirebondable metal layer 330 and on the polymer layer 260, and the openings 340*a* formed in the polymer layer 340 expose the contact points 330*a* and 330*b*. For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient.

In another case, the polymer layer 340 can be formed by spin-on coating a positive-type photosensitive polybenzoxazole layer having a thickness of between 3 and 25 micrometers on the wirebondable metal layer 330 and on the polymer layer 260, then baking the spin-on coated polybenzoxazole layer, then exposing the baked polybenzoxazole layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to form multiple openings exposing the contact points 330*a* and 330*b*, then curing or heating the developed polybenzoxazole layer at a temperature between 150 and 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient, the cured polybenzoxazole layer having a thickness of between 3 and 25 micrometers, and then removing the residual polymeric material or other contaminants from the contact points 330*a* and 330*b* with an $O_2$ plasma or a plasma containing fluorine of below 200 PPM and oxygen. By the way, the polymer layer 340 can be formed on the wirebondable metal layer 330 and on the polymer layer 260, and the openings 340*a* formed in the polymer layer 340 expose the contact points 330*a* and 330*b*.

Figure 4M:
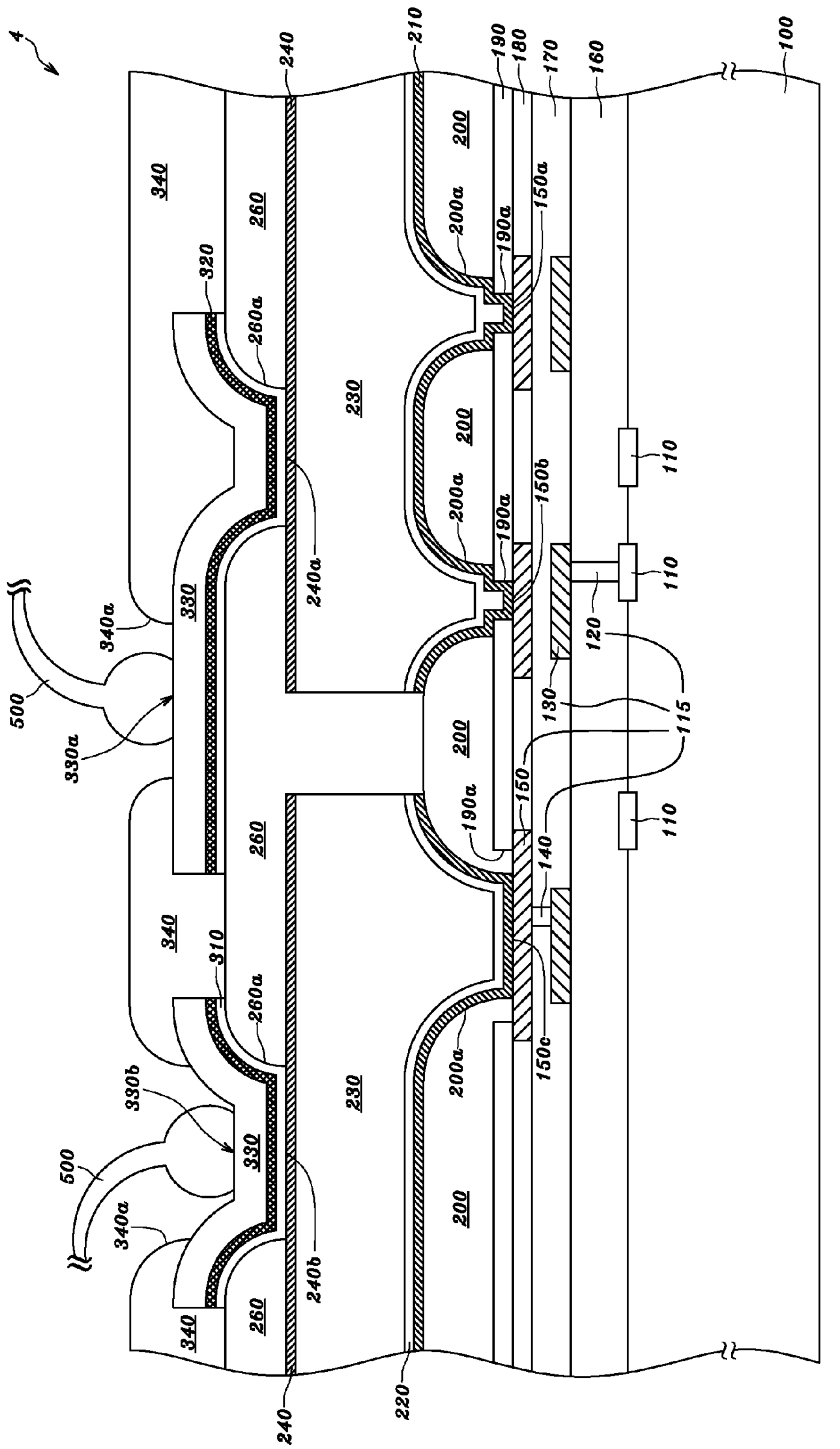

Referring to FIG. 4M, after the polymer layer 340 is formed, the semiconductor wafer 2 can be cut into a plurality of individual semiconductor chips 4 (only one of them is shown) by a dice sawing process.

Next, via a wire-bonding process, two wires 500, made of gold, copper or aluminum, can be ball bonded on the contact points 330*a* and 330*b* of the semiconductor chip 4. Alternatively, via a wire-bonding process, the wires 500, made of gold, copper or aluminum, can be wedge bonded on the contact points 330*a* and 330*b* of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 4N:
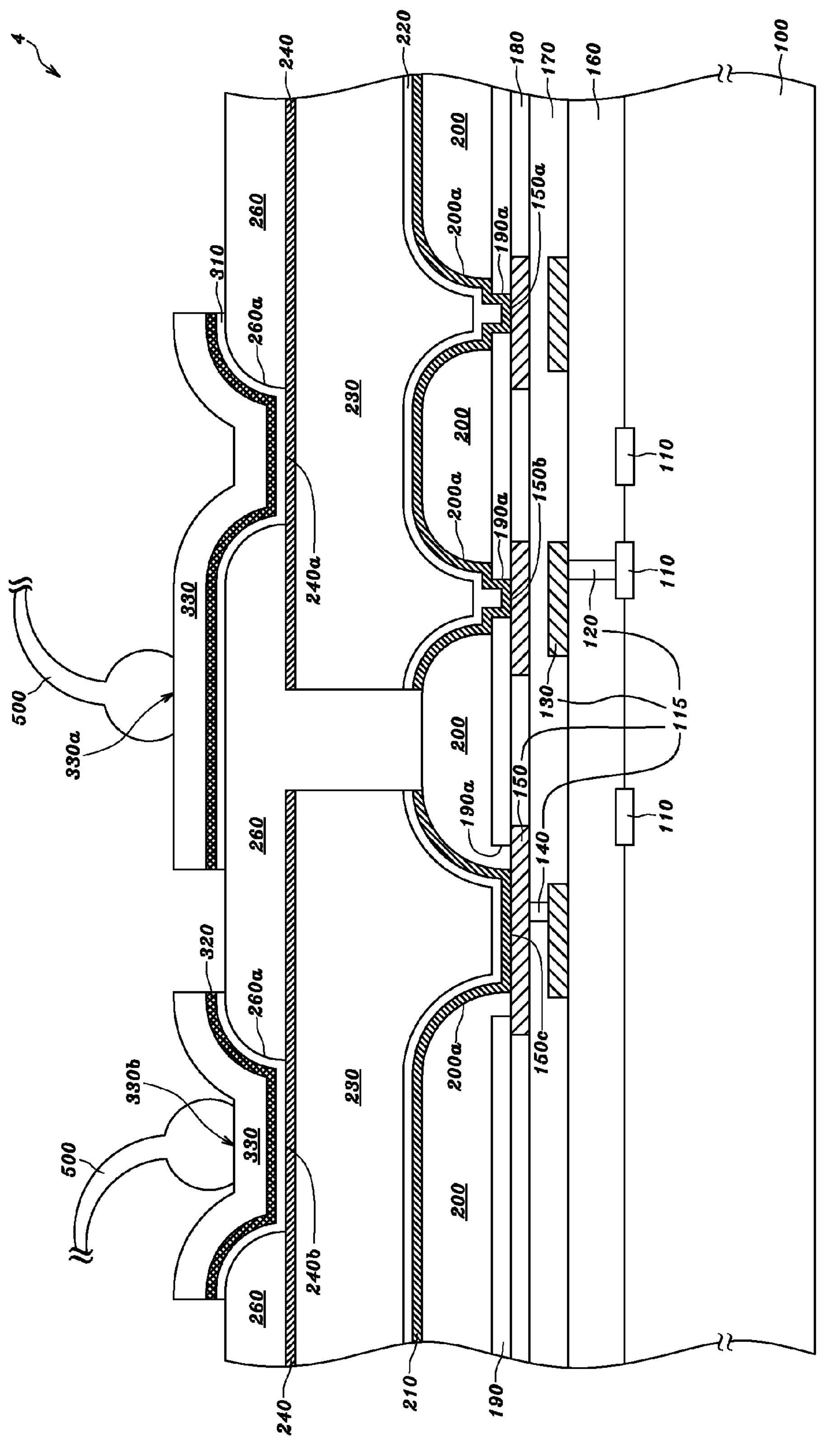
FIGS. 4N and 4T are cross-sectional views showing a semiconductor chip with two thick metal layers and a wirebonded wire bonded to the topmost thick metal layer.
Figure 40:
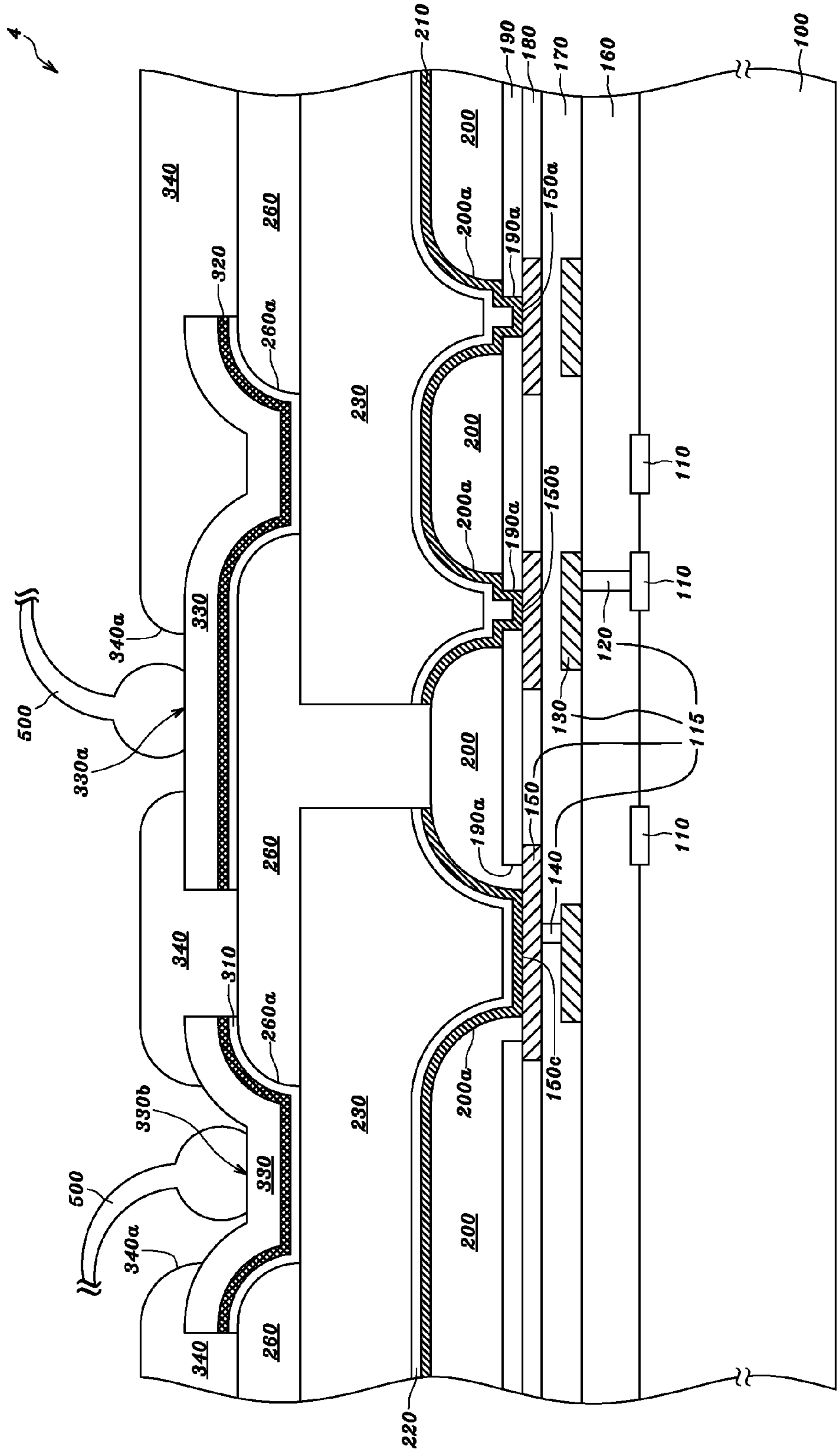

Alternatively, referring to FIG. 4N, the step of forming the polymer layer 340 as shown in FIG. 4L can be omitted, that is, after performing the above-mentioned steps as shown in FIGS. 4A-4K, the step illustrated in FIG. 4M can be performed without the polymer layer 340 formed on the polymer layer 260 and on the wirebondable metal layer 330.

Alternatively, referring to FIG. 4O, the step of forming the barrier layer 240 shown in FIG. 4C can be omitted, that is, after the copper layer 230 shown in FIG. 4C is formed, the photoresist layer 245*a* is removed, without forming the barrier layer 240 on the copper layer 230, using an inorganic solution or using an organic solution with amide as illustrated in FIG. 4D, followed by performing the above-mentioned steps as shown in FIGS. 4E-4M.

Figure 4P:
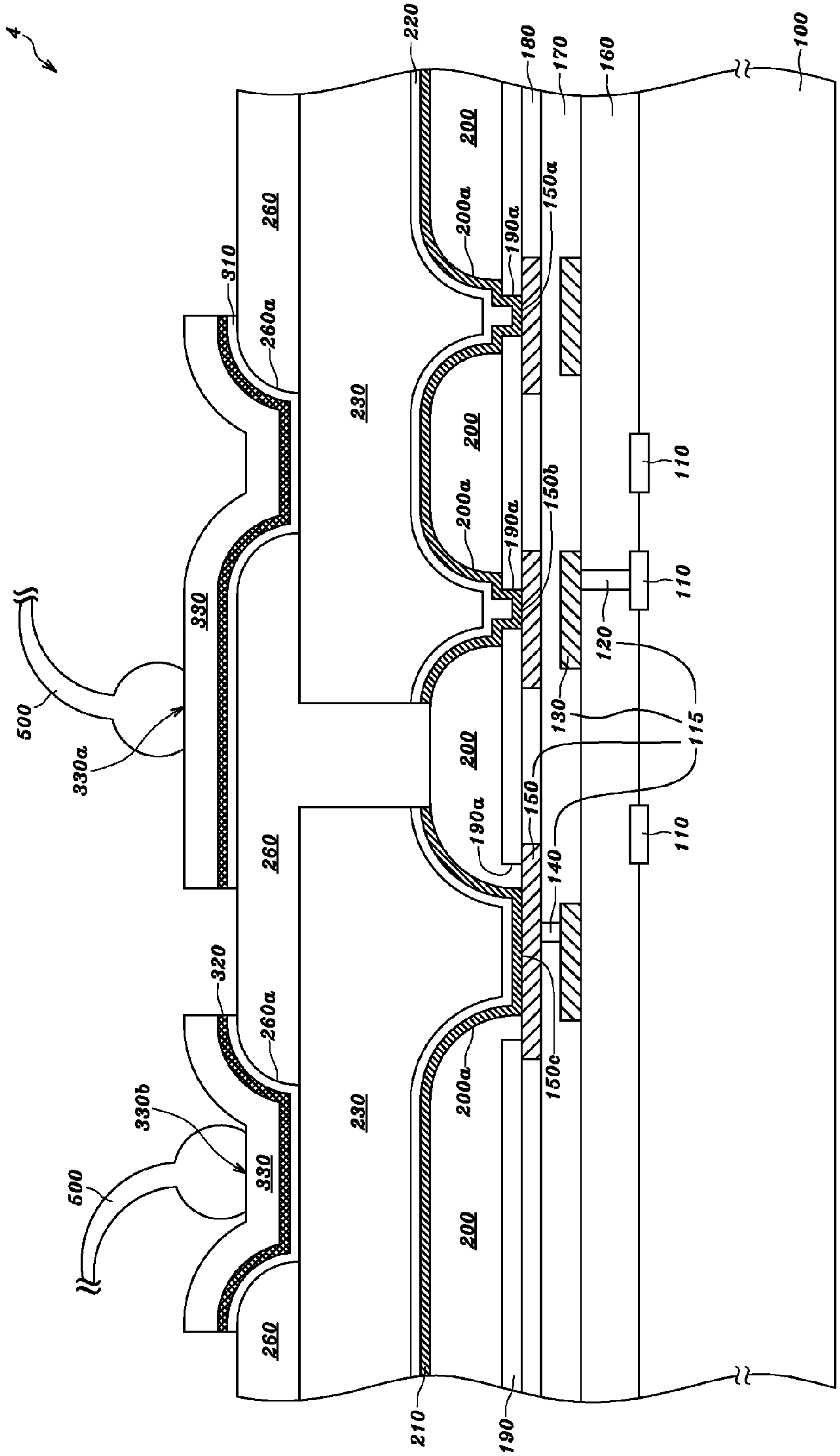

Alternatively, referring to FIG. 4P, the step of forming the barrier layer 240 shown in FIG. 4C and the step of forming the polymer layer 340 shown in FIG. 4L can be omitted, that is, after the copper layer 230 shown in FIG. 4C is formed, the photoresist layer 245*a* is removed, without forming the barrier layer 240 on the copper layer 230, using an inorganic solution or using an organic solution with amide as illustrated in FIG. 4D, followed by performing the above-mentioned steps as shown in FIGS. 4E-4K, followed by performing the above-mentioned step as shown in FIG. 4M without the polymer layer 340 formed on the polymer layer 260 and on the wirebondable metal layer 330.

Figure 4Q:
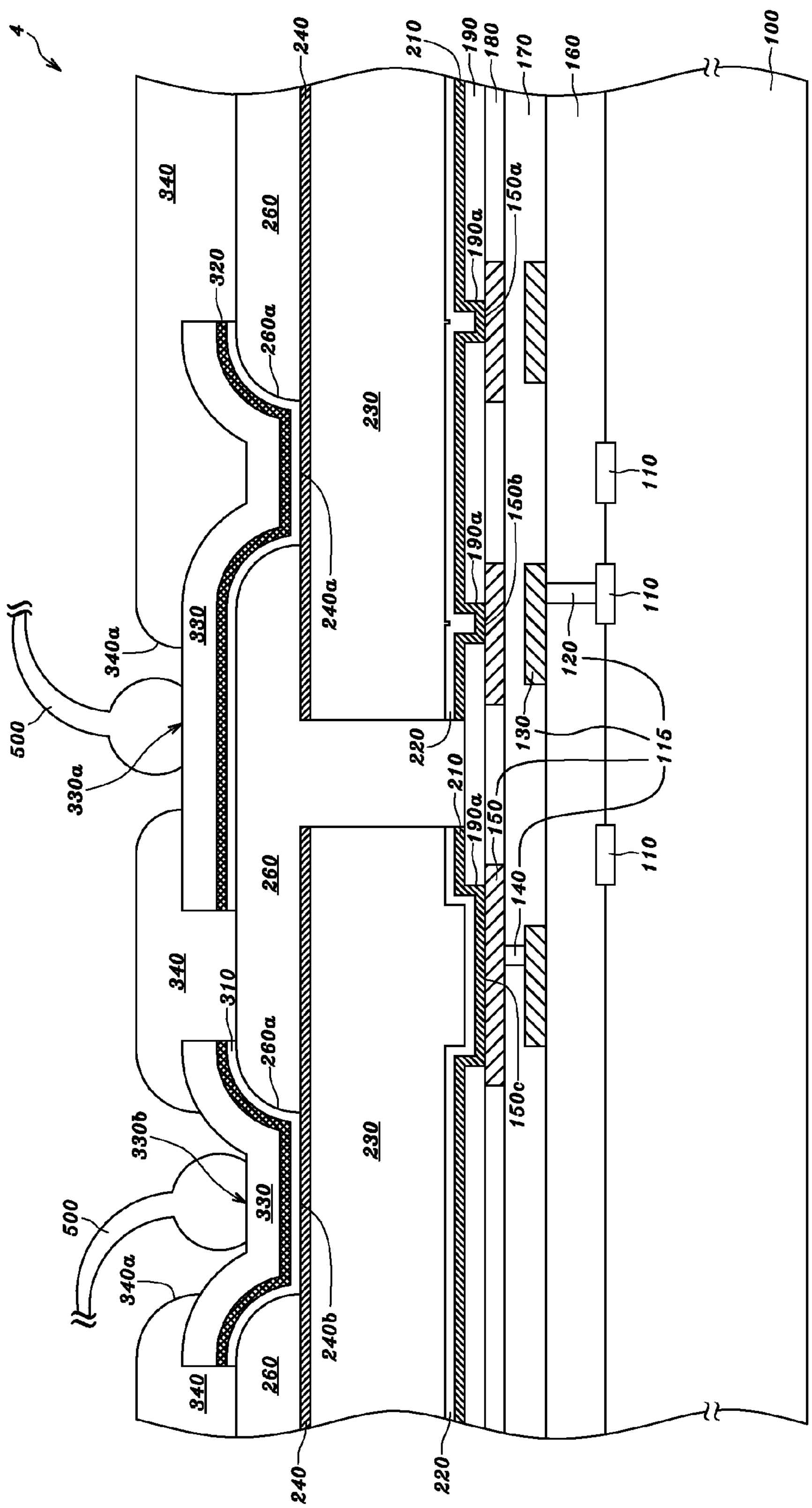

Alternatively, referring to FIG. 4Q, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240 and on the passivation layer 190, followed by performing the above-mentioned steps as shown in FIGS. 4G-4M. The process of forming the adhesion/barrier layer 210 shown in FIG. 4Q can be referred to as the process of forming the adhesion/barrier layer 210 as illustrated in FIG. 4A. The process of forming the seed layer 220 shown in FIG. 4Q can be referred to as the process of forming the seed layer 220 as illustrated in FIG. 4A. The process of forming the polymer layer 260 shown in FIG. 4Q can be referred to as the process of forming the polymer layer 260 as illustrated in FIG. 4F.

Figure 4R:
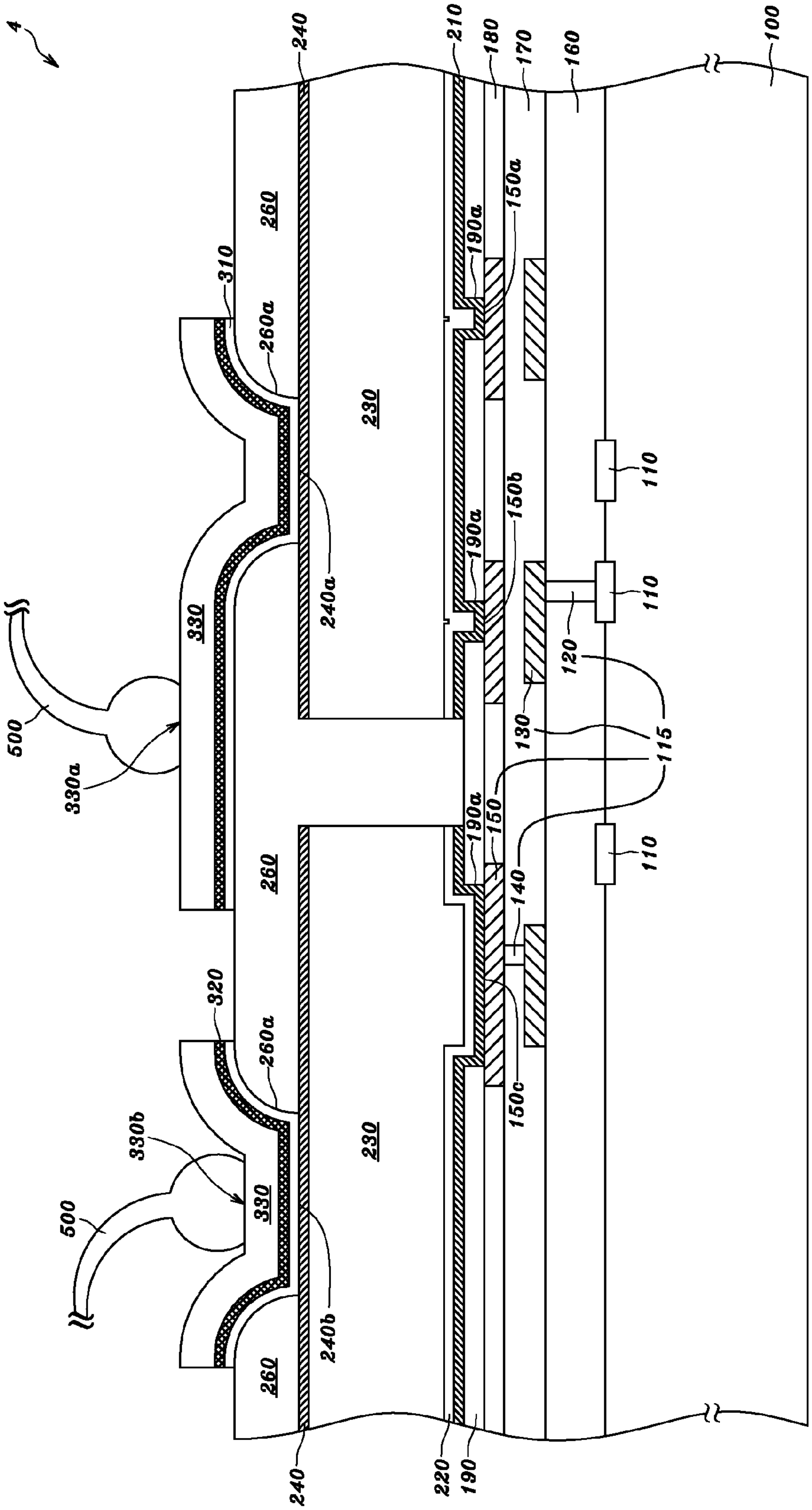

Alternatively, referring to FIG. 4R, the step of forming the polymer layer 200 as illustrated in FIG. 3 and the step of forming the polymer layer 340 as illustrated in FIG. 4L can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240 and on the passivation layer 190, followed by performing the above-mentioned steps as shown in FIGS. 4G-4K, followed by performing the above-mentioned step as shown in FIG. 4M without the polymer layer 340 formed on the polymer layer 260 and on the wirebondable metal layer 330. The process of forming the adhesion/barrier layer 210 shown in FIG. 4R can be referred to as the process of forming the adhesion/barrier layer 210 as illustrated in FIG. 4A. The process of forming the seed layer 220 shown in FIG. 4R can be referred to as the process of forming the seed layer 220 as illustrated in FIG. 4A. The process of forming the polymer layer 260 shown in FIG. 4R can be referred to as the process of forming the polymer layer 260 as illustrated in FIG. 4F.

Figure 4S:
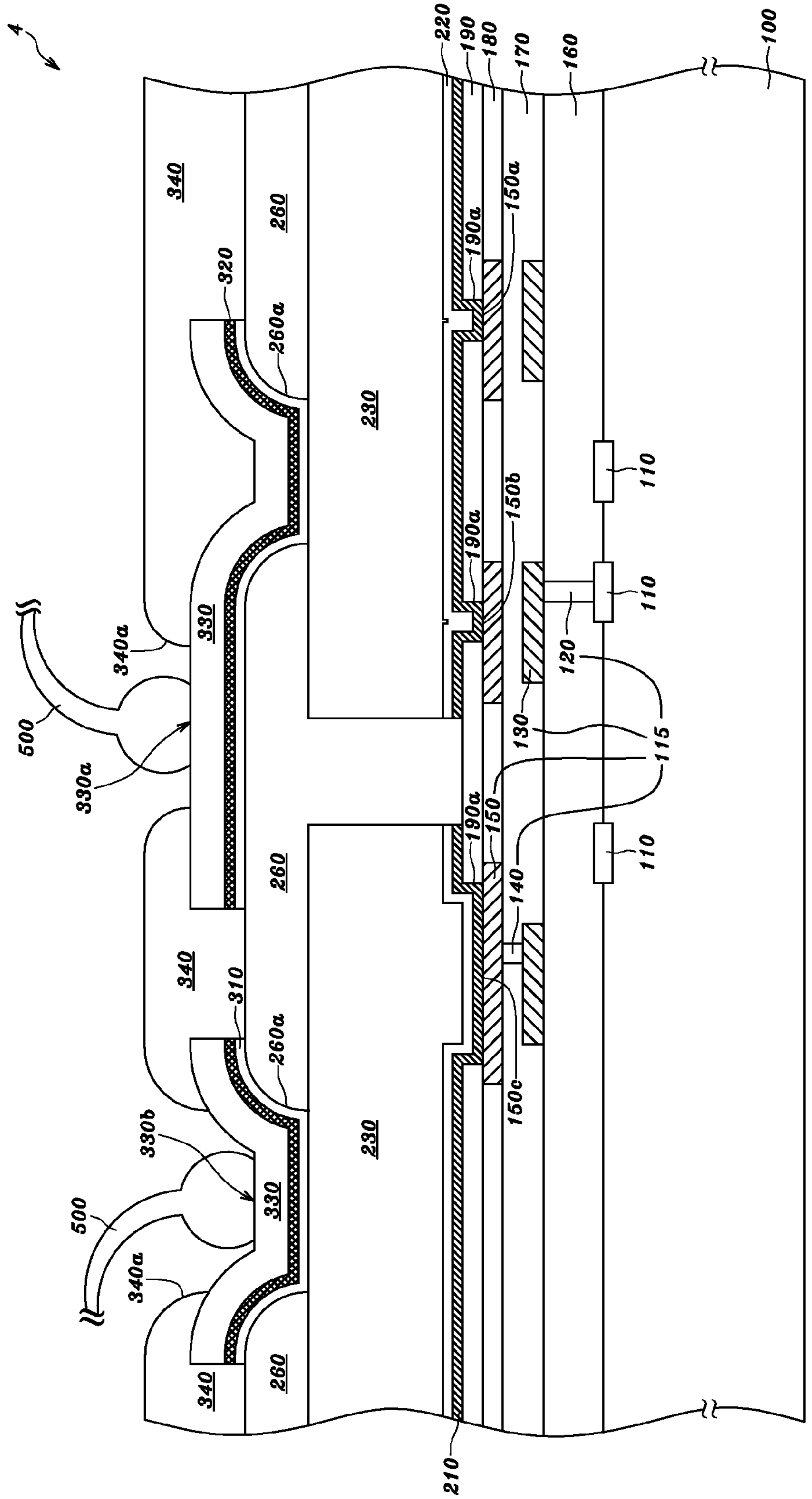

Alternatively, referring to FIG. 4S, the step of forming the polymer layer 200 as illustrated in FIG. 3 and the step of forming the barrier layer 240 shown in FIG. 4C can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned step as shown in FIG. 4B, followed by forming the copper layer 230 on the seed layer 220 exposed by the openings 245 in the photoresist layer 245*a* as illustrated in FIG. 4C, followed by performing the above-mentioned steps as shown in FIGS. 4D-4E, followed by forming the polymer layer 260 on the copper layer 230 and on the passivation layer 190, followed by performing the above-mentioned steps as shown in FIGS. 4G-4M. The process of forming the adhesion/barrier layer 210 shown in FIG. 4S can be referred to as the process of forming the adhesion/barrier layer 210 as illustrated in FIG. 4A. The process of forming the seed layer 220 shown in FIG. 4S can be referred to as the process of forming the seed layer 220 as illustrated in FIG. 4A. The process of forming the copper layer 230 shown in FIG. 4S can be referred to as the process of forming the copper layer 230 as illustrated in FIG. 4C. The process of forming the polymer layer 260 shown in FIG. 4S can be referred to as the process of forming the polymer layer 260 as illustrated in FIG. 4F.

Figure 4T:
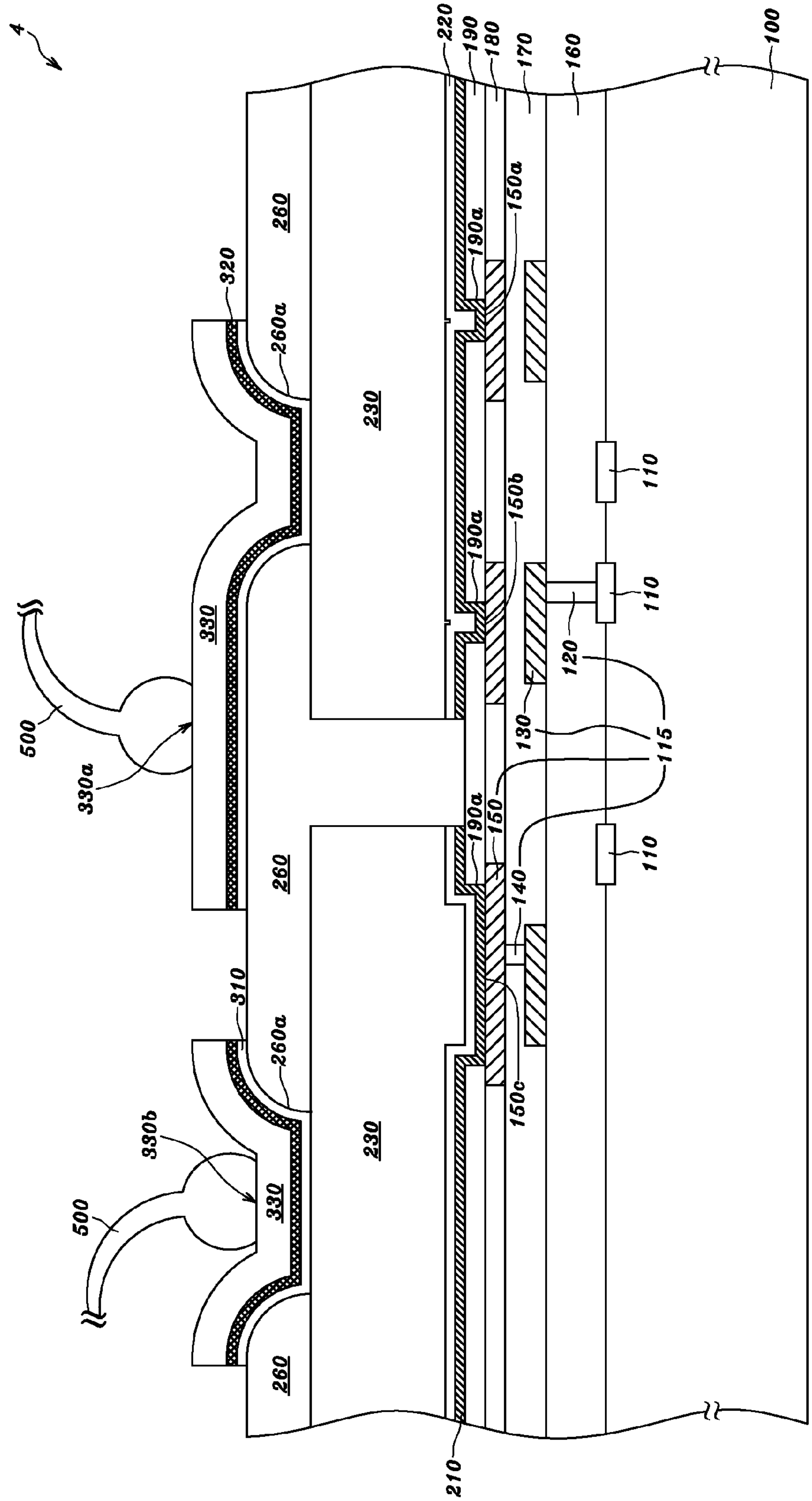

Alternatively, referring to FIG. 4T, the step of forming the polymer layer 200 as illustrated in FIG. 3, the step of forming the barrier layer 240 shown in FIG. 4C and the step of forming the polymer layer 340 as illustrated in FIG. 4L can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned step as shown in FIG. 4B, followed by forming the copper layer 230 on the seed layer 220 exposed by the openings 245 in the photoresist layer 245*a* as illustrated in FIG. 4C, followed by performing the above-mentioned steps as shown in FIGS. 4D-4E, followed by forming the polymer layer 260 on the copper layer 230 and on the passivation layer 190, followed by performing the above-mentioned steps as shown in FIGS. 4G-4K, followed by performing the above-mentioned step as shown in FIG. 4M without the polymer layer 340 formed on the polymer layer 260 and on the wirebondable metal layer 330. The process of forming the adhesion/barrier layer 210 shown in FIG. 4T can be referred to as the process of forming the adhesion/barrier layer 210 as illustrated in FIG. 4A. The process of forming the seed layer 220 shown in FIG. 4T can be referred to as the process of forming the seed layer 220 as illustrated in FIG. 4A. The process of forming the copper layer 230 shown in FIG. 4T can be referred to as the process of forming the copper layer 230 as illustrated in FIG. 4C. The process of forming the polymer layer 260 shown in FIG. 4T can be referred to as the process of forming the polymer layer 260 as illustrated in FIG. 4F.

Thereby, in this embodiment, the contact point 150*a* can be connected to the contact point 150*b* through the copper layer 230, and the wire 500 bonded on the contact point 330*a* can be connected to the contact points 150*a* and 150*b* through the wirebondable metal layer 330 and the copper layer 230. The position of the contact point 330*a* from a top perspective view can be different from that of the contact point 150*a* and that of the contact point 150*b*. The position of the contact point 330*b* from a top perspective view can be different from that of the contact point 150*c*. The wire 500 bonded on the contact point 330*b* can be connected to the contact point 150*c* through the wirebondable metal layer 330 and the copper layer 230.

Embodiment 2

Figure 5A:
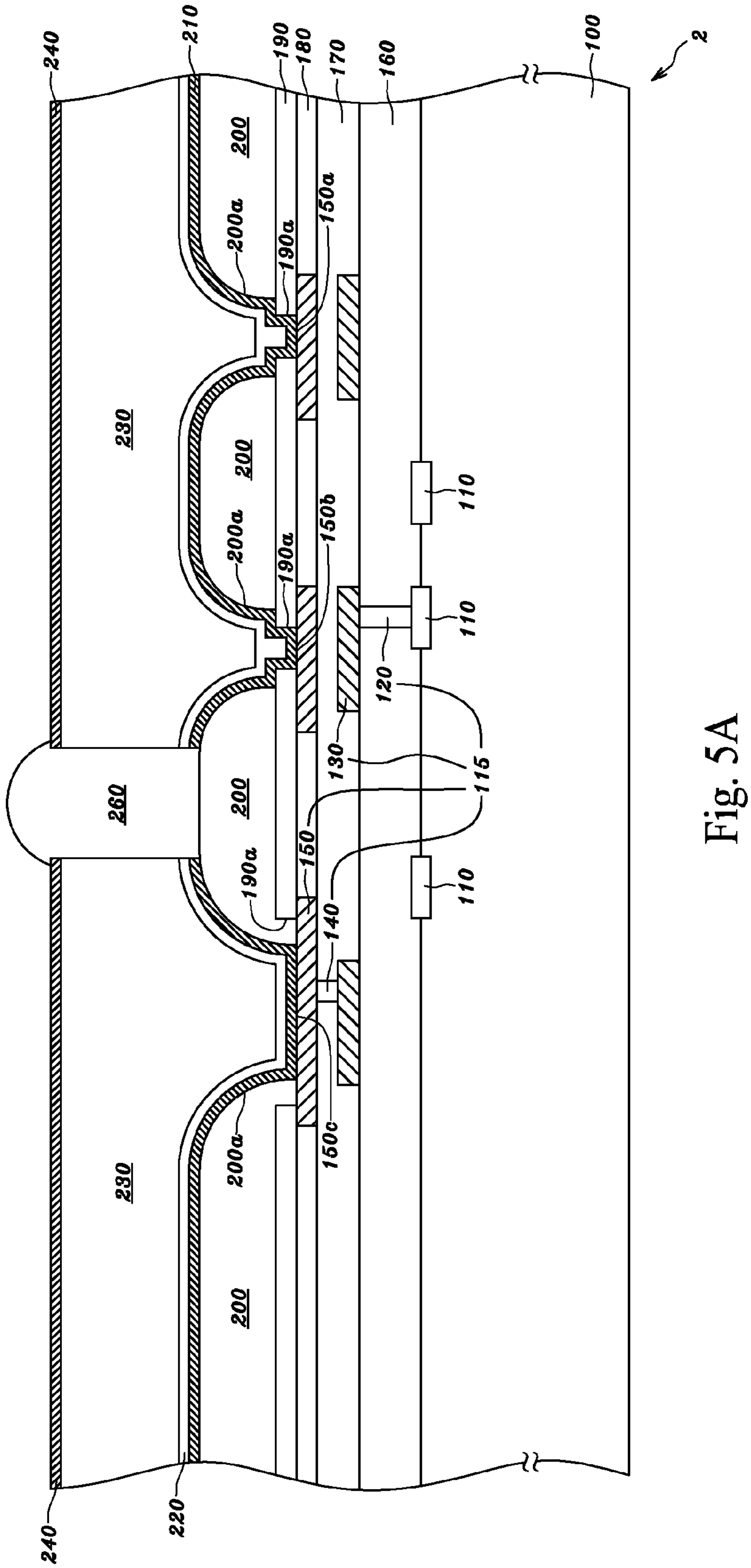
FIGS. 5A-5G are cross-sectional views showing a process for forming a semiconductor chip and bonding a wirebonded wire to the semiconductor chip according to one embodiment of the present invention.

Referring to FIG. 5A, after the step shown in FIG. 4E, a polymer layer 260 can be formed on the polymer layer 200 and in the gap between neighboring metal traces provided by the adhesion/barrier 210, the seed layer 220, the copper layer 230 and the barrier layer 240 by a process including a spin-on coating process, a lamination process, a screen-printing process or a spraying process. The polymer layer 260 has a thickness between 3 and 25 micrometers, and preferably between 5 and 15 micrometers, and the material of the polymer layer 260 may include polyimide (PI), benzocyclobutane (BCB), polybenzoxazole (PBO) or epoxy resin. The process of forming the polymer layer 260 shown in FIG. 5A can be referred to as the process of forming the polymer layer 260 as illustrated in FIG. 4F.

Figure 5B:
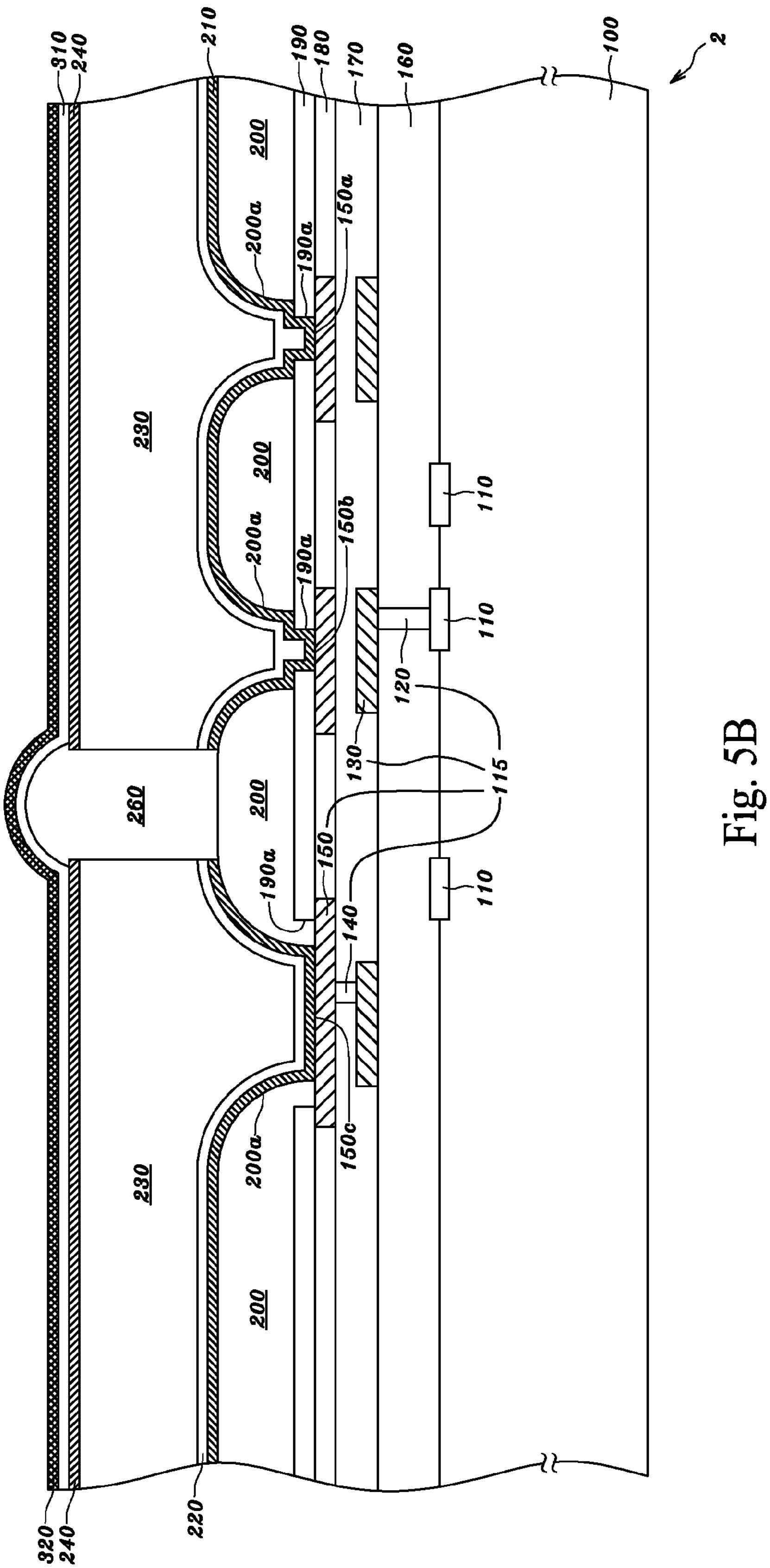

Referring to FIG. 5B, an adhesion/barrier layer 310 having a thickness between 0.02 and 0.5 micrometers, and preferably between 0.1 and 0.2 micrometers, can be formed on the polymer layer 260 and on the barrier layer 240. The adhesion/barrier layer 310 can be formed by a physical vapor deposition (PVD) process, such as a sputtering process or an evaporation process. The material of the adhesion/barrier layer 310 can be titanium, a titanium-tungsten alloy, titanium nitride, chromium, tantalum, tantalum nitride or a composite of the above-mentioned materials.

For example, the adhesion/barrier layer 310 can be formed by sputtering a titanium layer, a titanium-nitride layer, a titanium-tungsten-alloy layer or a chromium layer with a thickness between 0.02 and 0.5 micrometers, and preferably between 0.1 and 0.2 micrometers, on the polymer layer 260 and on the barrier layer 240. Alternatively, the adhesion/barrier layer 310 can be formed by sputtering a titanium layer with a thickness between 0.01 and 0.15 micrometers on the polymer layer 260 and on the barrier layer 240, and then sputtering a titanium-tungsten-alloy layer with a thickness between 0.1 and 0.35 micrometers on the titanium layer.

Next, a seed layer 320 having a thickness between 0.05 and 0.5 micrometers, and preferably between 0.08 and 0.15 micrometers, is formed on the adhesion/barrier layer 310. The seed layer 320 can be formed by a physical vapor deposition (PVD) process, such as a sputtering process or an evaporation process. The material of the seed layer 320 can be gold, platinum or palladium. The seed layer 320 is beneficial to electroplating a metal layer thereon.

The processes of forming the adhesion/barrier layer 310 and forming the seed layer 320 on the adhesion/barrier layer 310 as illustrated in FIG. 5B can be referred to as the processes of forming the adhesion/barrier layer 310 and forming seed layer 320 on the adhesion/barrier layer 310 as illustrated in FIG. 4G.

Figure 5C:
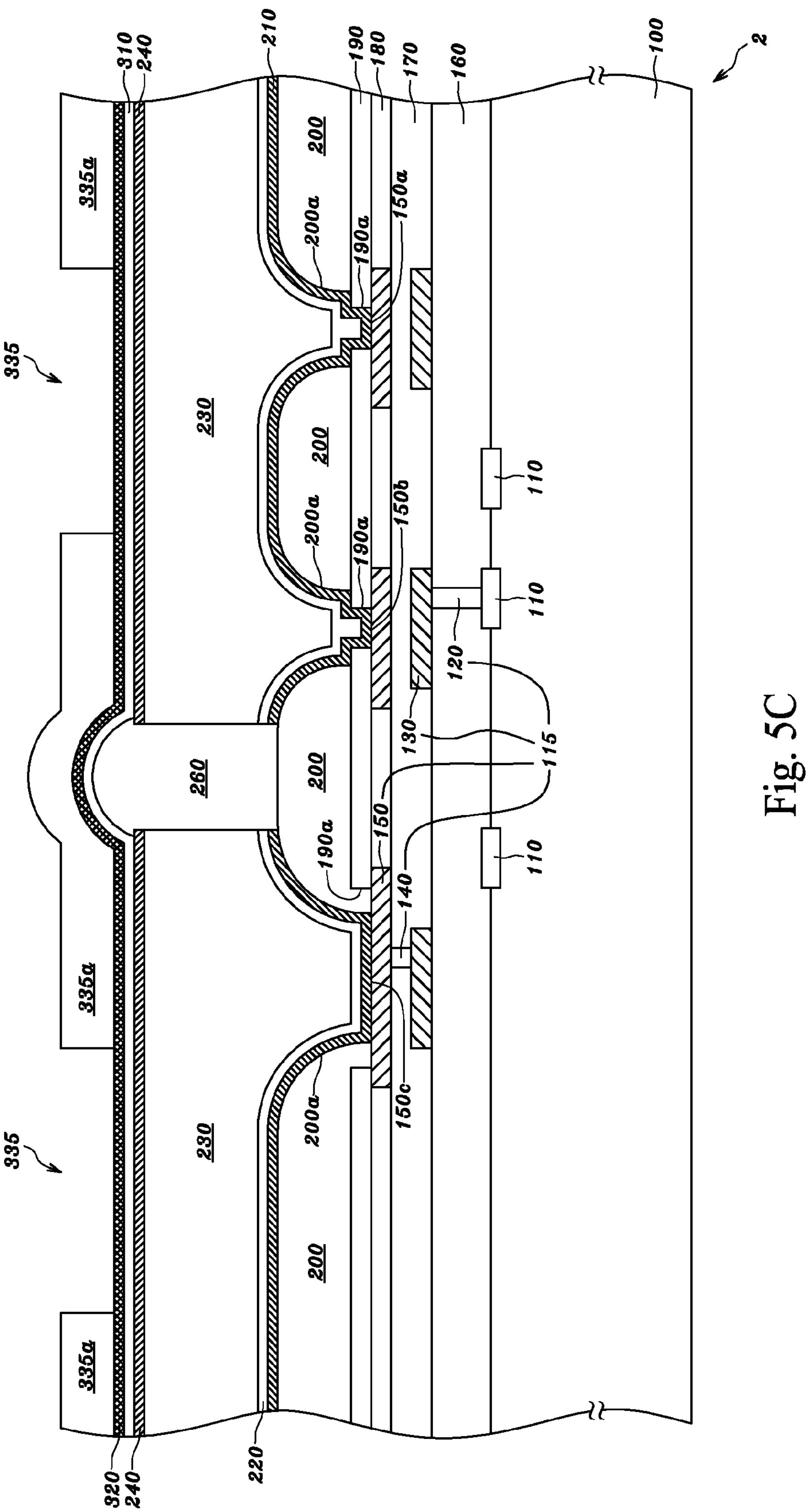

Referring to FIG. 5C, a photoresist layer 335*a*, such as a positive-type photoresist layer or a negative-type photoresist layer, having a thickness between 5 and 30 micrometers, and preferably between 10 and 15 micrometers, is formed on the seed layer 320 by a spin-on coating process, a lamination process, a screen-printing process or a spraying process. Next, the photoresist layer 335*a* is patterned with the processes of exposure and development to form openings 335 in the photoresist layer 335*a* exposing the seed layer 320. A 1× stepper or a 1× contact aligner can be used to expose the photoresist layer 335*a* during the process of exposure. The processes of forming the photoresist layer 335*a* and forming the openings 335 in the photoresist layer 335*a* as illustrated in FIG. 5C can be referred to as the processes of forming the photoresist layer 335*a* and forming the openings 335 in the photoresist layer 335*a* as illustrated in FIG. 4H.

Figure 5D:
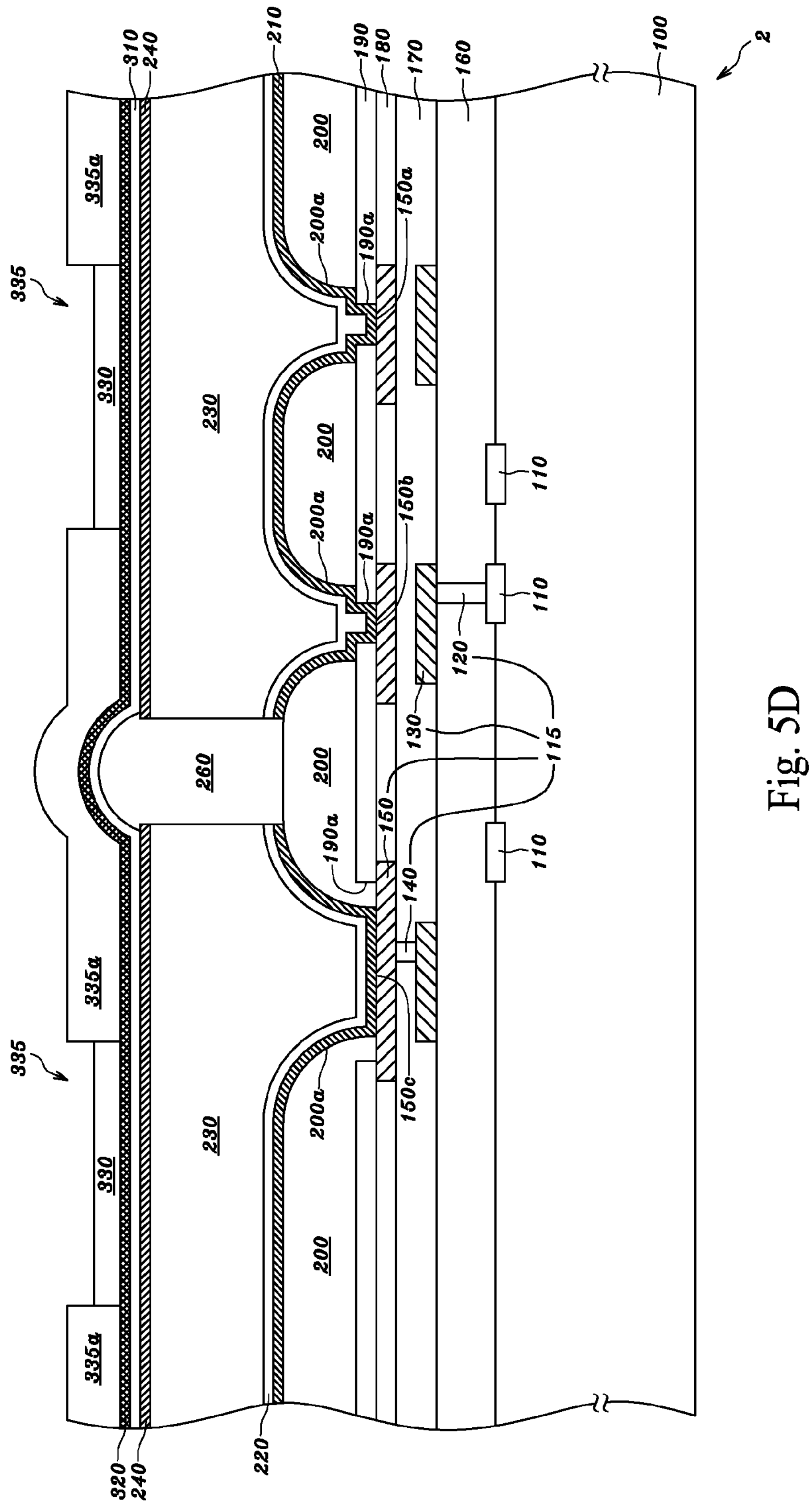

Referring to FIG. 5D, a wirebondable metal layer 330 having a thickness between 1 and 20 micrometers, and preferably between 2 and 8 micrometers, can be electroplated or electroless plated on the seed layer 320 exposed by the openings 335 in the photoresist layer 335*a*. The processes of forming the wirebondable metal layer 330 shown in FIG. 5D can be referred to as the processes of forming the wirebondable metal layer 330 as illustrated in FIG. 4I.

Figure 5E:
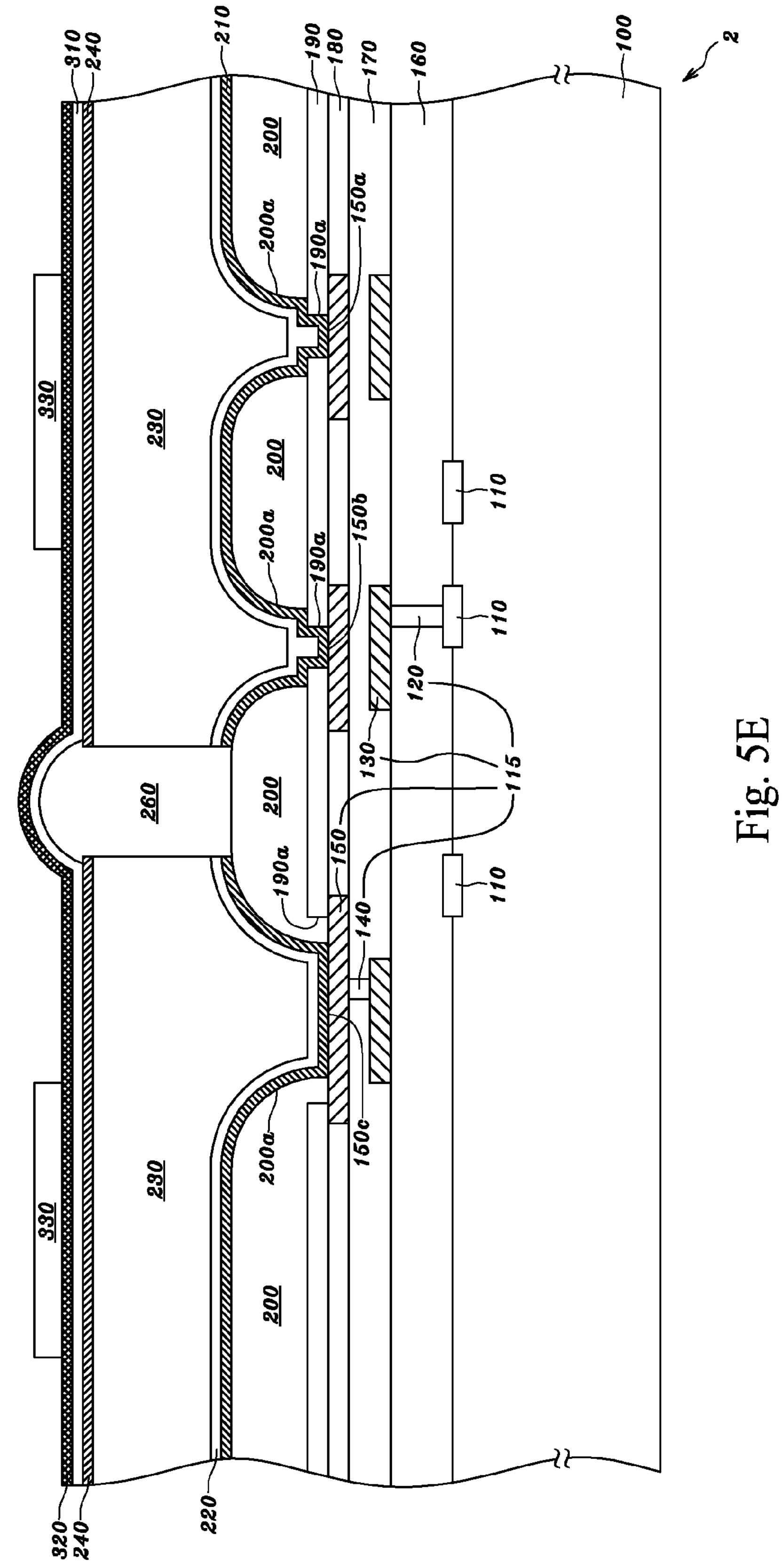

Referring to FIG. 5E, after the wirebondable metal layer 330 is formed, the photoresist layer 335*a* can be removed using an inorganic solution or using an organic solution with amide. Some residuals from the photoresist layer 335*a* could remain on the wirebondable metal layer 330 and on the seed layer 320 not under the wirebondable metal layer 330. Thereafter, the residuals can be removed from the wirebondable metal layer 330 and from the seed layer 320 with a plasma, such as an $O_2$ plasma or a plasma containing fluorine of below 200 PPM and oxygen.

Figure 5F:
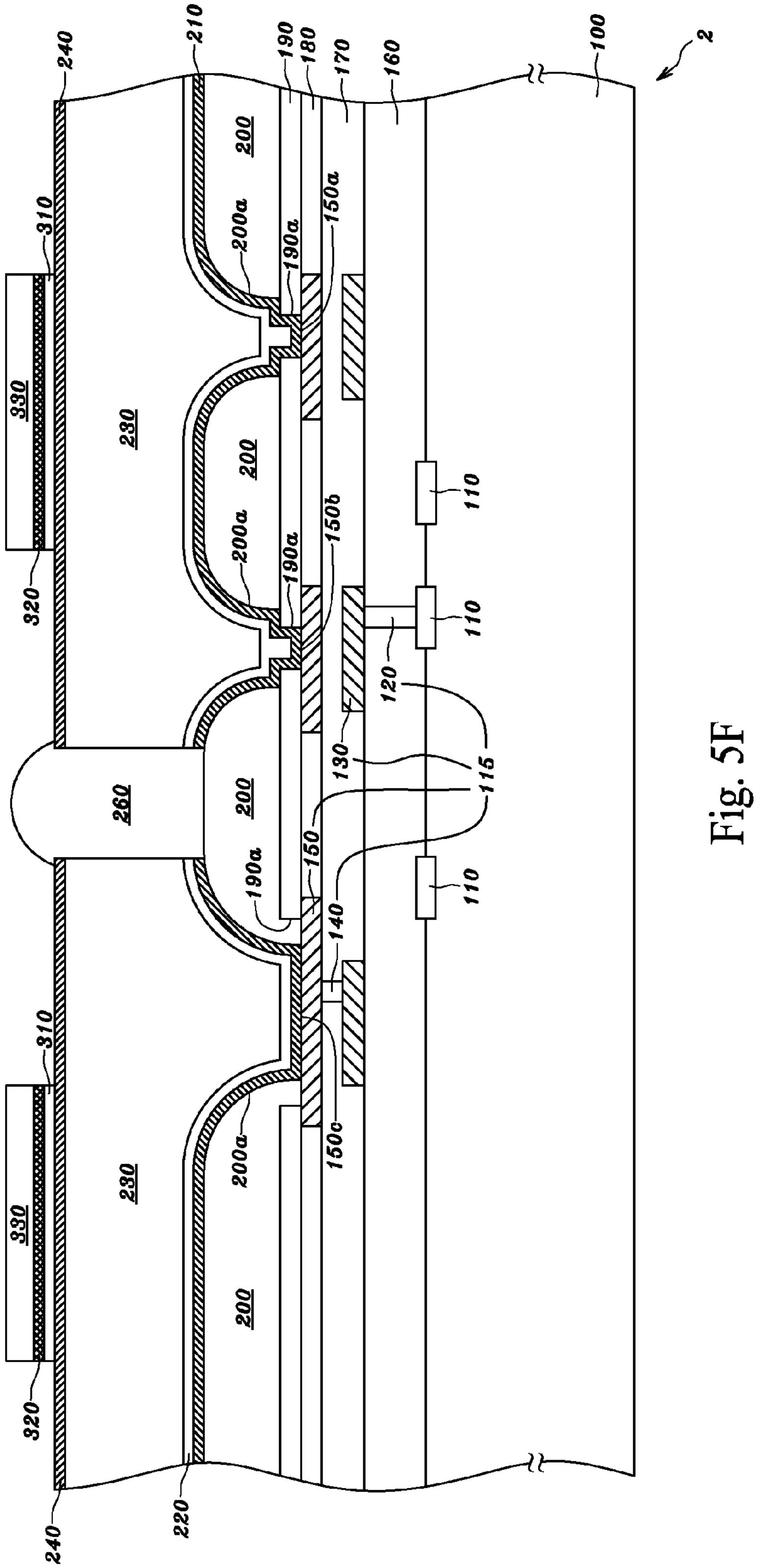

Referring to FIG. 5F, the seed layer 320 and the adhesion/barrier layer 310 not under the wirebondable metal layer 330 are subsequently removed with an etching method. The process as illustrated in FIG. 5F, of removing the seed layer 320 and the adhesion/barrier layer 310 not under the wirebondable metal layer 330, can be referred to as the process as illustrated in FIG. 4K, of removing the seed layer 320 and the adhesion/barrier layer 310 not under the wirebondable metal layer 330.

Figure 5G:
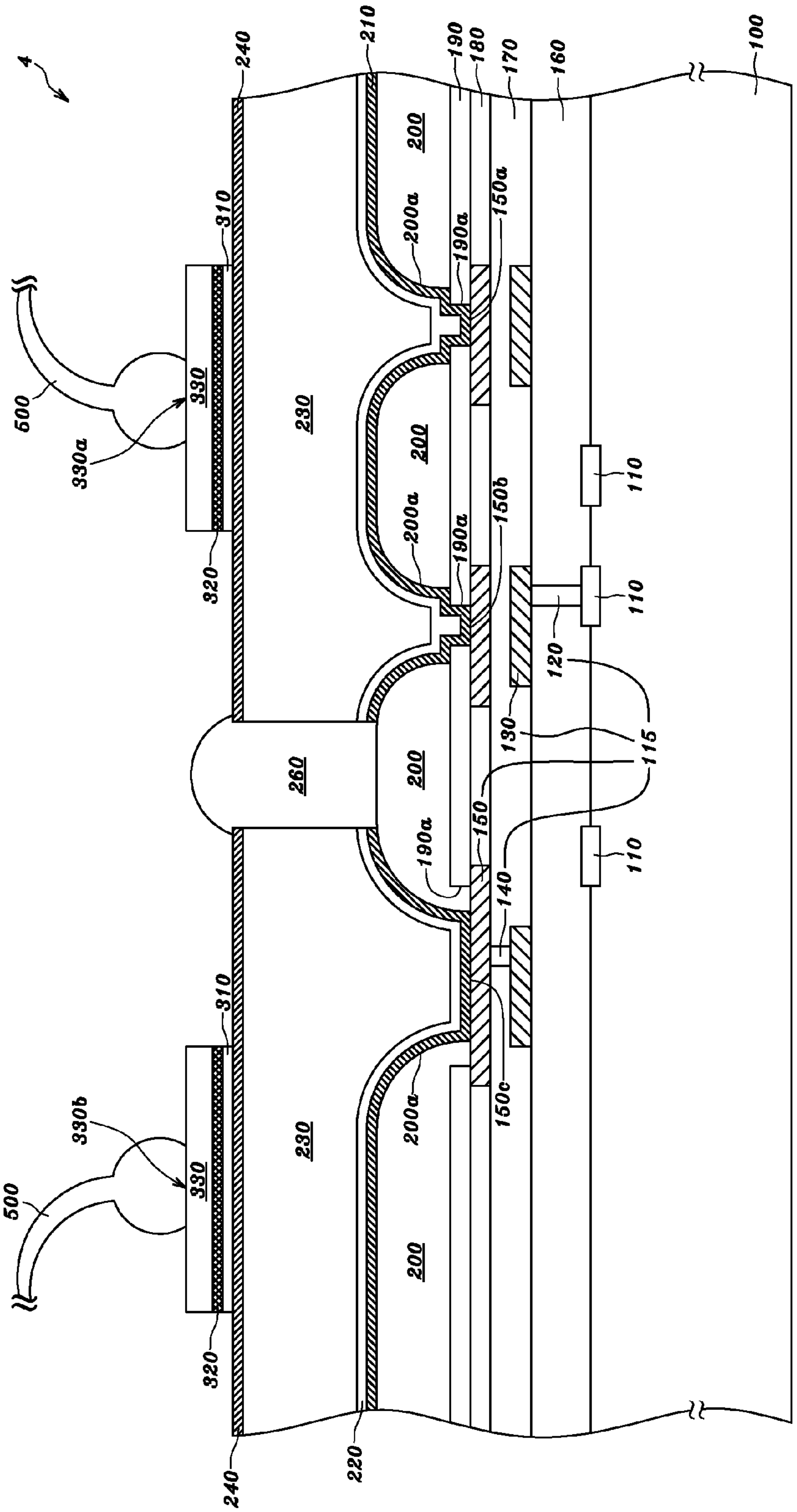

Referring to FIG. 5G, after removing the seed layer 320 and the adhesion/barrier layer 310 not under the wirebondable metal layer 330, the semiconductor wafer 2 can be cut into a plurality of individual semiconductor chips 4 (only one of them is shown) by a dice sawing process.

Next, via a wire-bonding process, two wires 500, made of gold, copper or aluminum, can be ball bonded on two contact points 330*a* and 330*b* of the wirebondable metal layer 330 of the semiconductor chip 4. Alternatively, via a wire-bonding process, the wires 500, made of gold, copper or aluminum, can be wedge bonded on the contact points 330*a* and 330*b* of the wirebondable metal layer 330 of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 5H:
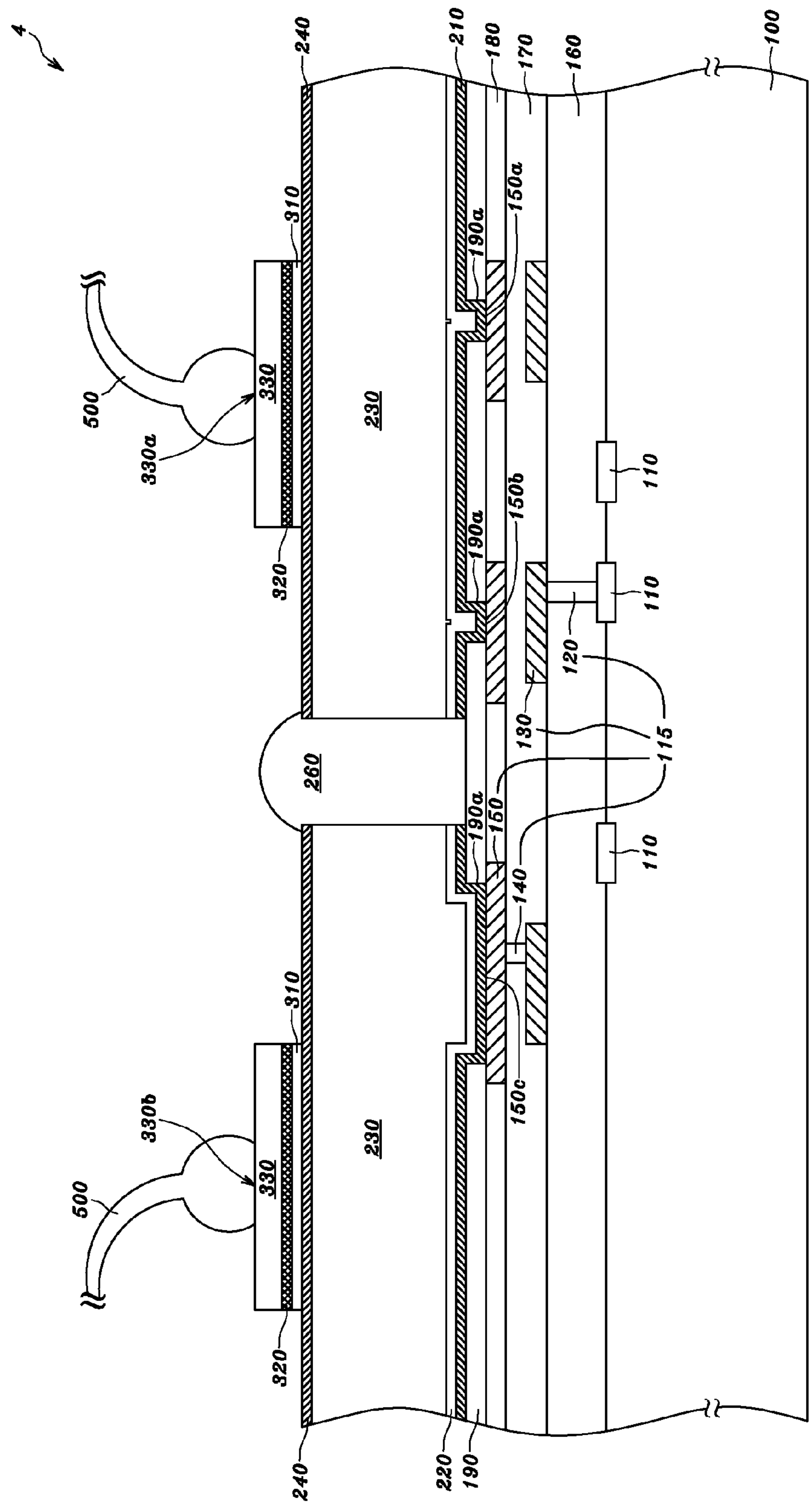
FIG. 5H is a cross-sectional view showing a semiconductor chip with two thick metal layers and a wirebonded wire bonded to the topmost thick metal layer.

Alternatively, referring to FIG. 5H, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the passivation layer 190 and in the gap between neighboring metal traces provided by the adhesion/barrier 210, the seed layer 220, the copper layer 230 and the barrier layer 240, followed by performing the above-mentioned steps as shown in FIGS. 5B-5G. The process of forming the adhesion/barrier layer 210 shown in FIG. 5H can be referred to as the process of forming the adhesion/barrier layer 210 as illustrated in FIG. 4A. The process of forming the seed layer 220 shown in FIG. 5H can be referred to as the process of forming the seed layer 220 as illustrated in FIG. 4A. The process of forming the polymer layer 260 shown in FIG. 5H can be referred to as the process of forming the polymer layer 260 as illustrated in FIG. 5A.

Embodiment 3

Figure 6A:
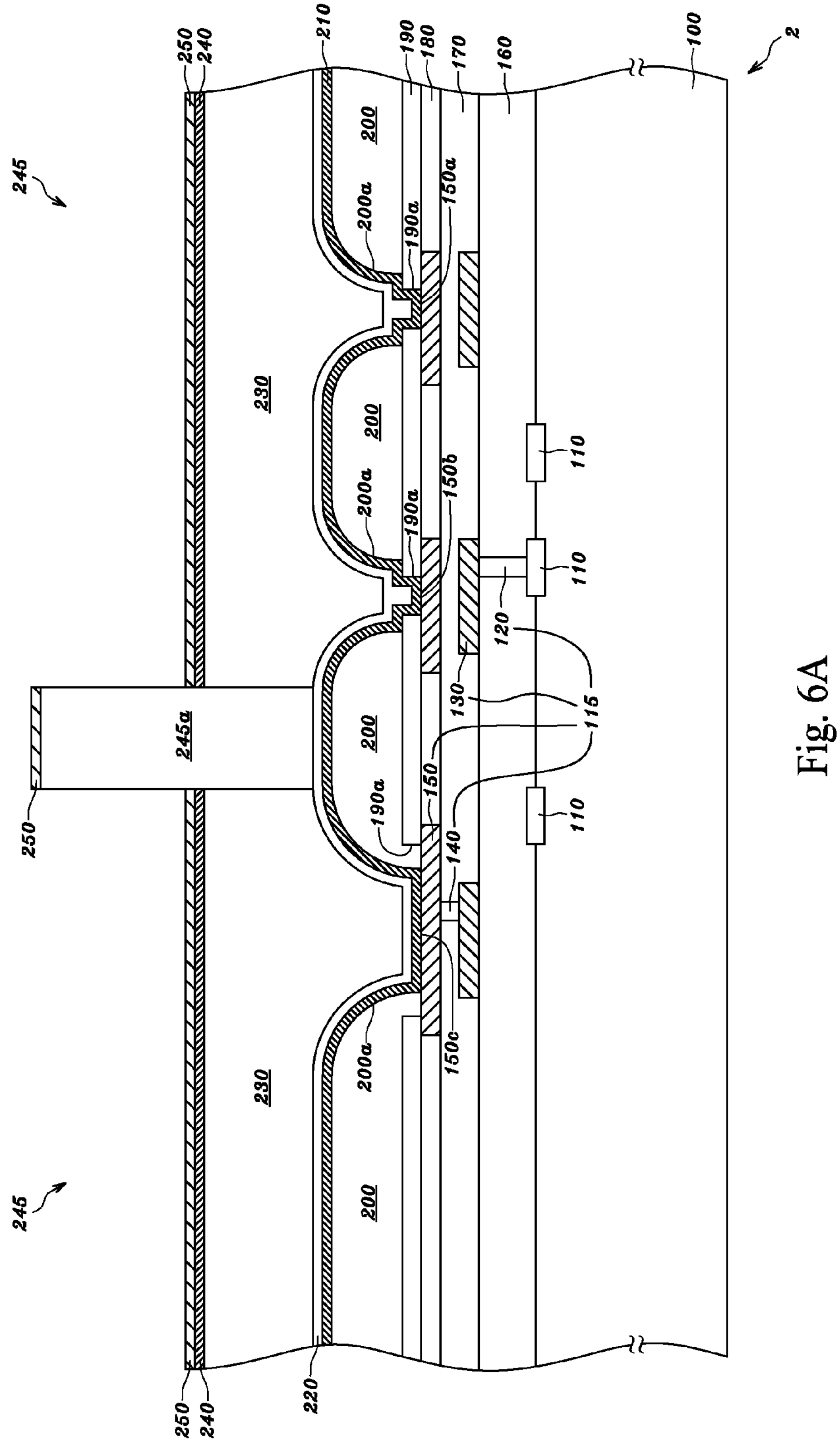
FIGS. 6A-6E are cross-sectional views showing a process for forming a semiconductor chip and bonding a wirebonded wire to the semiconductor chip according to one embodiment of the present invention.

Referring to FIG. 6A, after the barrier layer 240 shown in FIG. 4C is formed, a bonding layer 250 having a thickness between 0.01 and 2 micrometers can be formed on the barrier layer 240 by a sputtering process. The bonding layer 250 can be a gold layer with a thickness between 0.01 and 2 micrometers, a platinum layer with a thickness between 0.01 and 2 micrometers, or a palladium layer with a thickness between 0.01 and 2 micrometers.

In a case, when the barrier layer 240 is formed by electroplating or electroless plating a nickel layer with a thickness between 0.05 and 5 micrometers, and preferably between 0.1 and 1 micrometers, on the copper layer 230, the bonding layer 250 can be formed by sputtering a gold layer with a thickness between 0.01 and 2 micrometers on the nickel layer.

In another case, when the barrier layer 240 is formed by electroplating or electroless plating a nickel layer with a thickness between 0.05 and 5 micrometers, and preferably between 0.1 and 1 micrometers, on the copper layer 230, the bonding layer 250 can be formed by sputtering a platinum layer with a thickness between 0.01 and 2 micrometers on the nickel layer.

In another case, when the barrier layer 240 is formed by electroplating or electroless plating a nickel layer with a thickness between 0.05 and 5 micrometers, and preferably between 0.1 and 1 micrometers, on the copper layer 230, the bonding layer 250 can be formed by sputtering a palladium layer with a thickness between 0.01 and 2 micrometers on the nickel layer.

In another case, when the barrier layer 240 is formed by electroplating or electroless plating a cobalt layer with a thickness between 0.05 and 5 micrometers, and preferably between 0.1 and 1 micrometers, on the copper layer 230, the bonding layer 250 can be formed by sputtering a gold layer with a thickness between 0.01 and 2 micrometers on the cobalt layer.

In another case, when the barrier layer 240 is formed by electroplating or electroless plating a cobalt layer with a thickness between 0.05 and 5 micrometers, and preferably between 0.1 and 1 micrometers, on the copper layer 230, the bonding layer 250 can be formed by sputtering a platinum layer with a thickness between 0.01 and 2 micrometers on the cobalt layer.

In another case, when the barrier layer 240 is formed by electroplating or electroless plating a cobalt layer with a thickness between 0.05 and 5 micrometers, and preferably between 0.1 and 1 micrometers, on the copper layer 230, the bonding layer 250 can be formed by sputtering a palladium layer with a thickness between 0.01 and 2 micrometers on the cobalt layer.

Figure 6B:
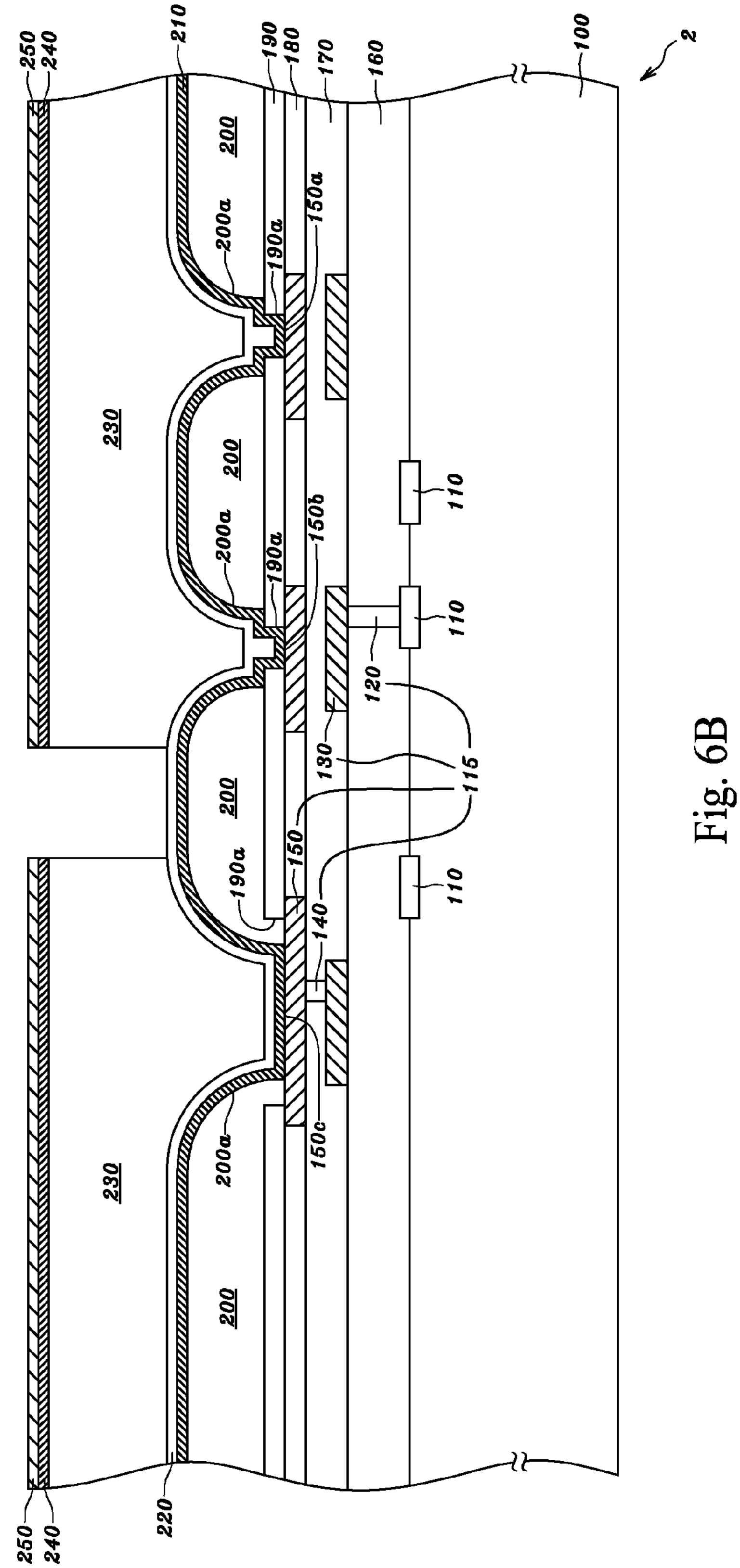

Referring to FIG. 6B, after the bonding layer 250 is formed, the photoresist layer 245*a* can be removed using an inorganic solution or using an organic solution with amide. Some residuals from the photoresist layer 245*a* could remain on the bonding layer 250 and on the seed layer 220 not under the copper layer 230. Thereafter, the residuals can be removed from the bonding layer 250 and from the seed layer 220 with a plasma, such as an $O_2$ plasma or a plasma containing fluorine of below 200 PPM and oxygen.

Figure 6C:
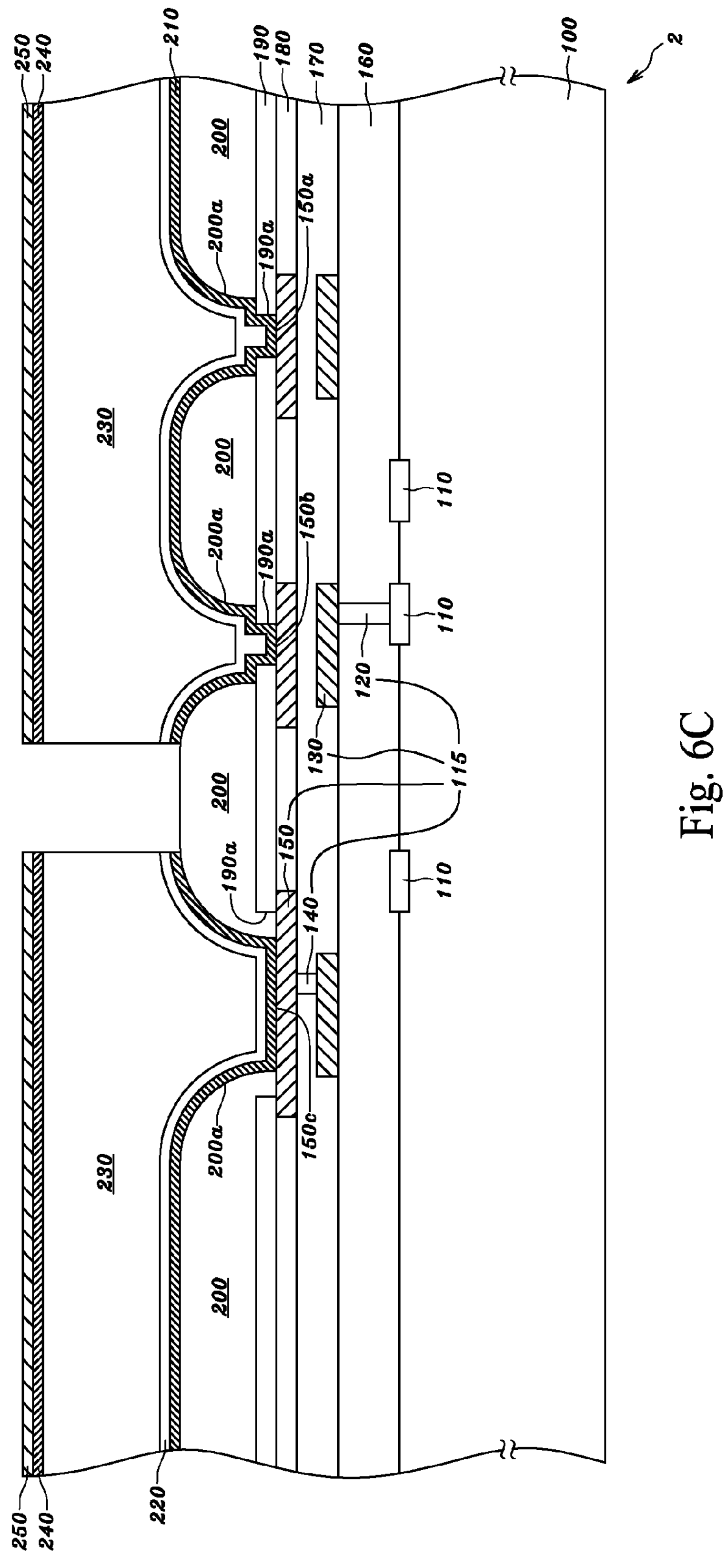

Referring to FIG. 6C, the seed layer 220 and the adhesion/barrier layer 210 not under the copper layer 230 are subsequently removed with an etching method. The process as illustrated in FIG. 6C, of removing the seed layer 220 and the adhesion/barrier layer 210 not under the copper metal layer 230, can be referred to as the process as illustrated in FIG. 4E, of removing the seed layer 220 and the adhesion/barrier layer 210 not under the copper metal layer 230.

Figure 6D:
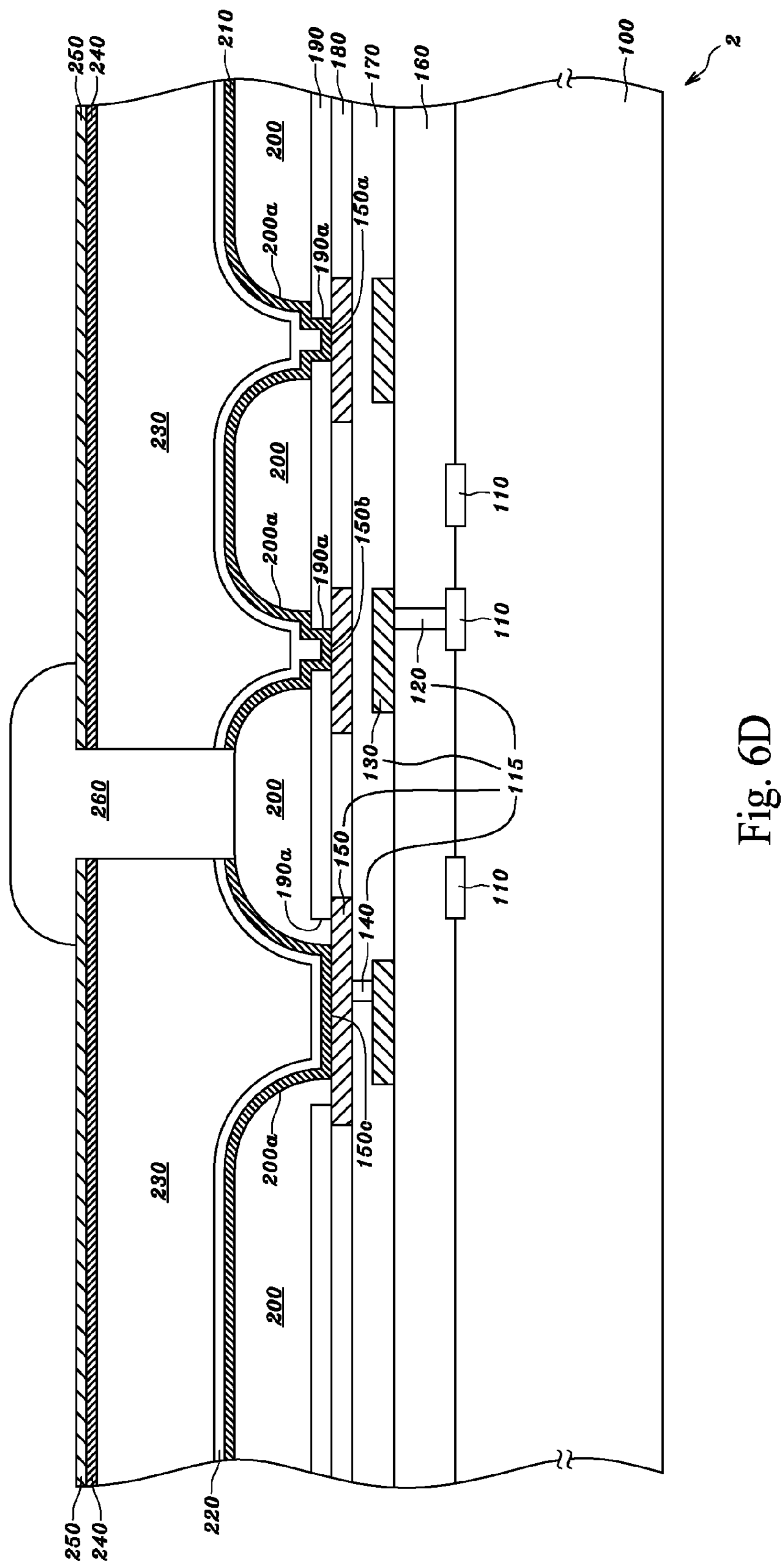

Referring to FIG. 6D, a polymer layer 260 can be formed on the bonding layer 250, on the polymer layer 200 and in the gap between neighboring metal traces provided by the adhesion/barrier 210, the seed layer 220, the copper layer 230, the barrier layer 240 and the bonding layer 250 by a process including a spin-on coating process, a lamination process, a screen-printing process or a spraying process. The polymer layer 260 has a thickness between 3 and 25 micrometers, and preferably between 5 and 15 micrometers, and the material of the polymer layer 260 may include benzocyclobutane (BCB), polyimide (PI), polybenzoxazole (PBO) or epoxy resin. The process of forming the polymer layer 260 shown in FIG. 6D can be referred to as the process of forming the polymer layer 260 as illustrated in FIG. 4F.

Figure 6E:
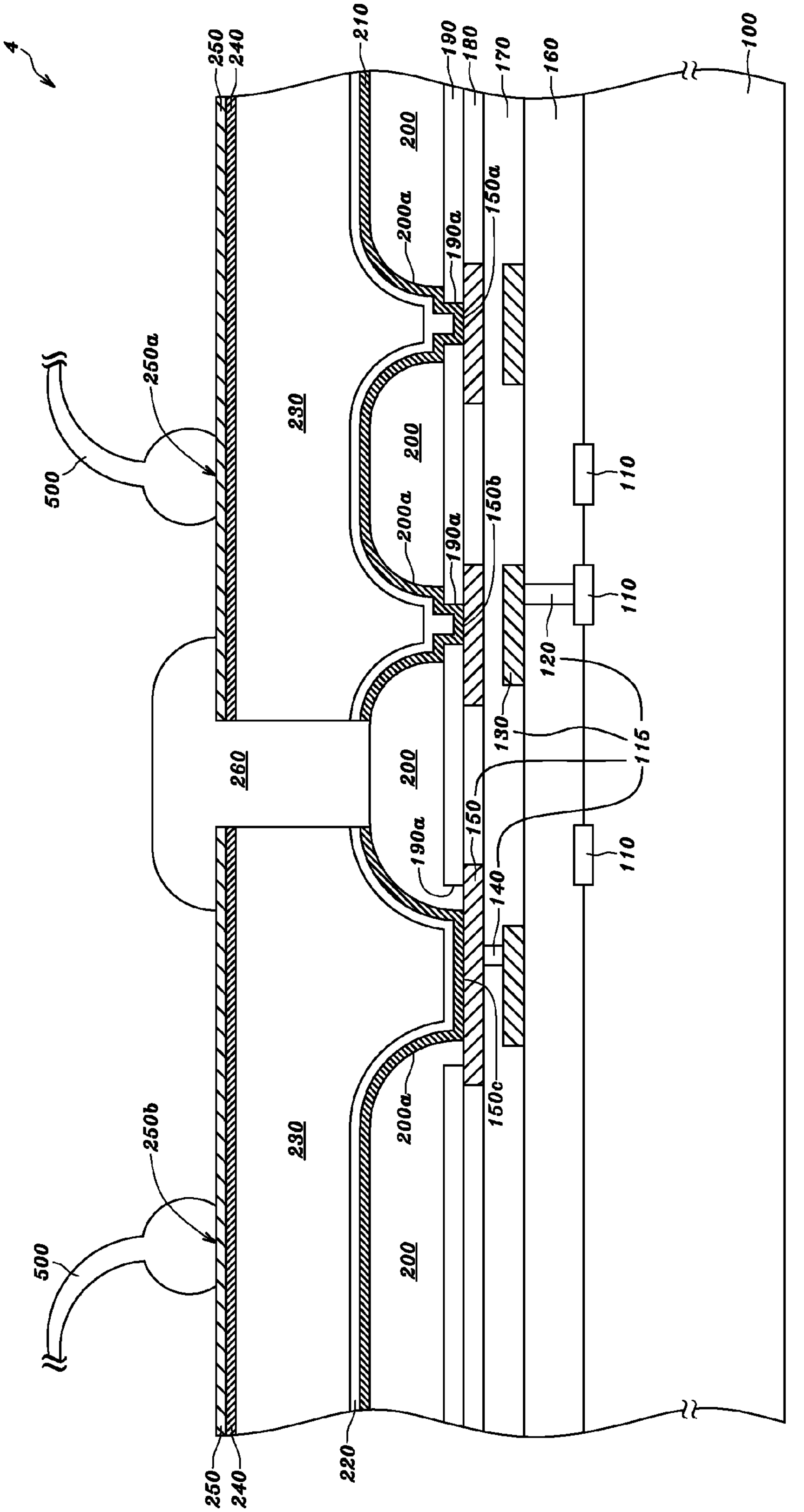

Referring to FIG. 6E, after the polymer layer 260 is formed, the semiconductor wafer 2 can be cut into a plurality of individual semiconductor chips 4 (only one of them is shown) by a dice sawing process.

Next, via a wire-bonding process, two wires 500, made of gold, copper or aluminum, can be ball bonded on two contact points 250*a* and 250*b* of the bonding layer 250 of the semiconductor chip 4. Alternatively, via a wire-bonding process, the wires 500, made of gold, copper or aluminum, can be wedge bonded on the contact points 250*a* and 250*b* of the bonding layer 250 of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 6F:
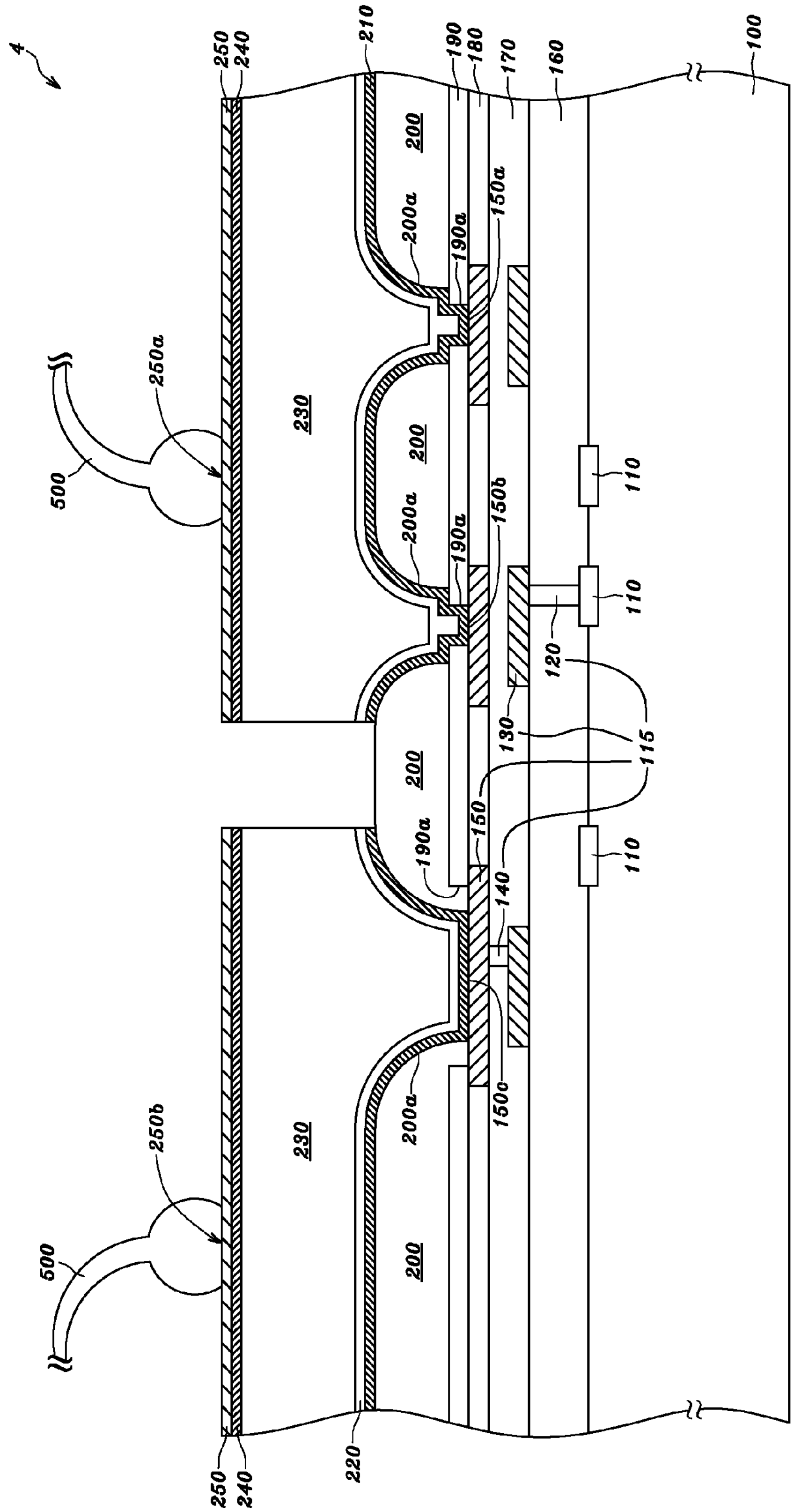
FIGS. 6F and 6H are cross-sectional views showing a semiconductor chip with a thick metal layer and a wirebonded wire bonded to the thick metal layer.

Alternatively, referring to FIG. 6F, the step of forming the polymer layer 260 as shown in FIG. 6D can be omitted, that is, after performing the above-mentioned steps as shown in FIGS. 6A-6C, the step illustrated in FIG. 6E can be performed without the polymer layer 260 formed on the bonding layer 250, on the polymer layer 200 and in the gap between the neighboring metal traces provided by the adhesion/barrier 210, the seed layer 220, the copper layer 230, the barrier layer 240 and the bonding layer 250.

Figure 6G:
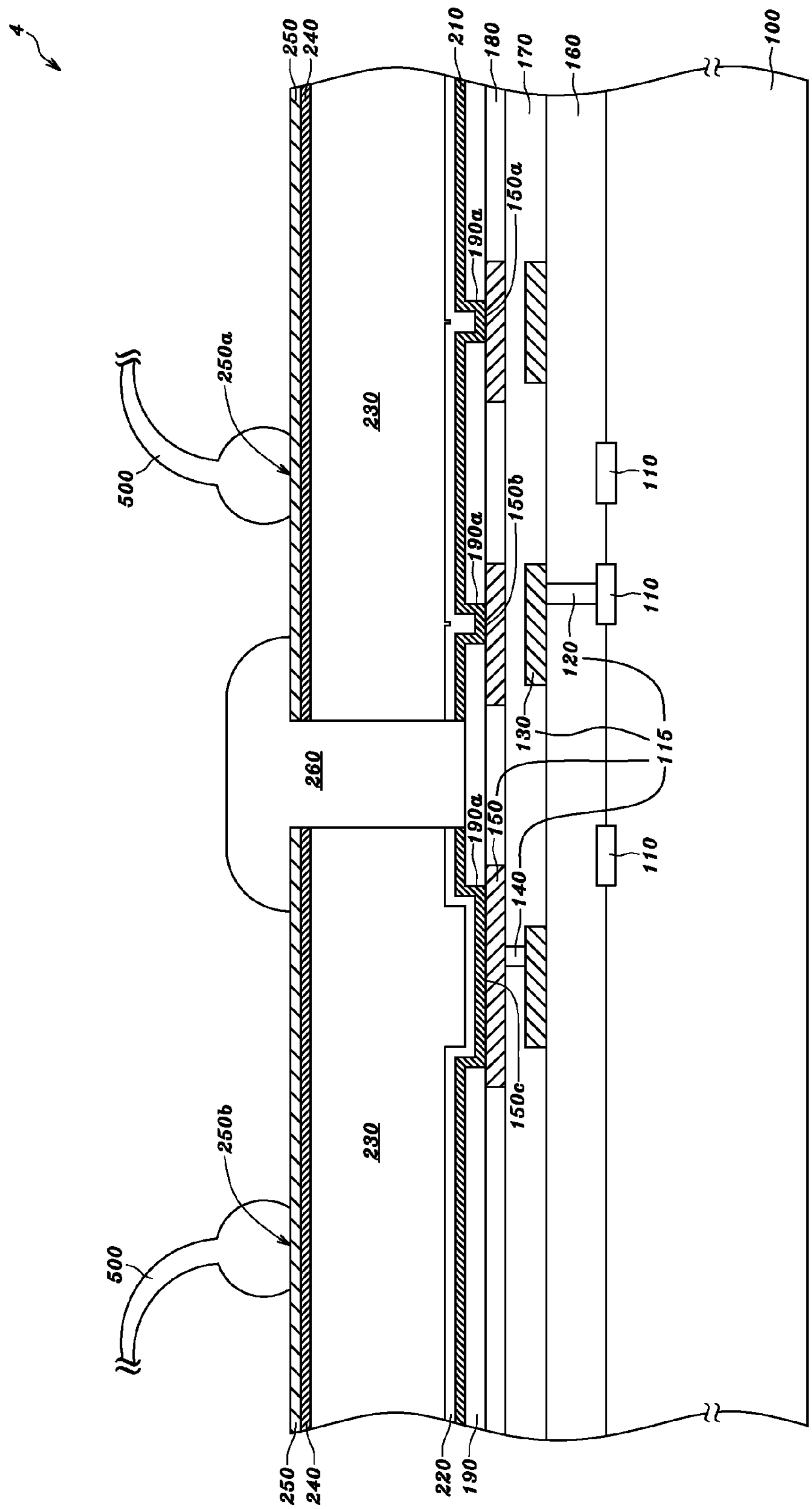

Alternatively, referring to FIG. 6G, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4C, followed by performing the above-mentioned steps as shown in FIGS. 6A-6C, followed by forming the polymer layer 260 on the bonding layer 250, on the passivation layer 190 and in the gap between neighboring metal traces provided by the adhesion/barrier 210, the seed layer 220, the copper layer 230, the barrier layer 240 and the bonding layer 250, followed by performing the above-mentioned step as shown in FIG. 6E. The process of forming the adhesion/barrier layer 210 shown in FIG. 6G can be referred to as the process of forming the adhesion/barrier layer 210 as illustrated in FIG. 4A. The process of forming the seed layer 220 shown in FIG. 6G can be referred to as the process of forming the seed layer 220 as illustrated in FIG. 4A. The process of forming the polymer layer 260 shown in FIG. 6G can be referred to as the process of forming the polymer layer 260 as illustrated in FIG. 4F.

Figure 6H:
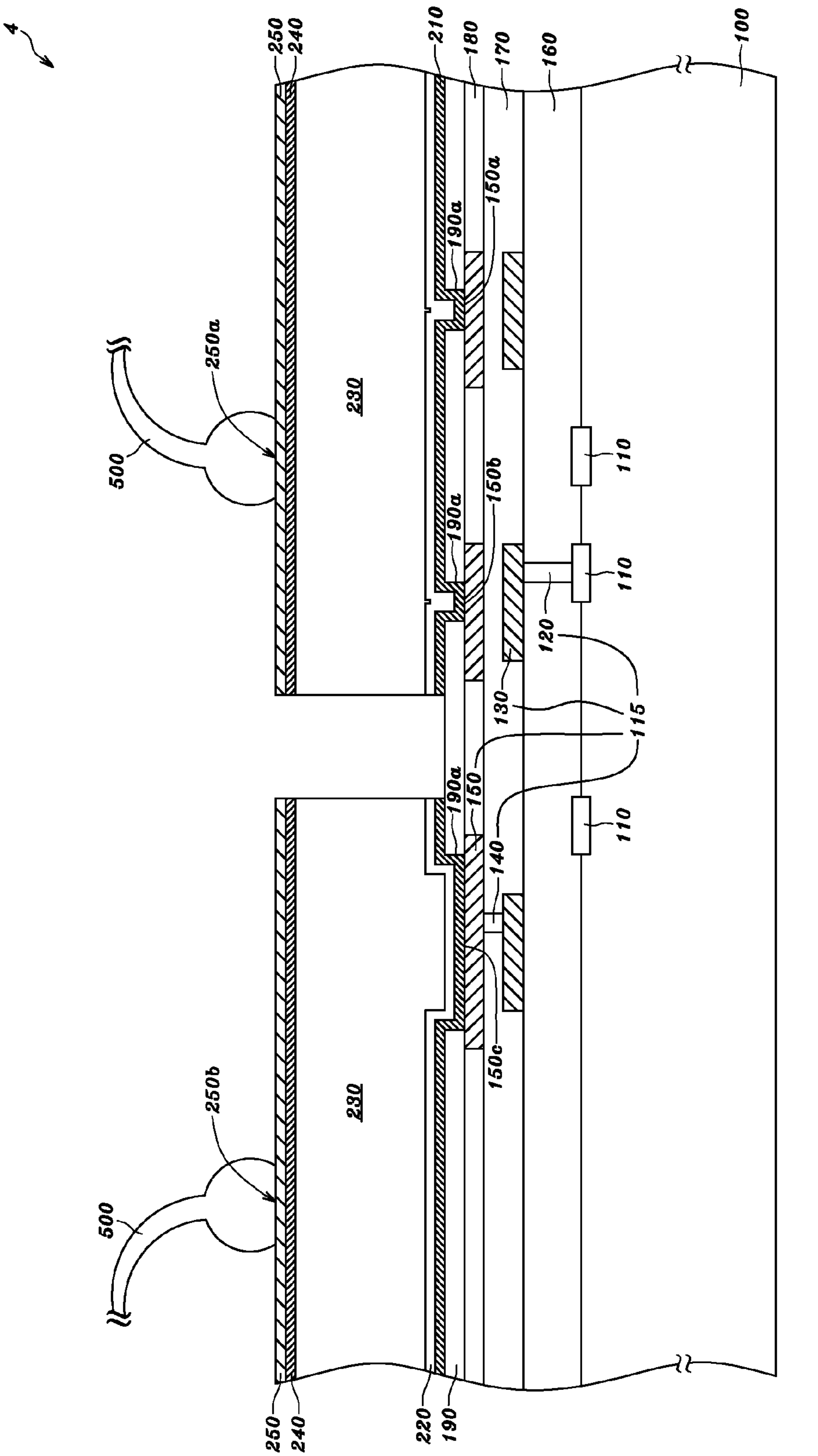

Alternatively, referring to FIG. 6H, the step of forming the polymer layer 200 as shown in FIG. 3 and the step of forming the polymer layer 260 as shown in FIG. 6D can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4C, followed by performing the above-mentioned steps as shown in FIGS. 6A-6C, followed by performing the above-mentioned step as shown in FIG. 6E without the polymer layer 260 formed on the bonding layer 250, on the passivation layer 190 and in the gap between the neighboring metal traces provided by the adhesion/barrier 210, the seed layer 220, the copper layer 230, the barrier layer 240 and the bonding layer 250. The process of forming the adhesion/barrier layer 210 shown in FIG. 6H can be referred to as the process of forming the adhesion/barrier layer 210 as illustrated in FIG. 4A. The process of forming the seed layer 220 shown in FIG. 6H can be referred to as the process of forming the seed layer 220 as illustrated in FIG. 4A.

Embodiment 4

Figure 7A:
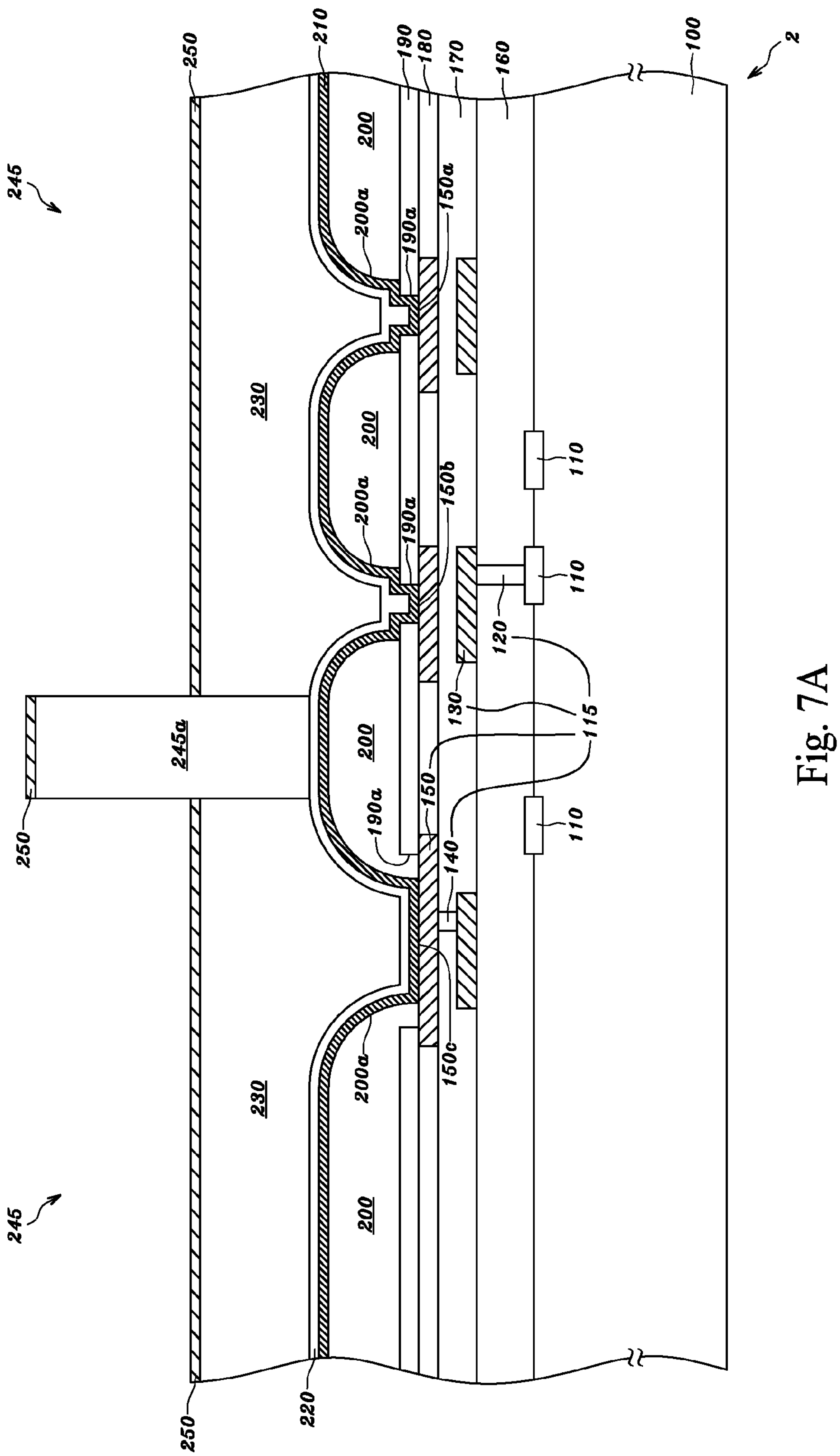
FIGS. 7A-7E are cross-sectional views showing a process for forming a semiconductor chip and bonding a wirebonded wire to the semiconductor chip according to one embodiment of the present invention.

Referring to FIG. 7A, after the step shown in FIG. 4B, a copper layer 230 having a thickness between 3 and 25 micrometers, and preferably between 10 and 20 micrometers, can be electroplated or electroless plated on the seed layer 220 exposed by the openings 245 in the photoresist layer 245*a*. Next, a bonding layer 250 having a thickness between 0.01 and 2 micrometers can be formed on the copper layer 230 by a sputtering process. The bonding layer 250 can be a gold layer with a thickness between 0.01 and 2 micrometers, a platinum layer with a thickness between 0.01 and 2 micrometers, or a palladium layer with a thickness between 0.01 and 2 micrometers.

In a case, the bonding layer 250 can be formed by sputtering a gold layer with a thickness between 0.01 and 2 micrometers on the copper layer 230. In another case, the bonding layer 250 can be formed by sputtering a platinum layer with a thickness between 0.01 and 2 micrometers on the copper layer 230. In another case, the bonding layer 250 can be formed by sputtering a palladium layer with a thickness between 0.01 and 2 micrometers on the copper layer 230.

Figure 7B:
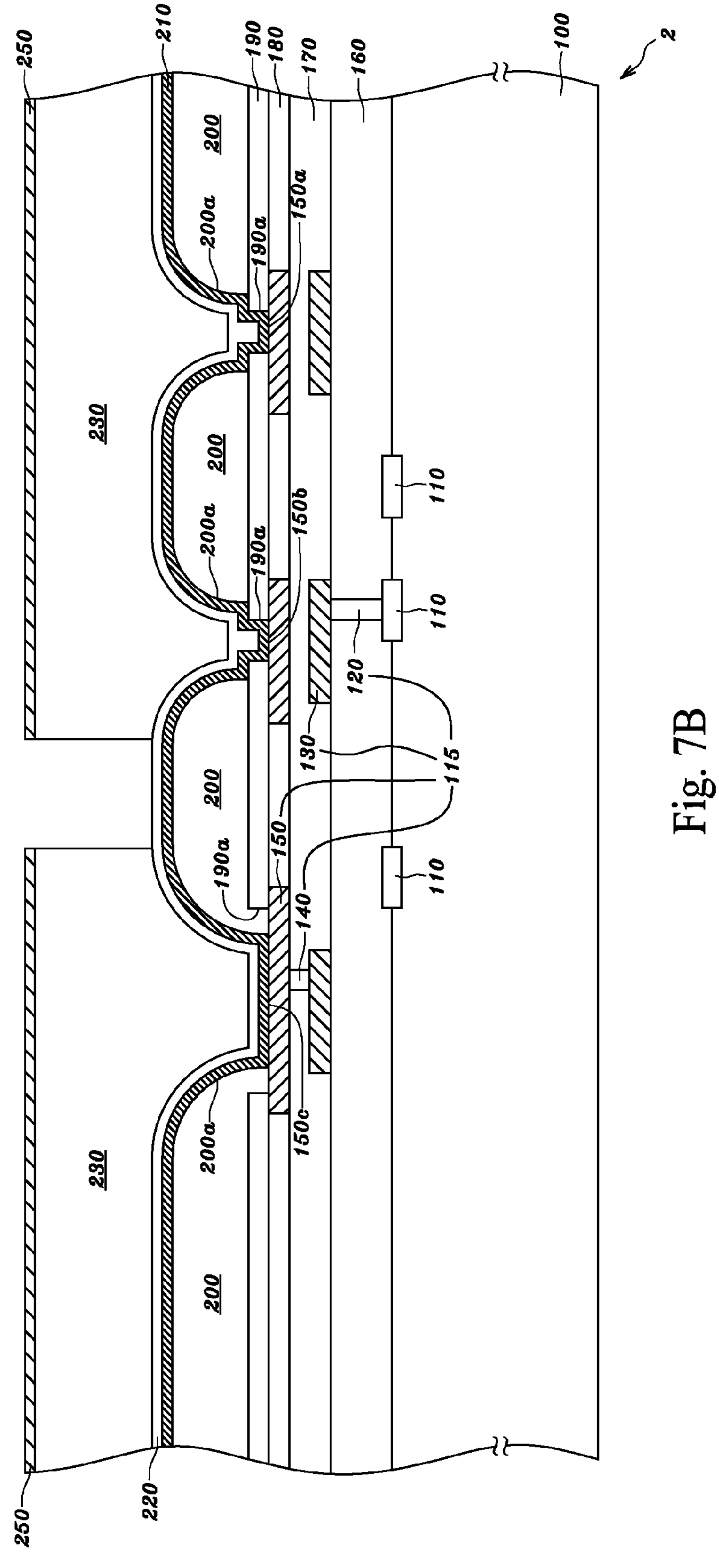

Referring to FIG. 7B, after the bonding layer 250 is formed, the photoresist layer 245*a* can be removed using an inorganic solution or using an organic solution with amide. Some residuals from the photoresist layer 245*a* could remain on the bonding layer 250 and on the seed layer 220 not under the copper layer 230. Thereafter, the residuals can be removed from the bonding layer 250 and from the seed layer 220 with a plasma, such as an $O_2$ plasma or a plasma containing fluorine of below 200 PPM and oxygen.

Figure 7C:
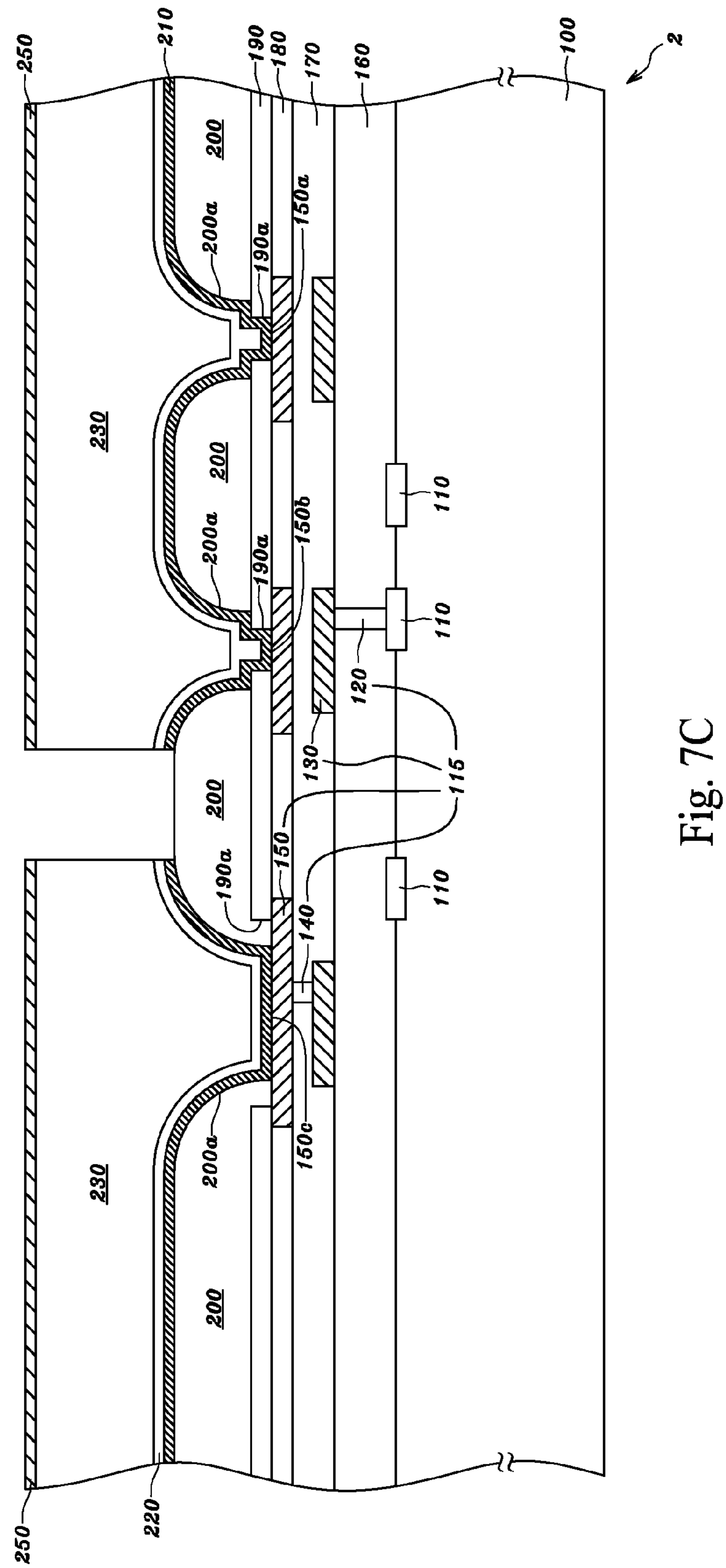

Referring to FIG. 7C, the seed layer 220 and the adhesion/barrier layer 210 not under the copper layer 230 are subsequently removed with an etching method. The process as illustrated in FIG. 7C, of removing the seed layer 220 and the adhesion/barrier layer 210 not under the copper layer 230, can be referred to as the process as illustrated in FIG. 4E, of removing the seed layer 220 and the adhesion/barrier layer 210 not under the copper layer 230.

Figure 7D:
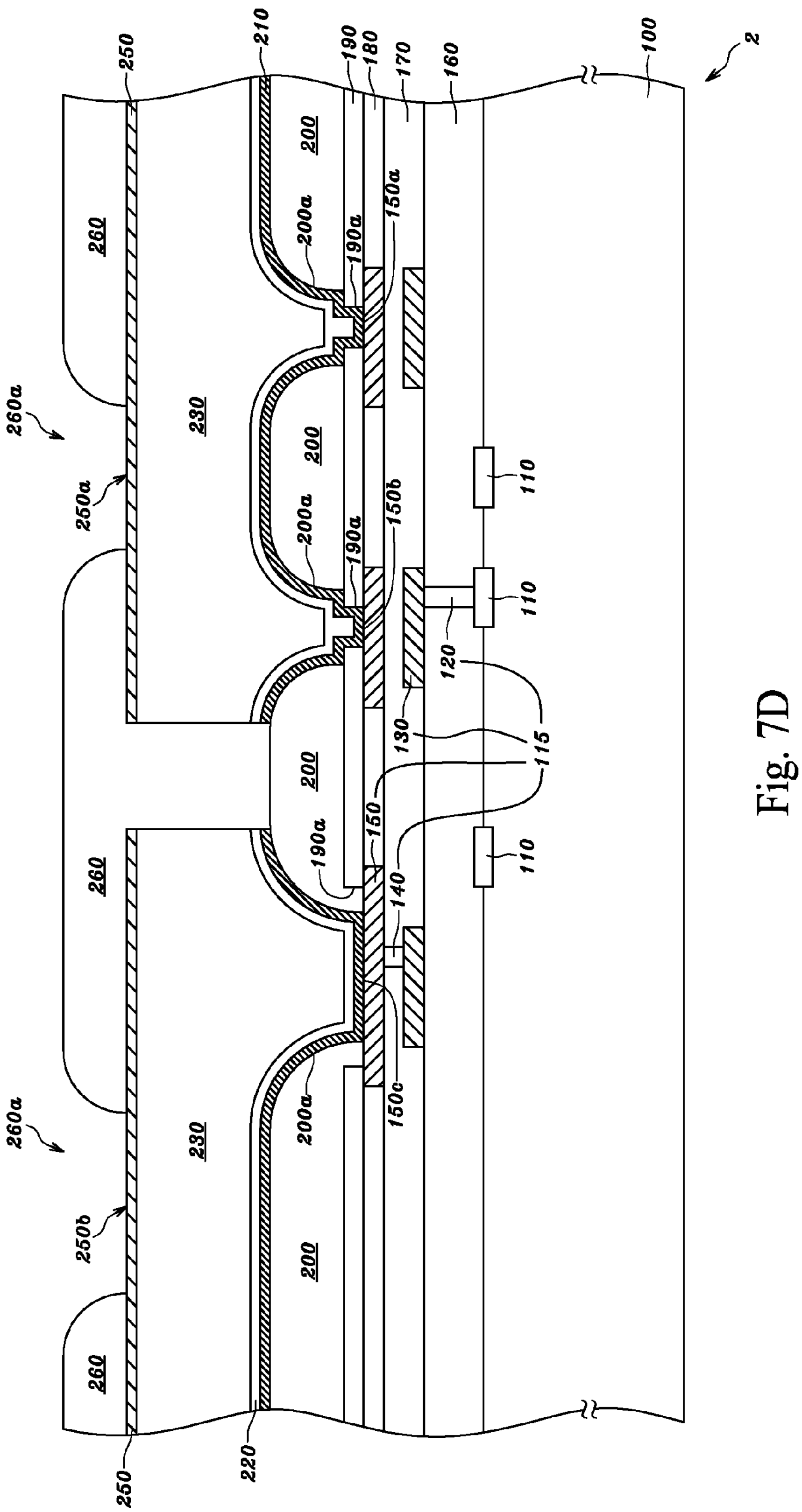

Referring to FIG. 7D, a polymer layer 260 can be formed on the bonding layer 250, on the polymer layer 200 and in the gap between neighboring metal traces provided by the adhesion/barrier 210, the seed layer 220, the copper layer 230 and the bonding layer 250 by a process including a spin-on coating process, a lamination process, a screen-printing process or a spraying process, and two openings 260*a* in the polymer layer 260 expose two contact points 250*a* and 250*b* of the bonding layer 250. The polymer layer 260 has a thickness between 3 and 25 micrometers, and preferably between 5 and 15 micrometers, and the material of the polymer layer 260 may include benzocyclobutane (BCB), polyimide (PI), polybenzoxazole (PBO) or epoxy resin. The process of forming the polymer layer 260 shown in FIG. 7D can be referred to as the process of forming the polymer layer 260 as illustrated in FIG. 4F.

Figure 7E:
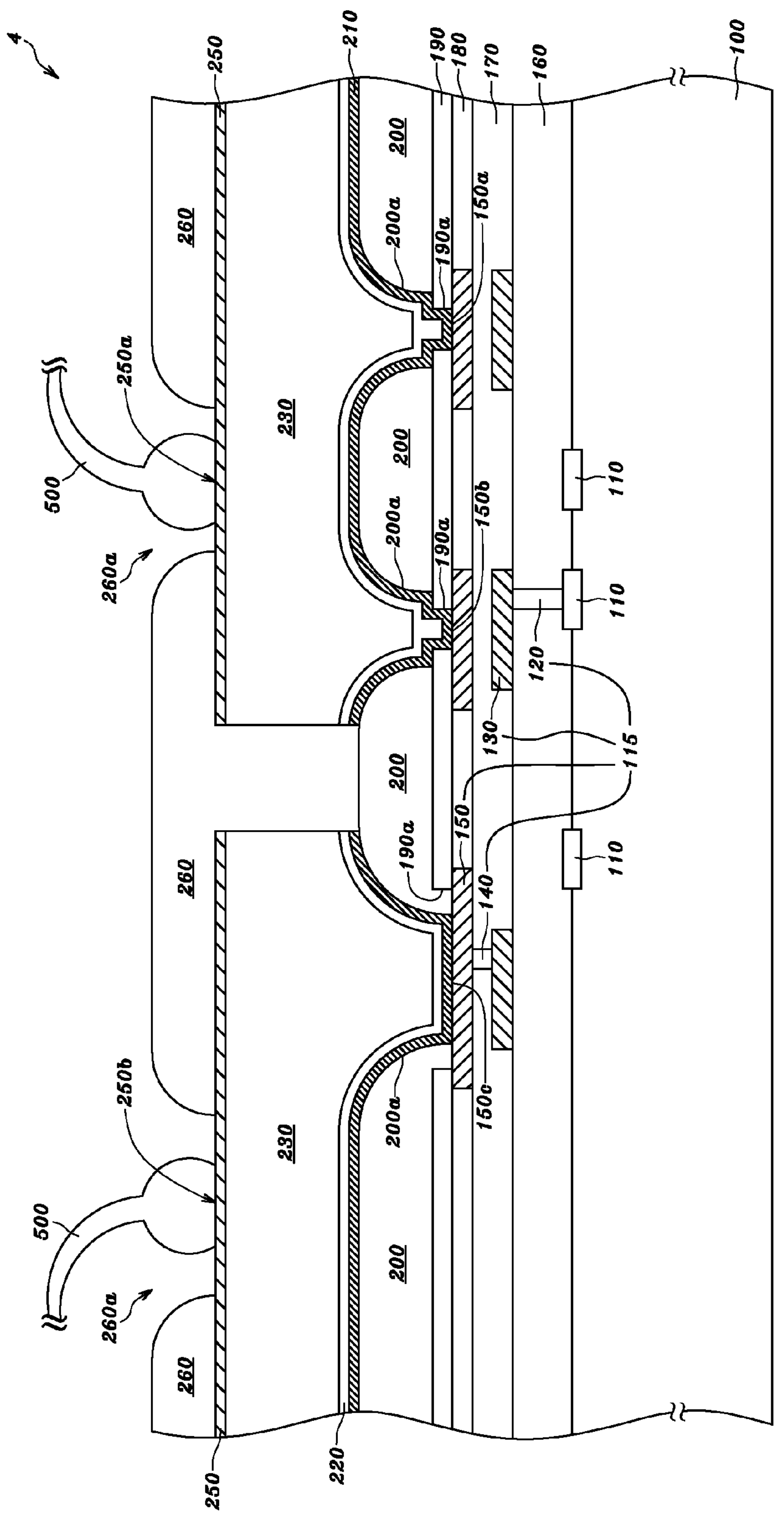

Referring to FIG. 7E, after the polymer layer 260 is formed, the semiconductor wafer 2 can be cut into a plurality of individual semiconductor chips 4 (only one of them is shown) by a dice sawing process.

Next, via a wire-bonding process, two wires 500, made of gold, copper or aluminum, can be ball bonded on the contact points 250*a* and 250*b* of the bonding layer 250 of the semiconductor chip 4. Alternatively, via a wire-bonding process, the wires 500, made of gold, copper or aluminum, can be wedge bonded on the contact points 250*a* and 250*b* of the bonding layer 250 of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 7F:
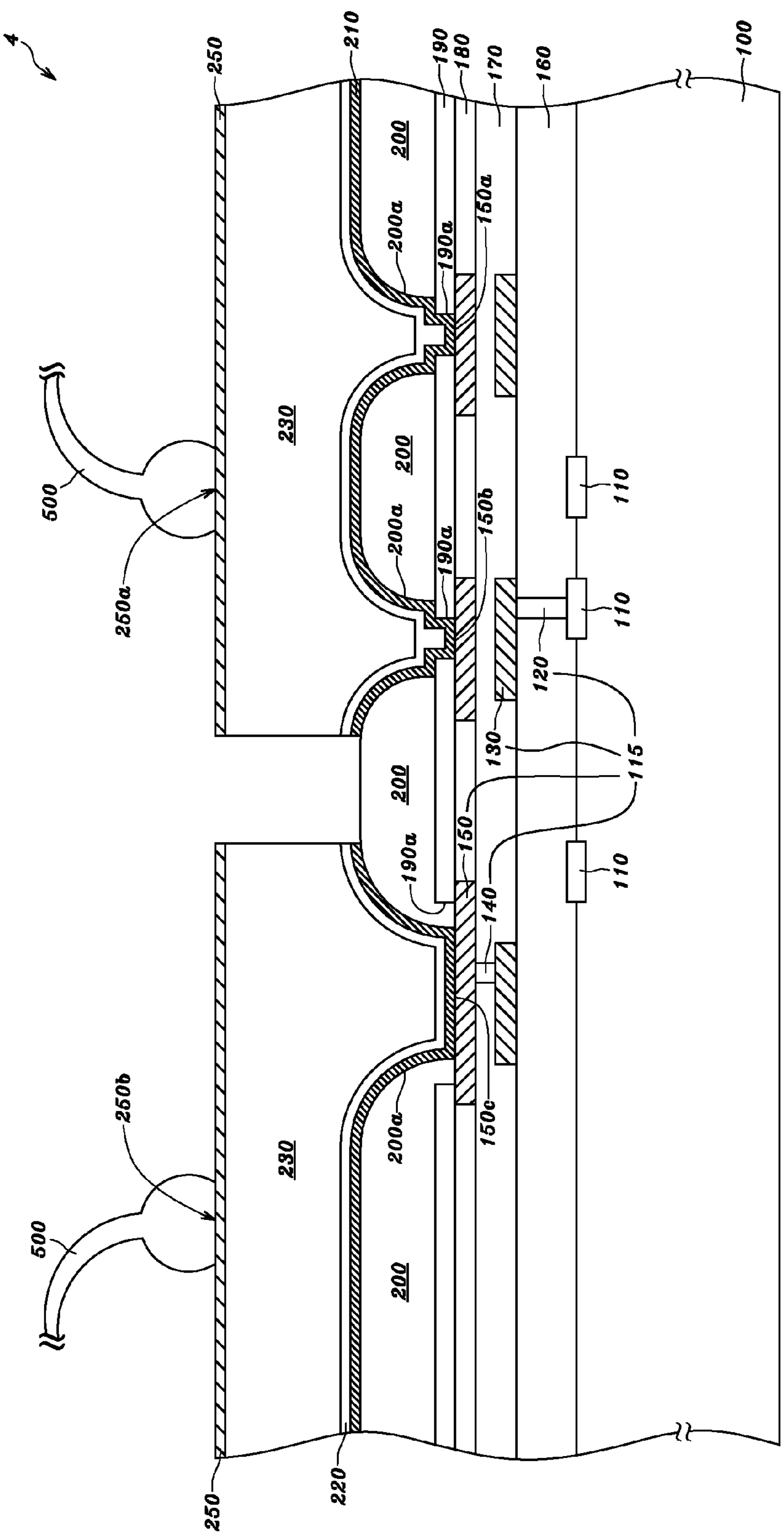
FIGS. 7F and 7H are cross-sectional views showing a semiconductor chip with a thick metal layer and a wirebonded wire bonded to the thick metal layer.

Alternatively, referring to FIG. 7F, the step of forming the polymer layer 260 as shown in FIG. 7D can be omitted, that is, after performing the above-mentioned steps as shown in FIGS. 7A-7C, the step illustrated in FIG. 7E can be performed without the polymer layer 260 formed on the bonding layer 250, on the polymer layer 200 and in the gap between the neighboring metal traces provided by the adhesion/barrier 210, the seed layer 220, the copper layer 230 and the bonding layer 250.

Figure 7G:
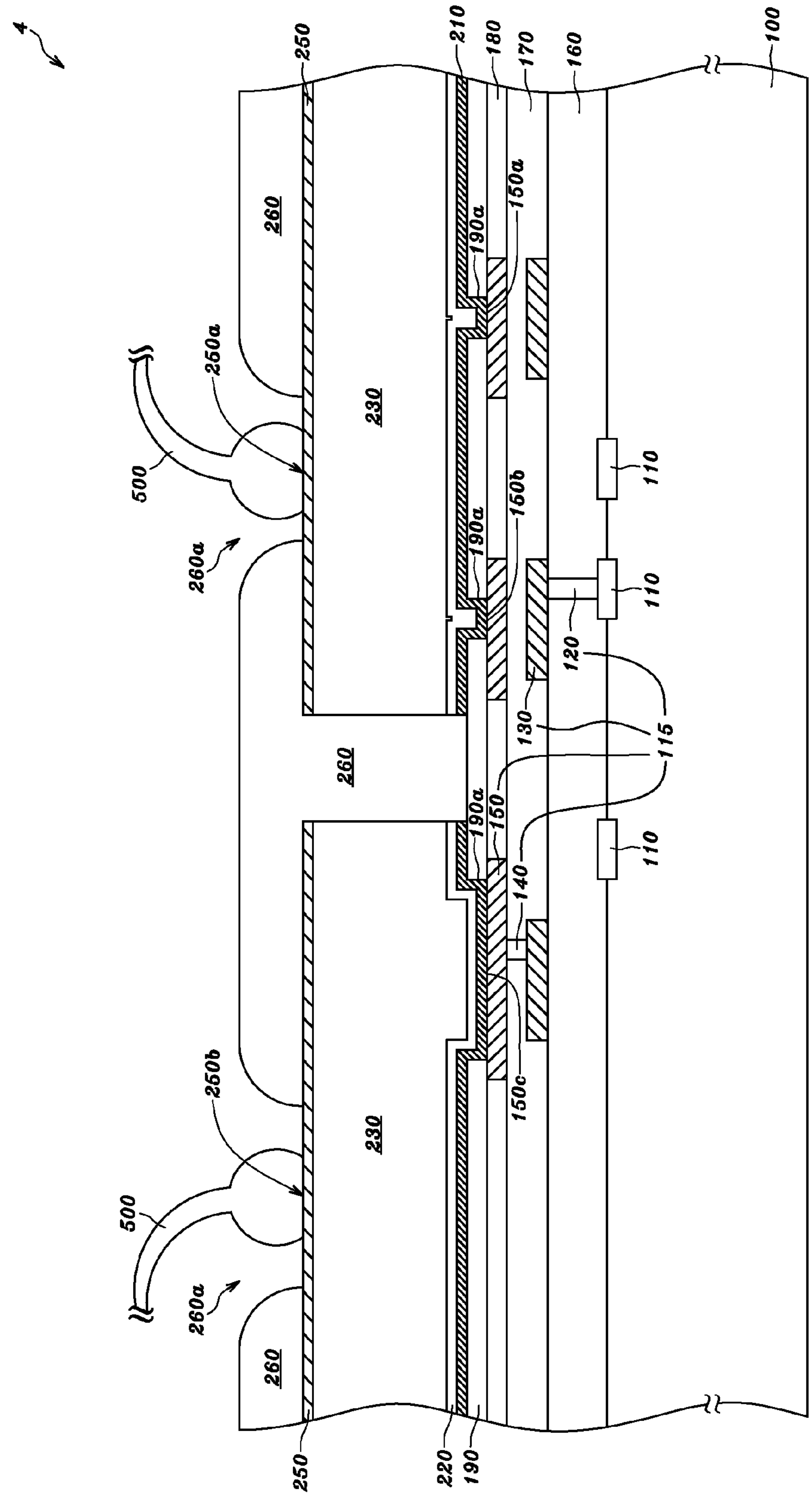

Alternatively, referring to FIG. 7G, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned step as shown in FIG. 4B, followed by performing the above-mentioned steps as shown in FIGS. 7A-7C, followed by forming the polymer layer 260 on the bonding layer 250, on the passivation layer 190 and in the gap between the neighboring metal traces provided by the adhesion/barrier 210, the seed layer 220, the copper layer 230 and the bonding layer 250, followed by performing the above-mentioned step as shown in FIG. 7E. The process of forming the adhesion/barrier layer 210 shown in FIG. 7G can be referred to as the process of forming the adhesion/barrier layer 210 as illustrated in FIG. 4A. The process of forming the seed layer 220 shown in FIG. 7G can be referred to as the process of forming the seed layer 220 as illustrated in FIG. 4A. The process of forming the polymer layer 260 shown in FIG. 7G can be referred to as the process of forming the polymer layer 260 as illustrated in FIG. 4F.

Figure 7H:
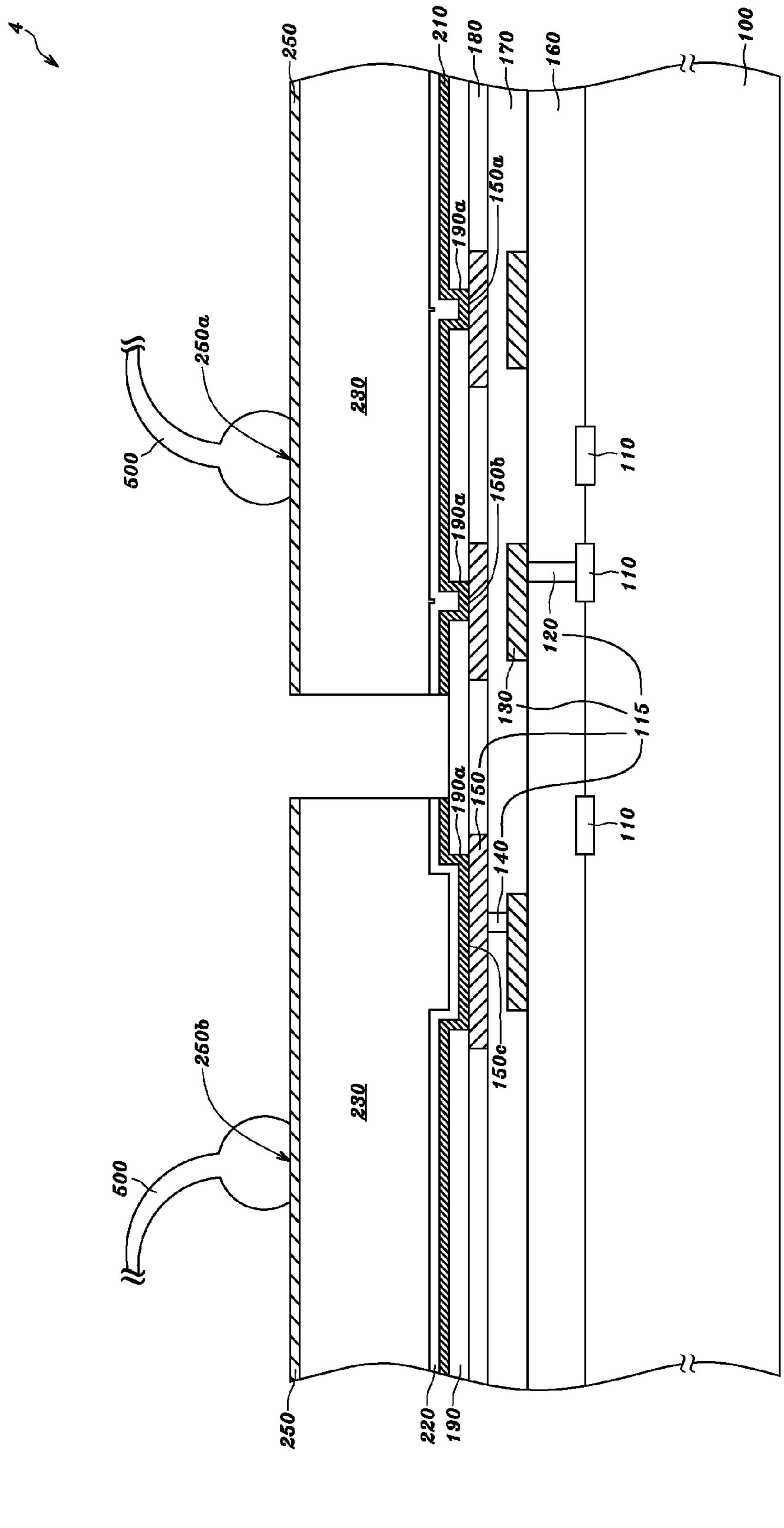

Alternatively, referring to FIG. 7H, the step of forming the polymer layer 200 as shown in FIG. 3 and the step of forming the polymer layer 260 as shown in FIG. 7D can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned step as shown in FIG. 4B, followed by performing the above-mentioned steps as shown in FIGS. 7A-7C, followed by performing the above-mentioned step as shown in FIG. 7E without the polymer layer 260 formed on the bonding layer 250, on the passivation layer 190 and in the gap between the neighboring metal traces provided by the adhesion/barrier 210, the seed layer 220, the copper layer 230 and the bonding layer 250. The process of forming the adhesion/barrier layer 210 shown in FIG. 7H can be referred to as the process of forming the adhesion/barrier layer 210 as illustrated in FIG. 4A. The process of forming the seed layer 220 shown in FIG. 7H can be referred to as the process of forming the seed layer 220 as illustrated in FIG. 4A.

Embodiment 5

Figure 8A:
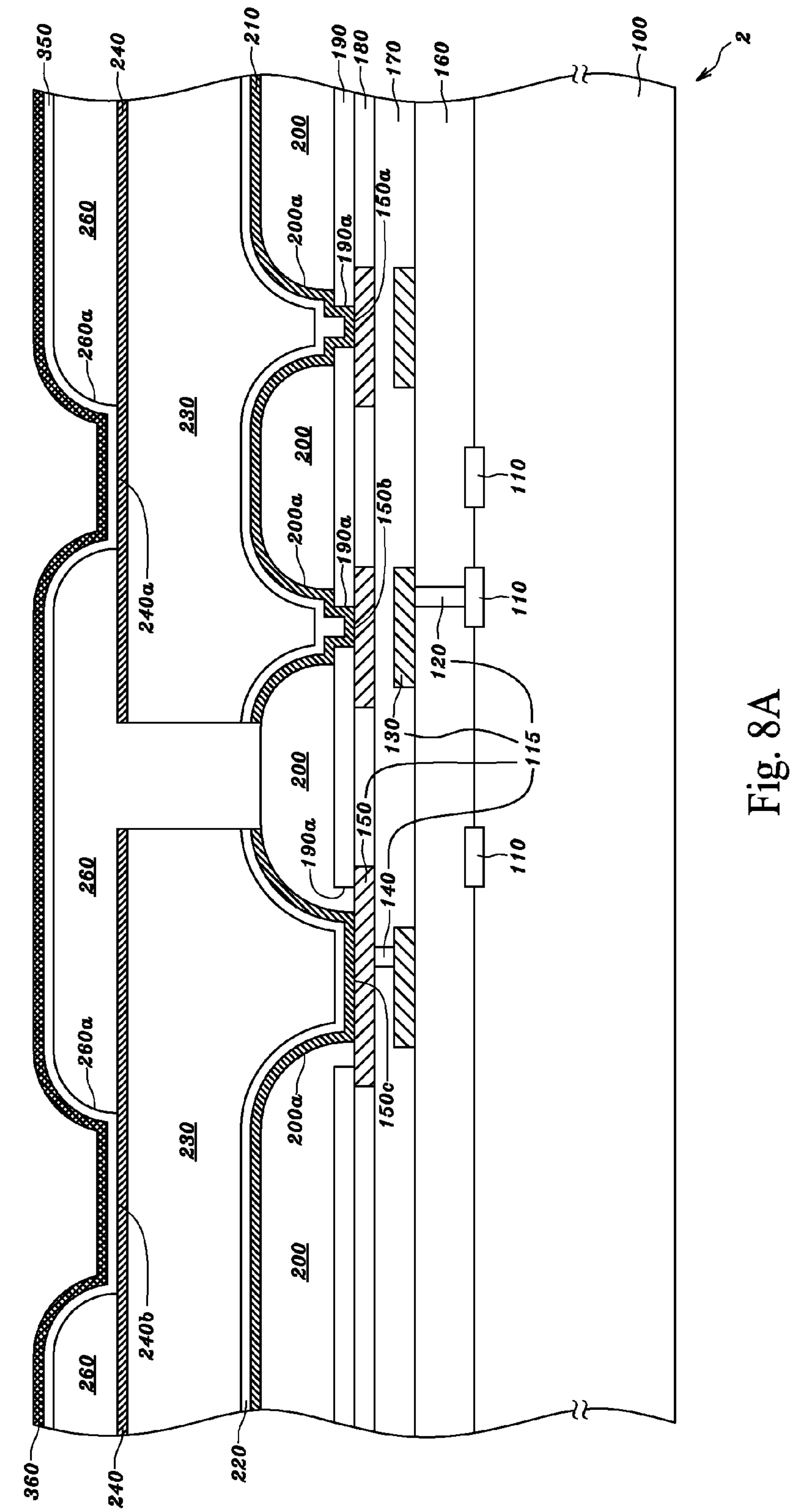
FIGS. 8A-8G are cross-sectional views showing a process for forming a semiconductor chip and bonding a wirebonded wire to the semiconductor chip according to one embodiment of the present invention.

Referring to FIG. 8A, after the step shown in FIG. 4F, an adhesion/barrier layer 350 having a thickness between 0.02 and 0.5 micrometers, and preferably between 0.1 and 0.2 micrometers, can be formed on the polymer layer 260 and on the contact points 240*a* and 240*b* exposed by the openings 260*a*. The adhesion/barrier layer 350 can be formed by a physical vapor deposition (PVD) process, such as a sputtering process or an evaporation process. The material of the adhesion/barrier layer 350 can be titanium, a titanium-tungsten alloy, titanium nitride, chromium, tantalum, tantalum nitride or a composite of the above-mentioned materials.

In a case, the adhesion/barrier layer 350 can be formed by sputtering a titanium layer, a titanium-nitride layer, a titanium-tungsten-alloy layer or a chromium layer with a thickness between 0.02 and 0.5 micrometers, and preferably between 0.1 and 0.2 micrometers, on the polymer layer 260 and on the contact points 240*a* and 240*b* exposed by the openings 260*a*. In another case, the adhesion/barrier layer 350 can be formed by sputtering a titanium layer with a thickness between 0.01 and 0.15 micrometers on the polymer layer 260 and on the contact points 240*a* and 240*b* exposed by the openings 260*a*, and then sputtering a titanium-tungsten-alloy layer with a thickness between 0.1 and 0.35 micrometers on the titanium layer.

Next, a seed layer 360 having a thickness between 0.1 and 1 micrometers, and preferably between 0.2 and 0.5 micrometers, is formed on the adhesion/barrier layer 350. The seed layer 360 can be formed by a physical vapor deposition (PVD) process, such as a sputtering process or an evaporation process. The material of the seed layer 360 can be copper. The seed layer 360 is beneficial to electroplating a metal layer thereon.

In a case, when the adhesion/barrier layer 350 is formed by sputtering a titanium-containing layer with a thickness between 0.02 and 0.5 micrometers, and preferably between 0.1 and 0.2 micrometers, on the polymer layer 260 and on the contact points 240*a* and 240*b* exposed by the openings 260*a*, the seed layer 360 can be formed by sputtering a copper layer with a thickness between 0.1 and 1 micrometers, and preferably between 0.2 and 0.5 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer.

In another case, when the adhesion/barrier layer 350 is formed by sputtering a chromium layer with a thickness between 0.02 and 0.5 micrometers, and preferably between 0.1 and 0.2 micrometers, on the polymer layer 260 and on the contact points 240*a* and 240*b* exposed by the openings 260*a*, the seed layer 360 can be formed by sputtering a copper layer with a thickness between 0.1 and 1 micrometers, and preferably between 0.2 and 0.5 micrometers, on the chromium layer.

Figure 8B:
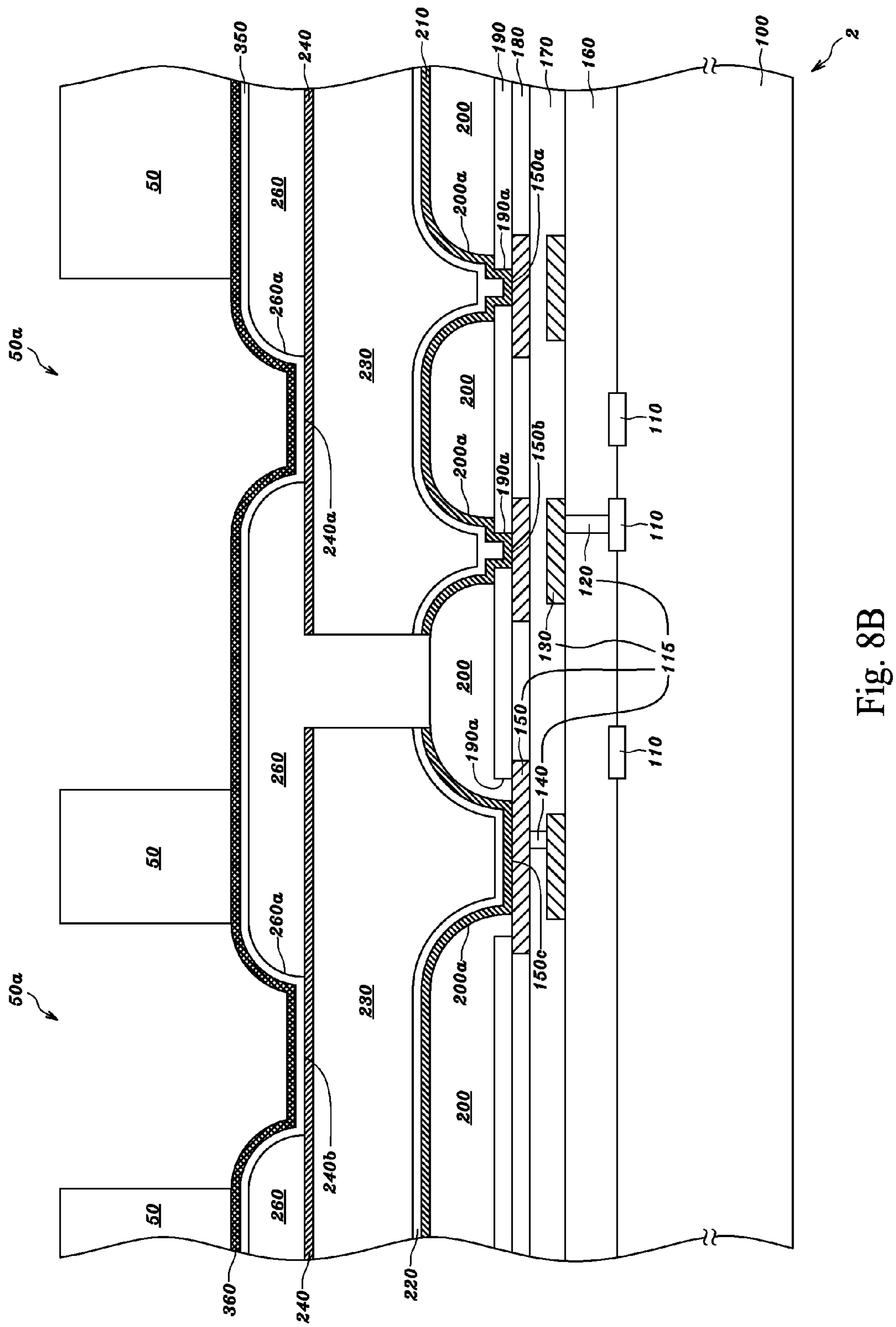

Referring to FIG. 8B, a photoresist layer 50, such as a positive-type photoresist layer or a negative-type photoresist layer, having a thickness between 5 and 30 micrometers, and preferably between 10 and 25 micrometers, is formed on the seed layer 360 by a spin-on coating process, a lamination process, a screen-printing process or a spraying process. Next, the photoresist layer 50 is patterned with the processes of exposure and development to form openings 50*a* in the photoresist layer 50 exposing the seed layer 360. A 1× stepper or a 1× contact aligner can be used to expose the photoresist layer 50 during the process of exposure.

For example, the photoresist layer 50 can be formed by spin-on coating a positive-type photosensitive polymer layer having a thickness between 5 and 30 micrometers, and preferably between 10 and 25 micrometers, on the seed layer 360, then exposing the photosensitive polymer layer using a 1× stepper or contact aligner with at least two of G-line, H-line and I-line, wherein G-line has a wavelength ranging from 434 to 438 nm, H-line has a wavelength ranging from 403 to 407 nm, and I-line has a wavelength ranging from 363 to 367 nm, then developing the exposed polymer layer by spraying and puddling a developer on the semiconductor wafer 2 or by immersing the semiconductor wafer 2 into a developer, and then cleaning the semiconductor wafer 2 using deionized wafer and drying the semiconductor wafer 2 by spinning the semiconductor wafer 2. After development, a scum removal process of removing the residual polymeric material or other contaminants from the seed layer 360 may be conducted by using an $O_2$ plasma or a plasma containing fluorine of below 200 PPM and oxygen. By these processes, the photoresist layer 50 can be patterned with the openings 50*a* in the photoresist layer 50 exposing the seed layer 360.

Figure 8C:
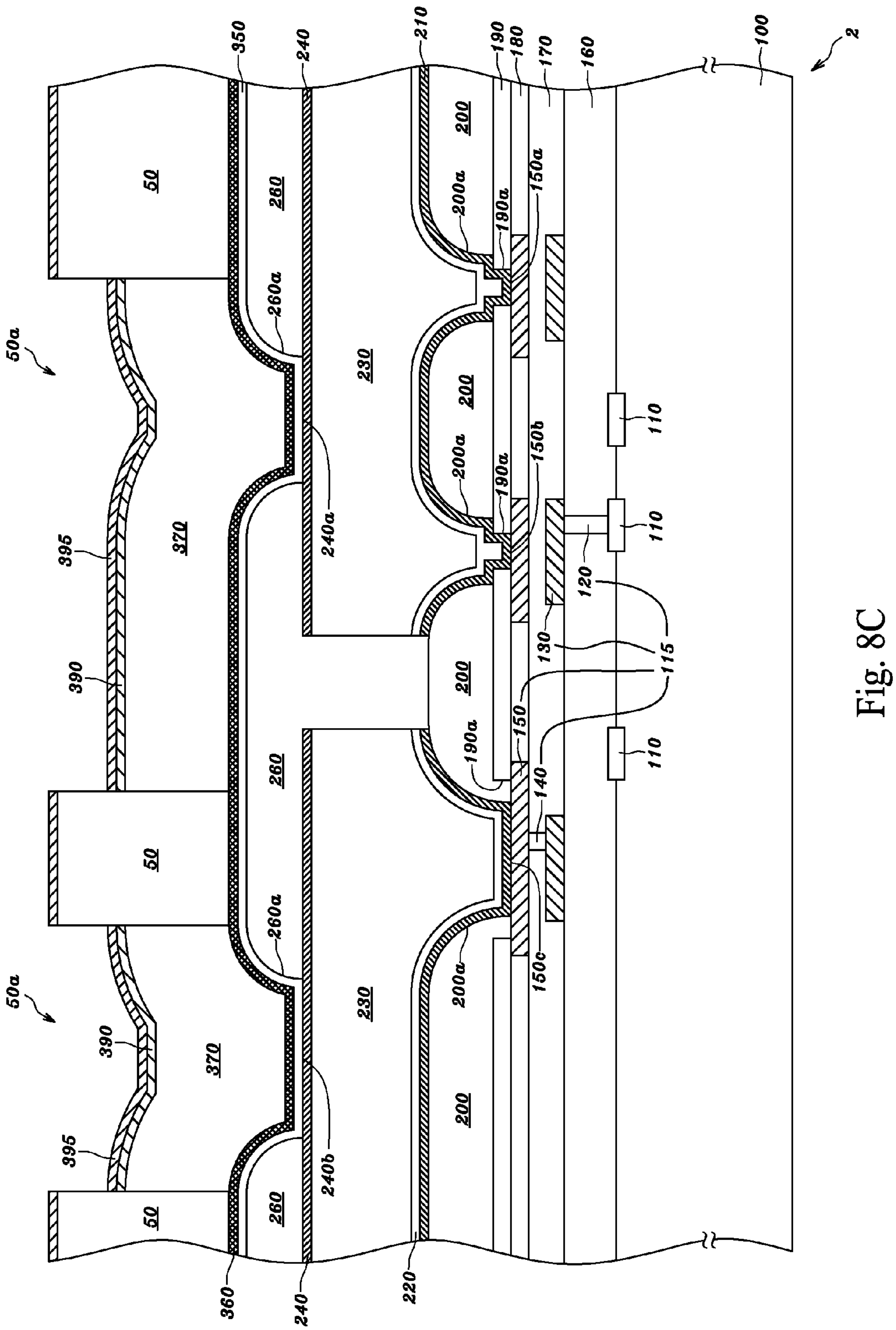

Referring to FIG. 8C, a copper layer 370 having a thickness between 3 and 25 micrometers, and preferably between 10 and 20 micrometers, can be electroplated or electroless plated on the seed layer 360 exposed by the openings 50*a* in the photoresist layer 50. Next, a barrier layer 390 having a thickness between 0.1 and 5 micrometers, and preferably between 0.1 and 1 micrometers, can be electroplated or electroless plated on the copper layer 370. The material of the barrier layer 390 can be nickel or cobalt. Next, a bonding layer 395 having a thickness between 0.01 and 2 micrometers can be formed on the barrier layer 390 by a sputtering process. The bonding layer 395 can be a gold layer with a thickness between 0.01 and 2 micrometers, a platinum layer with a thickness between 0.01 and 2 micrometers, or a palladium layer with a thickness between 0.01 and 2 micrometers.

In a case, when the barrier layer 390 is formed by electroplating or electroless plating a nickel layer with a thickness between 0.1 and 5 micrometers, and preferably between 0.1 and 1 micrometers, on the copper layer 370, the bonding layer 395 can be formed by sputtering a gold layer with a thickness between 0.01 and 2 micrometers on the nickel layer.

In another case, when the barrier layer 390 is formed by electroplating or electroless plating a nickel layer with a thickness between 0.1 and 5 micrometers, and preferably between 0.1 and 1 micrometers, on the copper layer 370, the bonding layer 395 can be formed by sputtering a platinum layer with a thickness between 0.01 and 2 micrometers on the nickel layer.

In another case, when the barrier layer 390 is formed by electroplating or electroless plating a nickel layer with a thickness between 0.1 and 5 micrometers, and preferably between 0.1 and 1 micrometers, on the copper layer 370, the bonding layer 395 can be formed by sputtering a palladium layer with a thickness between 0.01 and 2 micrometers on the nickel layer.

In another case, when the barrier layer 390 is formed by electroplating or electroless plating a cobalt layer with a thickness between 0.1 and 5 micrometers, and preferably between 0.1 and 1 micrometers, on the copper layer 370, the bonding layer 395 can be formed by sputtering a gold layer with a thickness between 0.01 and 2 micrometers on the cobalt layer.

In another case, when the barrier layer 390 is formed by electroplating or electroless plating a cobalt layer with a thickness between 0.1 and 5 micrometers, and preferably between 0.1 and 1 micrometers, on the copper layer 370, the bonding layer 395 can be formed by sputtering a platinum layer with a thickness between 0.01 and 2 micrometers on the cobalt layer.

In another case, when the barrier layer 390 is formed by electroplating or electroless plating a cobalt layer with a thickness between 0.1 and 5 micrometers, and preferably between 0.1 and 1 micrometers, on the copper layer 230, the bonding layer 395 can be formed by sputtering a palladium layer with a thickness between 0.01 and 2 micrometers on the cobalt layer.

Figure 8D:
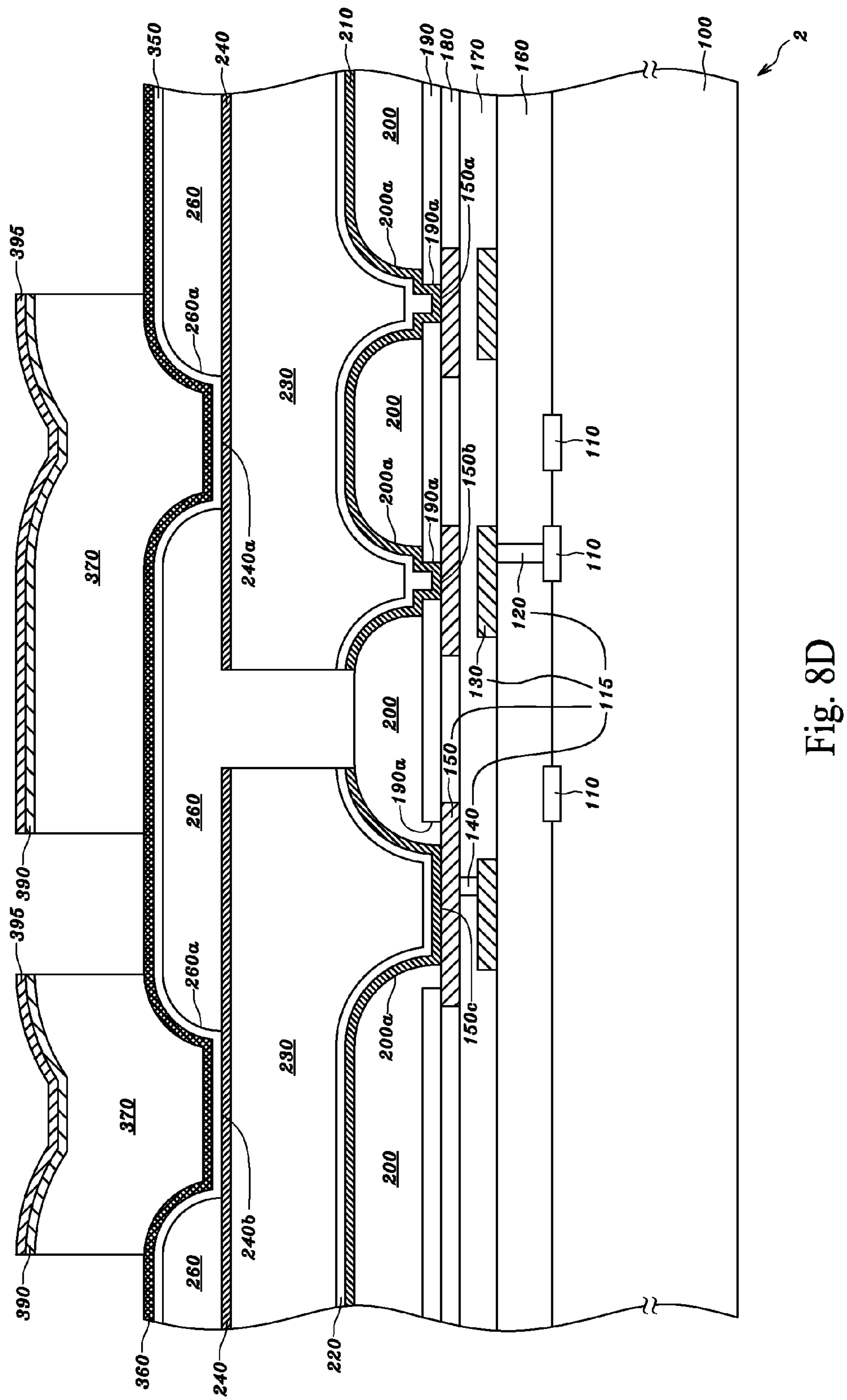

Referring to FIG. 8D, after the bonding layer 395 is formed, the photoresist layer 50 can be removed using an inorganic solution or using an organic solution with amide. Some residuals from the photoresist layer 50 could remain on the bonding layer 395 and on the seed layer 360 not under the copper layer 370. Thereafter, the residuals can be removed from the bonding layer 395 and from the seed layer 360 with a plasma, such as an $O_2$ plasma or a plasma containing fluorine of below 200 PPM and oxygen.

Figure 8E:
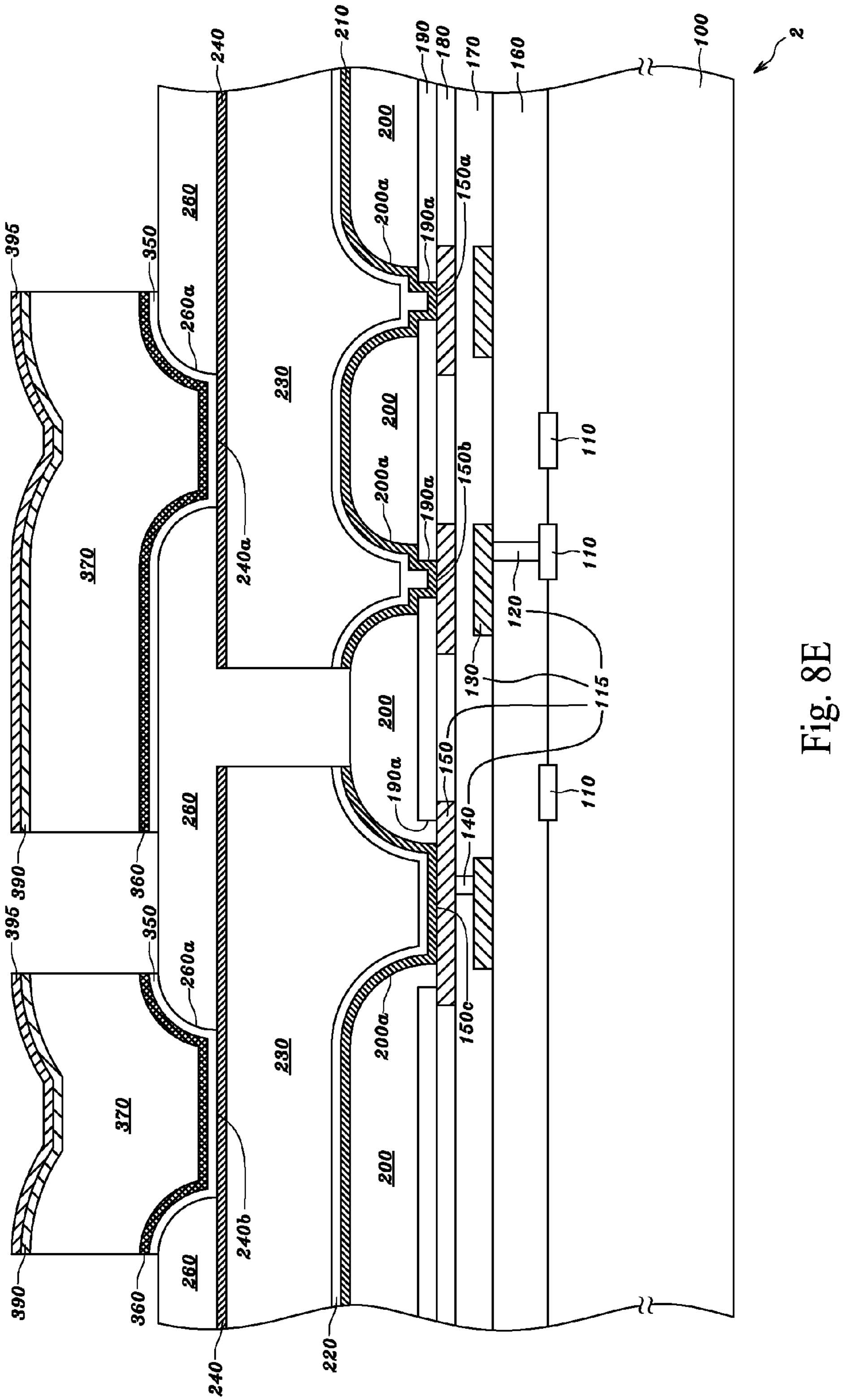

Referring to FIG. 8E, the seed layer 360 and the adhesion/barrier layer 350 not under the copper layer 370 are subsequently removed with an etching method. In a case, the seed layer 360 and the adhesion/barrier layer 350 not under the copper layer 370 can be subsequently removed by a dry etching method. As to the dry etching method, both the seed layer 360 and the adhesion/barrier layer 350 not under the copper layer 370 can be subsequently removed by an Ar sputtering etching process; alternatively, both the seed layer 360 and the adhesion/barrier layer 350 not under the copper layer 370 can be subsequently removed by a reactive ion etching (RIE) process; alternatively, the seed layer 360 not under the copper layer 370 can be removed by an Ar sputtering etching process, and the adhesion/barrier layer 350 not under the copper layer 370 can be removed by a reactive ion etching (RIE) process. In another case, the seed layer 360 and the adhesion/barrier layer 350 not under the copper layer 370 can be subsequently removed by a wet etching method. As to the wet etching method, when the seed layer 360 is a copper layer, it can be etched with a solution containing $NH_4OH$ or with a solution containing $H_2SO_4$; when the adhesion/barrier layer 350 is a titanium-tungsten-alloy layer, it can be etched with a solution containing hydrogen peroxide or with a solution containing $NH_4OH$ and hydrogen peroxide; when the adhesion/barrier layer 350 is a titanium layer, it can be etched with a solution containing hydrogen fluoride or with a solution containing $NH_4OH$ and hydrogen peroxide; when the adhesion/barrier layer 350 is a chromium layer, it can be etched with a solution containing potassium ferricyanide. In another case, the seed layer 360, such as copper, not under the copper layer 370 can be removed by a solution containing $NH_4OH$ or a solution containing $H_2SO_4$, and the adhesion/barrier layer 350 not under the copper layer 370 can be removed by a reactive ion etching (RIE) process. In another case, the seed layer 360, such as copper, not under the copper layer 370 can be removed by a solution containing $NH_4OH$ or a solution containing $H_2SO_4$, and the adhesion/barrier layer 350 not under the copper layer 370 can be removed by an Ar sputtering etching process.

Figure 8F:
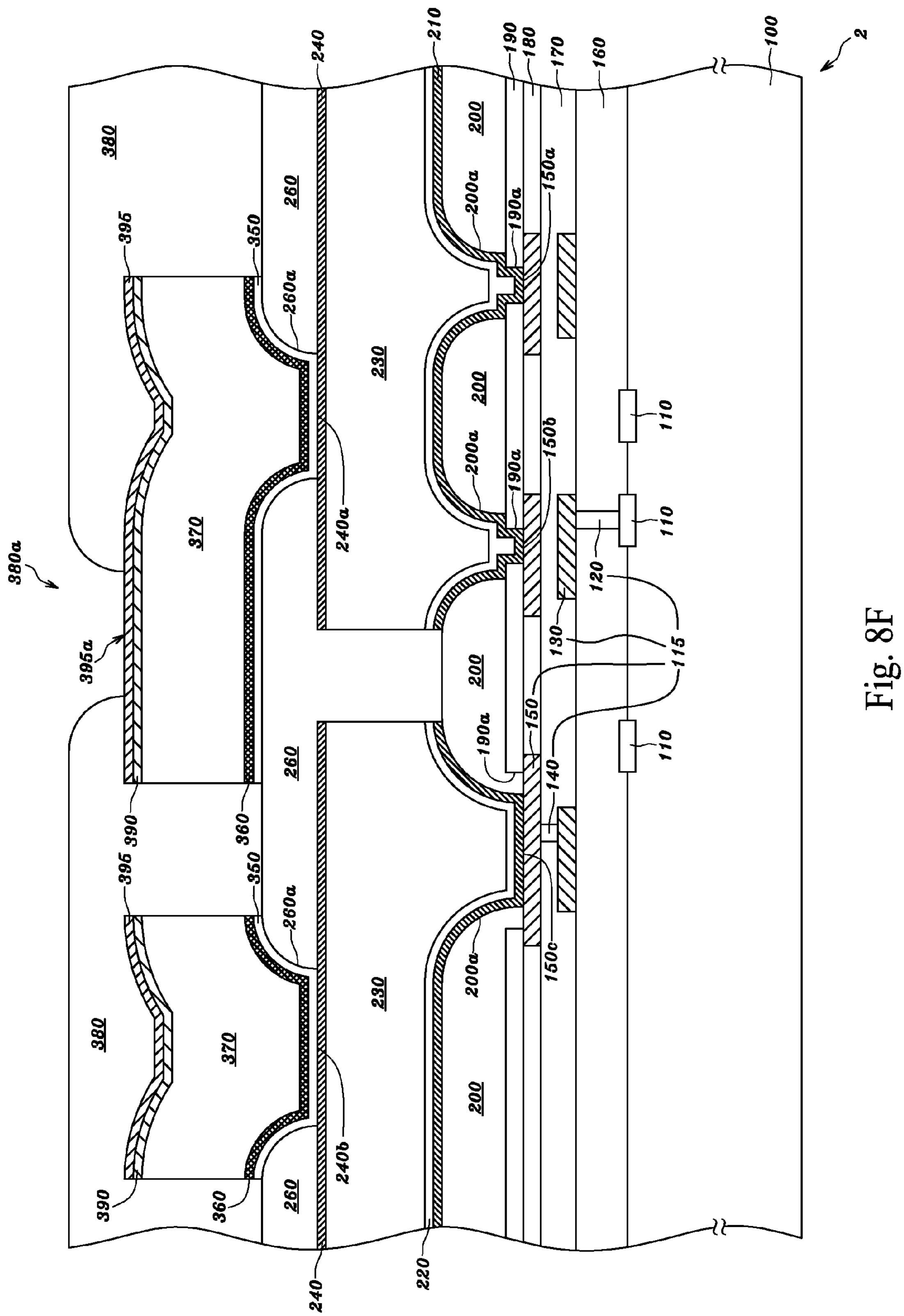

Referring to FIG. 8F, a polymer layer 380 can be formed on the bonding layer 395, on the polymer layer 260 and in the gap between neighboring metal traces provided by the adhesion/barrier 350, the seed layer 360, the copper layer 370, the barrier layer 390 and the bonding layer 395 by a process including a spin-on coating process, a lamination process, a screen-printing process or a spraying process, and an opening 380*a* in the polymer layer 380 exposes a contact point 395*a* of the bonding layer 395. The polymer layer 380 has a thickness between 3 and 25 micrometers, and preferably between 5 and 15 micrometers, and the material of the polymer layer 380 may include benzocyclobutane (BCB), polyimide (PI), polybenzoxazole (PBO) or epoxy resin.

In a case, the polymer layer 380 can be formed by spin-on coating a negative-type photosensitive polyimide layer having a thickness between 6 and 50 micrometers on the bonding layer 395, on the polymer layer 260 and in the gap between neighboring metal traces provided by the adhesion/barrier 350, the seed layer 360, the copper layer 370, the barrier layer 390 and the bonding layer 395, then baking the spin-on coated polyimide layer, then exposing the baked polyimide layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form an opening exposing the contact points 395*a*, then curing or heating the developed polyimide layer at a temperature between 180 and 400° C. for a time between 20 and 150 minutes in a nitrogen ambient or in an oxygen-free ambient, the cured polyimide layer having a thickness between 3 and 25 micrometers, and then removing the residual polymeric material or other contaminants from the contact point 395*a* with an $O_2$ plasma or a plasma containing fluorine of below 200 PPM and oxygen. By the way, the polymer layer 380 can be formed on the bonding layer 395, on the polymer layer 260 and in the gap between neighboring metal traces provided by the adhesion/barrier 350, the seed layer 360, the copper layer 370, the barrier layer 390 and the bonding layer 395, and the opening 380*a* formed in the polymer layer 380 exposes the contact point 395*a*. For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient.

In another case, the polymer layer 380 can be formed by spin-on coating a positive-type photosensitive polybenzoxazole layer having a thickness of between 3 and 25 micrometers on the bonding layer 395, on the polymer layer 260 and in the gap between neighboring metal traces provided by the adhesion/barrier 350, the seed layer 360, the copper layer 370, the barrier layer 390 and the bonding layer 395, then baking the spin-on coated polybenzoxazole layer, then exposing the baked polybenzoxazole layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to form an opening exposing the contact point 395*a*, then curing or heating the developed polybenzoxazole layer at a temperature between 150 and 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient, the cured polybenzoxazole layer having a thickness of between 3 and 25 μm, and then removing the residual polymeric material or other contaminants from the contact point 395*a* with an $O_2$ plasma or a plasma containing fluorine of below 200 PPM and oxygen. By the way, the polymer layer 380 can be formed on the bonding layer 395, on the polymer layer 260 and in the gap between neighboring metal traces provided by the adhesion/barrier 350, the seed layer 360, the copper layer 370, the barrier layer 390 and the bonding layer 395, and the opening 380*a* formed in the polymer layer 380 exposes the contact point 395*a*.

Figure 8G:
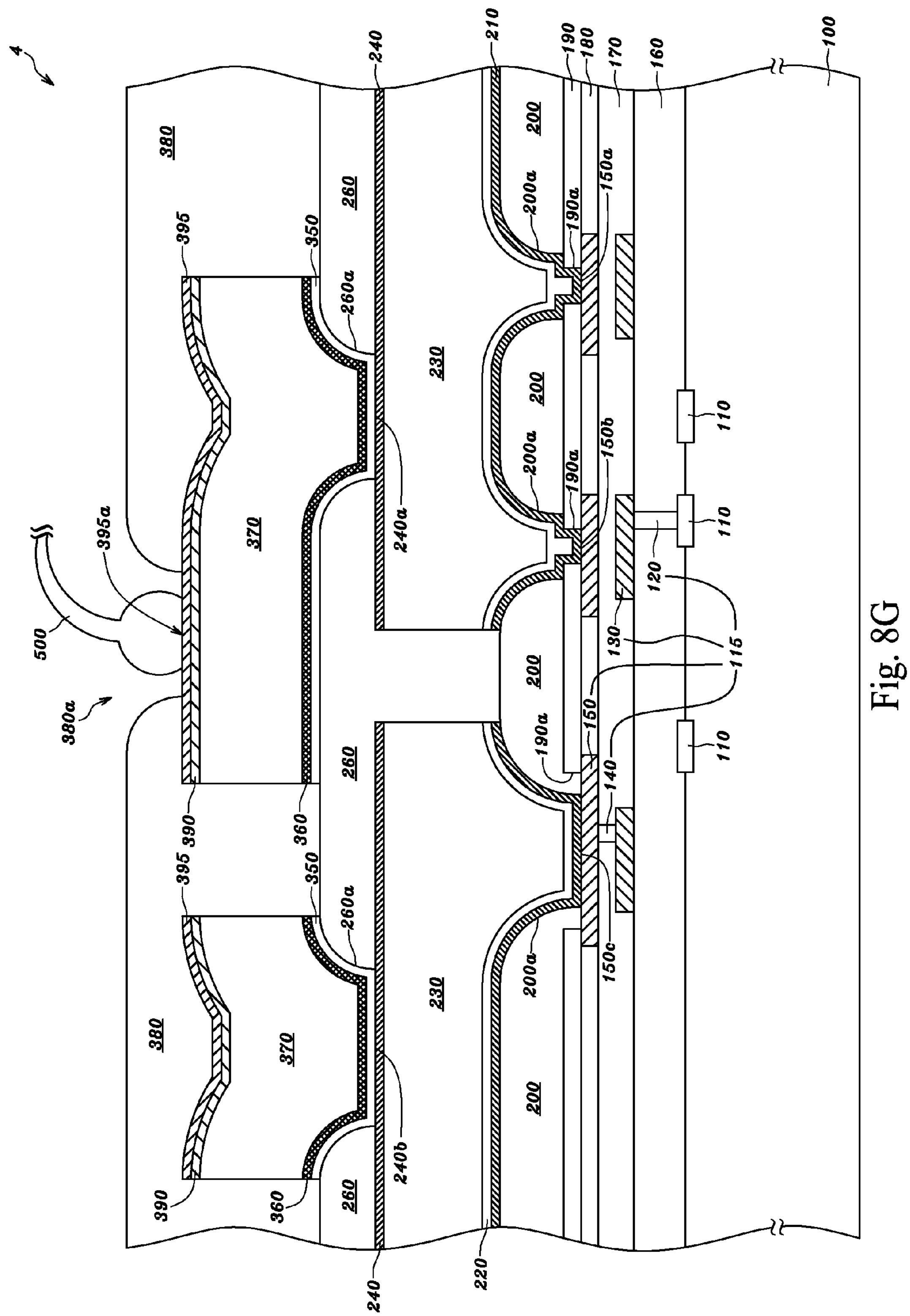

Referring to FIG. 8G, after the polymer layer 380 is formed, the semiconductor wafer 2 can be cut into a plurality of individual semiconductor chips 4 (only one of them is shown) by a dice sawing process.

Next, via a wire-bonding process, a wire 500, made of gold, copper or aluminum, can be ball bonded on the contact point 395*a* of the bonding layer 395 of the semiconductor chip 4. Alternatively, via a wire-bonding process, the wire 500, made of gold, copper or aluminum, can be wedge bonded on the contact point 395*a* of the bonding layer 395 of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 8H:
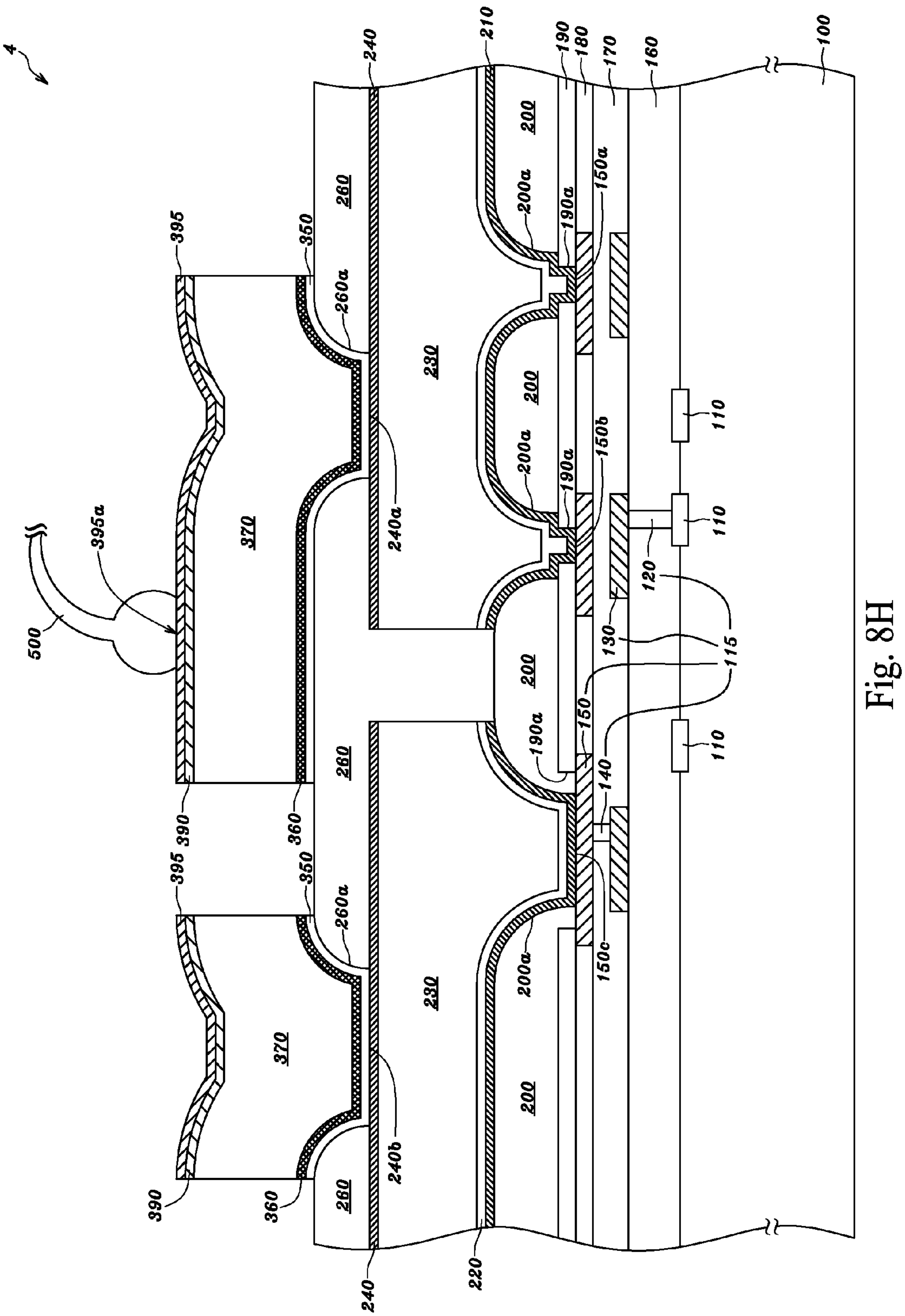
FIGS. 8H and 8J are cross-sectional views showing a semiconductor chip with two thick metal layers and a wirebonded wire bonded to the topmost thick metal layer.

Alternatively, referring to FIG. 8H, the step of forming the polymer layer 380 as shown in FIG. 8F can be omitted, that is, after performing the above-mentioned steps as shown in FIGS. 8A-8E, the step illustrated in FIG. 8G can be performed without the polymer layer 380 formed on the bonding layer 395, on the polymer layer 260 and in the gap between neighboring metal traces provided by the adhesion/barrier

350, the seed layer 360, the copper layer 370, the barrier layer 390 and the bonding layer 395.

Figure 8I:
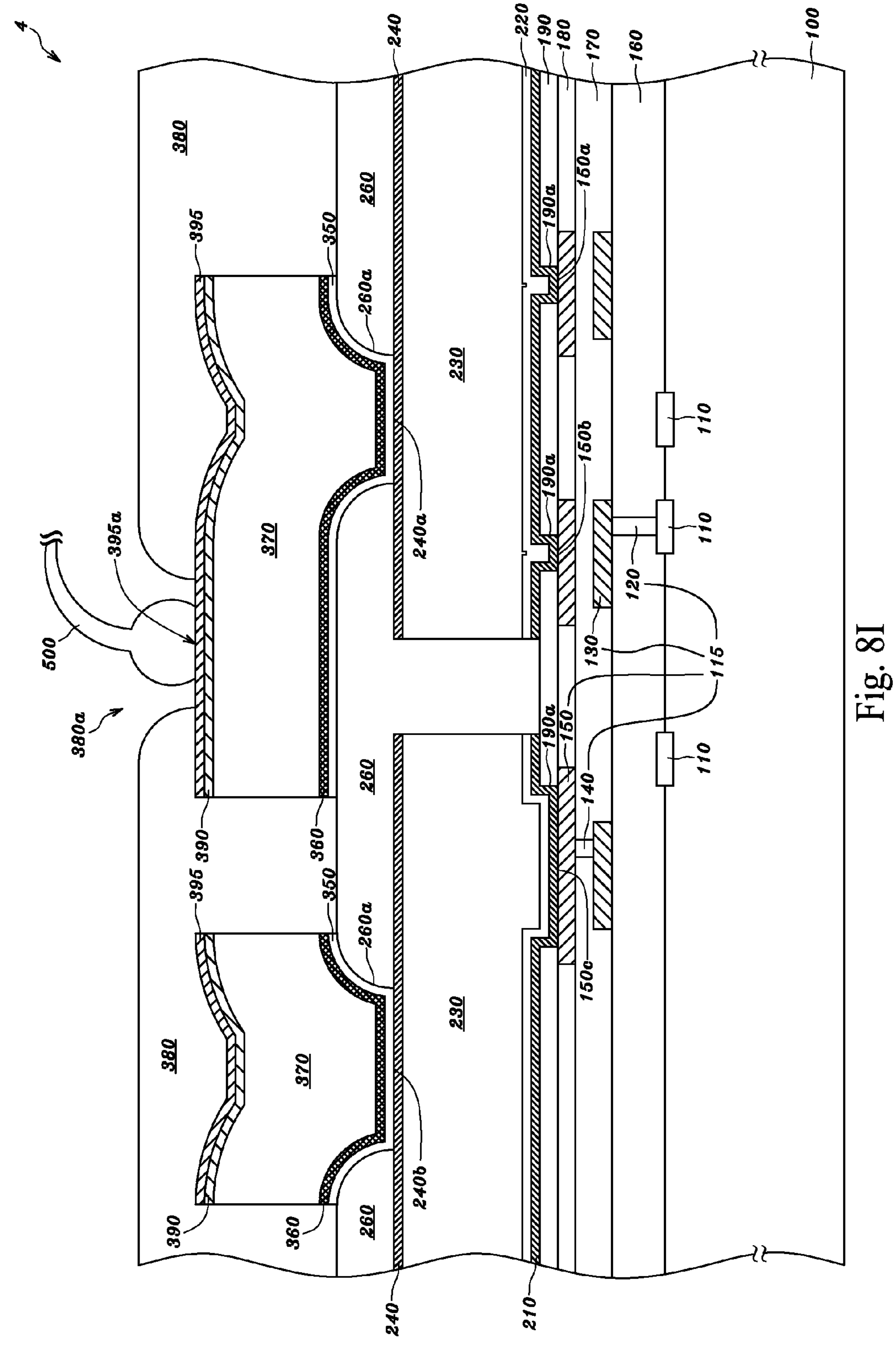

Alternatively, referring to FIG. 8I, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8G. The process of forming the adhesion/barrier layer 210 shown in FIG. 8I can be referred to as the process of forming the adhesion/barrier layer 210 as illustrated in FIG. 4A. The process of forming the seed layer 220 shown in FIG. 8I can be referred to as the process of forming the seed layer 220 as illustrated in FIG. 4A. The process of forming the polymer layer 260 shown in FIG. 8I can be referred to as the process of forming the polymer layer 260 as illustrated in FIG. 4F.

Figure 8J:
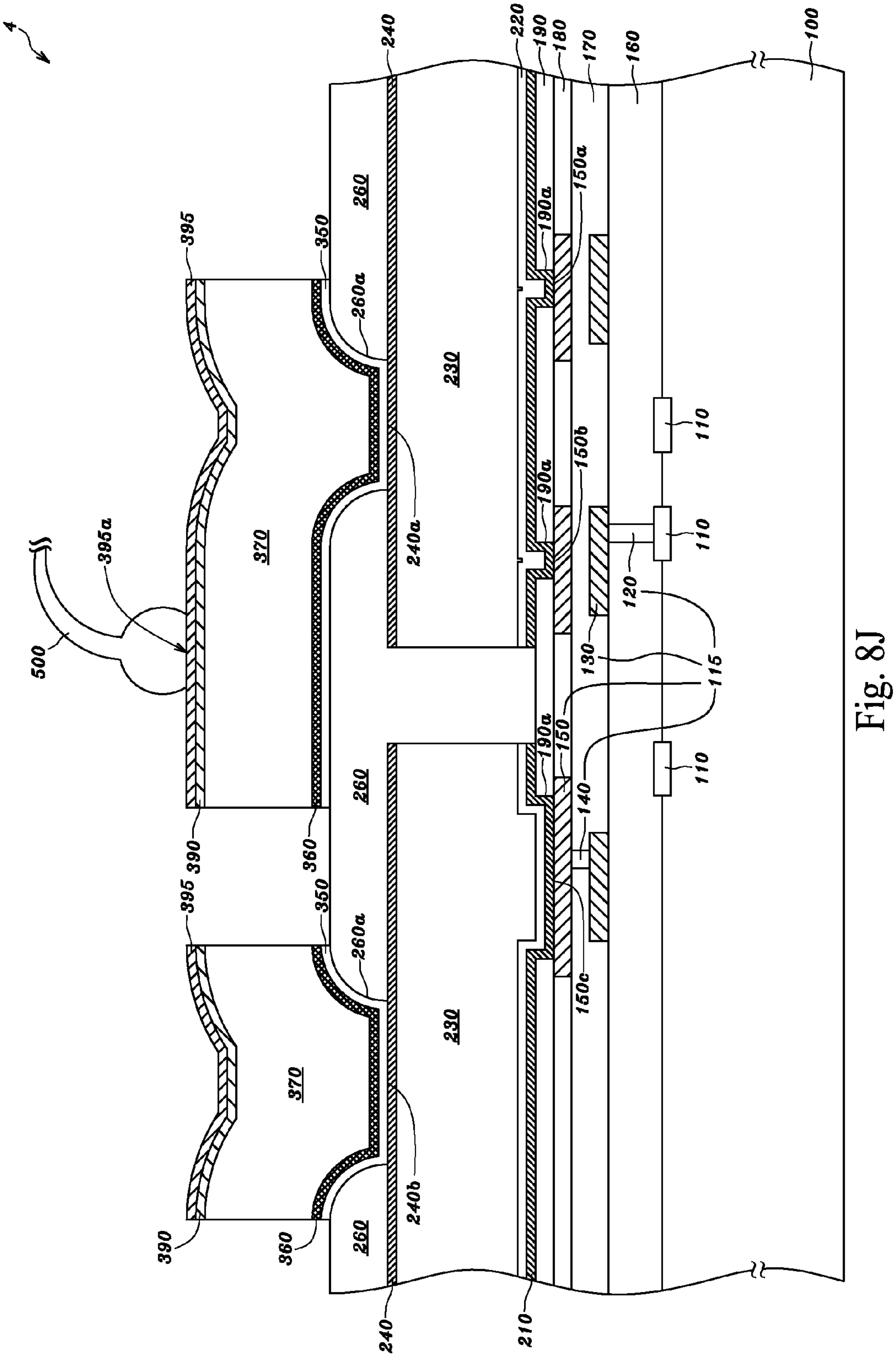

Alternatively, referring to FIG. 8J, the step of forming the polymer layer 200 as shown in FIG. 3 and the step of forming the polymer layer 380 as shown in FIG. 8F can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8E, followed by performing the above-mentioned step as shown in FIG. 8G without the polymer layer 380 formed on the bonding layer 395, on the polymer layer 260 and in the gap between neighboring metal traces provided by the adhesion/barrier 350, the seed layer 360, the copper layer 370, the barrier layer 390 and the bonding layer 395. The process of forming the adhesion/barrier layer 210 shown in FIG. 8J can be referred to as the process of forming the adhesion/barrier layer 210 as illustrated in FIG. 4A. The process of forming the seed layer 220 shown in FIG. 8J can be referred to as the process of forming the seed layer 220 as illustrated in FIG. 4A. The process of forming the polymer layer 260 shown in FIG. 8J can be referred to as the process of forming the polymer layer 260 as illustrated in FIG. 4F.

Embodiment 6

Figure 9A:
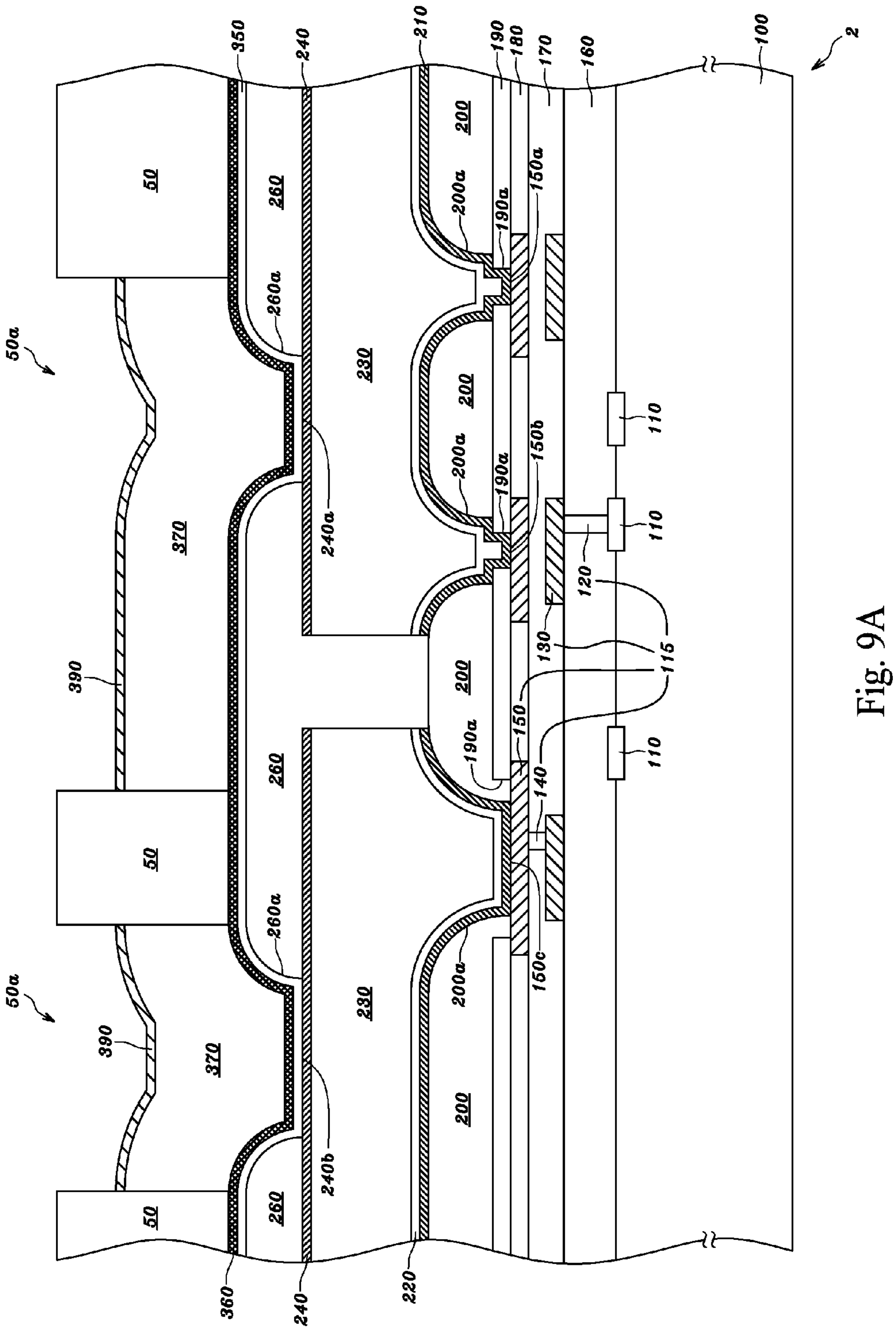
FIGS. 9A-9K are cross-sectional views showing a process for forming a semiconductor chip and bonding a wirebonded wire to the semiconductor chip according to one embodiment of the present invention.

Referring to FIG. 9A, after the step shown in FIG. 8B, a copper layer 370 having a thickness between 3 and 25 micrometers, and preferably between 10 and 20 micrometers, can be electroplated or electroless plated on the seed layer 360 exposed by the openings 50*a* in the photoresist layer 50. Next, a barrier layer 390 having a thickness between 0.1 and 5 micrometers, and preferably between 0.1 and 1 micrometers, can be electroplated or electroless plated on the copper layer 370. The material of the barrier layer 390 can be nickel or cobalt.

In a case, the barrier layer 390 can be formed by electroplating or electroless plating a nickel layer with a thickness between 0.1 and 5 micrometers, and preferably between 0.1 and 1 micrometers, on the copper layer 370.

In another case, the barrier layer 390 can be formed by electroplating or electroless plating a cobalt layer with a thickness between 0.1 and 5 micrometers, and preferably between 0.1 and 1 micrometers, on the copper layer 370.

Figure 9B:
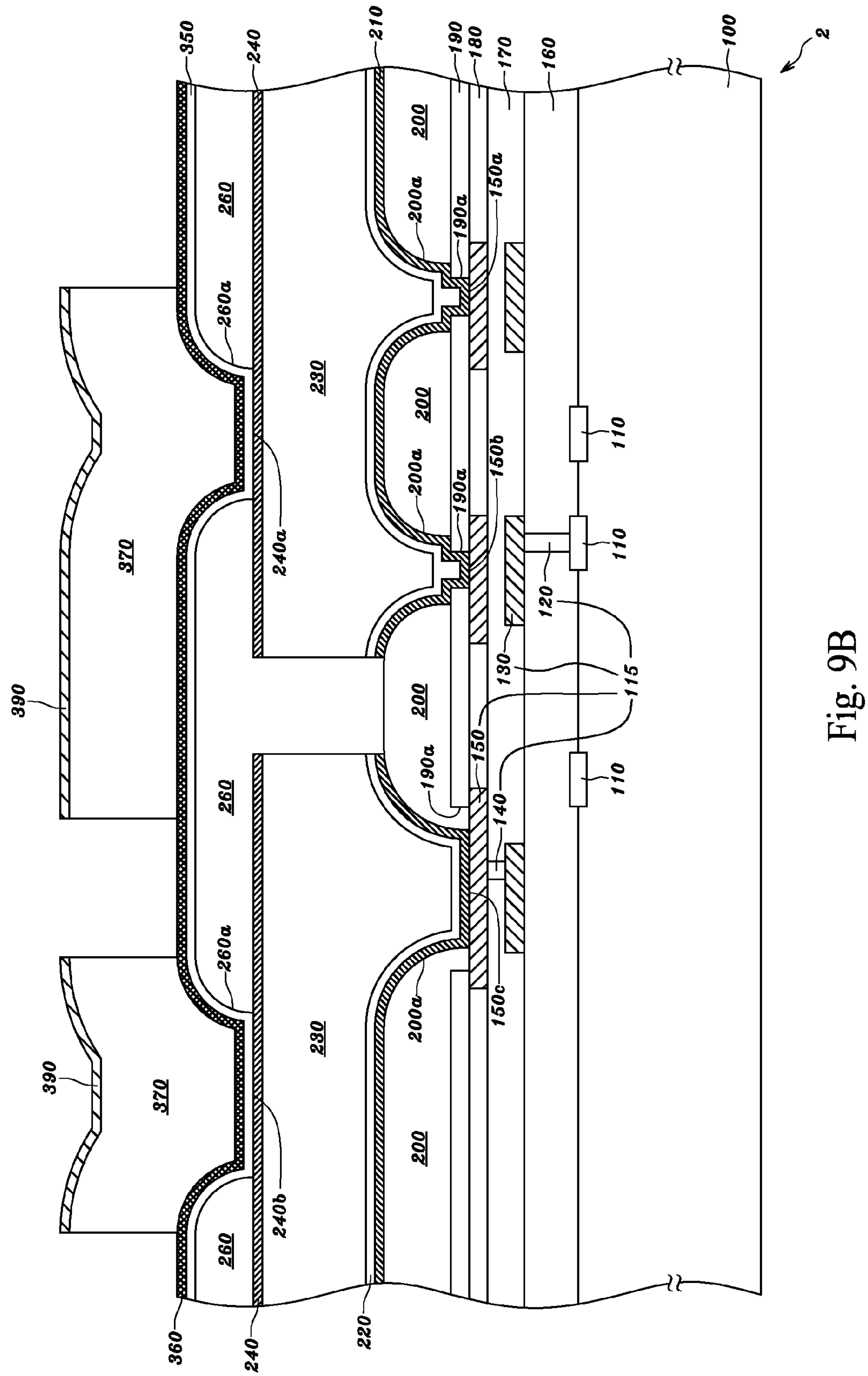

Referring to FIG. 9B, after the barrier layer 390 is formed, the photoresist layer 50 can be removed using an inorganic solution or using an organic solution with amide. Some residuals from the photoresist layer 50 could remain on the barrier layer 390 and on the seed layer 360 not under the copper layer 370. Thereafter, the residuals can be removed from the barrier layer 390 and from the seed layer 360 with a plasma, such as an $O_2$ plasma or a plasma containing fluorine of below 200 PPM and oxygen.

Figure 9C:
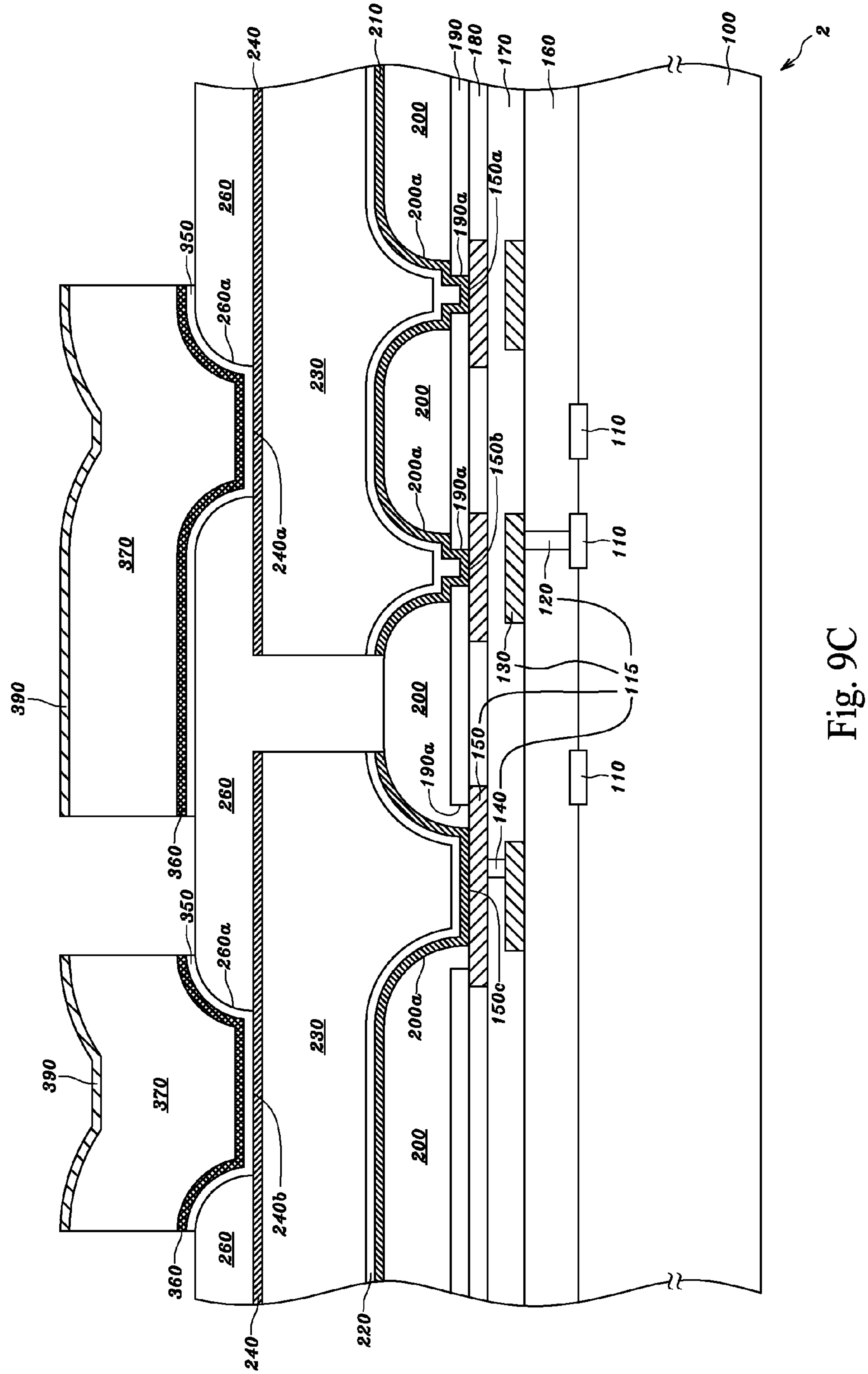

Referring to FIG. 9C, the seed layer 360 and the adhesion/barrier layer 350 not under the copper layer 370 are subsequently removed with an etching method. The process as illustrated in FIG. 9C, of removing the seed layer 360 and the adhesion/barrier layer 350 not under the copper layer 370, can be referred to as the process as illustrated in FIG. 8E, of removing the seed layer 360 and the adhesion/barrier layer 350 not under the copper layer 370.

Figure 9D:
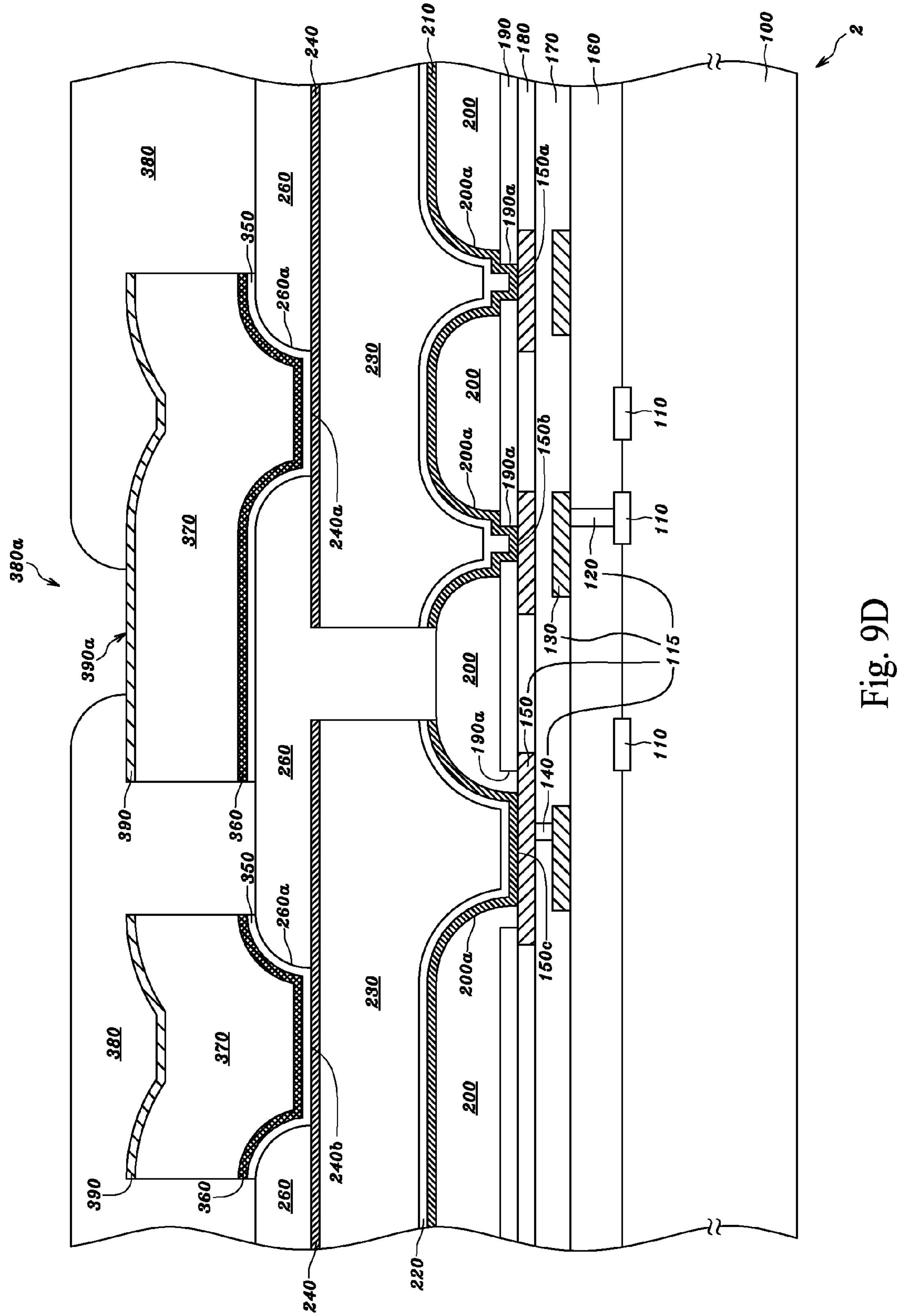

Referring to FIG. 9D, a polymer layer 380 is formed on the barrier layer 390, on the polymer layer 260 and in the gap between neighboring metal traces provided by the adhesion/barrier 350, the seed layer 360, the copper layer 370 and the barrier layer 390 by a process including a spin-on coating process, a lamination process, a screen-printing process or a spraying process, and an opening 380*a* in the polymer layer 380 exposes a contact point 390*a* of the barrier layer 390. The polymer layer 380 has a thickness between 3 and 25 micrometers, and preferably between 5 and 15 micrometers, and the material of the polymer layer 380 may include benzocyclobutane (BCB), polyimide (PI), polybenzoxazole (PBO) or epoxy resin. The process of forming the polymer layer 380 and forming the opening 380*a* in the polymer layer 380, as illustrated in FIG. 9D, can be referred to as the process of forming the polymer layer 380 and forming the opening 380*a* in the polymer layer 380, as illustrated in FIG. 8F.

Figure 9E:
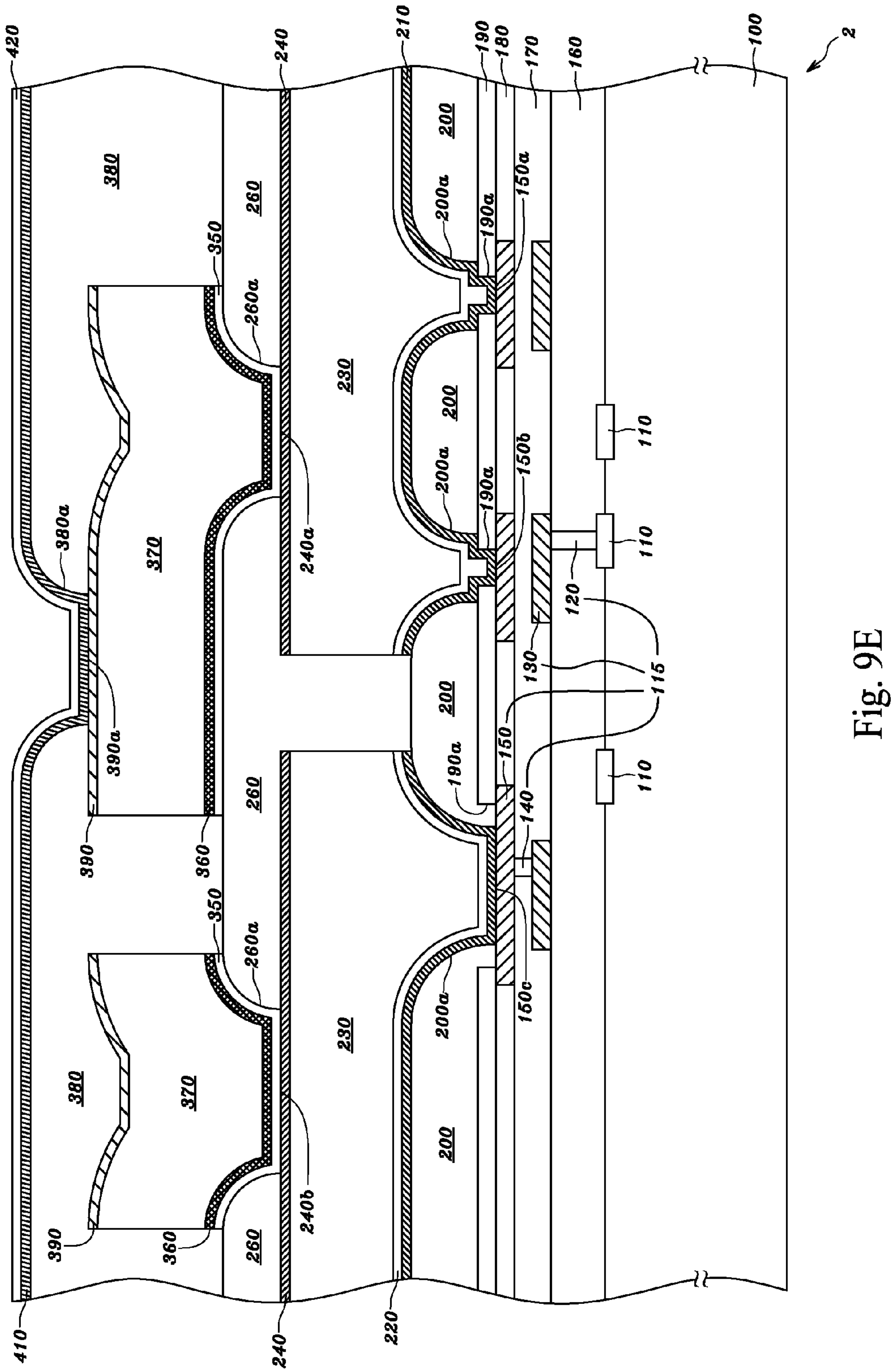

Referring to FIG. 9E, an adhesion/barrier layer 410 having a thickness between 0.02 and 0.5 micrometers, and preferably between 0.1 and 0.2 micrometers, can be formed on the polymer layer 380 and on the contact point 390*a* exposed by the opening 380*a*. The adhesion/barrier layer 410 can be formed by a physical vapor deposition (PVD) process, such as a sputtering process or an evaporation process. The material of the adhesion/barrier layer 410 can be titanium nitride, a titanium-tungsten alloy, titanium, chromium, tantalum, tantalum nitride or a composite of the above-mentioned materials.

In a case, the adhesion/barrier layer 410 can be formed by sputtering a titanium layer, a titanium-nitride layer, a titanium-tungsten-alloy layer or a chromium layer with a thickness between 0.02 and 0.5 micrometers, and preferably between 0.1 and 0.2 micrometers, on the polymer layer 380 and on the contact point 390*a* exposed by the opening 380*a*. In another case, the adhesion/barrier layer 410 can be formed by sputtering a titanium layer with a thickness between 0.01 and 0.15 micrometers on the polymer layer 380 and on the contact point 390*a* exposed by the opening 380*a*, and then sputtering a titanium-tungsten-alloy layer with a thickness between 0.1 and 0.35 micrometers on the titanium layer.

Next, a seed layer 420 having a thickness between 0.1 and 1 micrometers, and preferably between 0.05 and 0.5 micrometers, is formed on the adhesion/barrier layer 410. The seed layer 420 can be formed by a physical vapor deposition (PVD) process, such as a sputtering process or an evaporation process. The material of the seed layer 420 can be gold, platinum or palladium. The seed layer 420 is beneficial to electroplating a metal layer thereon.

In a case, when the adhesion/barrier layer 410 is formed by sputtering a titanium-containing layer with a thickness between 0.02 and 0.5 micrometers, and preferably between 0.1 and 0.2 micrometers, on the polymer layer 380 and on the contact point 390*a* exposed by the opening 380*a*, the seed layer 420 can be formed by sputtering a gold layer with a thickness between 0.1 and 1 micrometers, and preferably between 0.05 and 0.5 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer.

In another case, when the adhesion/barrier layer 410 is formed by sputtering a titanium-containing layer with a thickness between 0.02 and 0.5 micrometers, and preferably between 0.1 and 0.2 micrometers, on the polymer layer 380 and on the contact point 390*a* exposed by the opening 380*a*, the seed layer 420 can be formed by sputtering a platinum layer with a thickness between 0.1 and 1 micrometers, and preferably between 0.05 and 0.5 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer.

In another case, when the adhesion/barrier layer 410 is formed by sputtering a titanium-containing layer with a thickness between 0.02 and 0.5 micrometers, and preferably between 0.1 and 0.2 micrometers, on the polymer layer 380 and on the contact point 390*a* exposed by the opening 380*a*, the seed layer 420 can be formed by sputtering a palladium layer with a thickness between 0.1 and 1 micrometers, and preferably between 0.05 and 0.5 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer.

Figure 9F:
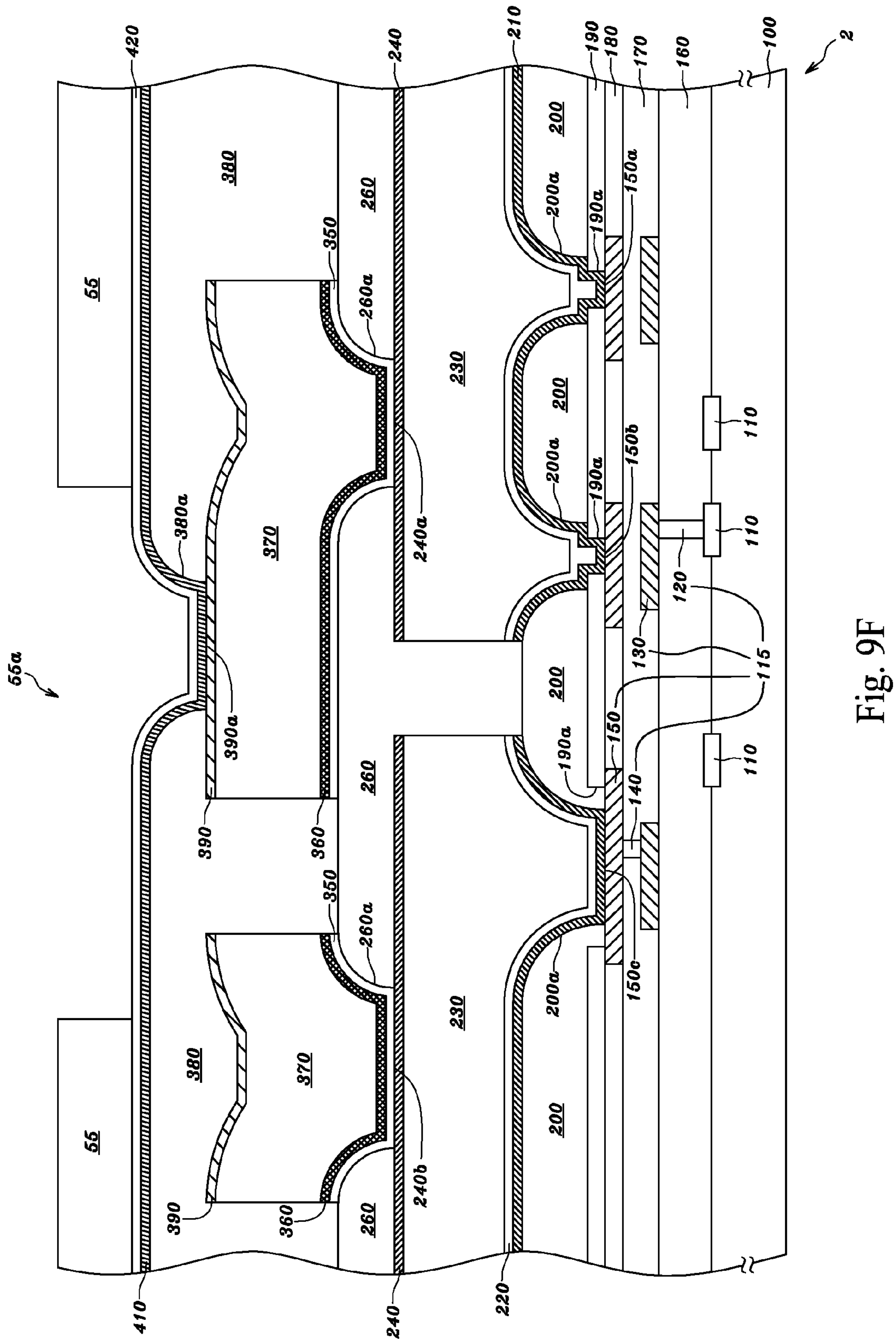

Referring to FIG. 9F, a photoresist layer 55, such as a positive-type photoresist layer or a negative-type photoresist layer, having a thickness between 5 and 30 micrometers, and preferably between 5 and 15 micrometers, is formed on the seed layer 420 by a spin-on coating process, a lamination process, a screen-printing process or a spraying process. Next, the photoresist layer 55 is patterned with the processes of exposure and development to form an opening 55*a* in the photoresist layer 55 exposing the seed layer 420. A 1× stepper or a 1× contact aligner can be used to expose the photoresist layer 55 during the process of exposure.

For example, the photoresist layer 55 can be formed by spin-on coating a positive-type photosensitive polymer layer having a thickness between 5 and 30 micrometers, and preferably between 5 and 15 micrometers, on the seed layer 420, then exposing the photosensitive polymer layer using a 1× stepper or a contact aligner with at least two of G-line, H-line and I-line, wherein G-line has a wavelength ranging from 434 to 438 nm, H-line has a wavelength ranging from 403 to 407 nm, and I-line has a wavelength ranging from 363 to 367 nm, then developing the exposed polymer layer by spraying and puddling a developer on the semiconductor wafer 2 or by immersing the semiconductor wafer 2 into a developer, and then cleaning the semiconductor wafer 2 using deionized wafer and drying the semiconductor wafer 2 by spinning the semiconductor wafer 2. After development, a scum removal process of removing the residual polymeric material or other contaminants from the seed layer 420 may be conducted by using an $O_2$ plasma or a plasma containing fluorine of below 200 PPM and oxygen. By these processes, the photoresist layer 55 can be patterned with the opening 55*a* in the photoresist layer 55 exposing the seed layer 420.

Figure 9G:
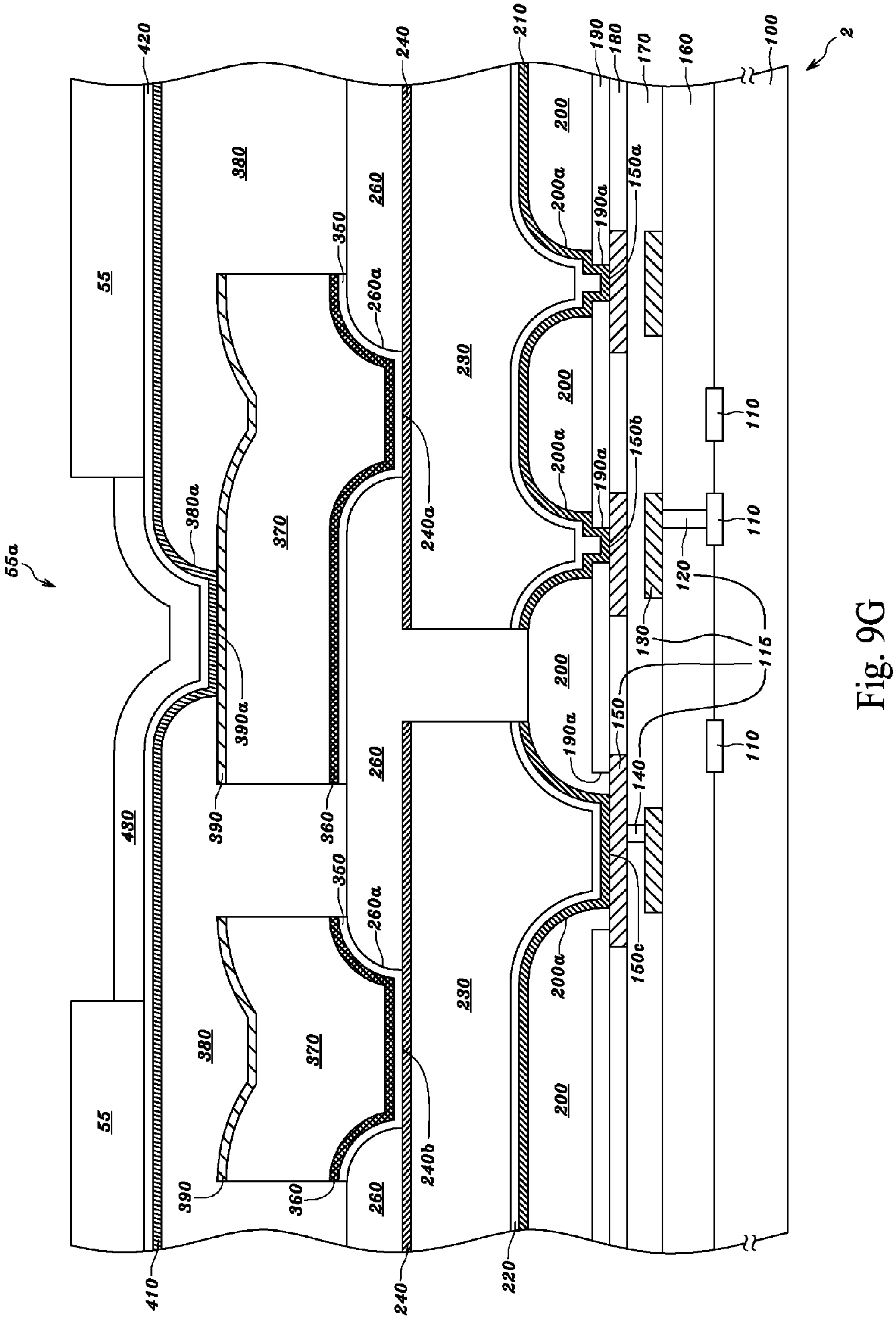

Referring to FIG. 9G, a wirebondable metal layer 430 having a thickness between 1 and 20 micrometers, and preferably between 2 and 8 micrometers, can be electroplated on the seed layer 420 exposed by the opening 55*a* in the photoresist layer 55. The material of the wirebondable metal layer 430 can be gold, platinum or palladium. In a case, the wirebondable metal layer 430 can be formed by electroplating a gold layer with a thickness between 1 and 20 micrometers, and preferably between 2 and 8 micrometers, on the seed layer 420, made of gold, exposed by the opening 55*a* with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. In another case, the wirebondable metal layer 430 can be formed by electroplating a platinum layer with a thickness between 1 and 20 micrometers, and preferably between 2 and 8 micrometers, on the seed layer 420, made of platinum, exposed by the opening 55*a*. In another case, the wirebondable metal layer 430 can be formed by electroplating a palladium layer with a thickness between 1 and 20 micrometers, and preferably between 2 and 8 micrometers, on the seed layer 420, made of palladium, exposed by the opening 55*a*.

Figure 9H:
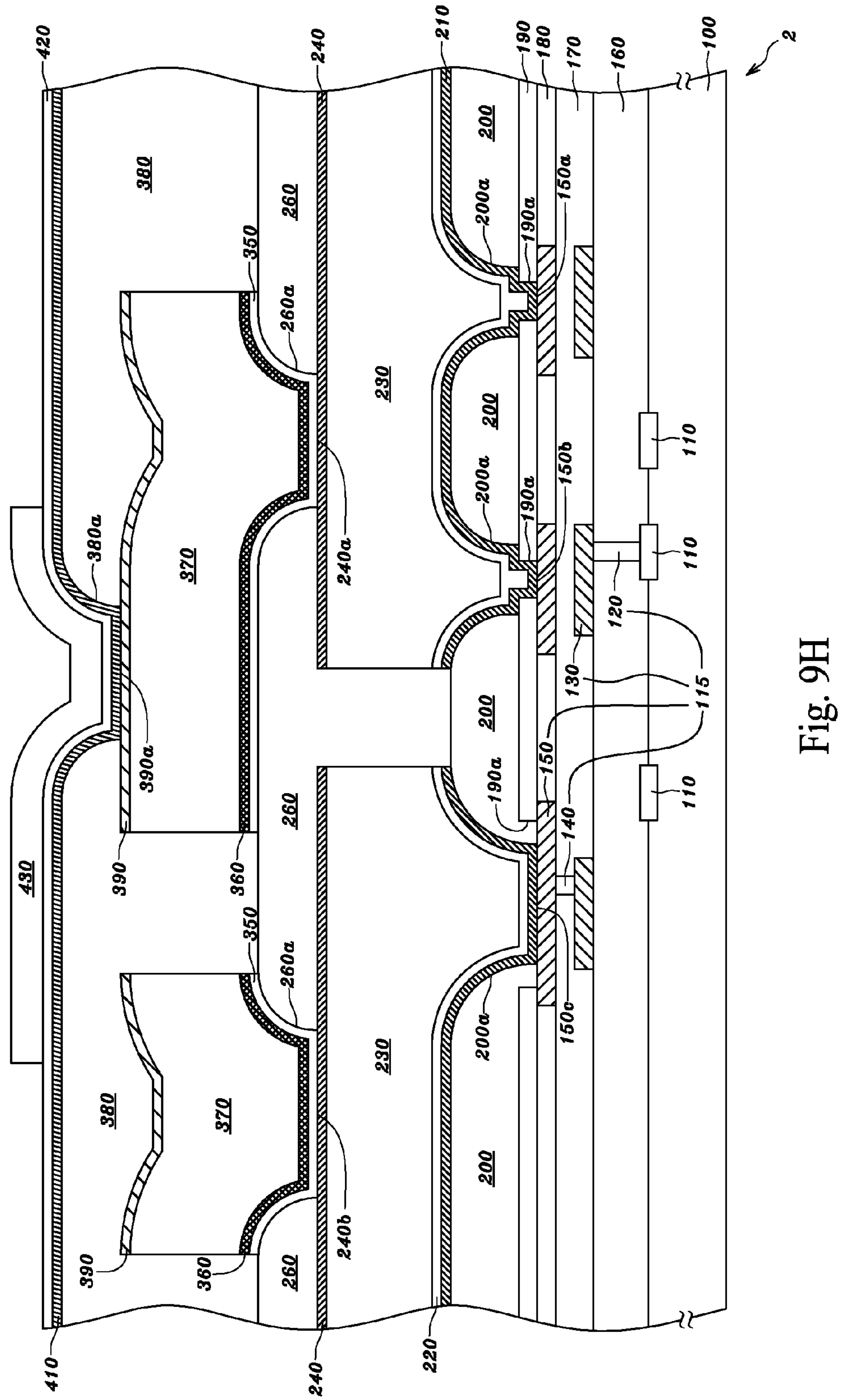

Referring to FIG. 9H, after the wirebondable metal layer 430 is formed, the photoresist layer 55 can be removed using an inorganic solution or using an organic solution with amide. Some residuals from the photoresist layer 55 could remain on the wirebondable metal layer 430 and on the seed layer 420 not under the wirebondable metal layer 430. Thereafter, the residuals can be removed from the wirebondable metal layer 430 and from the seed layer 420 with a plasma, such as an $O_2$ plasma or a plasma containing fluorine of below 200 PPM and oxygen.

Figure 9I:
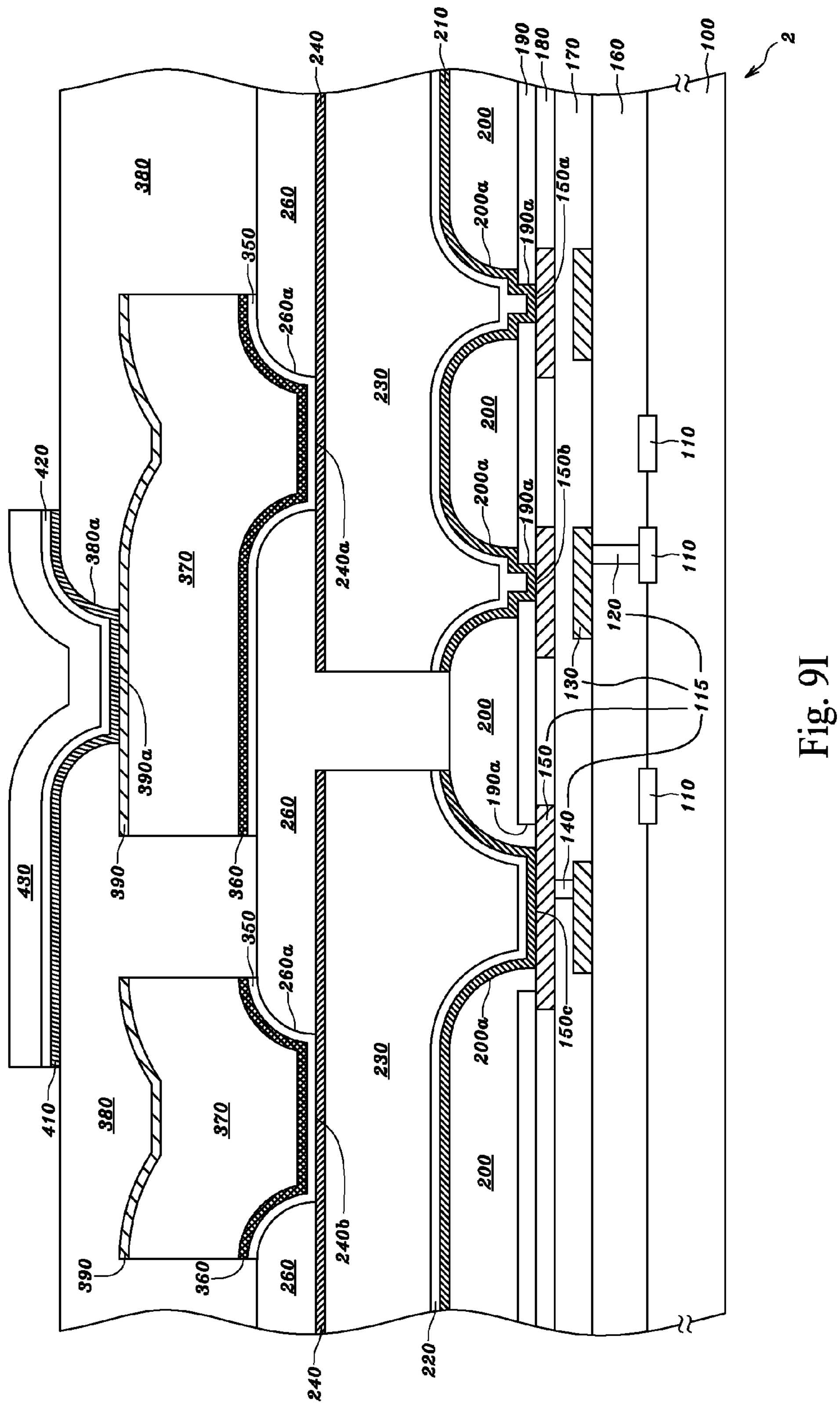

Referring to FIG. 9I, the seed layer 420 and the adhesion/barrier layer 410 not under the wirebondable metal layer 430 are subsequently removed with an etching method. In a case, the seed layer 420 and the adhesion/barrier layer 410 not under the wirebondable metal layer 430 can be subsequently removed by a dry etching method. As to the dry etching method, both the seed layer 420 and the adhesion/barrier layer 410 not under the wirebondable metal layer 430 can be subsequently removed by an Ar sputtering etching process; alternatively, both the seed layer 420 and the adhesion/barrier layer 410 not under the wirebondable metal layer 430 can be subsequently removed by a reactive ion etching (RIE) process; alternatively, the seed layer 420 not under the wirebondable metal layer 430 can be removed by an Ar sputtering etching process, and the adhesion/barrier layer 410 not under the wirebondable metal layer 430 can be removed by a reactive ion etching (RIE) process; alternatively, the seed layer 420 not under the wirebondable metal layer 430 can be removed by a reactive ion etching (RIE) process, and the adhesion/barrier layer 410 not under the wirebondable metal layer 430 can be removed by an Ar sputtering etching process. In another case, the seed layer 420 and the adhesion/barrier layer 410 not under the wirebondable metal layer 430 can be subsequently removed by a wet etching method. As to the wet etching method, when the seed layer 420 is a gold layer, it can be etched with an iodine-containing solution, such as a solution containing potassium iodide; when the adhesion/barrier layer 410 is a titanium layer, it can be etched with a solution containing hydrogen fluoride or with a solution containing $NH_4OH$ and hydrogen peroxide; when the adhesion/barrier layer 410 is a titanium-tungsten-alloy layer, it can be etched with a solution containing hydrogen peroxide or with a solution containing $NH_4OH$ and hydrogen peroxide; when the adhesion/barrier layer 410 is a chromium layer, it can be etched with a solution containing potassium ferricyanide. In another case, the seed layer 420, such as gold, not under the wirebondable metal layer 430 can be removed by an iodine-containing solution, such as a solution containing potassium iodide, and the adhesion/barrier layer 410 not under the wirebondable metal layer 430 can be removed by a reactive ion etching (RIE) process. In another case, the seed layer 420, such as gold, not under the wirebondable metal layer 430 can be removed by an iodine-containing solution, such as a solution containing potassium iodide, and the adhesion/barrier layer 410 not under the wirebondable metal layer 430 can be removed by an Ar sputtering etching process.

Figure 9J:
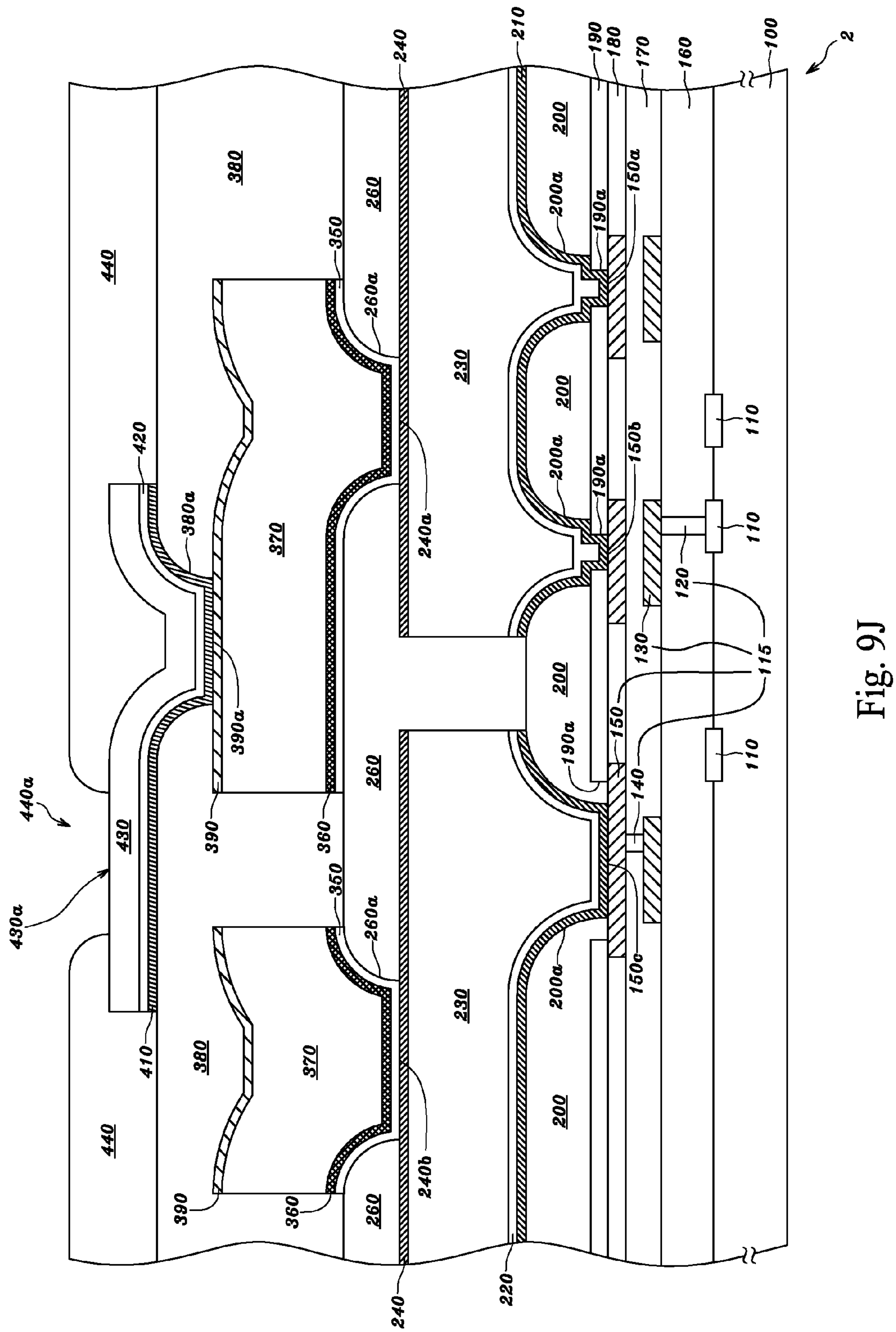

Referring to FIG. 9J, a polymer layer 440 can be formed on the wirebondable metal layer 430 and on the polymer layer 380 by a process including a spin-on coating process, a lamination process, a screen-printing process or a spraying process, and an opening 440*a* in the polymer layer 440 exposes a contact point 430*a* of the wirebondable metal layer 430. The polymer layer 440 has a thickness between 3 and 25 micrometers, and preferably between 5 and 15 micrometers, and the material of the polymer layer 440 may include benzocyclobutane (BCB), polyimide (PI), polybenzoxazole (PBO) or epoxy resin.

In a case, the polymer layer 440 can be formed by spin-on coating a negative-type photosensitive polyimide layer having a thickness between 6 and 50 micrometers on the wirebondable metal layer 430 and on the polymer layer 380, then baking the spin-on coated polyimide layer, then exposing the baked polyimide layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form an opening exposing the contact points 430*a*, then curing or heating the developed polyimide layer at a temperature between 180 and 400° C. for a time between 20 and 150 minutes in a nitrogen ambient or in an oxygen-free ambient, the cured polyimide layer having a thickness between 3 and 25 micrometers, and then removing the residual polymeric material or other contaminants from the contact point 430*a* with an $O_2$ plasma or a plasma containing fluorine of below 200 PPM and oxygen. By the way, the polymer layer 440 can be formed on the wirebondable metal layer 430 and on the polymer layer 380, and the opening 440*a* formed in the polymer layer 440 exposes the contact point 430*a*. For example, the developed polyimide layer can be cured or heated at a temperature between 180 and 250° C. for a time between 20 and 150 minutes in a nitrogen ambient or in an oxygen-free ambient. Alternatively, the developed polyimide layer can be cured or heated at a temperature between 250 and 290° C. for a time between 20 and 150 minutes in a nitrogen ambient or in an oxygen-free ambient. Alternatively, the developed polyimide layer can be cured or heated at a temperature between 290 and 400° C. for a time between 20 and 150 minutes in a nitrogen ambient or in an oxygen-free ambient. Alternatively, the developed polyimide layer can be cured or heated at a temperature between 200 and 390° C. for a time between 20 and 150 minutes in a nitrogen ambient or in an oxygen-free ambient.

In another case, the polymer layer 440 can be formed by spin-on coating a positive-type photosensitive polybenzoxazole layer having a thickness of between 3 and 25 micrometers on the wirebondable metal layer 430 and on the polymer layer 380, then baking the spin-on coated polybenzoxazole layer, then exposing the baked polybenzoxazole layer using a 1× stepper or a 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polybenzoxazole layer, that is, G-line and H-line, G-line and I-line, H-line and I-line, or G-line, H-line and I-line illuminate the baked polybenzoxazole layer, then developing the exposed polybenzoxazole layer to form an opening exposing the contact point 430*a*, then curing or heating the developed polybenzoxazole layer at a temperature between 150 and 250° C., and preferably between 180 and 250° C., or between 200 and 400° C., and preferably between 250 and 350° C., for a time between 5 and 180 minutes, and preferably between 30 and 120 minutes, in a nitrogen ambient or in an oxygen-free ambient, the cured polybenzoxazole layer having a thickness of between 3 and 25 micrometers, and then removing the residual polymeric material or other contaminants from the contact point 430*a* with an $O_2$ plasma or a plasma containing fluorine of below 200 PPM and oxygen. By the way, the polymer layer 440 can be formed on the wirebondable metal layer 430 and on the polymer layer 380, and the opening 440*a* formed in the polymer layer 440 exposes the contact point 430*a*.

Figure 9K:
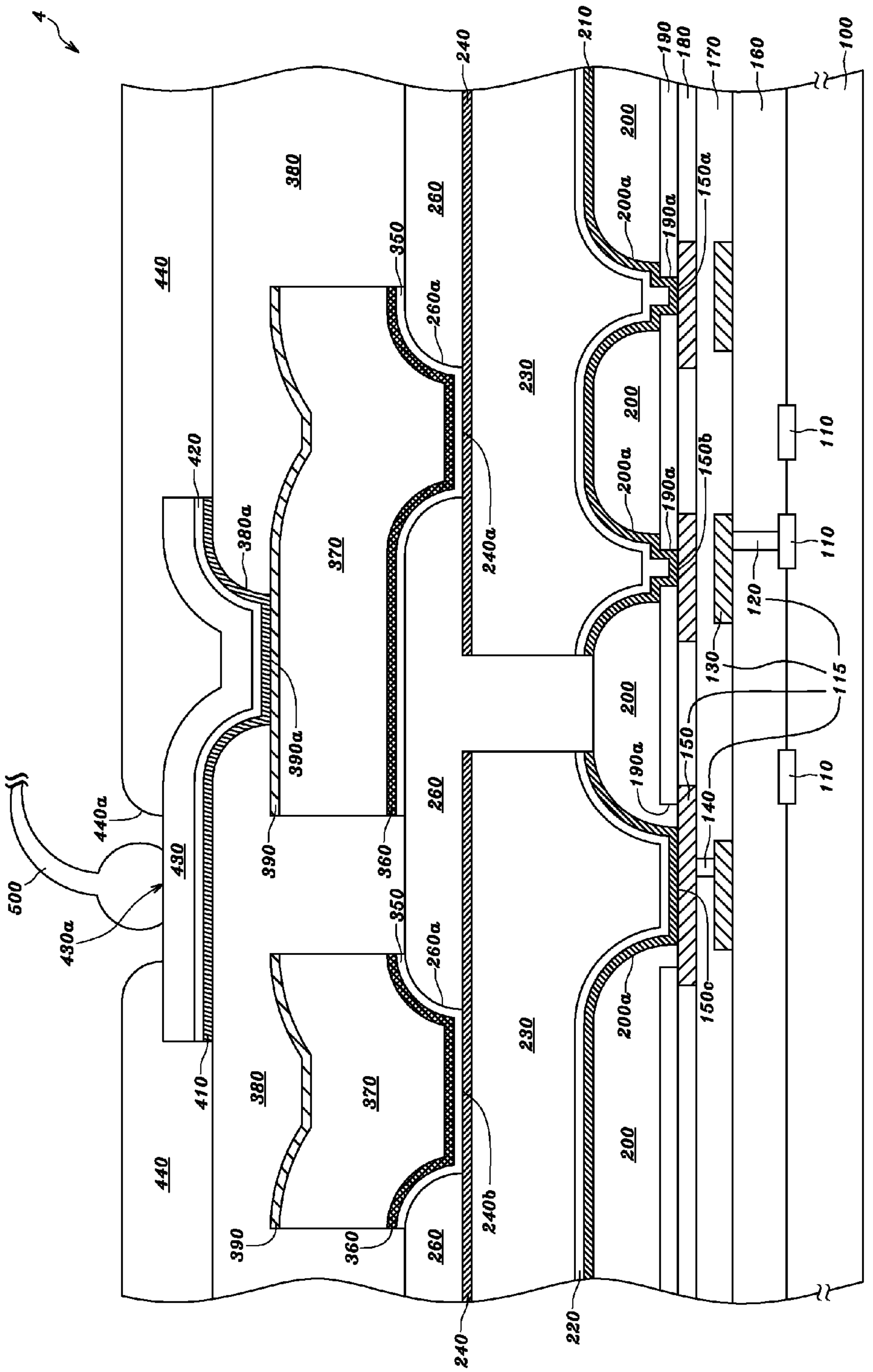

Referring to FIG. 9K, after the polymer layer 440 is formed, the semiconductor wafer 2 can be cut into a plurality of individual semiconductor chips 4 (only one of them is shown) by a dice sawing process.

Next, via a wire-bonding process, a wire 500, made of gold, copper or aluminum, can be ball bonded on the contact point 430*a* of the wirebondable metal layer 430 of the semiconductor chip 4. Alternatively, via a wire-bonding process, the wire 500, made of gold, copper or aluminum, can be wedge bonded on the contact point 430*a* of the wirebondable metal layer 430 of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 9L:
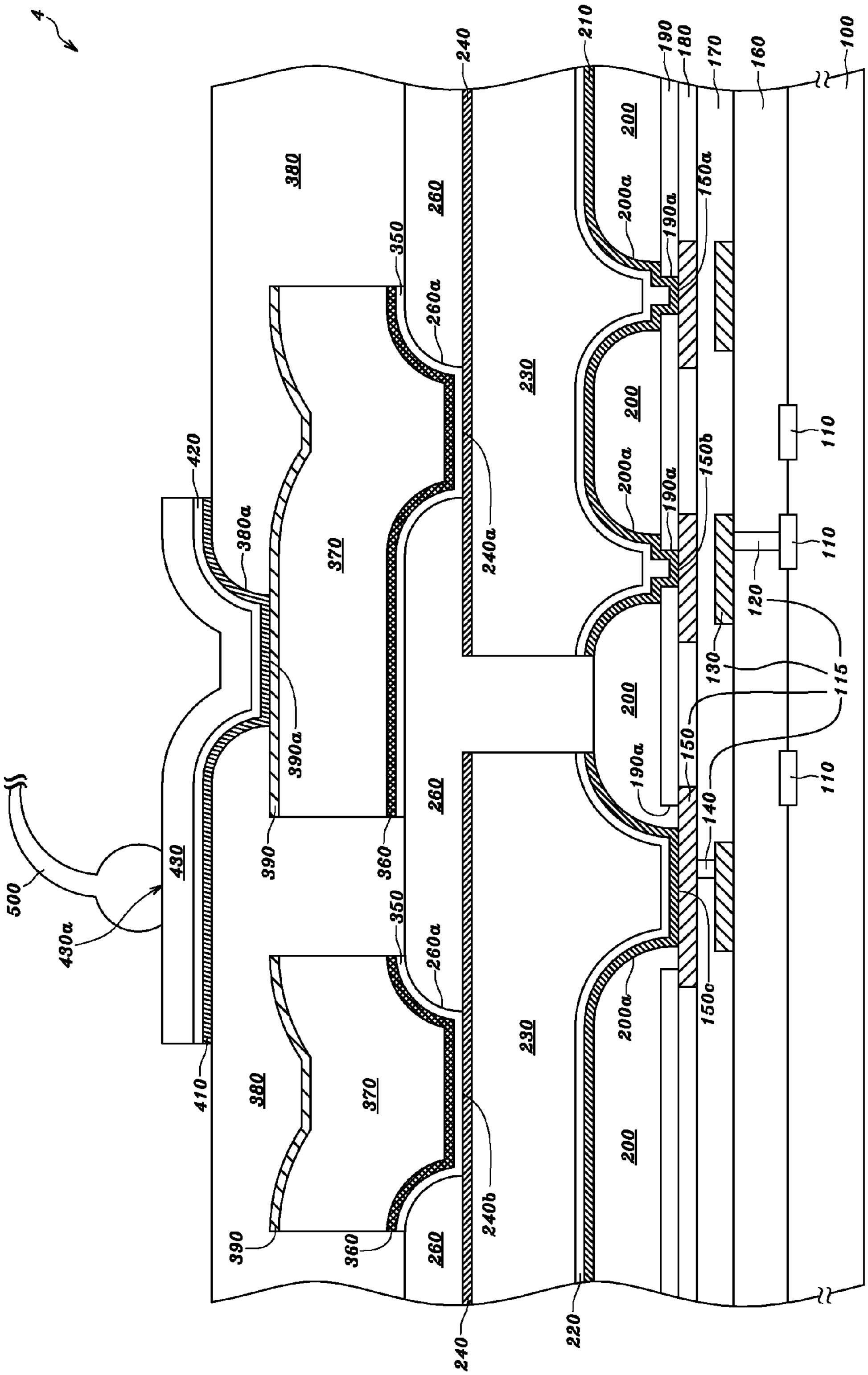
FIGS. 9L and 9R are cross-sectional views showing a semiconductor chip with third thick metal layers and a wirebonded wire bonded to the topmost thick metal layer.

Alternatively, referring to FIG. 9L, the step of forming the polymer layer 440 as shown in FIG. 9J can be omitted, that is, after performing the above-mentioned steps as shown in FIGS. 9A-9I, the step illustrated in FIG. 9K can be performed without the polymer layer 440 formed on the wirebondable metal layer 430 and on the polymer layer 380.

Figure 9M:
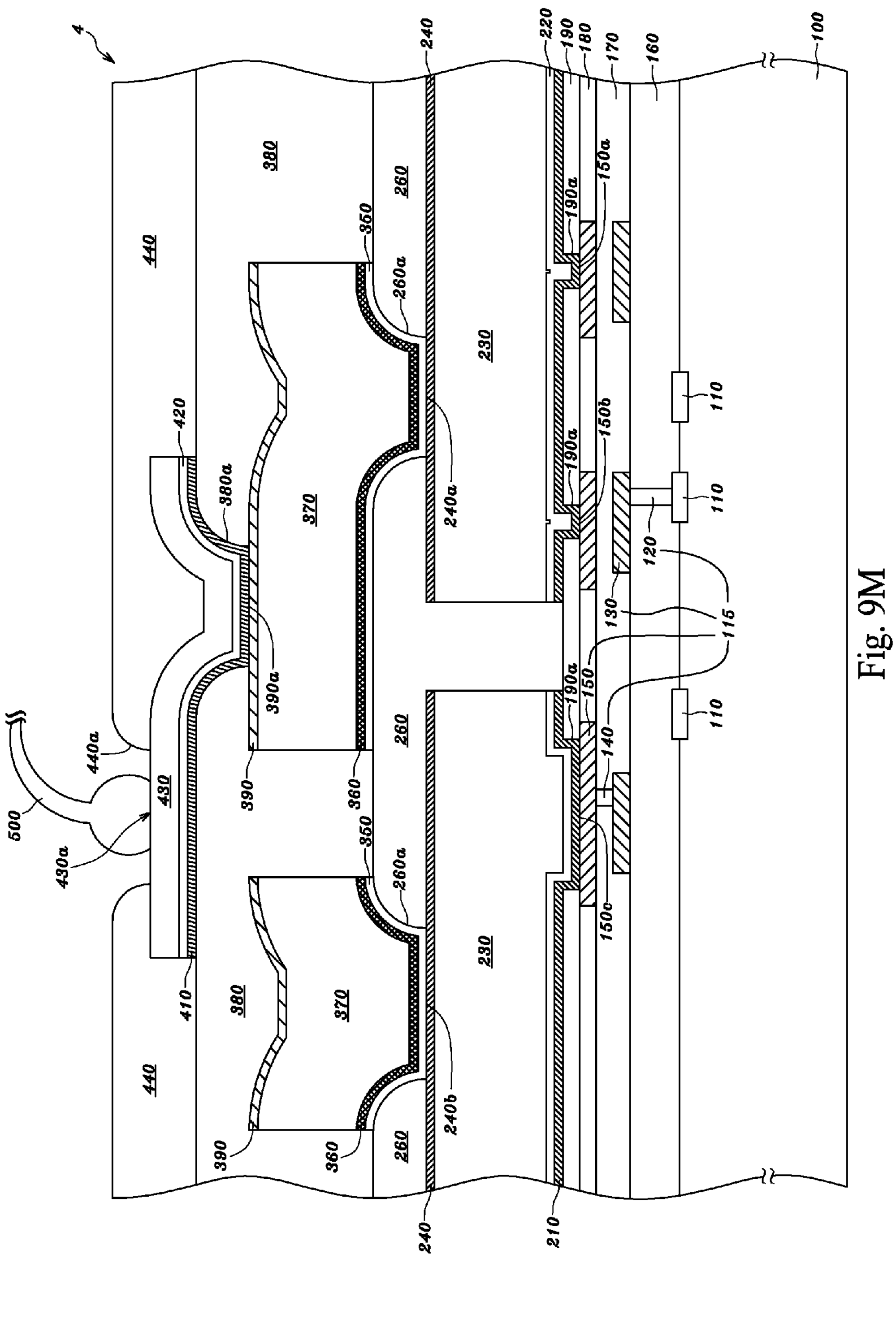

Alternatively, referring to FIG. 9M, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by performing the above-mentioned steps as shown in FIGS. 9A-9K. The process of forming the adhesion/barrier layer 210 shown in FIG. 9M can be referred to as the process of forming the adhesion/barrier layer 210 as illustrated in FIG. 4A. The process of forming the seed layer 220 shown in FIG. 9M can be referred to as the process of forming the seed layer 220 as illustrated in FIG. 4A. The process of forming the polymer layer 260 shown in FIG. 9M can be referred to as the process of forming the polymer layer 260 as illustrated in FIG. 4F.

Figure 9N:
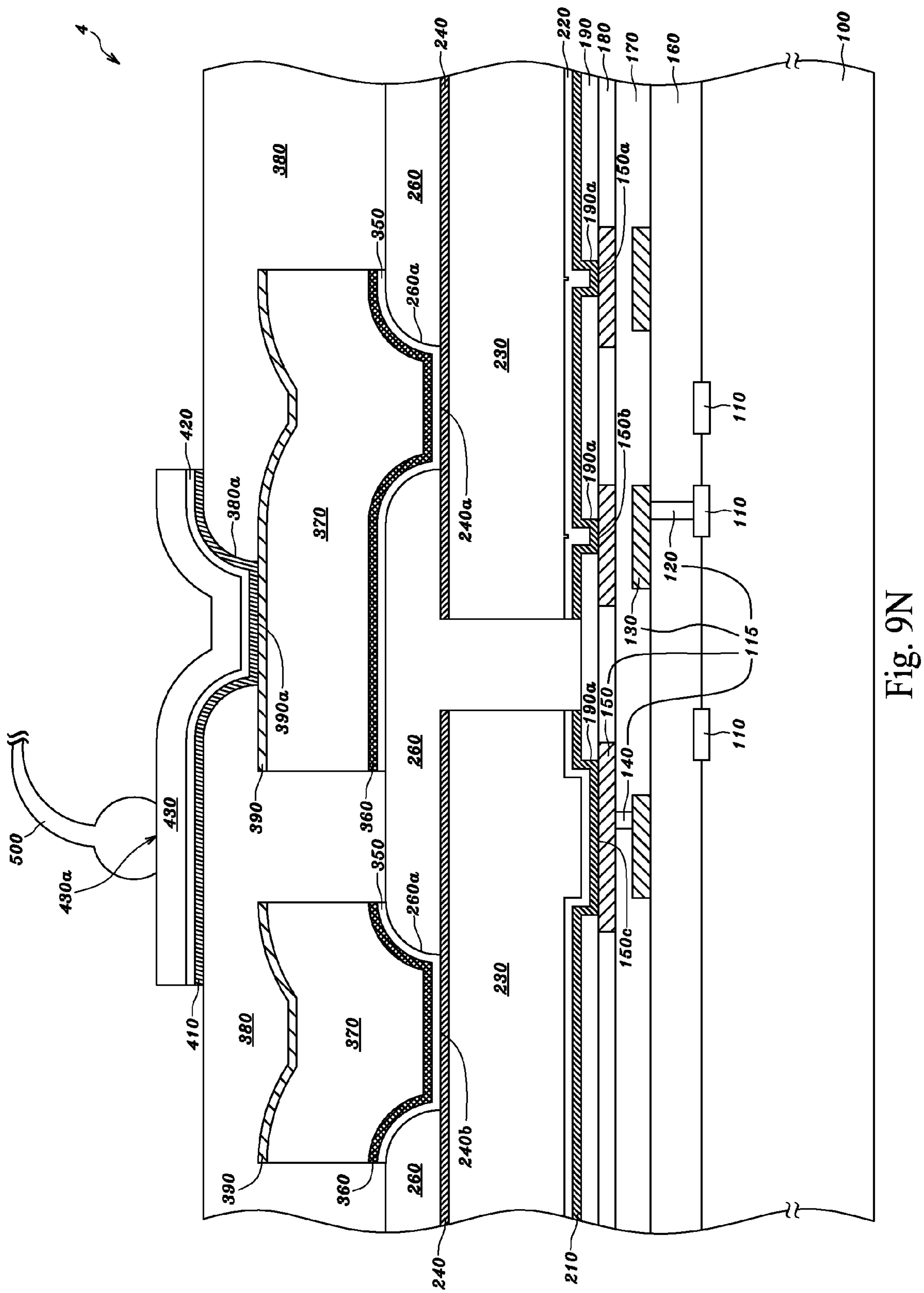
Figure 90:
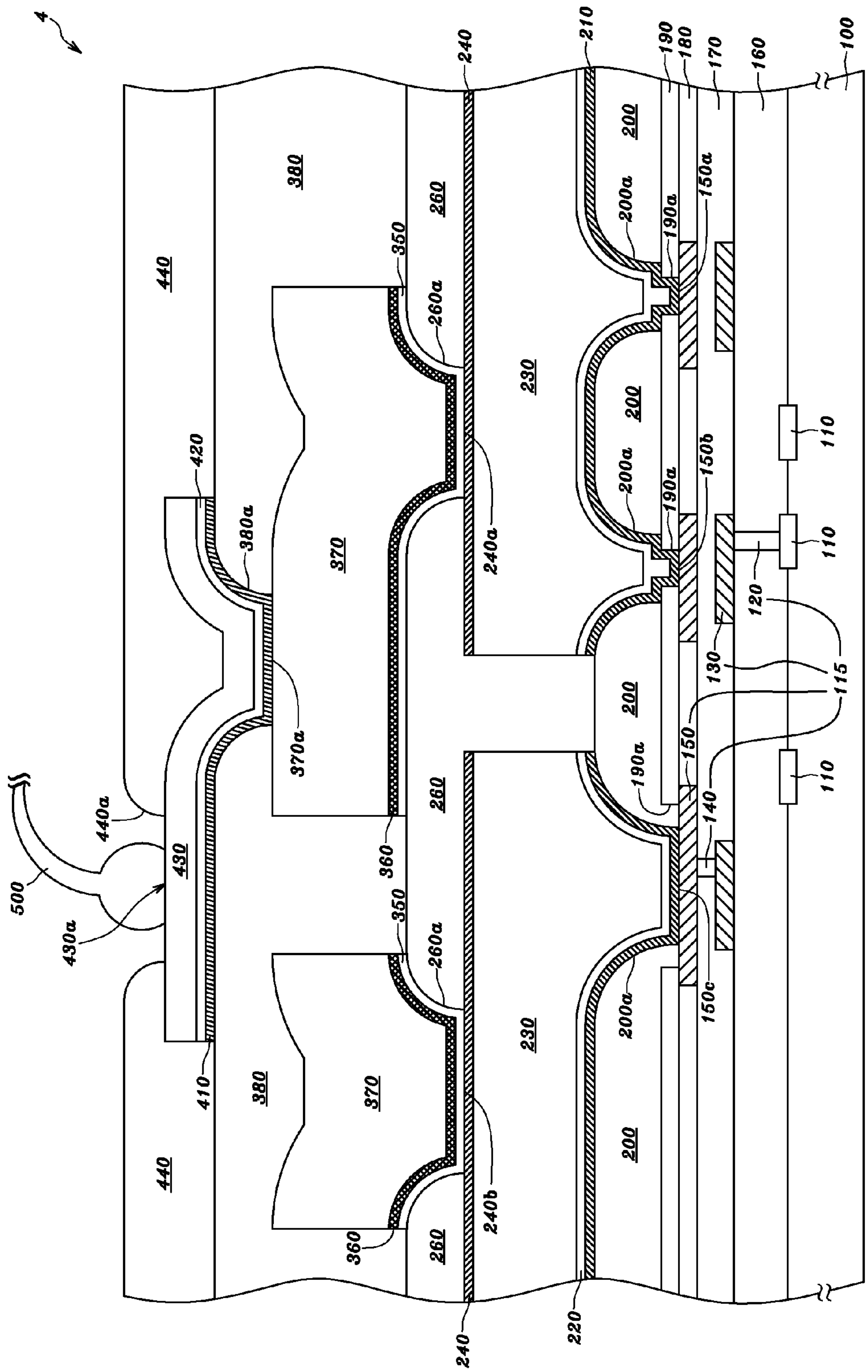

Alternatively, referring to FIG. 9N, the step of forming the polymer layer 200 as shown in FIG. 3 and the step of forming the polymer layer 440 as shown in FIG. 9J can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by performing the above-mentioned steps as shown in FIGS. 9A-9I, followed by performing the above-mentioned step as shown in FIG. 9K without the polymer layer 440 formed on the wirebondable metal layer 430 and on the polymer layer 380. The process of forming the adhesion/barrier layer 210 shown in FIG. 9N can be referred to as the process of forming the adhesion/barrier layer 210 as illustrated in FIG. 4A. The process of forming the seed layer 220 shown in FIG. 9N can be referred to as the process of forming the seed layer 220 as illustrated in FIG. 4A. The process of forming the polymer layer 260 shown in FIG. 9N can be referred to as the process of forming the polymer layer 260 as illustrated in FIG. 4F.

Alternatively, referring to FIG. 9O, the step of forming the barrier layer 390 shown in FIG. 9A can be omitted, that is, after the step shown in FIG. 8B, the copper layer 370 is electroplated or electroless plated on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned steps as shown in FIGS. 9F-9K. The process of forming the polymer layer 380 shown in FIG. 9O can be referred to as the process of forming the polymer layer 380 as illustrated in FIG. 9D. The process of forming the adhesion/barrier layer 410 shown in FIG. 9O can be referred to as the process of forming the adhesion/barrier layer 410 as illustrated in FIG. 9E. The process of forming the seed layer 420 shown in FIG. 9O can be referred to as the process of forming the seed layer 420 as illustrated in FIG. 9E.

Figure 9P:
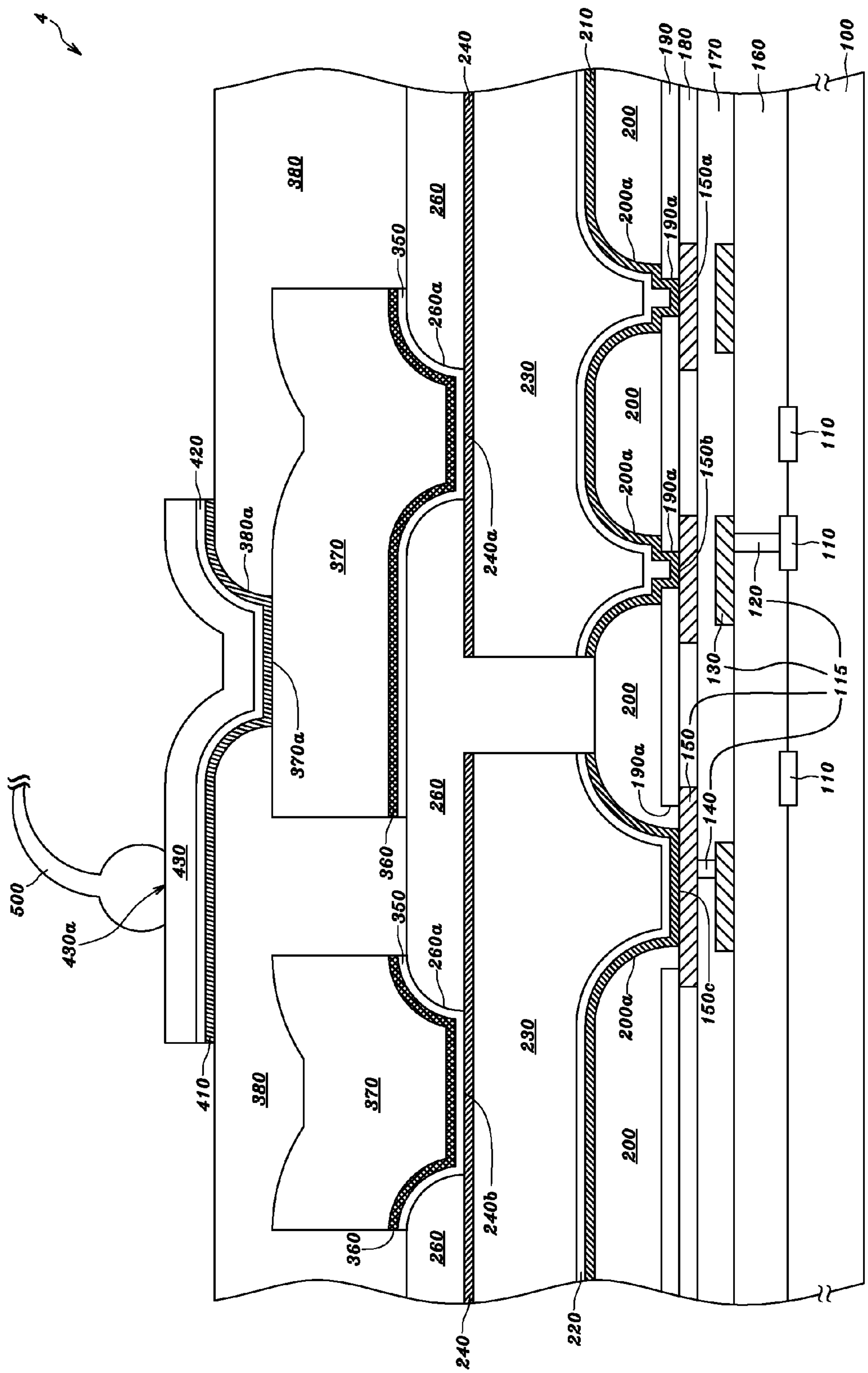

Alternatively, referring to FIG. 9P, the step of forming the barrier layer 390 shown in FIG. 9A and the step of forming the polymer layer 440 shown in FIG. 9J can be omitted, that is, that is, after the step shown in FIG. 8B, the copper layer 370 can be electroplated or electroless plated on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned steps as shown in FIGS. 9F-9I, followed by performing the above-mentioned step as shown in FIG. 9K without the polymer layer 440 formed on the wirebondable metal layer 430 and on the polymer layer 380. The process of forming the polymer layer 380 shown in FIG. 9P can be referred to as the process of forming the polymer layer 380 as illustrated in FIG. 9D. The process of forming the adhesion/barrier layer 410 shown in FIG. 9P can be referred to as the process of forming the adhesion/barrier layer 410 as illustrated in FIG. 9E. The process of forming the seed layer 420 shown in FIG. 9P can be referred to as the process of forming the seed layer 420 as illustrated in FIG. 9E.

Figure 9Q:
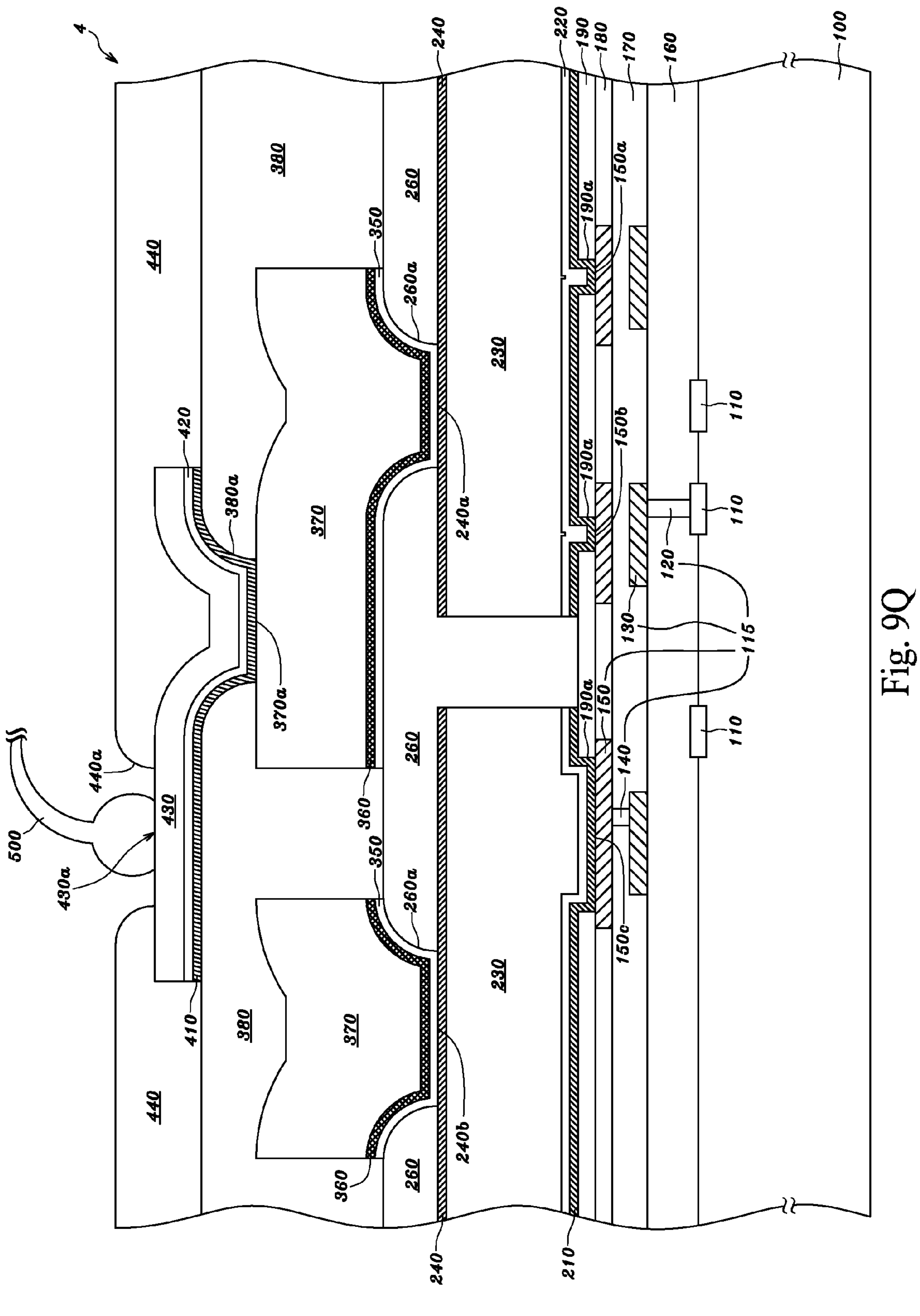

Alternatively, referring to FIG. 9Q, the step of forming the polymer layer 200 shown in FIG. 3 and the step of forming the barrier layer 390 shown in FIG. 9A can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the abovementioned steps as shown in FIGS. 8A-8B, followed by electroplating or electroless plating the copper layer 370 on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned steps as shown in FIGS. 9F-9K. The process of forming the adhesion/barrier layer 210 shown in FIG. 9Q can be referred to as the process of forming the adhesion/barrier layer 210 as illustrated in FIG. 4A. The process of forming the seed layer 220 shown in FIG. 9Q can be referred to as the process of forming the seed layer 220 as illustrated in FIG. 4A. The process of forming the polymer layer 260 shown in FIG. 9Q can be referred to as the process of forming the polymer layer 260 as illustrated in FIG. 4F. The process of forming the polymer layer 380 shown in FIG. 9Q can be referred to as the process of forming the polymer layer 380 as illustrated in FIG. 9D. The process of forming the adhesion/barrier layer 410 shown in FIG. 9Q can be referred to as the process of forming the adhesion/barrier layer 410 as illustrated in FIG. 9E. The process of forming the seed layer 420 shown in FIG. 9Q can be referred to as the process of forming the seed layer 420 as illustrated in FIG. 9E.

Figure 9R:
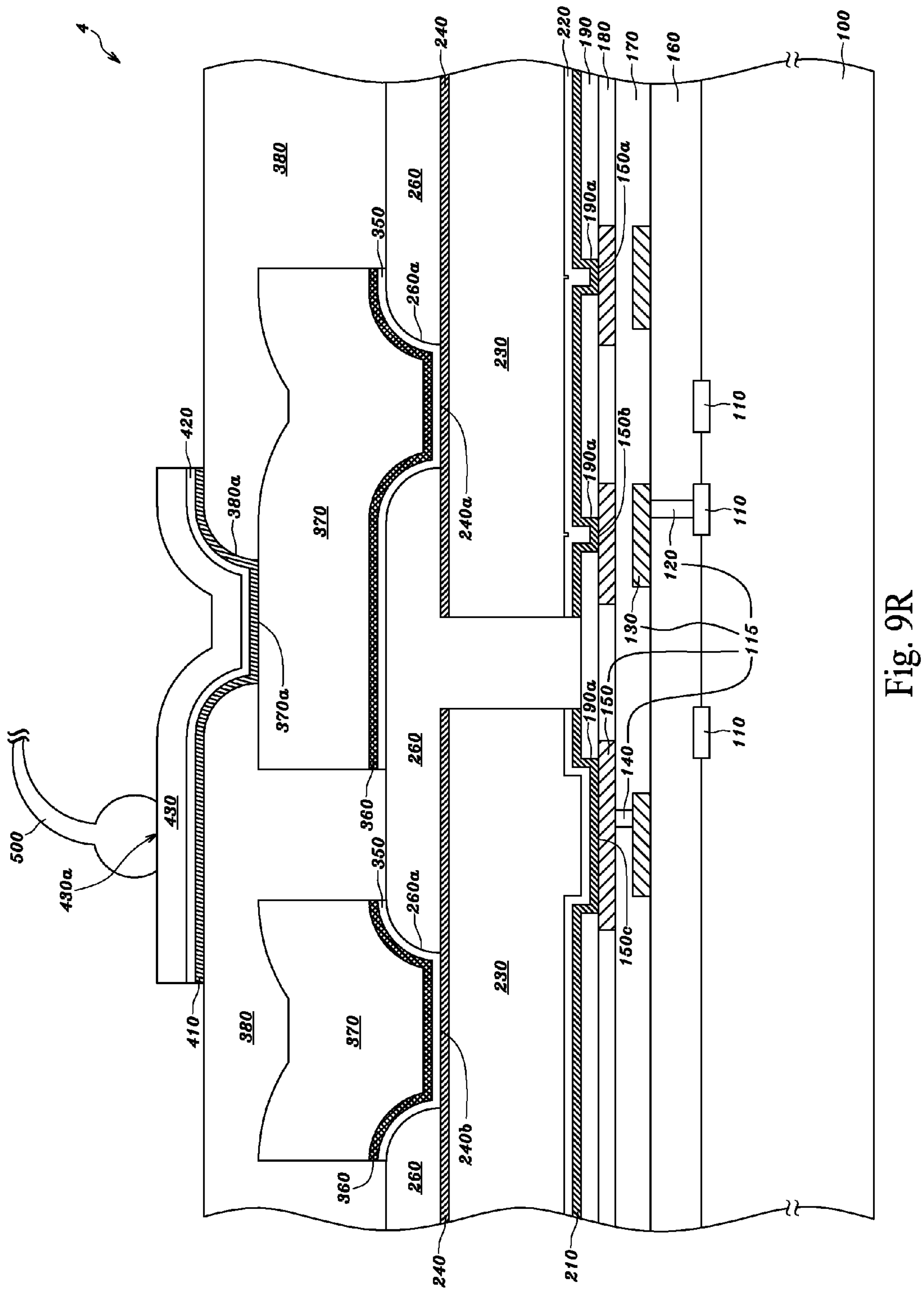

Alternatively, referring to FIG. 9R, the step of forming the polymer layer 200 shown in FIG. 3, the step of forming the barrier layer 390 shown in FIG. 9A and the step of forming the polymer layer 440 shown in FIG. 9J can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by electroplating or electroless plating the copper layer 370 on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned steps as shown in FIGS. 9F-9I, followed by performing the above-mentioned step as shown in FIG. 9K without the polymer layer 440 formed on the wirebondable metal layer 430 and on the polymer layer 380. The process of forming the adhesion/barrier layer 210 shown in FIG. 9R can be referred to as the process of forming the adhesion/barrier layer 210 as illustrated in FIG. 4A. The process of forming the seed layer 220 shown in FIG. 9R can be referred to as the process of forming the seed layer 220 as illustrated in FIG. 4A. The process of forming the polymer layer 260 shown in FIG. 9R can be referred to as the process of forming the polymer layer 260 as illustrated in FIG. 4F. The process of forming the polymer layer 380 shown in FIG. 9R can be referred to as the process of forming the polymer layer 380 as illustrated in FIG. 9D. The process of forming the adhesion/barrier layer 410 shown in FIG. 9R can be referred to as the process of forming the adhesion/barrier layer 410 as illustrated in FIG. 9E. The process of forming the seed layer 420 shown in FIG. 9R can be referred to as the process of forming the seed layer 420 as illustrated in FIG. 9E.

Embodiment 7

Figure 10A:
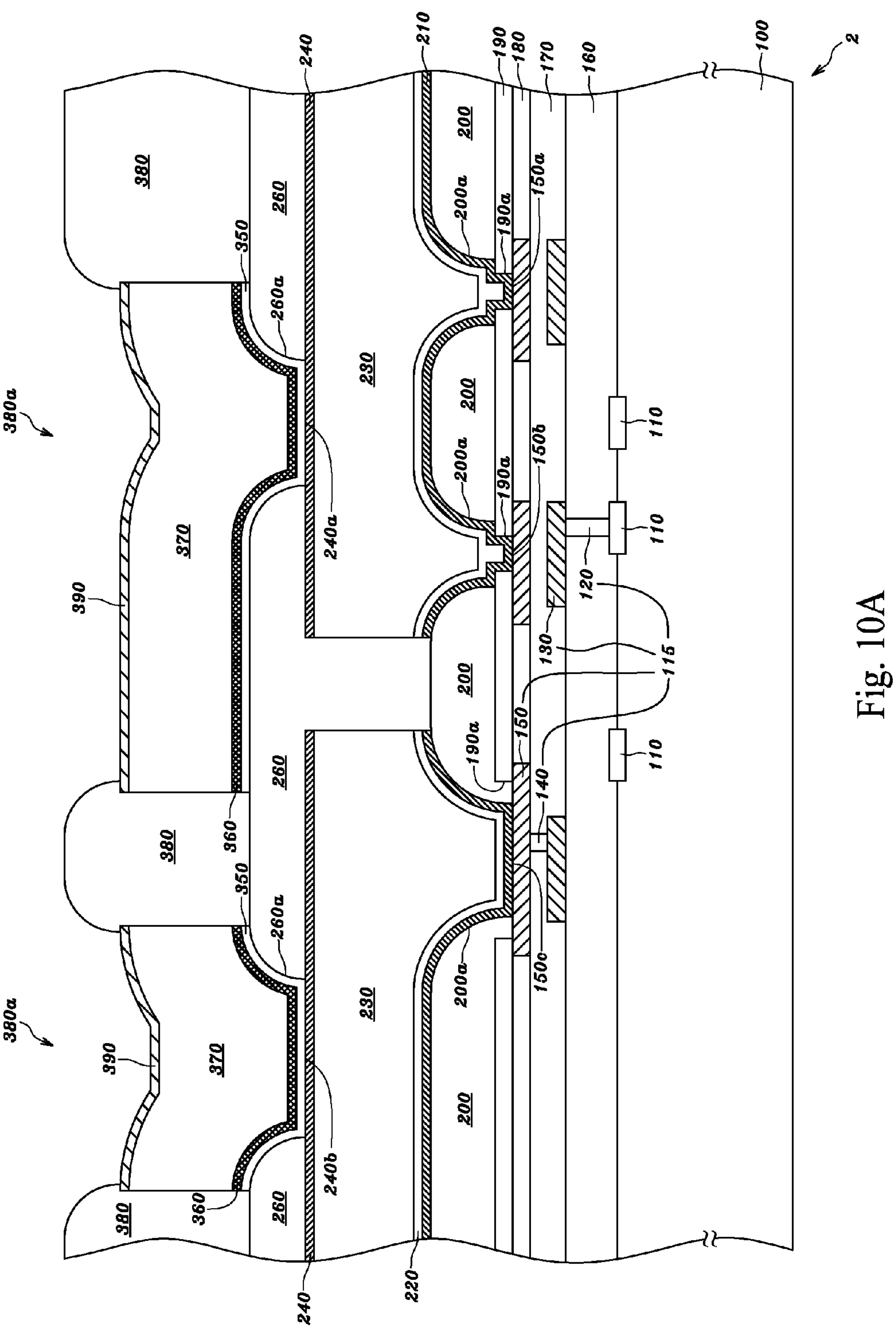
FIGS. 10A-10G are cross-sectional views showing a process for forming a semiconductor chip and bonding a wirebonded wire to the semiconductor chip according to one embodiment of the present invention.

Referring to FIG. 10A, after the step shown in FIG. 9C, a polymer layer 380 is formed on the polymer layer 260 and in the gap between neighboring metal traces provided by the adhesion/barrier 350, the seed layer 360, the copper layer 370 and the barrier layer 390 by a process including a spin-on coating process, a lamination process, a screen-printing process or a spraying process, and multiple openings 380*a* in the polymer layer 380 expose the barrier layer 390. The polymer layer 380 has a thickness between 3 and 25 micrometers, and preferably between 5 and 15 micrometers, and the material of the polymer layer 380 may include benzocyclobutane (BCB), polyimide (PI), polybenzoxazole (PBO) or epoxy resin. The processes of forming the polymer layer 380 and forming the openings 380*a* as illustrated in FIG. 10A can be referred to as the processes of forming the polymer layer 380 and forming the opening 380*a* as illustrated in FIG. 9D.

Figure 10B:
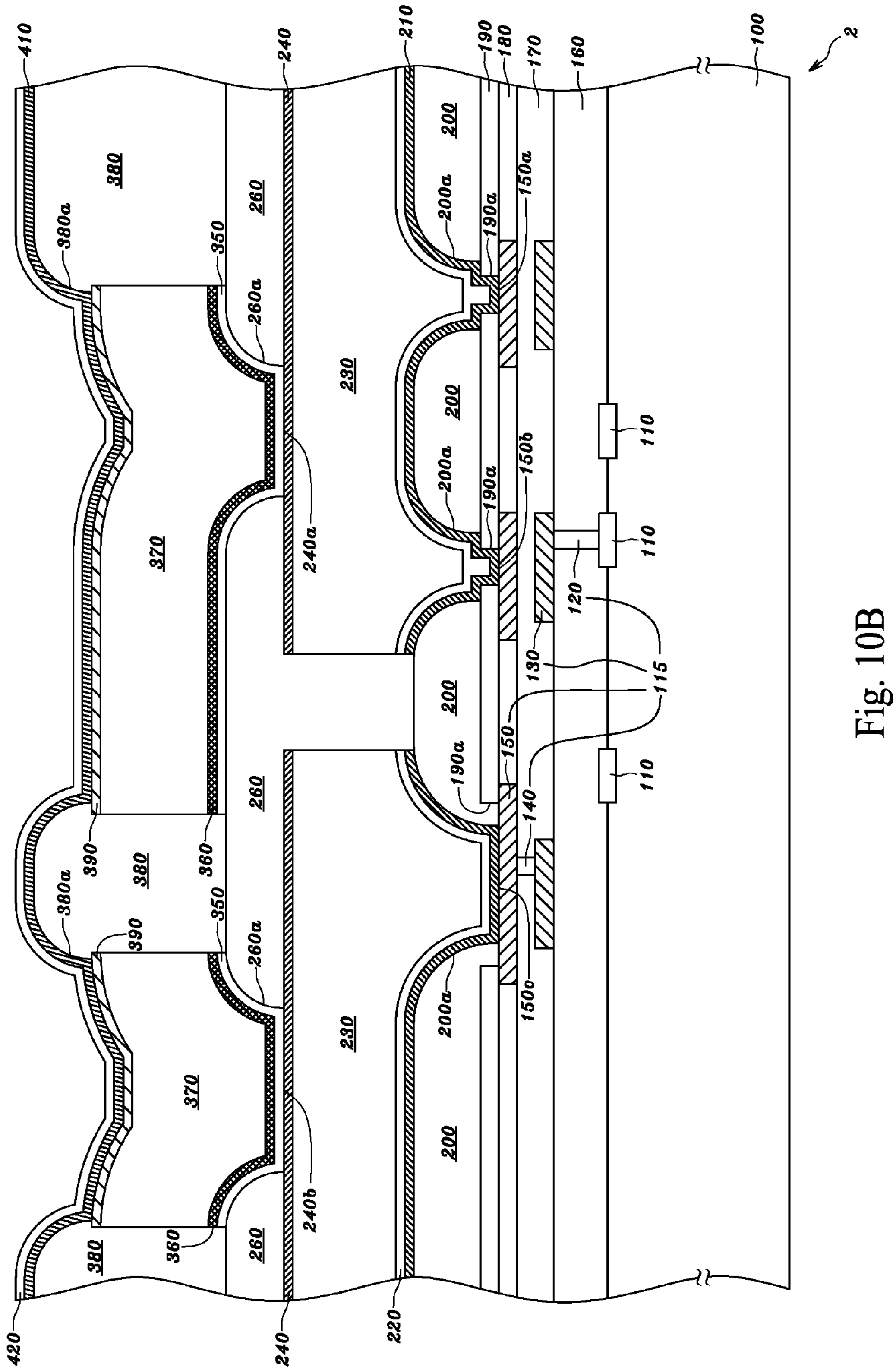

Referring to FIG. 10B, an adhesion/barrier layer 410 having a thickness between 0.02 and 0.5 micrometers, and preferably between 0.1 and 0.2 micrometers, is formed on the polymer layer 380 and on the barrier layer 390 exposed by the openings 380*a*. The adhesion/barrier layer 410 can be formed by a physical vapor deposition (PVD) process, such as a sputtering process or an evaporation process. The material of the adhesion/barrier layer 410 can be titanium nitride, a titanium-tungsten alloy, titanium, chromium, tantalum, tantalum nitride or a composite of the above-mentioned materials. The process of forming the adhesion/barrier layer 410 shown in FIG. 10B can be referred to as the process of forming the adhesion/barrier layer 410 as illustrated in FIG. 9E.

Next, a seed layer 420 having a thickness between 0.1 and 1 micrometers, and preferably between 0.05 and 0.5 micrometers, is formed on the adhesion/barrier layer 410. The seed layer 420 can be formed by a physical vapor deposition (PVD) process, such as a sputtering process or an evaporation process. The material of the seed layer 420 can be gold, platinum or palladium. The seed layer 420 is beneficial to electroplating a metal layer thereon. The process of forming the seed layer 420 shown in FIG. 10B can be referred to as the process of forming the seed layer 420 as illustrated in FIG. 9E.

Figure 10C:
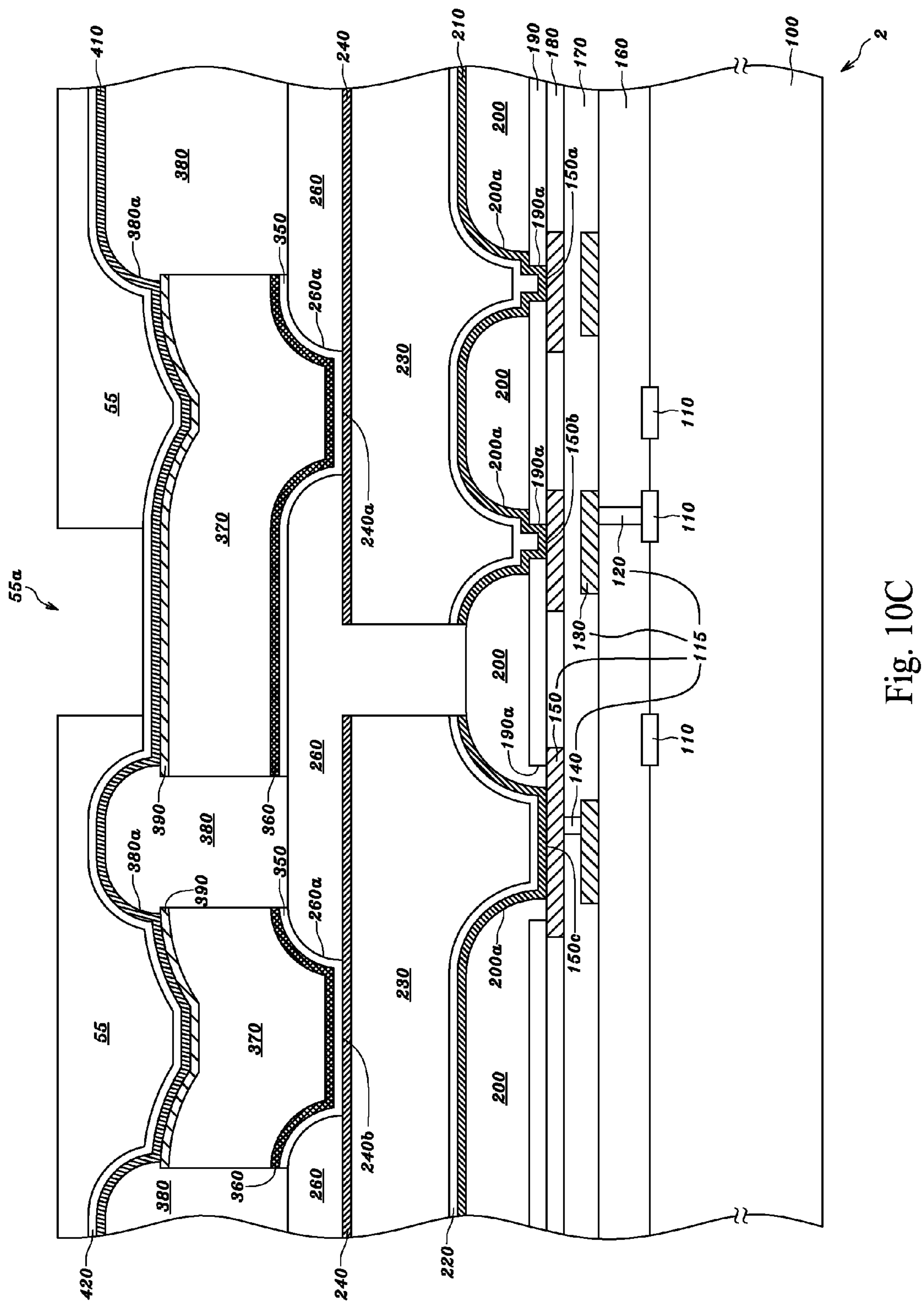

Referring to FIG. 10C, a photoresist layer 55, such as a positive-type photoresist layer or a negative-type photoresist layer, having a thickness between 5 and 30 micrometers, and preferably between 5 and 15 micrometers, is formed on the seed layer 420 by a spin-on coating process, a lamination process, a screen-printing process or a spraying process. Next, the photoresist layer 55 is patterned with the processes of exposure and development to form an opening 55*a* in the photoresist layer 55 exposing the seed layer 420. A 1× stepper or a 1× contact aligner can be used to expose the photoresist layer 55 during the process of exposure. The processes of forming the photoresist layer 55 and forming the opening 55*a* as illustrated in FIG. 10C can be referred to as the processes of forming the photoresist layer 55 and forming the opening 55*a* as illustrated in FIG. 9F.

Figure 10D:
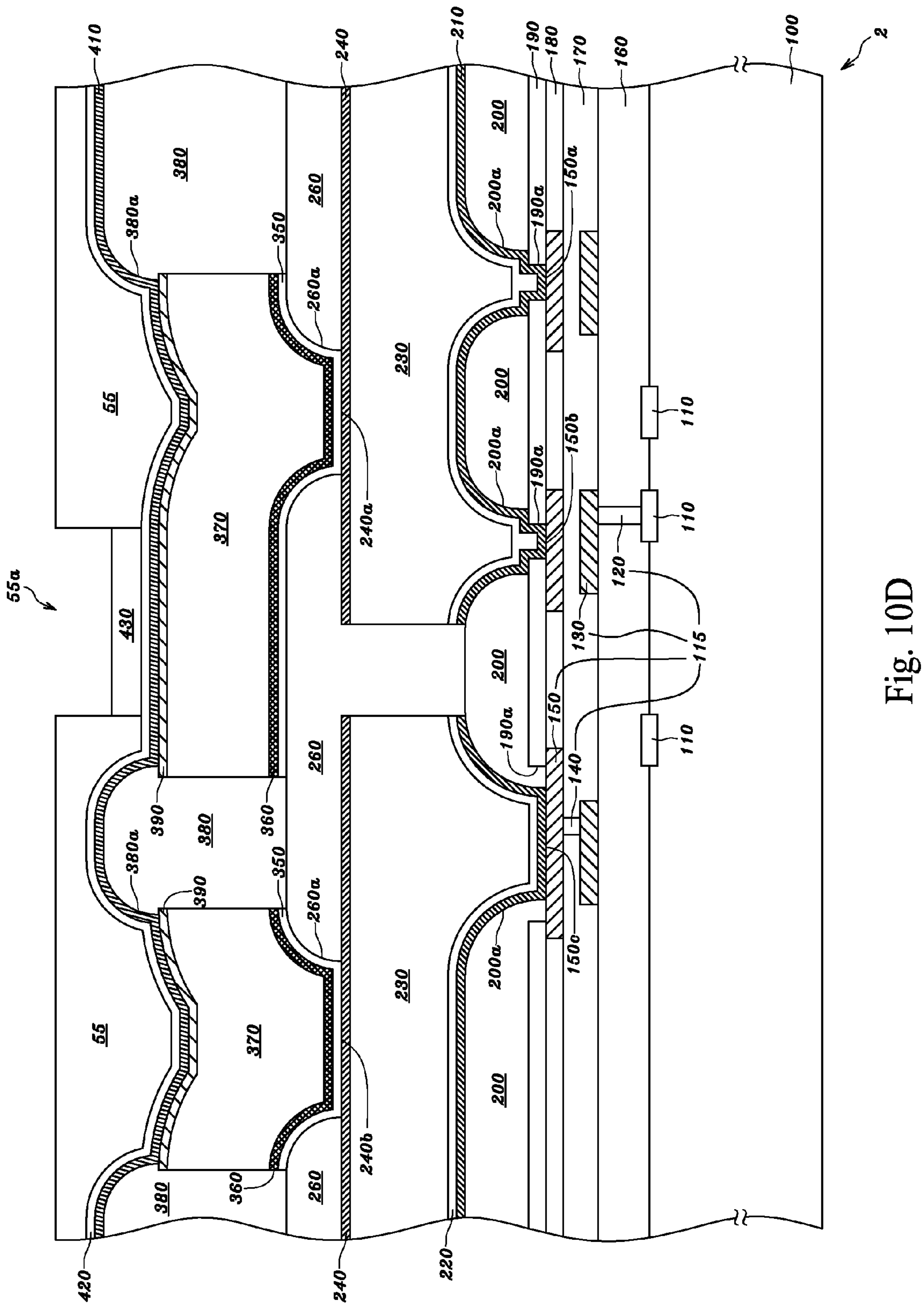

Referring to FIG. 10D, a wirebondable metal layer 430 having a thickness between 1 and 20 micrometers, and preferably between 2 and 8 micrometers, is electroplated on the seed layer 420 exposed by the opening 55*a* in the photoresist layer 55. The material of the wirebondable metal layer 430 can be gold, platinum or palladium. In a case, the wirebondable metal layer 430 can be formed by electroplating a gold layer with a thickness between 1 and 20 micrometers, and preferably between 2 and 8 micrometers, on the seed layer 420, made of gold, exposed by the opening 55*a* with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. In another case, the wirebondable metal layer 430 can be formed by electroplating a platinum layer with a thickness between 1 and 20 micrometers, and preferably between 2 and 8 micrometers, on the seed layer 420, made of platinum, exposed by the opening 55*a*. In another case, the wirebondable metal layer 430 can be formed by electroplating a palladium layer with a thickness between 1 and 20 micrometers, and preferably between 2 and 8 micrometers, on the seed layer 420, made of palladium, exposed by the opening 55*a*.

Figure 10E:
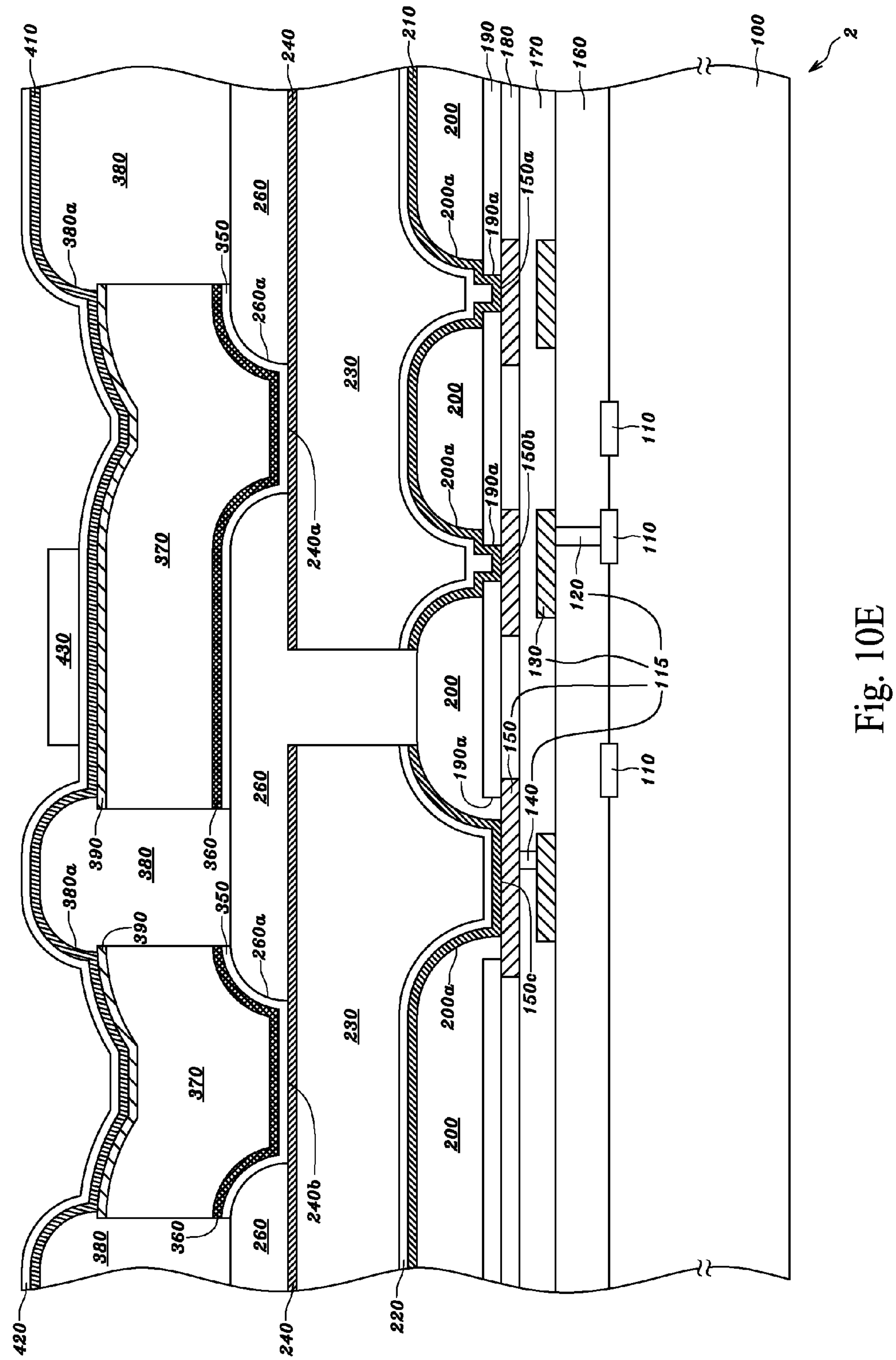

Referring to FIG. 10E, after the wirebondable metal layer 430 is formed, the photoresist layer 55 is removed using an inorganic solution or using an organic solution with amide. Some residuals from the photoresist layer 55 could remain on the wirebondable metal layer 430 and on the seed layer 420 not under the wirebondable metal layer 430. Thereafter, the residuals can be removed from the wirebondable metal layer 430 and from the seed layer 420 with a plasma, such as an $O_2$ plasma or a plasma containing fluorine of below 200 PPM and oxygen.

Figure 10F:
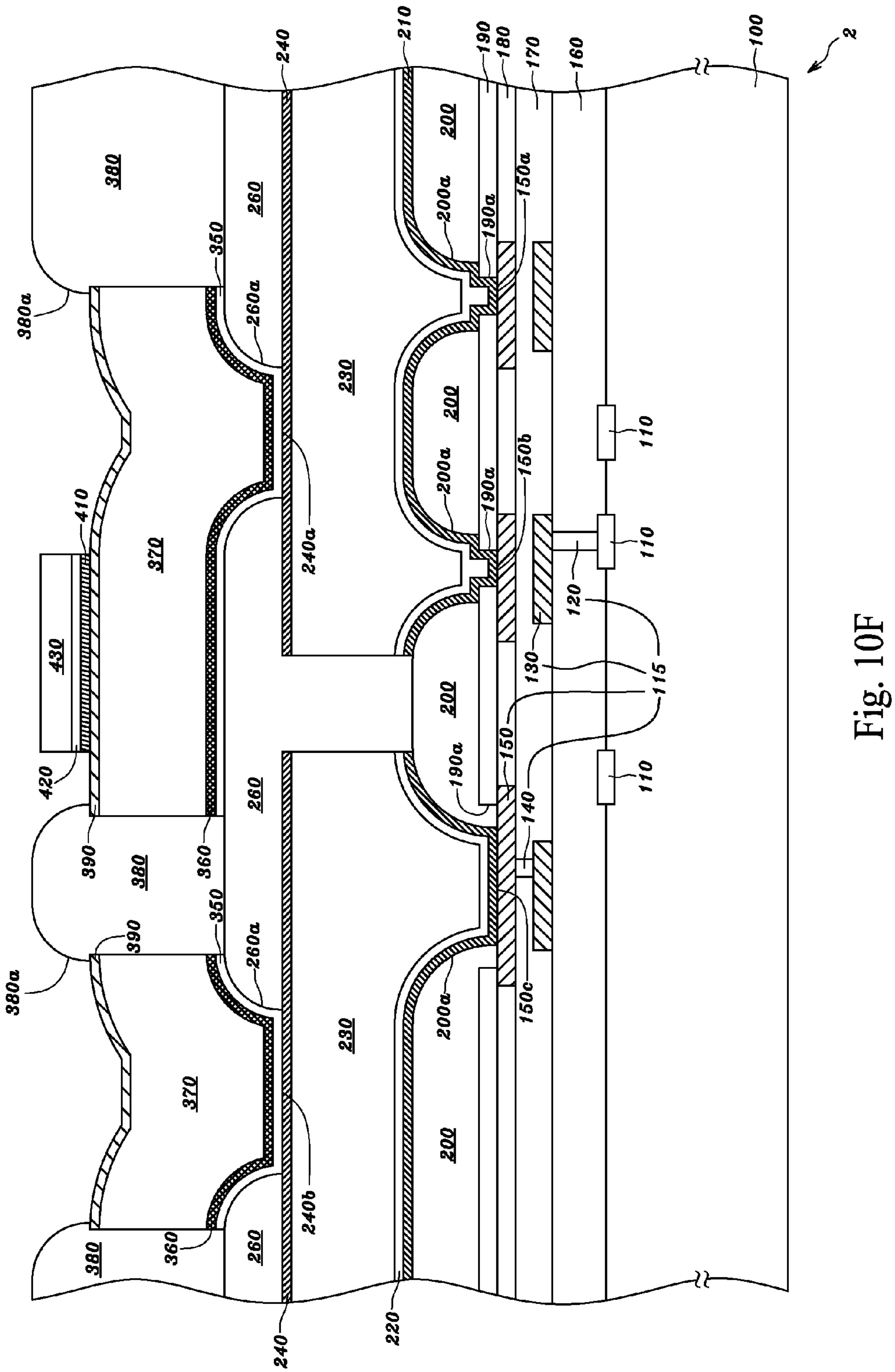

Referring to FIG. 10F, the seed layer 420 and the adhesion/barrier layer 410 not under the wirebondable metal layer 430 are subsequently removed with an etching method. The process as illustrated in FIG. 10F, of removing the seed layer 420 and the adhesion/barrier layer 410 not under the wirebondable metal layer 430, can be referred to as the process as illustrated in FIG. 9I, of removing the seed layer 420 and the adhesion/barrier layer 410 not under the wirebondable metal layer 430.

Figure 10G:
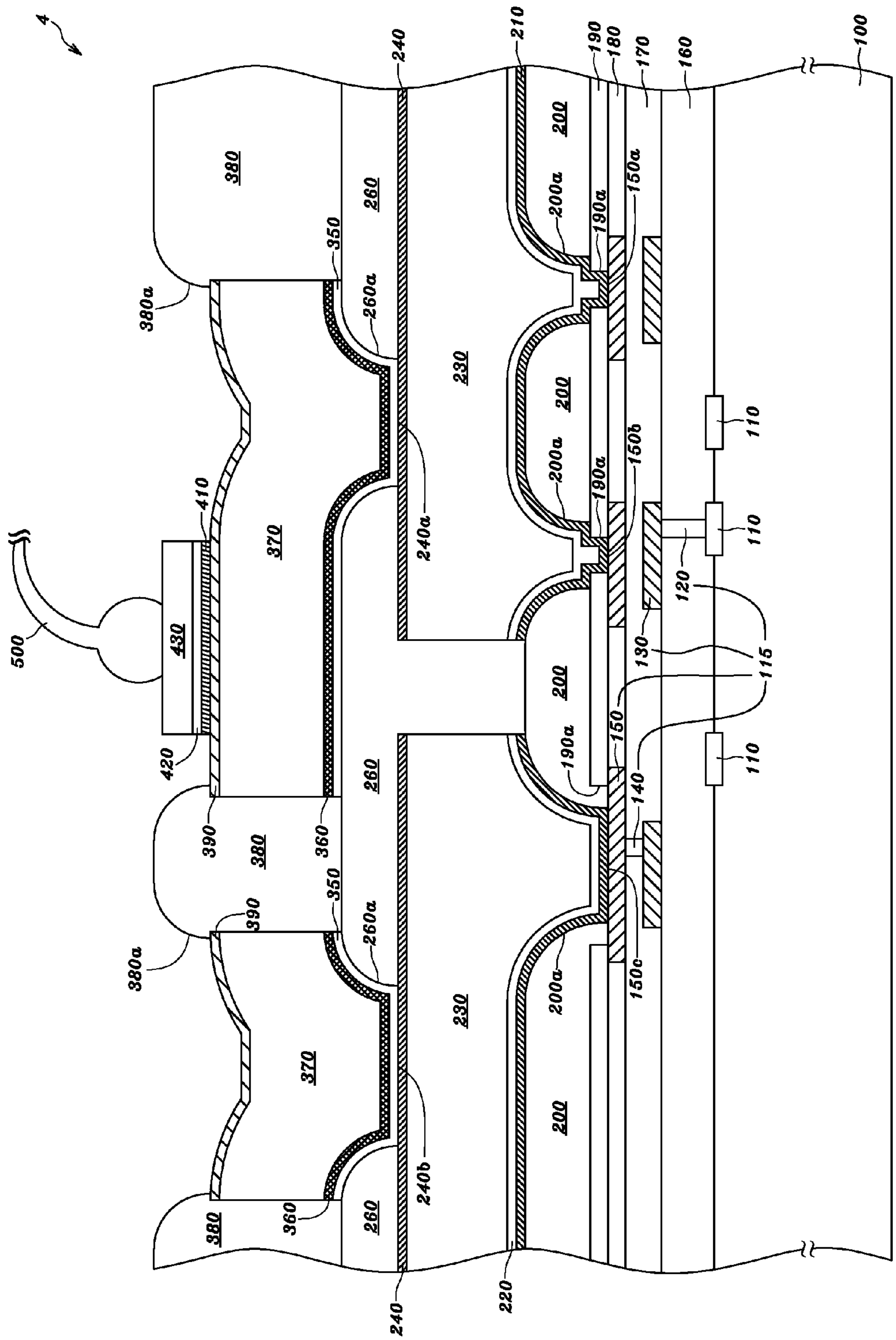

Referring to FIG. 10G, after the seed layer 420 and the adhesion/barrier layer 410 not under the wirebondable metal layer 430 are removed, the semiconductor wafer 2 can be cut into a plurality of individual semiconductor chips 4 (only one of them is shown) by a dice sawing process.

Next, via a wire-bonding process, a wire 500, made of gold, copper or aluminum, can be ball bonded on the wirebondable metal layer 430 of the semiconductor chip 4. Alternatively, via a wire-bonding process, the wire 500, made of gold, copper or aluminum, can be wedge bonded on the wirebondable metal layer 430 of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 10H:
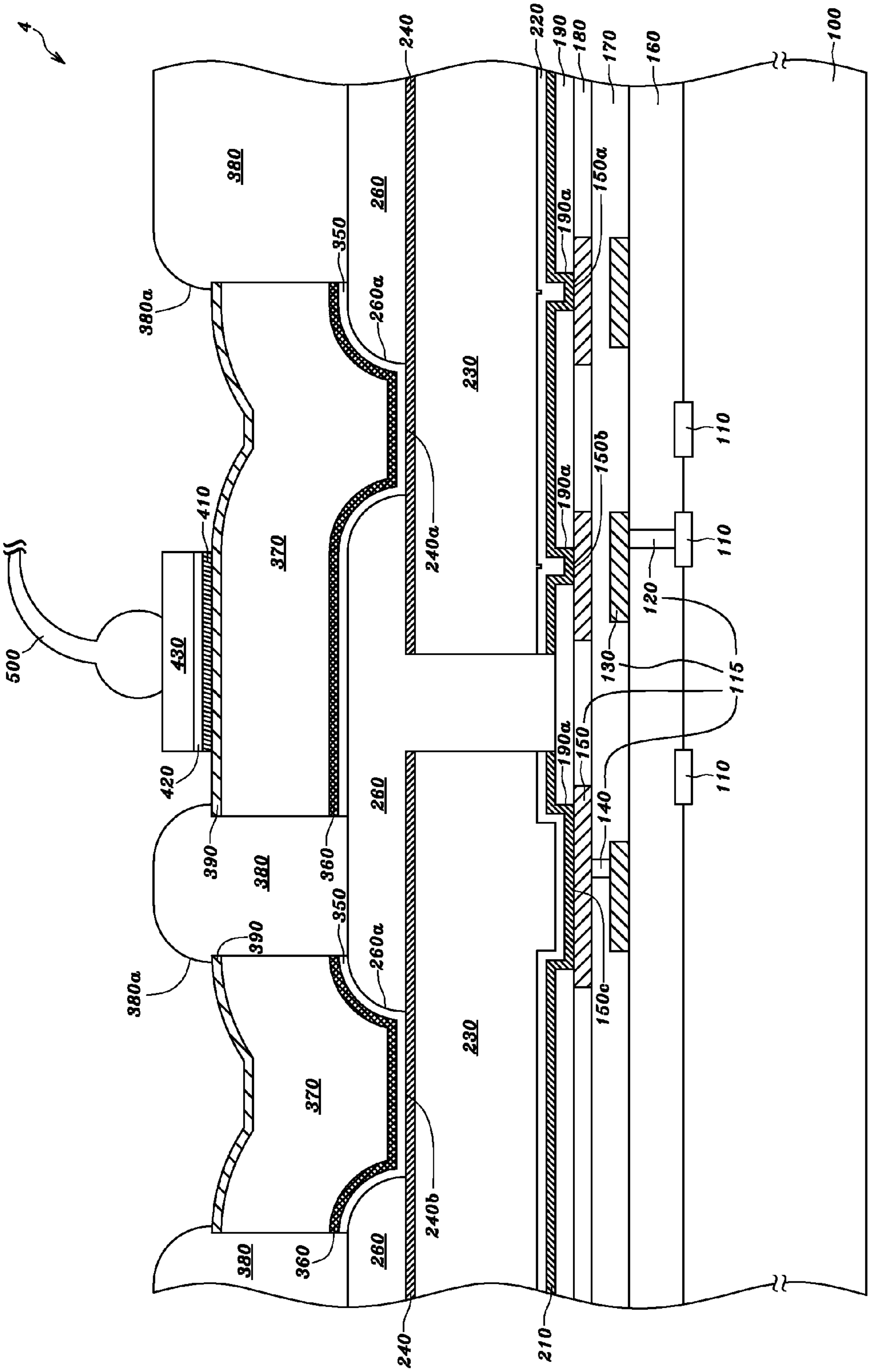
FIGS. 10H and 10J are cross-sectional views showing a semiconductor chip with third thick metal layers and a wirebonded wire bonded to the topmost thick metal layer.

Alternatively, referring to FIG. 10H, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by performing the above-mentioned steps as shown in FIGS. 9A-9C, followed by performing the above-mentioned steps as shown in FIGS. 10A-10G. The process of forming the adhesion/barrier layer 210 shown in FIG. 10H can be referred to as the process of forming the adhesion/barrier layer 210 as illustrated in FIG. 4A. The process of forming the seed layer 220 shown in FIG. 10H can be referred to as the process of forming the seed layer 220 as illustrated in FIG. 4A. The process of forming the polymer layer 260 shown in FIG. 10H can be referred to as the process of forming the polymer layer 260 as illustrated in FIG. 4F.

Figure 10I:
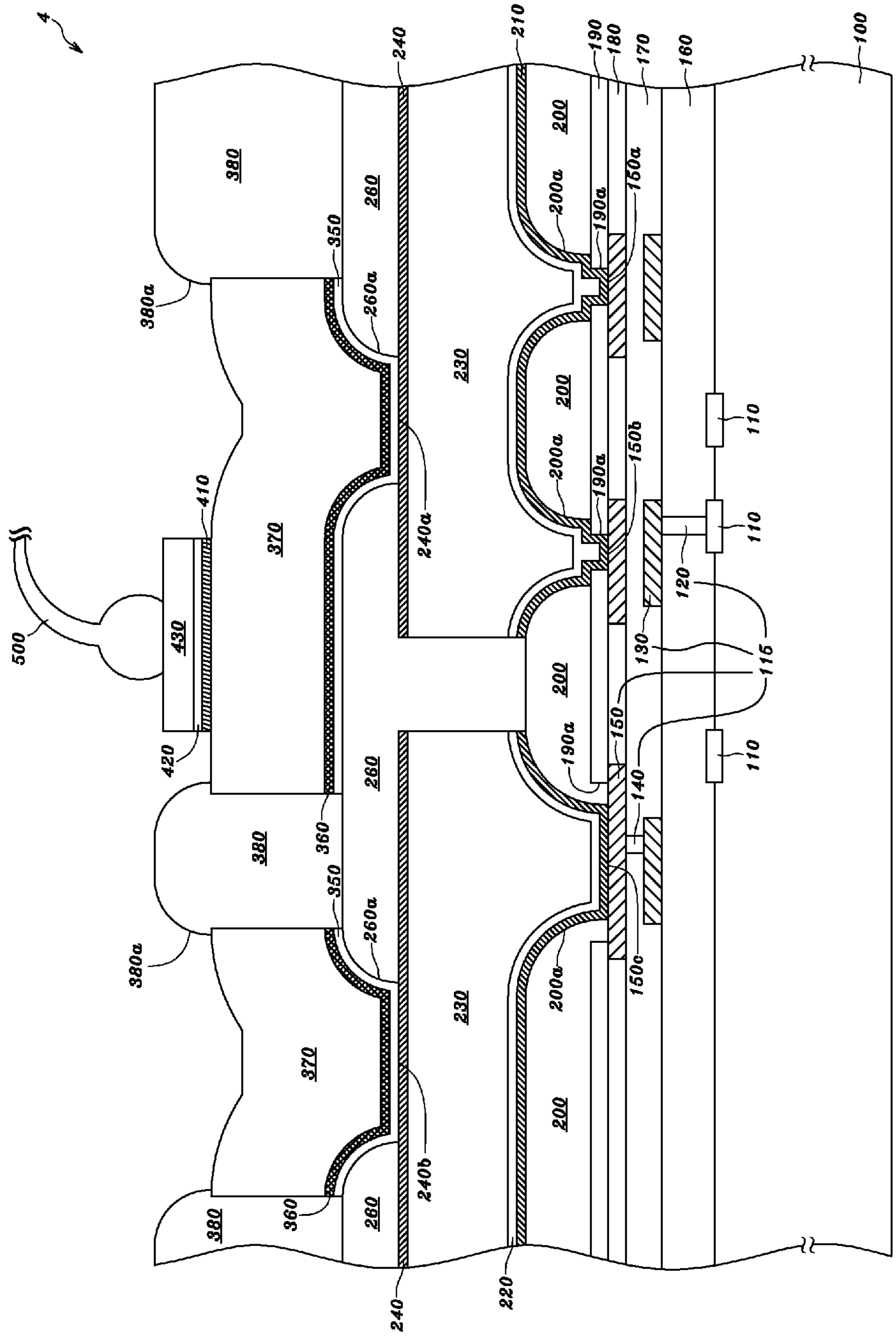

Alternatively, referring to FIG. 10I, the step of forming the barrier layer 390 shown in FIG. 9A can be omitted, that is, that is, after the step shown in FIG. 8B, the copper layer 370 is electroplated or electroless plated on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the polymer layer 260 and in the gap between neighboring metal traces provided by the adhesion/barrier 350, the seed layer 360 and the copper layer 370, wherein the openings 380*a* in the polymer layer 380 expose the copper layer 370, followed by forming the adhesion/barrier layer 410 on the polymer layer 380 and on the copper layer 370 exposed by the openings 380*a*, followed by forming the seed layer 420 shown in FIG. 10B on the adhesion/barrier layer 410, followed by performing the above-mentioned steps as shown in FIGS. 10C-10G. The process of forming the polymer layer 380 shown in FIG. 10I can be referred to as the process of forming the polymer layer 380 as illustrated in FIG. 10A. The process of forming the adhesion/barrier layer 410 shown in FIG. 10I can be referred to as the process of forming the adhesion/barrier layer 410 as illustrated in FIG. 9E. The process of forming the seed layer 420 shown in FIG. 10I can be referred to as the process of forming the seed layer 420 as illustrated in FIG. 9E.

Figure 10J:
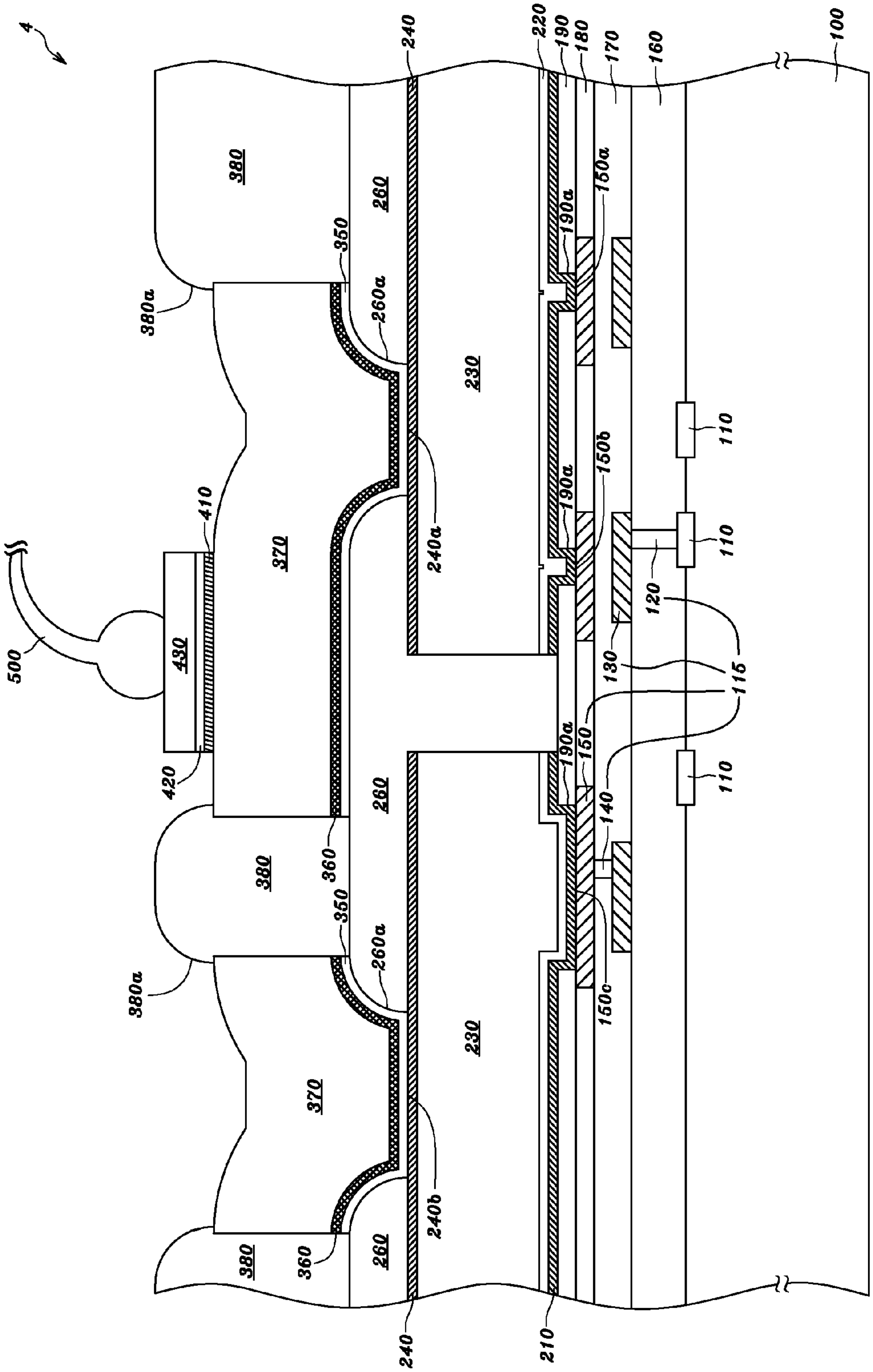

Alternatively, referring to FIG. 10J, the step of forming the polymer layer 200 shown in FIG. 3 and the step of forming the barrier layer 390 shown in FIG. 9A can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the abovementioned steps as shown in FIGS. 8A-8B, followed by electroplating or electroless plating the copper layer 370 on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the polymer layer 260 and in the gap between neighboring metal traces provided by the adhesion/barrier 350, the seed layer 360 and the copper layer 370, wherein the openings 380*a* in the polymer layer 380 expose the copper layer 370, followed by forming the adhesion/barrier layer 410 on the polymer layer 380 and on the copper layer 370 exposed by the openings 380*a*, followed by forming the seed layer 420 shown in FIG. 10B on the adhesion/barrier layer 410, followed by performing the above-mentioned steps as shown in FIGS. 10C-10G. The process of forming the adhesion/barrier layer 210 shown in FIG. 10J can be referred to as the process of forming the adhesion/barrier layer 210 as illustrated in FIG. 4A. The process of forming the seed layer 220 shown in FIG. 10J can be referred to as the process of forming the seed layer 220 as illustrated in FIG. 4A. The process of forming the polymer layer 260 shown in FIG. 10J can be referred to as the process of forming the polymer layer 260 as illustrated in FIG. 4F. The process of forming the polymer layer 380 shown in FIG. 10J can be referred to as the process of forming the polymer layer 380 as illustrated in FIG. 10A. The process of forming the adhesion/barrier layer 410 shown in FIG. 10J can be referred to as the process of forming the adhesion/barrier layer 410 as illustrated in FIG. 9E. The process of forming the seed layer 420 shown in FIG. 10J can be referred to as the process of forming the seed layer 420 as illustrated in FIG. 9E.

Embodiment 8

Figure 11A:
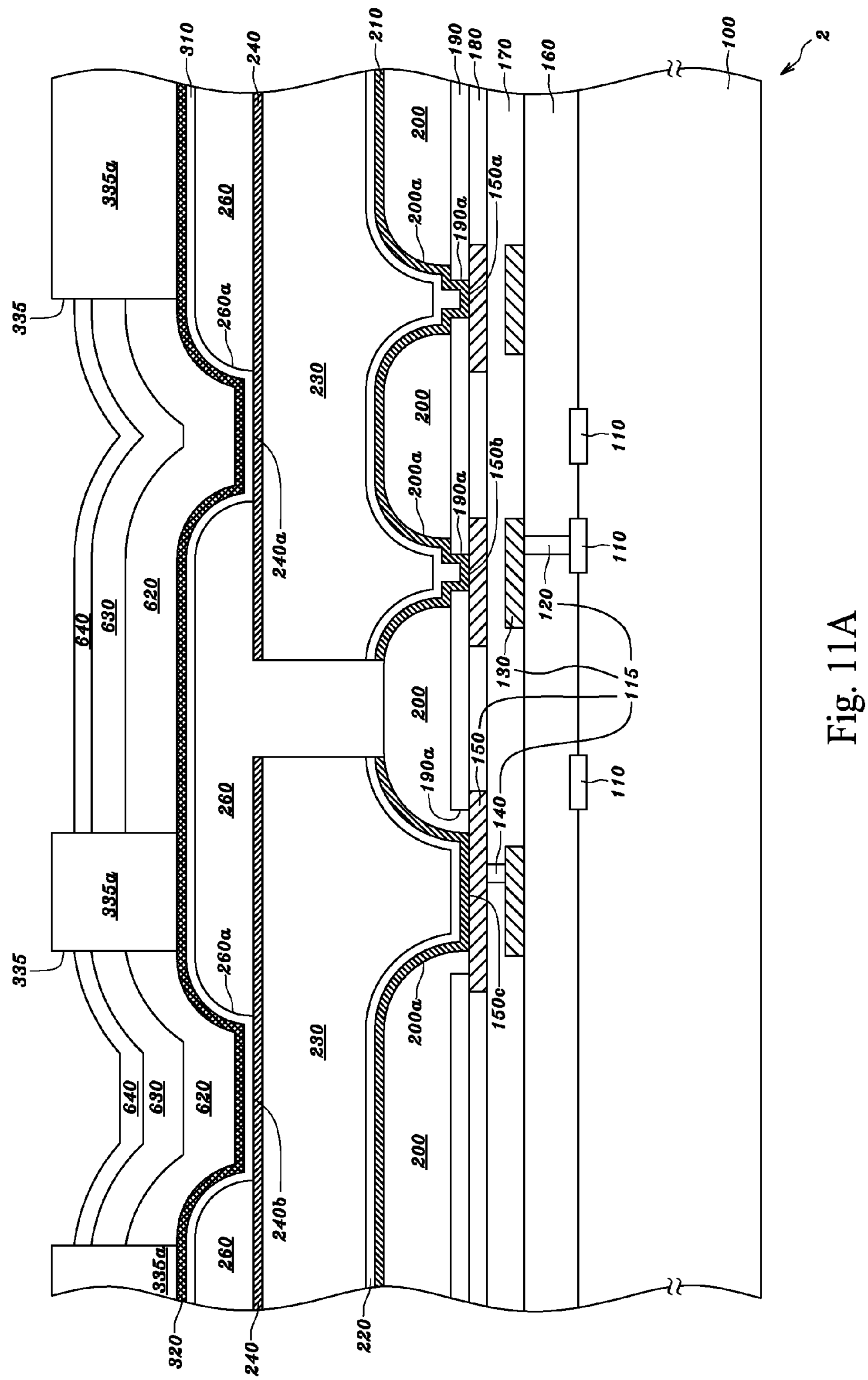
FIGS. 11A-11E are cross-sectional views showing a process for forming a semiconductor chip and bonding a wirebonded wire to the semiconductor chip according to one embodiment of the present invention.

Referring to FIG. 11A, after the step shown in FIG. 4H, a copper layer 620 having a thickness between 3 and 25 micrometers, and preferably between 10 and 20 micrometers, can be electroplated or electroless plated on the seed layer 320, made of copper, exposed by the openings 335 in the photoresist layer 335*a*. Next, a nickel layer 630 having a thickness between 0.05 and 5 micrometers, and preferably between 0.1 and 1 micrometers, can be electroplated or electroless plated on the copper layer 620 in the openings 335. Next, a wirebondable metal layer 640 having a thickness between 0.05 and 5 micrometers, and preferably between 0.05 and 2 micrometers, can be electroplated or electroless plated on the nickel layer 630 in the openings 335.

The material of the wirebondable metal layer 640 can be gold, platinum or palladium. In a case, the wirebondable metal layer 640 can be formed by electroplating a gold layer with a thickness between 0.05 and 5 micrometers, and preferably between 0.05 and 2 micrometers, on the nickel layer 630 in the openings 335 with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. In another case, the wirebondable metal layer 640 can be formed by electroplating a platinum layer with a thickness between 0.05 and 5 micrometers, and preferably between 0.05 and 2 micrometers, on the nickel layer 630 in the openings 335. In another case, the wirebondable metal layer 640 can be formed by electroplating a palladium layer with a thickness between 0.05 and 5 micrometers, and preferably between 0.05 and 2 micrometers, on the nickel layer 630 in the openings 335.

In this embodiment, the adhesion/barrier layer 310 can be formed by sputtering a titanium-containing layer on the polymer layer 260 and on the contact points 240*a* and 240*b* exposed by the openings 260*a*, and the seed layer 320 can be formed by sputtering a copper layer with a thickness between 0.05 and 0.5 micrometers, and preferably between 0.08 and 0.15 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer. Alternatively, the adhesion/barrier layer 310 can be formed by sputtering a chromium layer on the polymer layer 260 and on the contact points 240*a* and 240*b* exposed by the openings 260*a*, and the seed layer 320 can be formed by sputtering a copper layer with a thickness between 0.05 and 0.5 micrometers, and preferably between 0.08 and 0.15 micrometers, on the chromium layer.

Figure 11B:
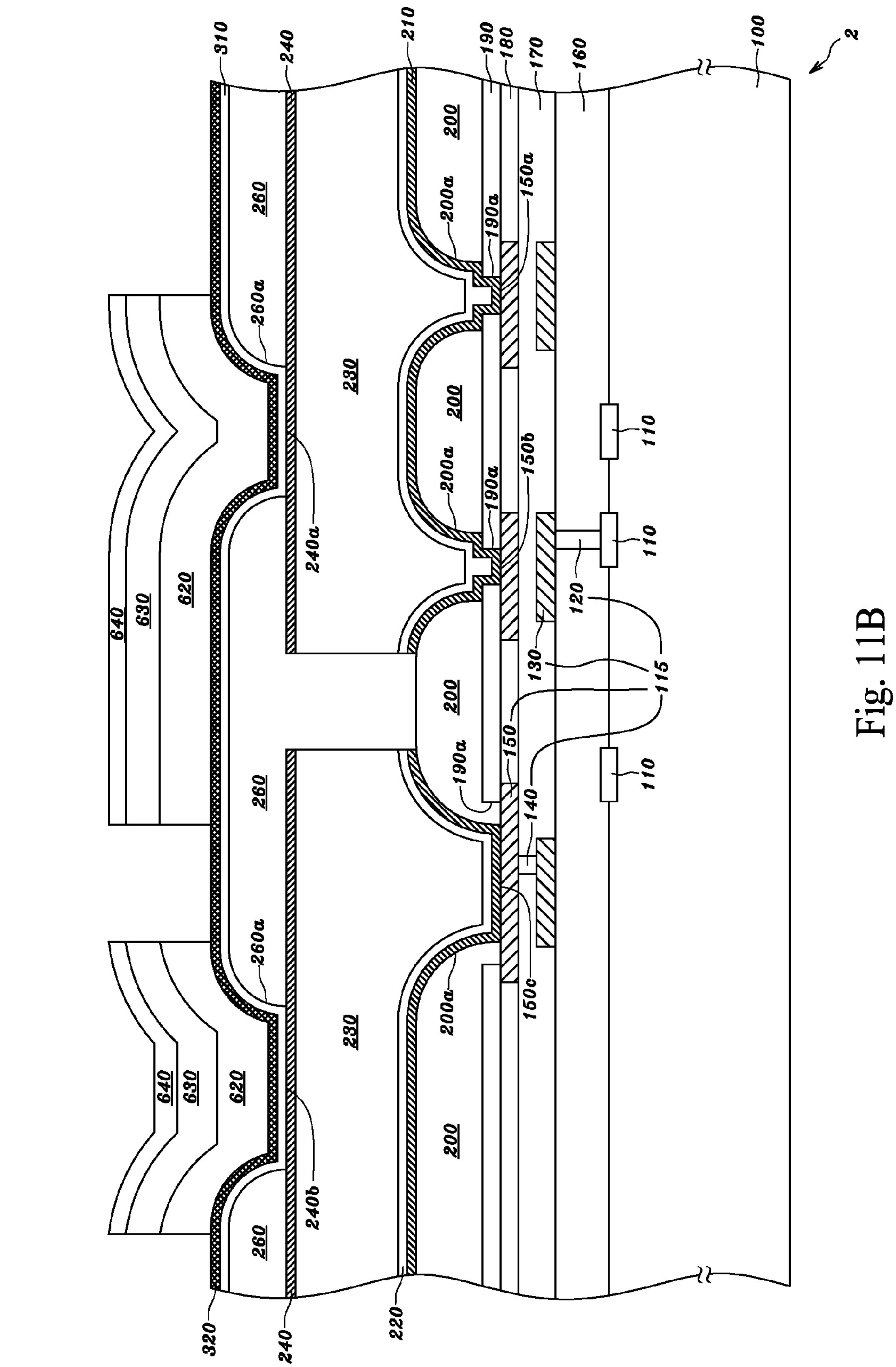

Referring to FIG. 11B, after the wirebondable metal layer 640 is formed, the photoresist layer 335*a* can be removed using an inorganic solution or using an organic solution with amide. Some residuals from the photoresist layer 335*a* could remain on the wirebondable metal layer 640 and on the seed layer 320 not under the copper layer 620. Thereafter, the residuals can be removed from the wirebondable metal layer 640 and from the seed layer 320 with a plasma, such as an $O_2$ plasma or a plasma containing fluorine of below 200 PPM and oxygen.

Figure 11C:
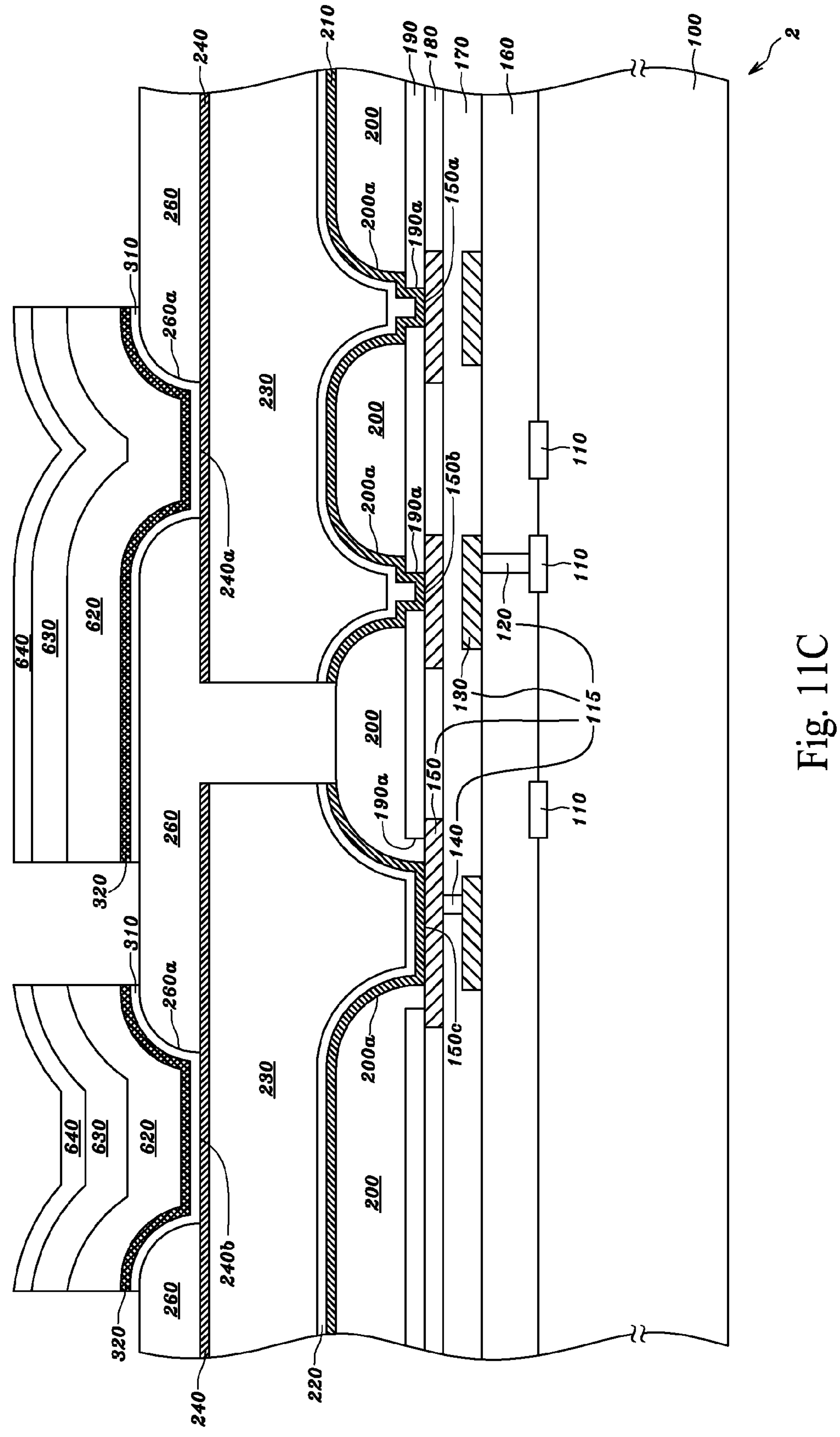

Referring to FIG. 11C, the seed layer 320 and the adhesion/barrier layer 310 not under the copper layer 620 are subsequently removed with an etching method. In a case, the seed layer 320 and the adhesion/barrier layer 310 not under the copper layer 620 can be subsequently removed by a dry etching method. As to the dry etching method, both the seed layer 320 and the adhesion/barrier layer 310 not under the copper layer 620 can be subsequently removed by an Ar sputtering etching process; alternatively, both the seed layer 320 and the adhesion/barrier layer 310 not under the copper layer 620 can be subsequently removed by a reactive ion etching (RIE) process; alternatively, the seed layer 320 not under the copper layer 620 can be removed by an Ar sputtering etching process, and the adhesion/barrier layer 310 not under the copper layer 620 can be removed by a reactive ion etching (RIE) process; alternatively, the seed layer 320 not under the copper layer 620 can be removed by a reactive ion etching (RIE) process, and the adhesion/barrier layer 310 not under the copper layer 620 can be removed by an Ar sputtering etching process. In another case, the seed layer 320 and the adhesion/barrier layer 310 not under the copper layer 620 can be subsequently removed by a wet etching method. As to the wet etching method, when the seed layer 320 is a copper layer, it can be etched with a solution containing $NH_4OH$ or with a solution containing $H_2SO_4$; when the adhesion/barrier layer 310 is a titanium layer, it can be etched with a solution containing hydrogen fluoride or with a solution containing $NH_4OH$ and hydrogen peroxide; when the adhesion/barrier layer 310 is a titanium-tungsten-alloy layer, it can be etched with a solution containing hydrogen peroxide or with a solution containing $NH_4OH$ and hydrogen peroxide; when the adhesion/barrier layer 310 is a chromium layer, it can be etched with a solution containing potassium ferricyanide. In another case, the seed layer 320, made of copper, not under the copper layer 620 can be removed by a solution containing $NH_4OH$ or with a solution containing $H_2SO_4$, and the adhesion/barrier layer 310 not under the copper layer 620 can be removed by a reactive ion etching (RIE) process. In another case, the seed layer 320, made of copper, not under the copper layer 620 can be removed by a solution containing $NH_4OH$ or with a solution containing $H_2SO_4$, and the adhesion/barrier layer 310 not under the copper layer 620 can be removed by an Ar sputtering etching process.

Figure 11D:
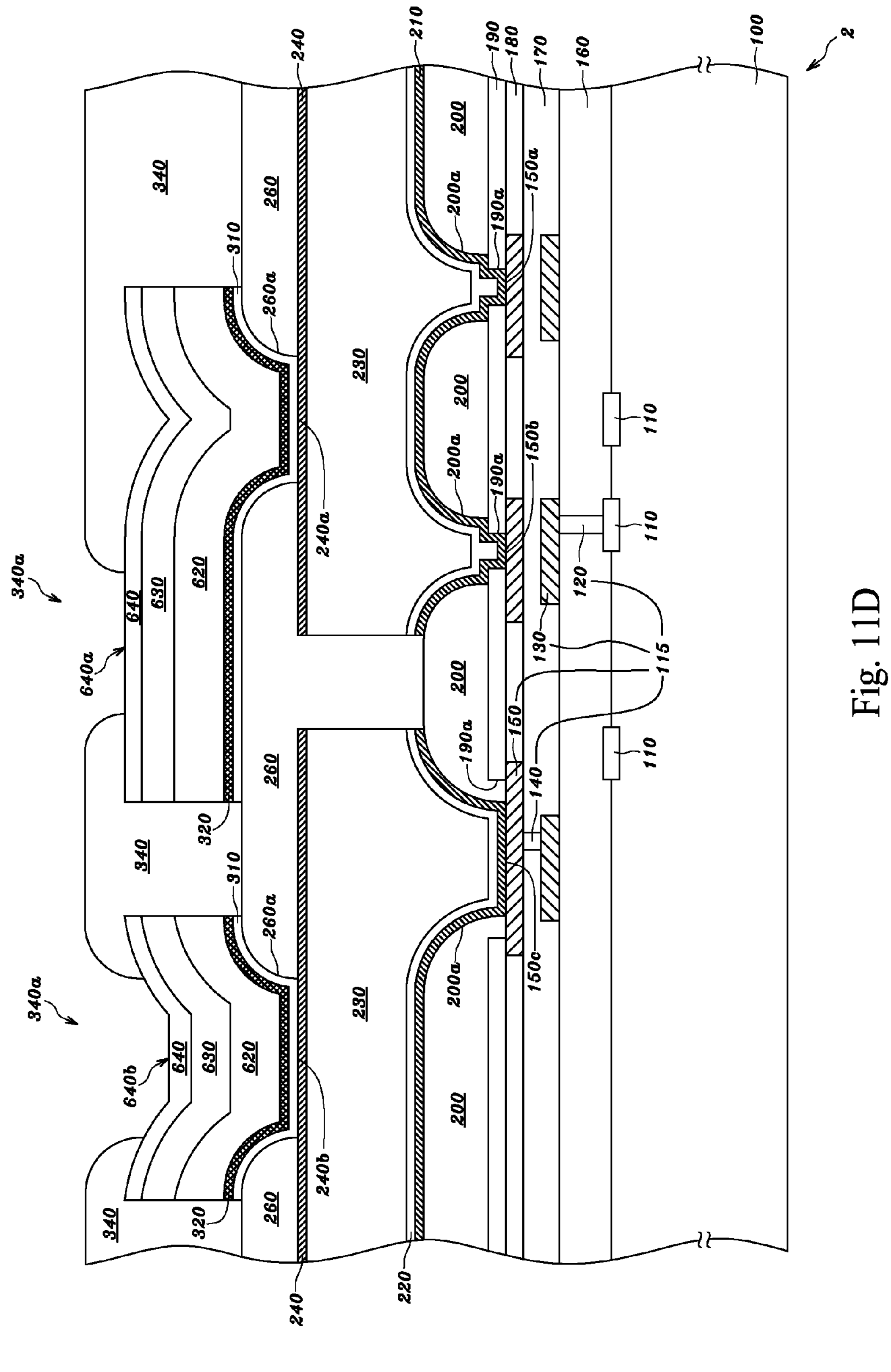

Referring to FIG. 11D, a polymer layer 340 can be formed on the wirebondable metal layer 640 and on the polymer layer 260 by a process including a spin-on coating process, a lamination process, a screen-printing process or a spraying process, and openings 340*a* in the polymer layer 340 are over contact points 640*a* and 640*b* of the wirebondable metal layer 640 and expose the contact points 640*a* and 640*b*. The contact points 640*a* and 640*b* are at bottoms of the openings 340*a*. The polymer layer 340 has a thickness between 3 and 25 micrometers, and preferably between 5 and 15 micrometers, and the material of the polymer layer 340 may include benzocyclobutane (BCB), polyimide (PI), polybenzoxazole (PBO) or epoxy resin. The process of forming the polymer layer 340 shown in FIG. 11D can be referred to as the process of forming the polymer layer 340 as illustrated in FIG. 4L.

Figure 11E:
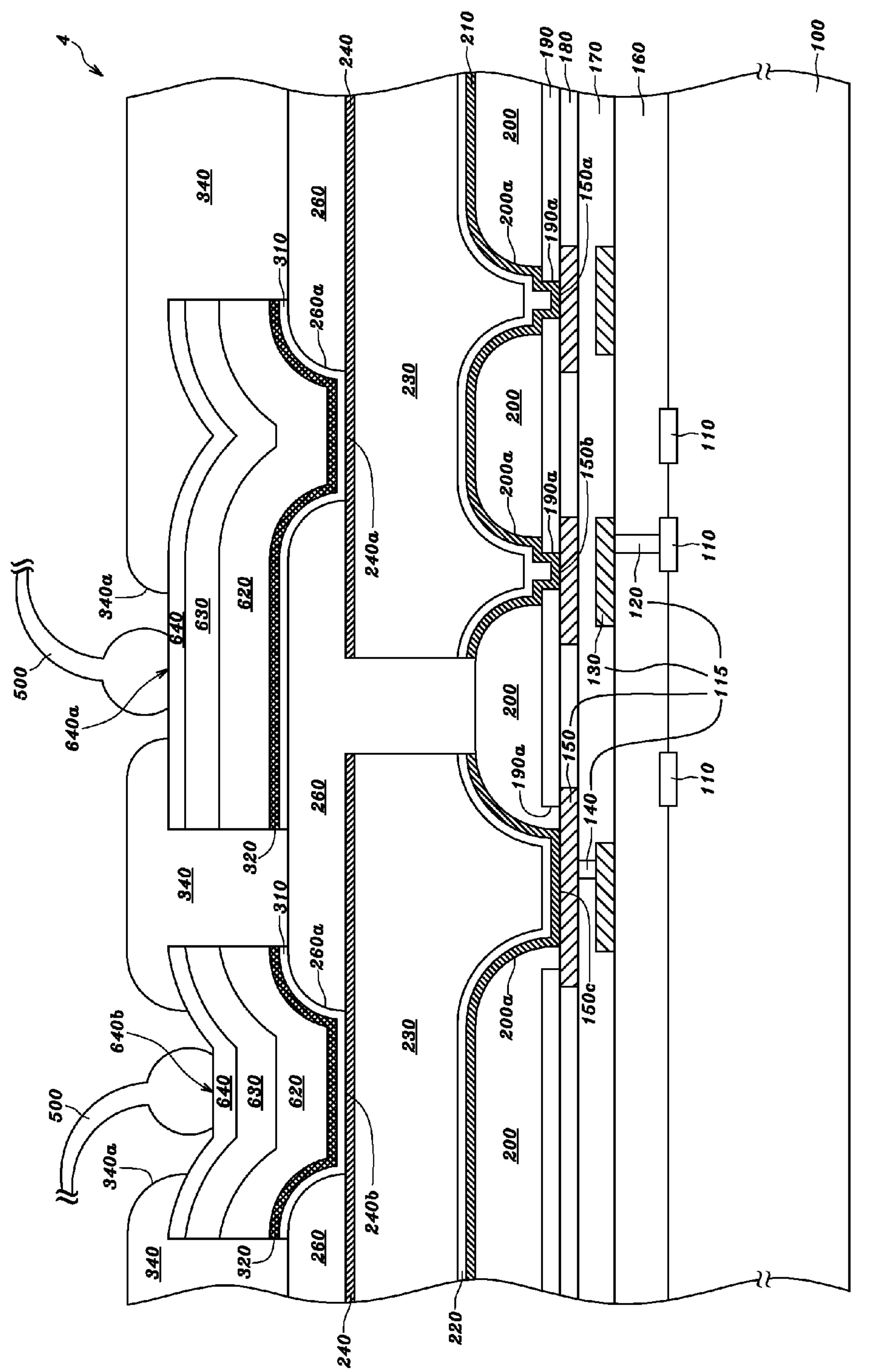

Referring to FIG. 11E, after the polymer layer 340 is formed, the semiconductor wafer 2 can be cut into a plurality of individual semiconductor chips 4 (only one of them is shown) by a dice sawing process.

Next, via a wire-bonding process, two wires 500, made of gold, copper or aluminum, can be ball bonded on the contact points 640*a* and 640*b* of the semiconductor chip 4. Alternatively, via a wire-bonding process, the wires 500, made of gold, copper or aluminum, can be wedge bonded on the contact points 640*a* and 640*b* of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 11F:
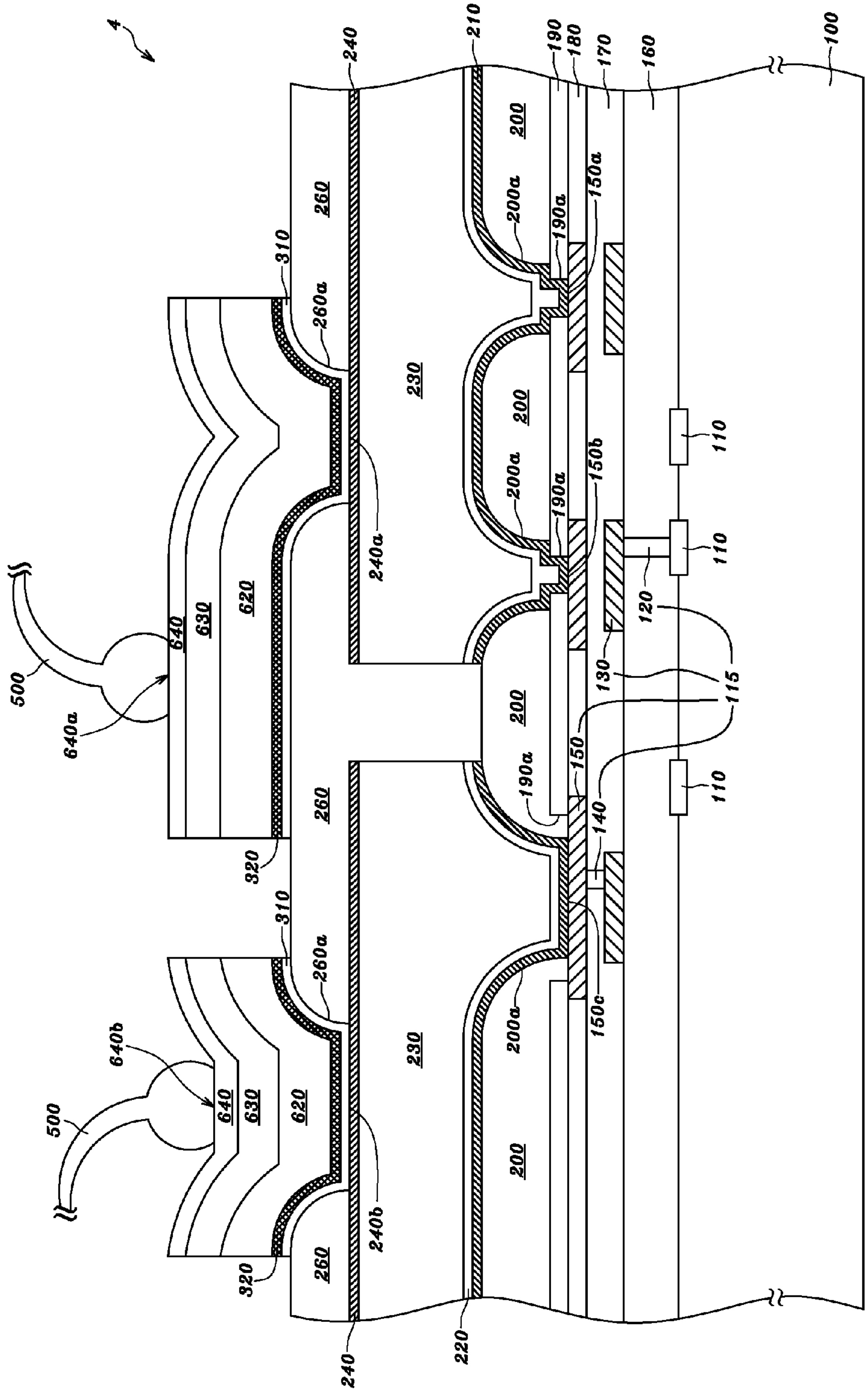
FIGS. 11F and 11L are cross-sectional views showing a semiconductor chip with two thick metal layers and a wirebonded wire bonded to the topmost thick metal layer.

Alternatively, referring to FIG. 11F, the step of forming the polymer layer 340 as shown in FIG. 11D can be omitted, that is, after performing the above-mentioned step as shown in FIG. 11C, the step illustrated in FIG. 11E can be performed without the polymer layer 340 formed on the polymer layer 260 and on the wirebondable metal layer 640.

Figure 11G:
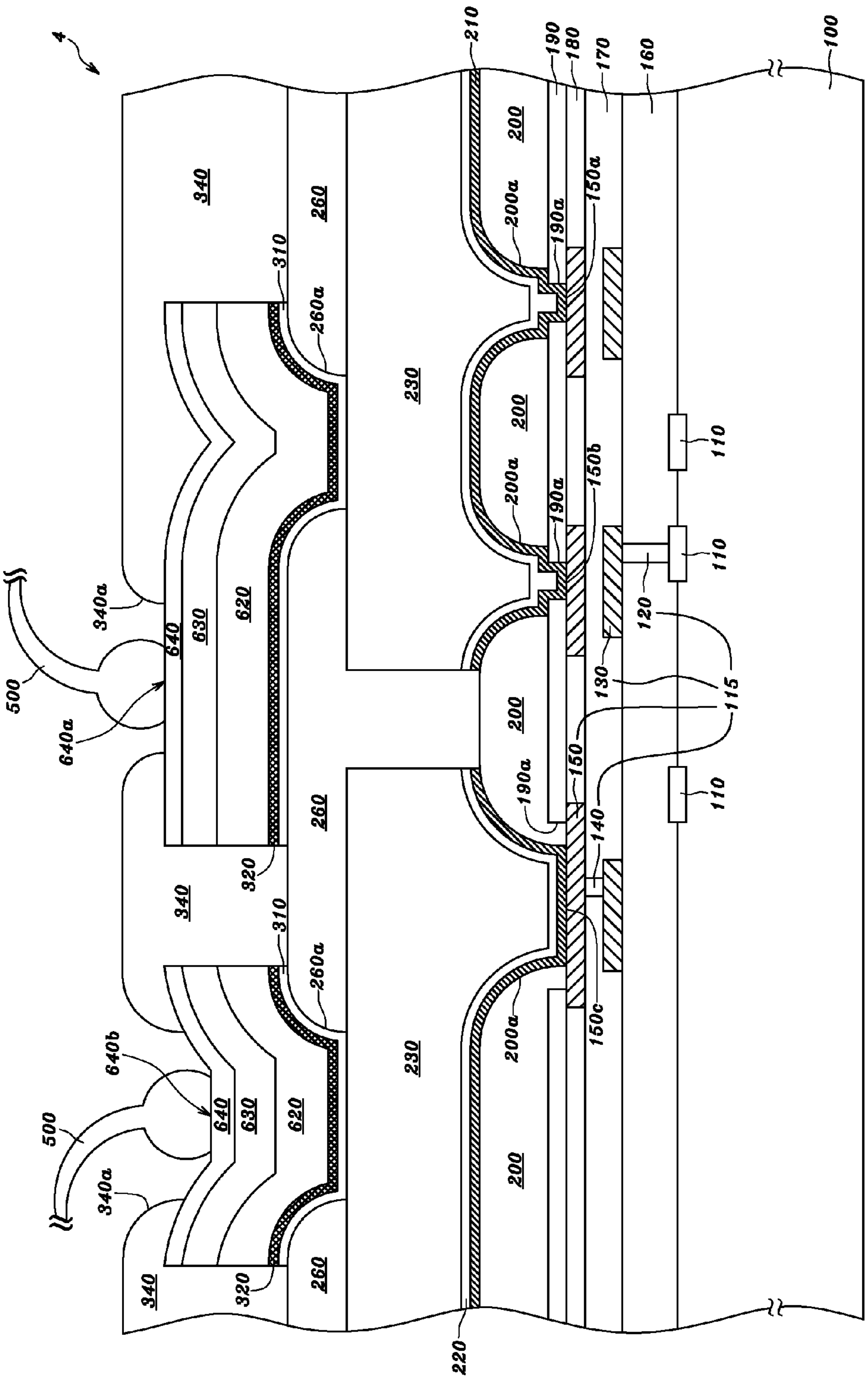

Alternatively, referring to FIG. 11G, the step of forming the barrier layer 240 shown in FIG. 4C can be omitted, that is, after the copper layer 230 shown in FIG. 4C is formed, the photoresist layer 245*a* is removed, without forming the barrier layer 240 on the copper layer 230, using an inorganic solution or using an organic solution with amide as illustrated in FIG. 4D, followed by performing the above-mentioned steps as shown in FIGS. 4E-4H, followed by performing the above-mentioned steps as shown in FIGS. 11A-11E.

Figure 11H:
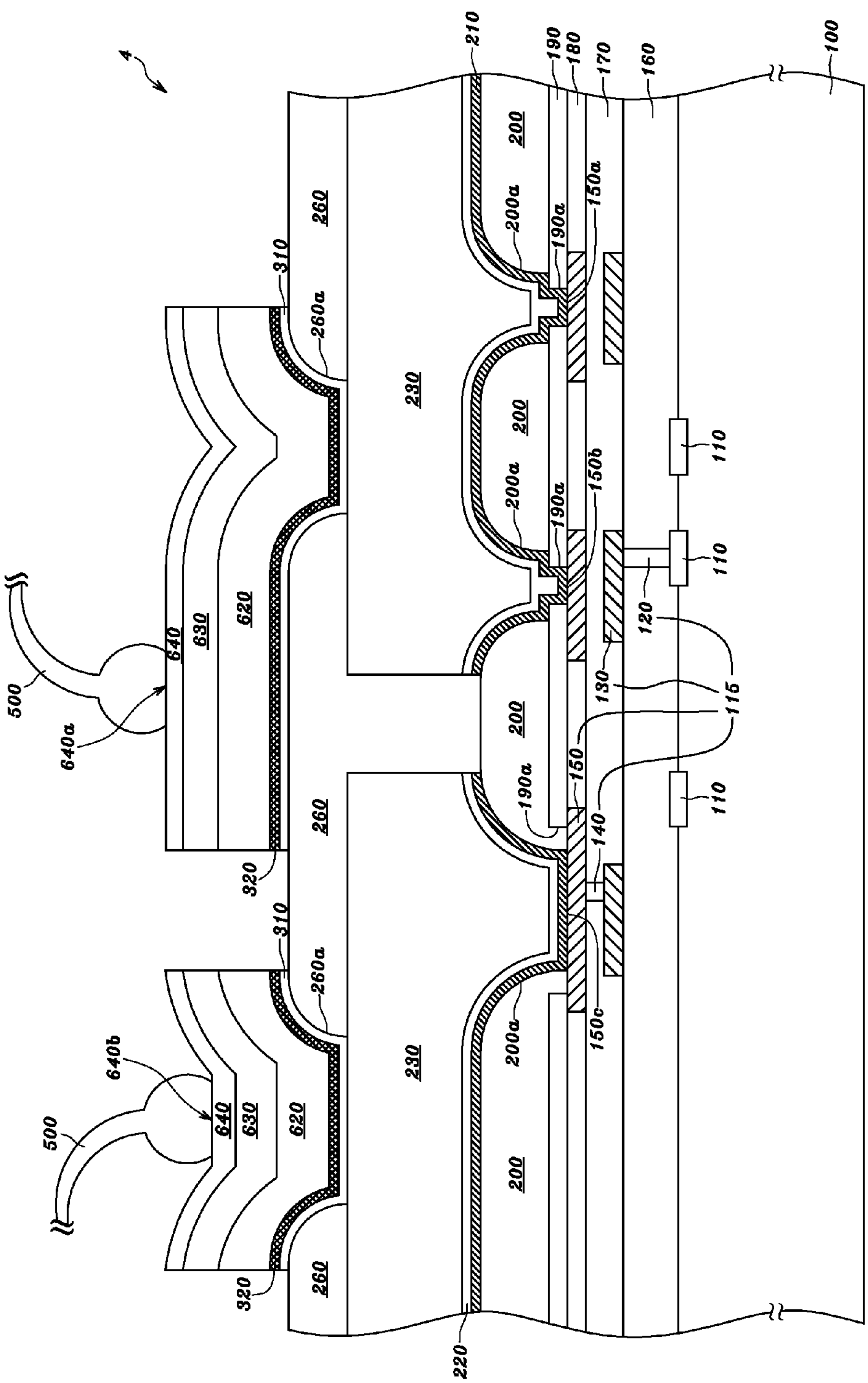

Alternatively, referring to FIG. 11H, the step of forming the barrier layer 240 shown in FIG. 4C and the step of forming the polymer layer 340 shown in FIG. 11D can be omitted, that is, after the copper layer 230 shown in FIG. 4C is formed, the photoresist layer 245*a* is removed, without forming the barrier layer 240 on the copper layer 230, using an inorganic solution or using an organic solution with amide as illustrated in FIG. 4D, followed by performing the above-mentioned steps as shown in FIGS. 4E-4H, followed by performing the above-mentioned steps as shown in FIGS. 11A-11C, followed by performing the above-mentioned step as shown in FIG. 11E without the polymer layer 340 formed on the polymer layer 260 and on the wirebondable metal layer 640.

Figure 11I:
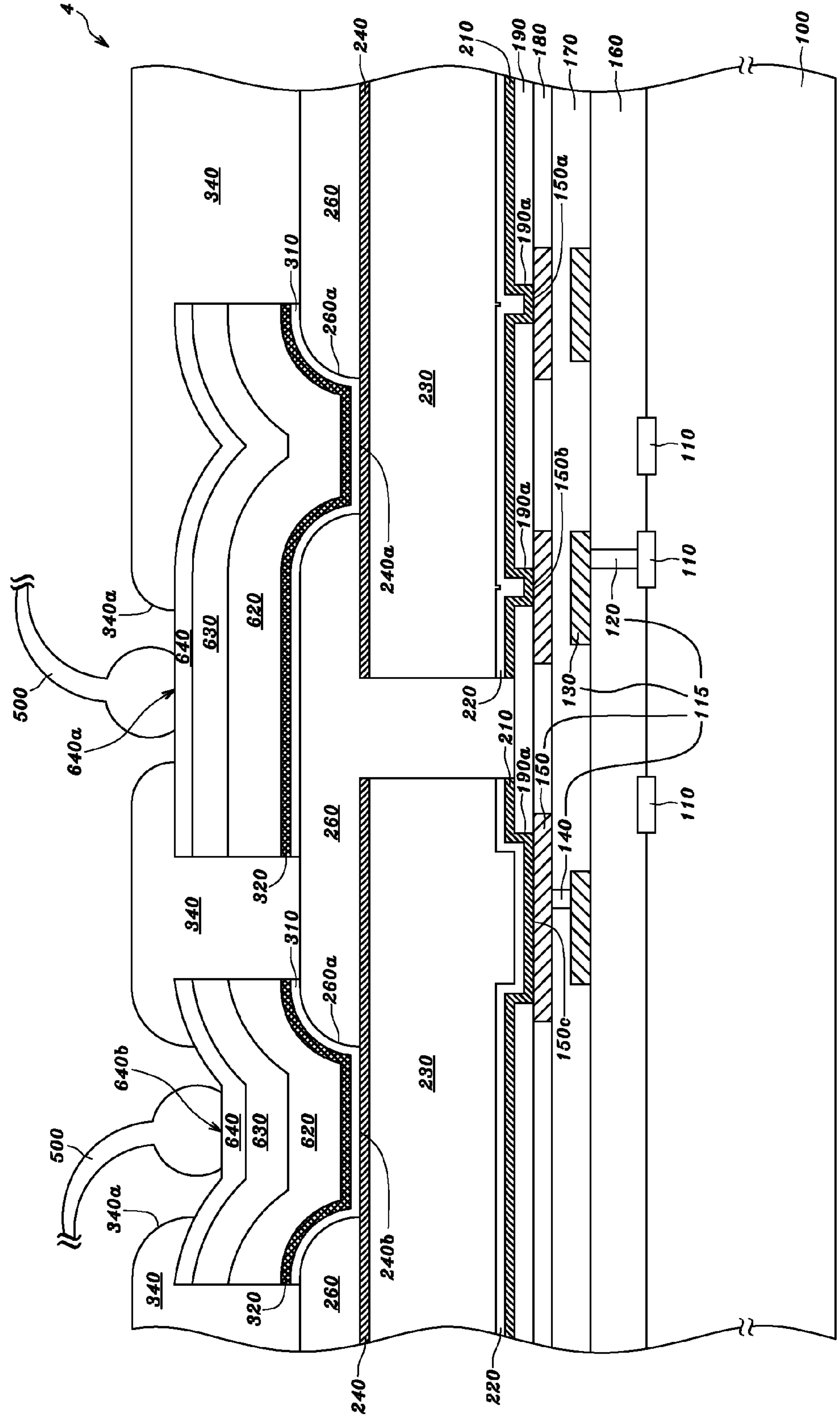

Alternatively, referring to FIG. 11I, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240 and on the passivation layer 190, followed by performing the above-mentioned steps as shown in FIGS. 4G-4H, followed by performing the above-mentioned steps as shown in FIGS. 11A-11E. The process of forming the adhesion/barrier layer 210 shown in FIG. 11I can be referred to as the process of forming the adhesion/barrier layer 210 as illustrated in FIG. 4A. The process of forming the seed layer 220 shown in FIG. 11I can be referred to as the process of forming the seed layer 220 as illustrated in FIG. 4A. The process of forming the polymer layer 260 shown in FIG. 11I can be referred to as the process of forming the polymer layer 260 as illustrated in FIG. 4F.

Figure 11J:
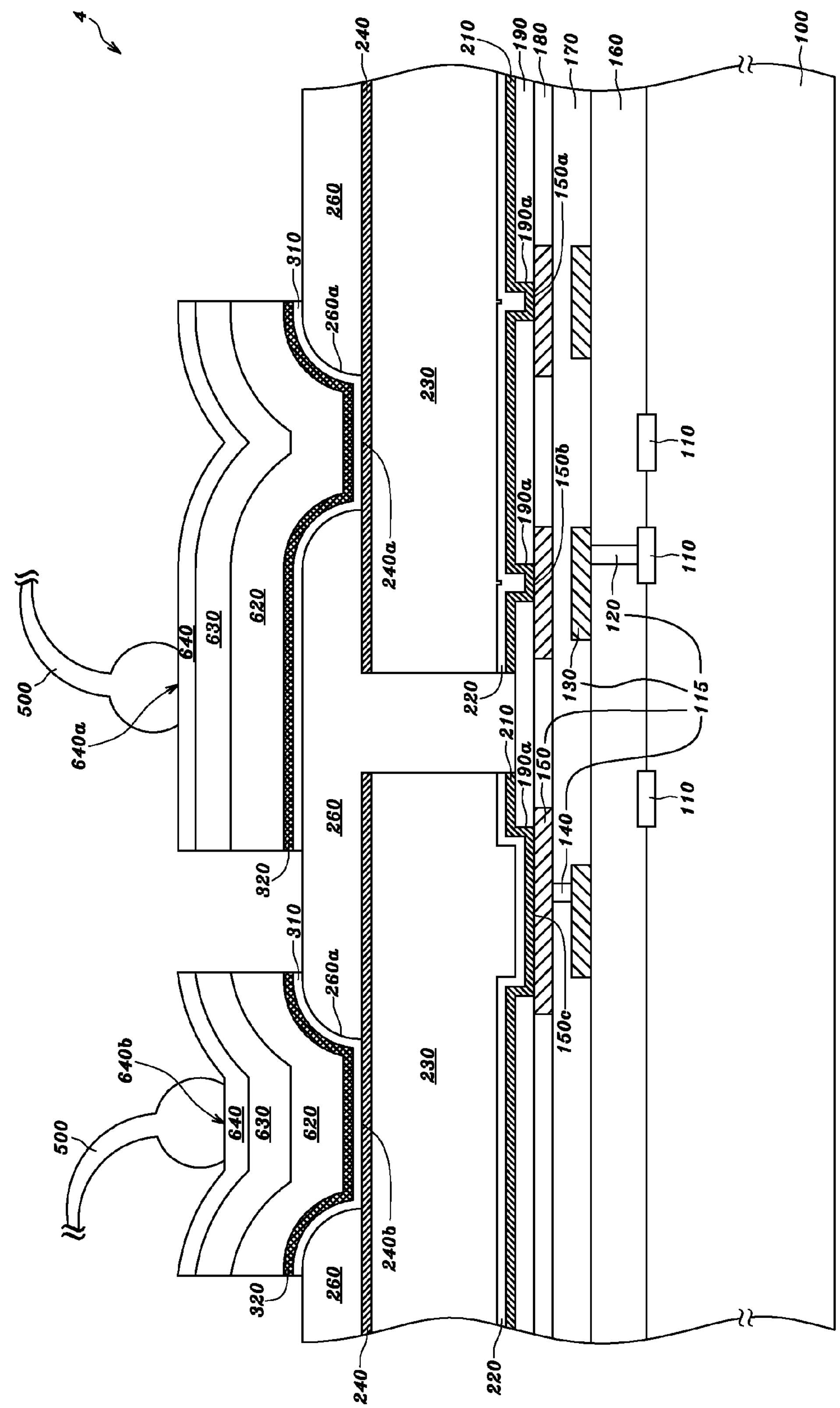

Alternatively, referring to FIG. 11J, the step of forming the polymer layer 200 as illustrated in FIG. 3 and the step of forming the polymer layer 340 as illustrated in FIG. 11D can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240 and on the passivation layer 190, followed by performing the above-mentioned steps as shown in FIGS. 4G-4H, followed by performing the above-mentioned steps as shown in FIGS. 11A-11C, followed by performing the above-mentioned step as shown in FIG. 11E without the polymer layer 340 formed on the polymer layer 260 and on the wirebondable metal layer 640. The process of forming the adhesion/barrier layer 210 shown in FIG. 11J can be referred to as the process of forming the adhesion/barrier layer 210 as illustrated in FIG. 4A. The process of forming the seed layer 220 shown in FIG. 11J can be referred to as the process of forming the seed layer 220 as illustrated in FIG. 4A. The process of forming the polymer layer 260 shown in FIG. 11J can be referred to as the process of forming the polymer layer 260 as illustrated in FIG. 4F.

Figure 11K:
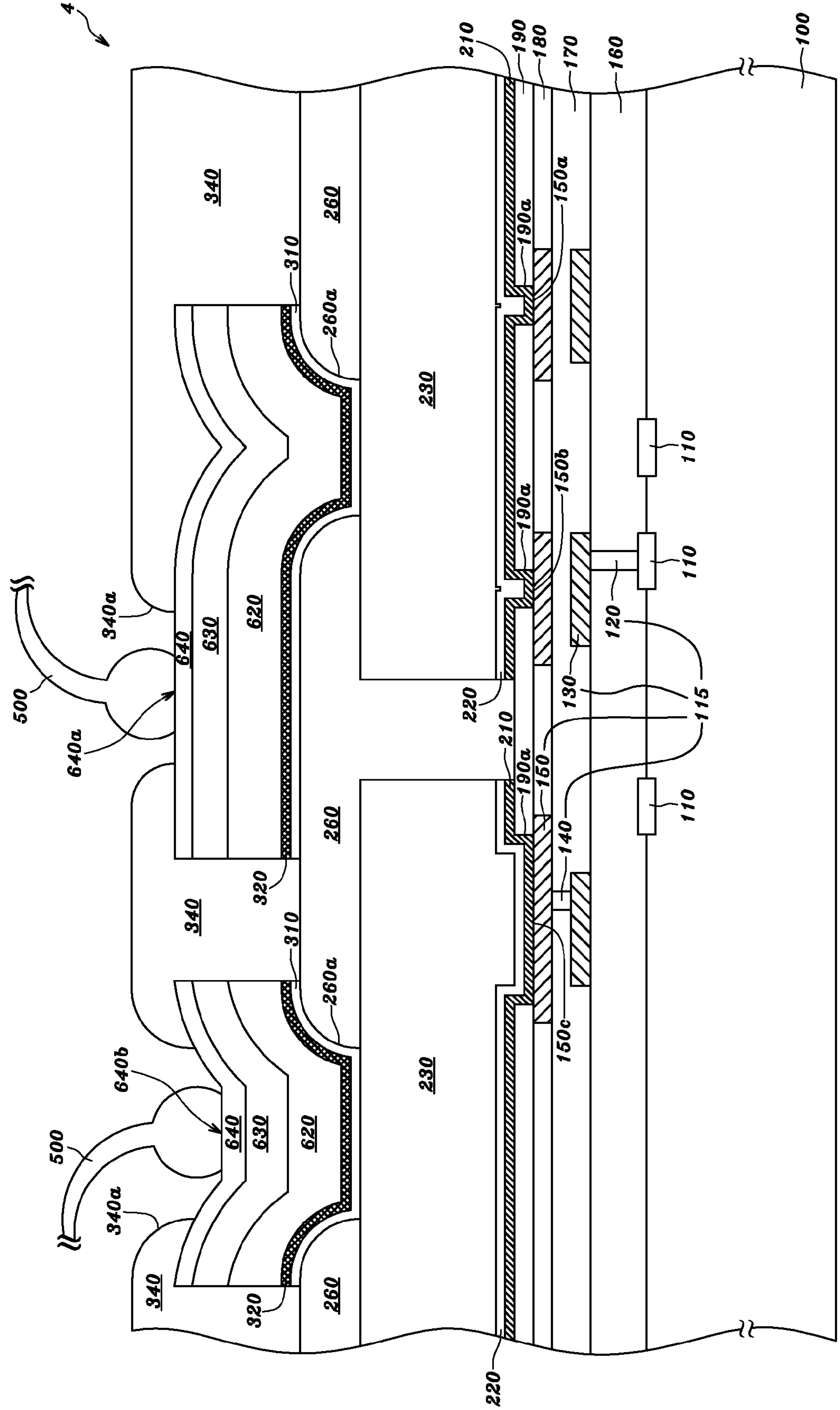

Alternatively, referring to FIG. 11K, the step of forming the polymer layer 200 as illustrated in FIG. 3 and the step of forming the barrier layer 240 shown in FIG. 4C can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned step as shown in FIG. 4B, followed by forming the copper layer 230 on the seed layer 220 exposed by the openings 245 in the photoresist layer 245*a* as illustrated in FIG. 4C, followed by performing the above-mentioned steps as shown in FIGS. 4D-4E, followed by forming the polymer layer 260 on the copper layer 230 and on the passivation layer 190, followed by performing the above-mentioned steps as shown in FIGS. 4G-4H, followed by performing the above-mentioned steps as shown in FIGS. 11A-11E. The process of forming the adhesion/barrier layer 210 shown in FIG. 11K can be referred to as the process of forming the adhesion/barrier layer 210 as illustrated in FIG. 4A. The process of forming the seed layer 220 shown in FIG. 11K can be referred to as the process of forming the seed layer 220 as illustrated in FIG. 4A. The process of forming the copper layer 230 shown in FIG. 11K can be referred to as the process of forming the copper layer 230 as illustrated in FIG. 4C. The process of forming the polymer layer 260 shown in FIG. 11K can be referred to as the process of forming the polymer layer 260 as illustrated in FIG. 4F.

Figure 11L:
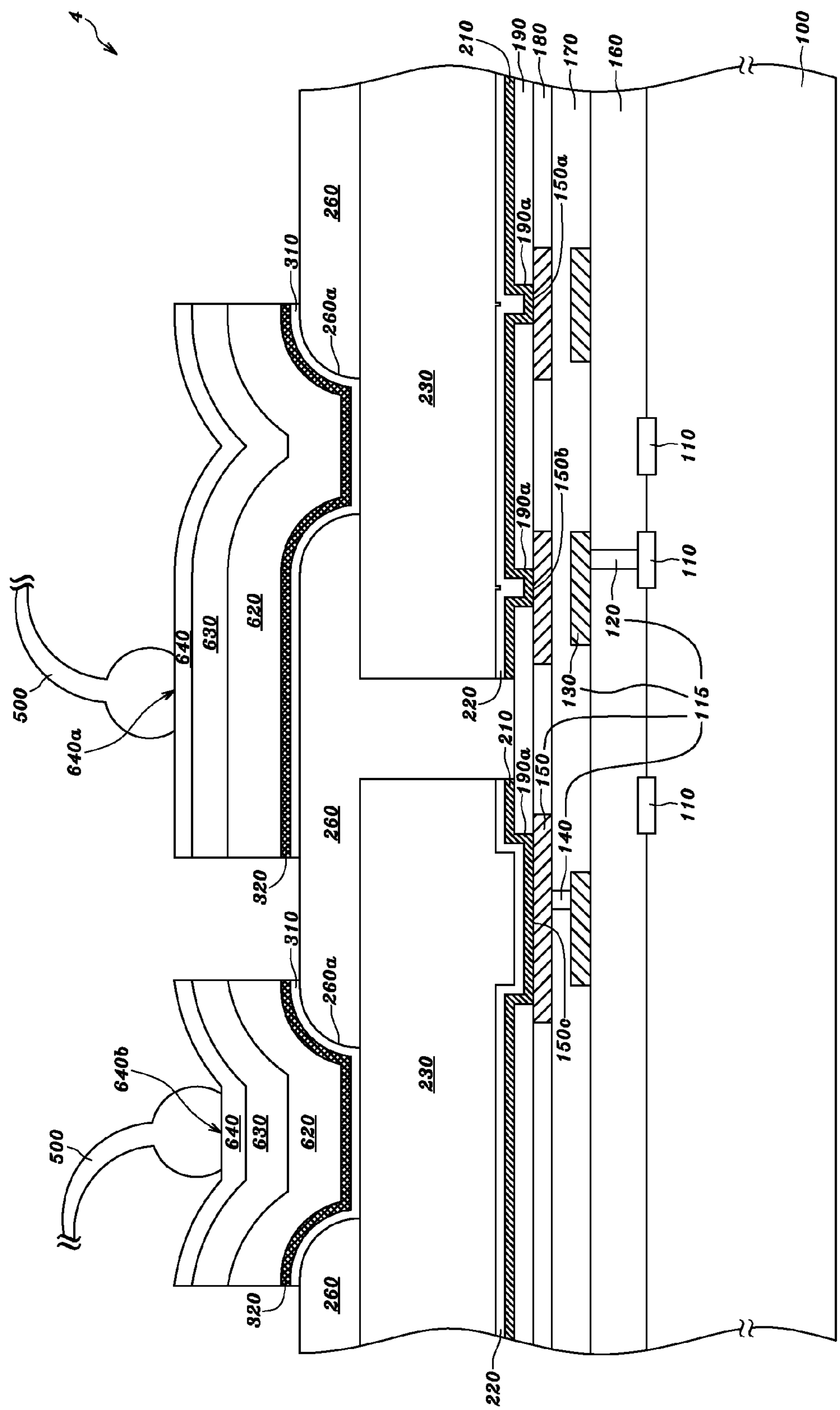

Alternatively, referring to FIG. 11L, the step of forming the polymer layer 200 as illustrated in FIG. 3, the step of forming the barrier layer 240 shown in FIG. 4C and the step of forming the polymer layer 340 as illustrated in FIG. 11D can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned step as shown in FIG. 4B, followed by forming the copper layer 230 on the seed layer 220 exposed by the openings 245 in the photoresist layer 245*a* as illustrated in FIG. 4C, followed by performing the above-mentioned steps as shown in FIGS. 4D-4E, followed by forming the polymer layer 260 on the copper layer 230 and on the passivation layer 190, followed by performing the above-mentioned steps as shown in FIGS. 4G-4H, followed by performing the above-mentioned steps as shown in FIGS. 11A-11C, followed by performing the above-mentioned step as shown in FIG. 11E without the polymer layer 340 formed on the polymer layer 260 and on the wirebondable metal layer 640. The process of forming the adhesion/barrier layer 210 shown in FIG. 11L can be referred to as the process of forming the adhesion/barrier layer 210 as illustrated in FIG. 4A. The process of forming the seed layer 220 shown in FIG. 11L can be referred to as the process of forming the seed layer 220 as illustrated in FIG. 4A. The process of forming the copper layer 230 shown in FIG. 11L can be referred to as the process of forming the copper layer 230 as illustrated in FIG. 4C. The process of forming the polymer layer 260 shown in FIG. 11L can be referred to as the process of forming the polymer layer 260 as illustrated in FIG. 4F.

Thereby, in this embodiment, the contact point 150*a* can be connected to the contact point 150*b* through the copper layer 230, and the wire 500 bonded on the contact point 640*a* can be connected to the contact points 150*a* and 150*b* through a metal trace provided by the adhesion/barrier 310, the seed layer 320, the copper layer 620, the nickel layer 630 and the wirebondable metal layer 640 and through a metallization structure at least comprising the adhesion/barrier 210, the seed layer 220 and the copper layer 230. The position of the contact point 640*a* from a top perspective view can be different from that of the contact point 150*a* and that of the contact point 150*b*. The position of the contact point 640*b* from a top perspective view can be different from that of the contact point 150*c*. The wire 500 bonded on the contact point 640*b* can be connected to the contact point 150*c* through a metal pad provided by the adhesion/barrier 310, the seed layer 320, the copper layer 620, the nickel layer 630 and the wirebondable metal layer 640 and through a metallization structure at least comprising the adhesion/barrier 210, the seed layer 220 and the copper layer 230.

Embodiment 9

Figure 12A:
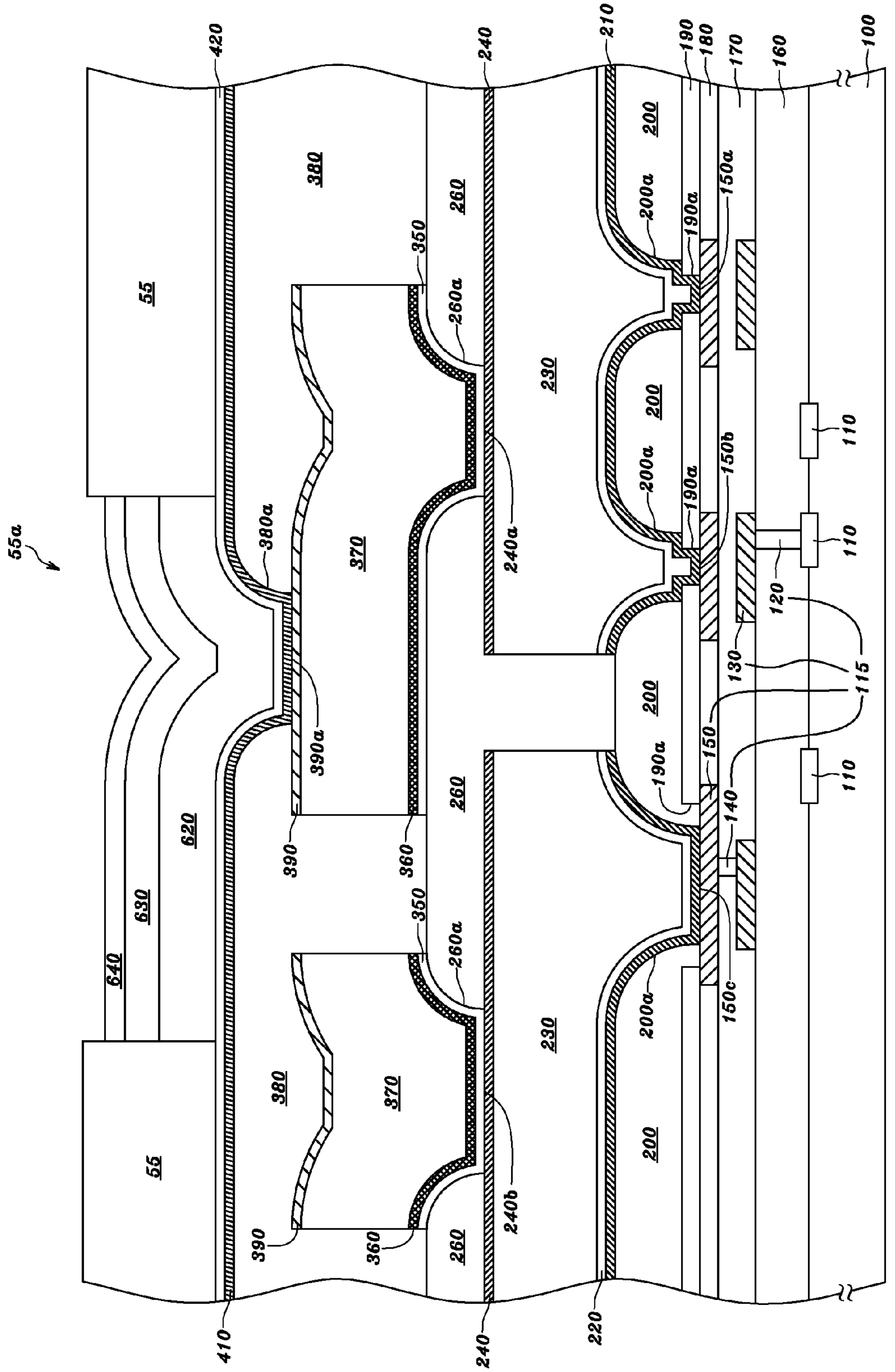
FIGS. 12A-12E are cross-sectional views showing a process for forming a semiconductor chip and bonding a wirebonded wire to the semiconductor chip according to one embodiment of the present invention.

Referring to FIG. 12A, after the step shown in FIG. 9F, a copper layer 620 having a thickness between 3 and 25 micrometers, and preferably between 10 and 20 micrometers, can be electroplated or electroless plated on the seed layer 420, made of copper, exposed by the opening 55*a* in the photoresist layer 55. Next, a nickel layer 630 having a thickness between 0.05 and 5 micrometers, and preferably between 0.1 and 1 micrometers, can be electroplated or electroless plated on the copper layer 620 in the opening 55*a*. Next, a wirebondable metal layer 640 having a thickness between 0.05 and 5 micrometers, and preferably between 0.05 and 2 micrometers, can be electroplated or electroless plated on the nickel layer 630 in the opening 55*a*.

The material of the wirebondable metal layer 640 can be gold, platinum or palladium. In a case, the wirebondable metal layer 640 can be formed by electroplating a gold layer with a thickness between 0.05 and 5 micrometers, and preferably between 0.05 and 2 micrometers, on the nickel layer 630 in the opening 55*a* with a non-cyanide electroplating solution, such as a solution containing gold sodium sulfite ($Na_3Au(SO_3)_2$) or a solution containing gold ammonium sulfite ($(NH_4)_3[Au(SO_3)_2]$), or with an electroplating solution containing cyanide. In another case, the wirebondable metal layer 640 can be formed by electroplating a platinum layer with a thickness between 0.05 and 5 micrometers, and preferably between 0.05 and 2 micrometers, on the nickel layer 630 in the opening 55*a*. In another case, the wirebondable metal layer 640 can be formed by electroplating a palladium layer with a thickness between 0.05 and 5 micrometers, and preferably between 0.05 and 2 micrometers, on the nickel layer 630 in the opening 55*a*.

In this embodiment, the adhesion/barrier layer 410 can be formed by sputtering a titanium-containing layer on the polymer layer 380 and on the contact point 390*a* exposed by the opening 380*a*, and the seed layer 420 can be formed by sputtering a copper layer with a thickness between 0.05 and 0.5 micrometers, and preferably between 0.08 and 0.15 micrometers, on the titanium-containing layer. The above-mentioned titanium-containing layer can be a single titanium-tungsten-alloy layer having a thickness between 0.02 and 0.5 micrometers, and preferably between 0.1 and 0.2 micrometers, a single titanium layer having a thickness between 0.02 and 0.5 micrometers, and preferably between 0.1 and 0.2 micrometers, a single titanium-nitride layer having a thickness between 0.02 and 0.5 micrometers, and preferably between 0.1 and 0.2 micrometers, or a composite layer comprising a titanium layer having a thickness between 0.01 and 0.15 micrometers, and a titanium-tungsten-alloy layer, having a thickness between 0.1 and 0.35 micrometers, on the titanium layer. Alternatively, the adhesion/barrier layer 410 can be formed by sputtering a chromium layer on the polymer layer 380 and on the contact point 390*a* exposed by the opening 380*a*, and the seed layer 420 can be formed by sputtering a copper layer with a thickness between 0.05 and 0.5 micrometers, and preferably between 0.08 and 0.15 micrometers, on the chromium layer.

Figure 12B:
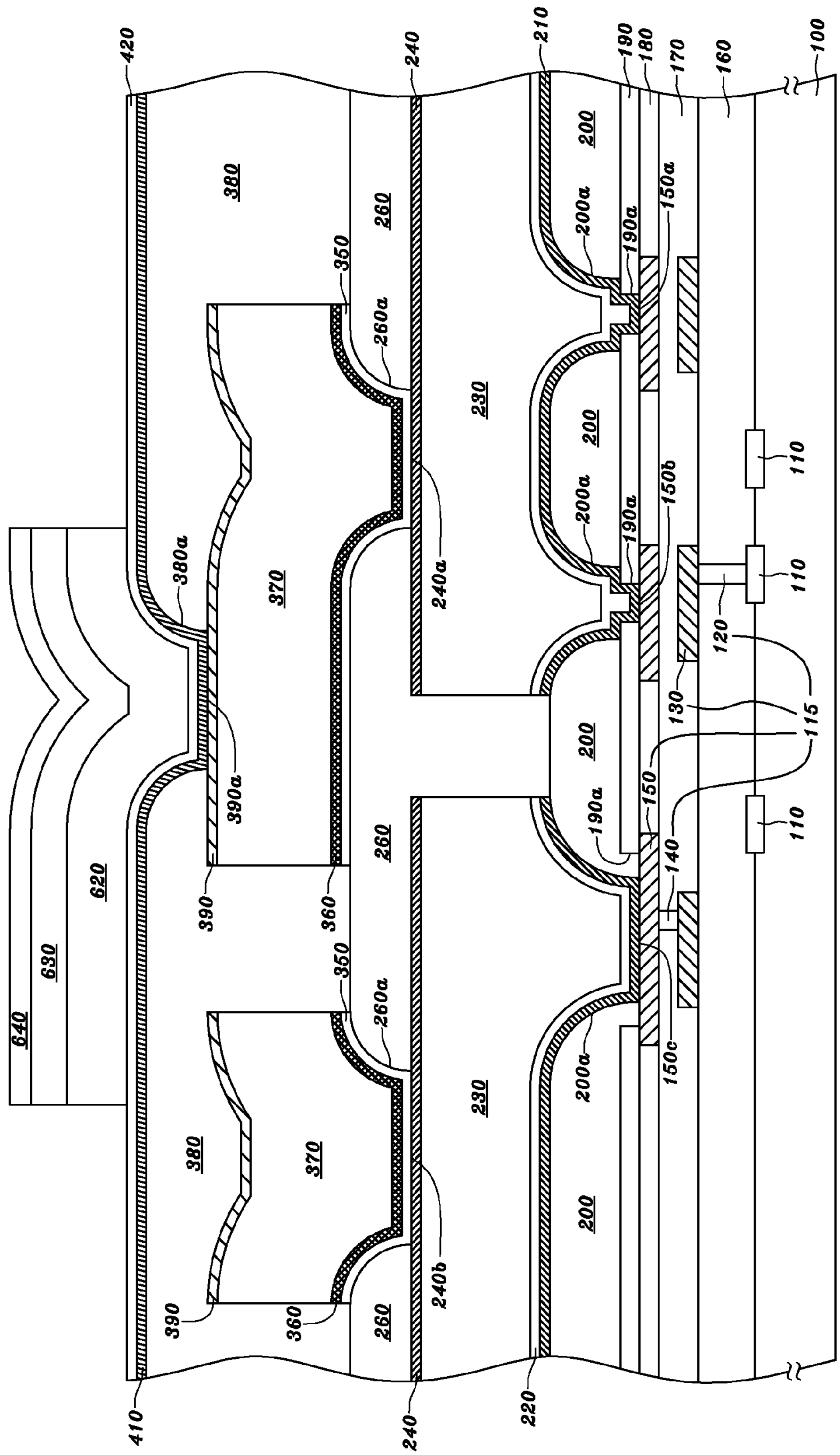

Referring to FIG. 12B, after the wirebondable metal layer 640 is formed, the photoresist layer 55 can be removed using an inorganic solution or using an organic solution with amide. Some residuals from the photoresist layer 55 could remain on the wirebondable metal layer 640 and on the seed layer 420 not under the copper layer 620. Thereafter, the residuals can be removed from the wirebondable metal layer 640 and from the seed layer 420 with a plasma, such as an $O_2$ plasma or a plasma containing fluorine of below 200 PPM and oxygen.

Figure 12C:
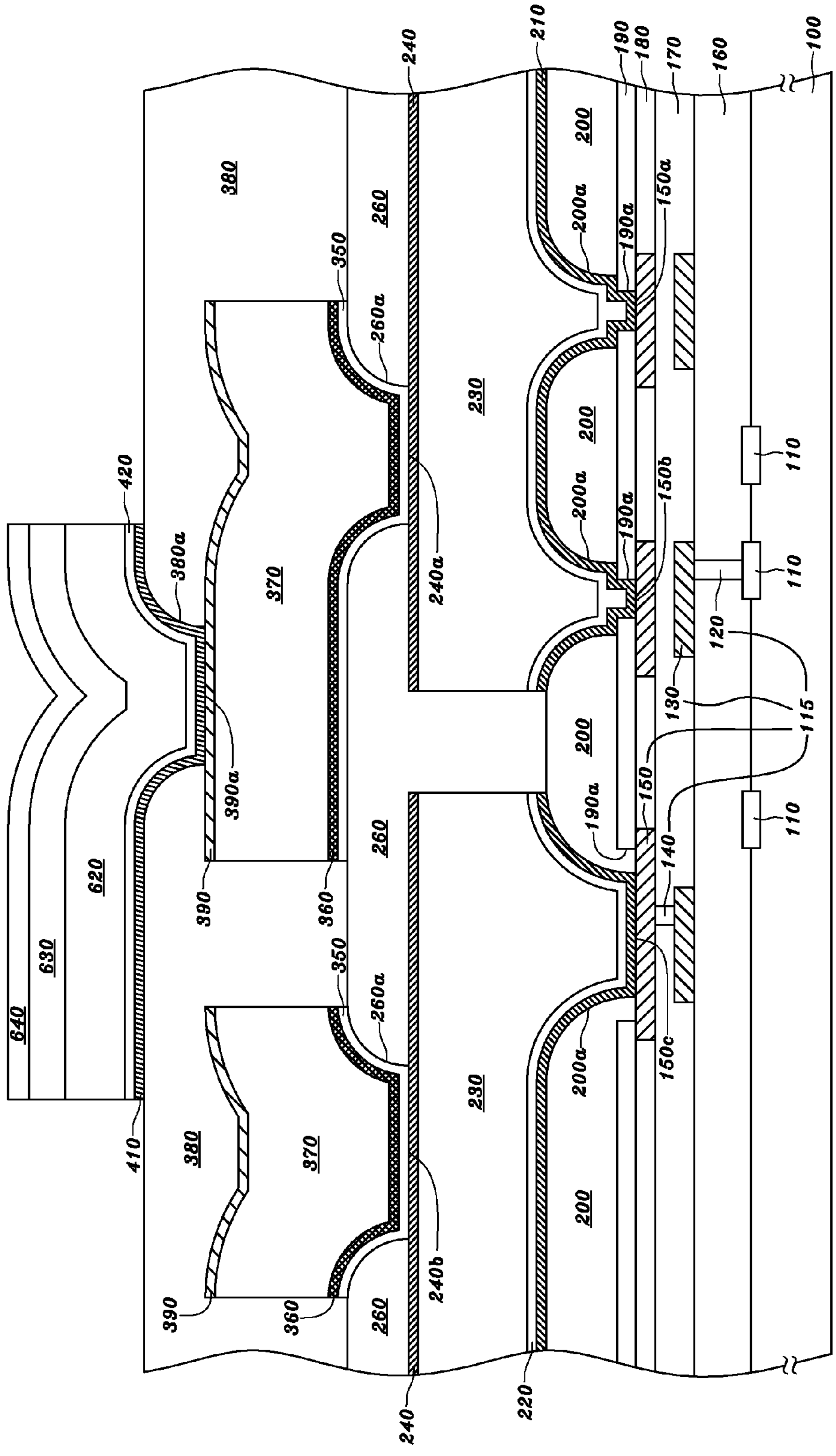

Referring to FIG. 12C, the seed layer 420 and the adhesion/barrier layer 410 not under the copper layer 620 are subsequently removed with an etching method. In a case, the seed layer 420 and the adhesion/barrier layer 410 not under the copper layer 620 can be subsequently removed by a dry etching method. As to the dry etching method, both the seed layer 420 and the adhesion/barrier layer 410 not under the copper layer 620 can be subsequently removed by an Ar sputtering etching process; alternatively, both the seed layer 420 and the adhesion/barrier layer 410 not under the copper layer 620 can be subsequently removed by a reactive ion etching (RIE) process; alternatively, the seed layer 420 not under the copper layer 620 can be removed by an Ar sputtering etching process, and the adhesion/barrier layer 410 not under the copper layer 620 can be removed by a reactive ion etching (RIE) process; alternatively, the seed layer 420 not under the copper layer 620 can be removed by a reactive ion etching (RIE) process, and the adhesion/barrier layer 410 not under the copper layer 620 can be removed by an Ar sputtering etching process. In another case, the seed layer 420 and the adhesion/barrier layer 410 not under the copper layer 620 can be subsequently removed by a wet etching method. As to the wet etching method, when the seed layer 420 is a copper layer, it can be etched with a solution containing $NH_4OH$ or with a solution containing $H_2SO_4$; when the adhesion/barrier layer 410 is a titanium layer, it can be etched with a solution containing hydrogen fluoride or with a solution containing $NH_4OH$ and hydrogen peroxide; when the adhesion/barrier layer 410 is a titanium-tungsten-alloy layer, it can be etched with a solution containing hydrogen peroxide or with a solution containing $NH_4OH$ and hydrogen peroxide; when the adhesion/barrier layer 410 is a chromium layer, it can be etched with a solution containing potassium ferricyanide. In another case, the seed layer 420, made of copper, not under the copper layer 620 can be removed by a solution containing $NH_4OH$ or with a solution containing $H_2SO_4$, and the adhesion/barrier layer 410 not under the copper layer 620 can be removed by a reactive ion etching (RIE) process. In another case, the seed layer 420, made of copper, not under the copper layer 620 can be removed by a solution containing $NH_4OH$ or with a solution containing $H_2SO_4$, and the adhesion/barrier layer 410 not under the copper layer 620 can be removed by an Ar sputtering etching process.

Figure 12D:
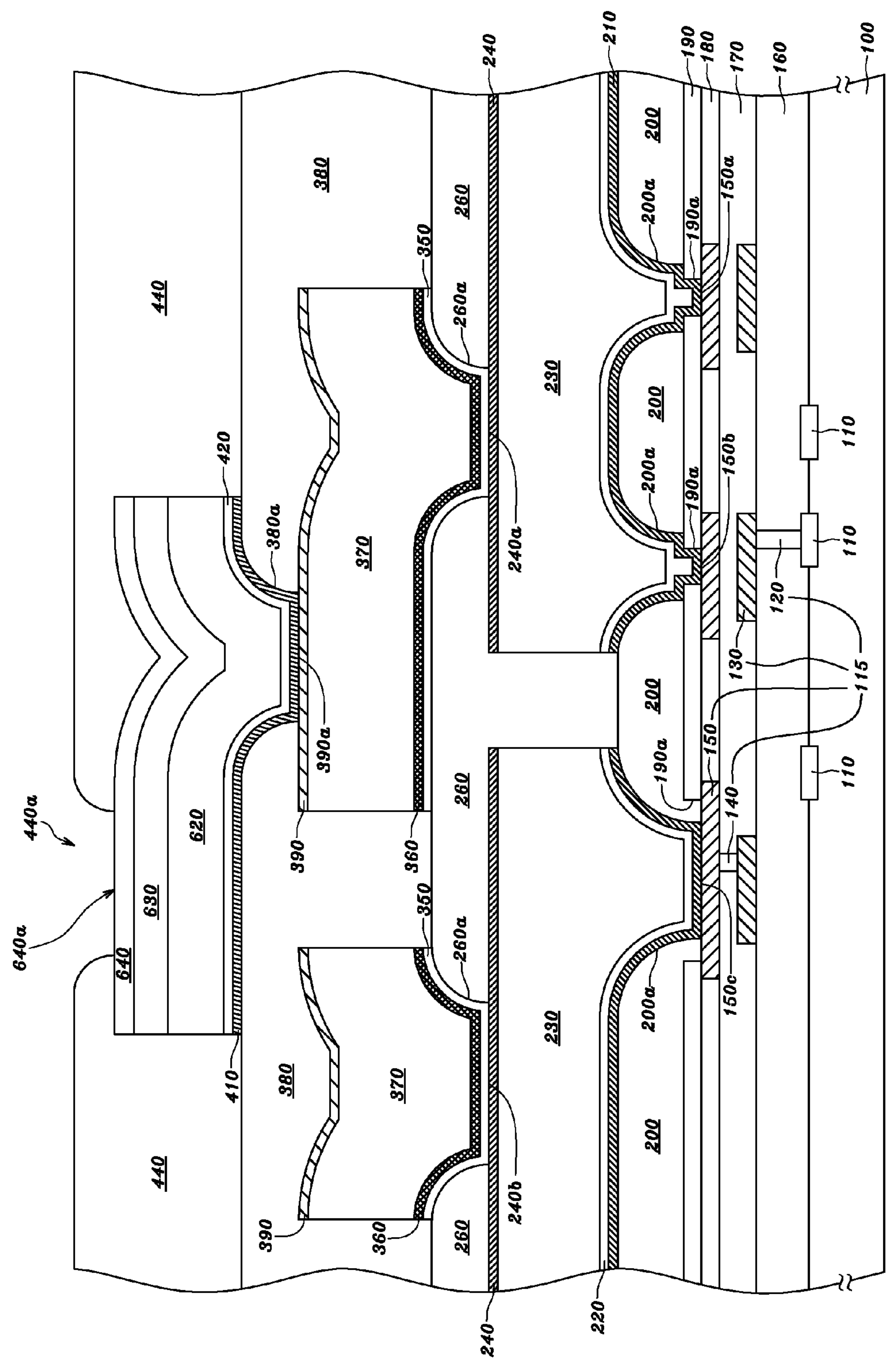

Referring to FIG. 12D, a polymer layer 440 can be formed on the wirebondable metal layer 640 and on the polymer layer 380 by a process including a spin-on coating process, a lamination process, a screen-printing process or a spraying process, and an opening 440*a* in the polymer layer 440 is over a contact point 640*a* of the wirebondable metal layer 640 and exposes the contact point 640*a*. The contact point 640*a* is at a bottom of the opening 440*a*. The polymer layer 440 has a thickness between 3 and 25 micrometers, and preferably between 5 and 15 micrometers, and the material of the polymer layer 440 may include benzocyclobutane (BCB), polyimide (PI), polybenzoxazole (PBO) or epoxy resin. The process of forming the polymer layer 440 shown in FIG. 12D can be referred to as the process of forming the polymer layer 440 as illustrated in FIG. 9J.

Figure 12E:
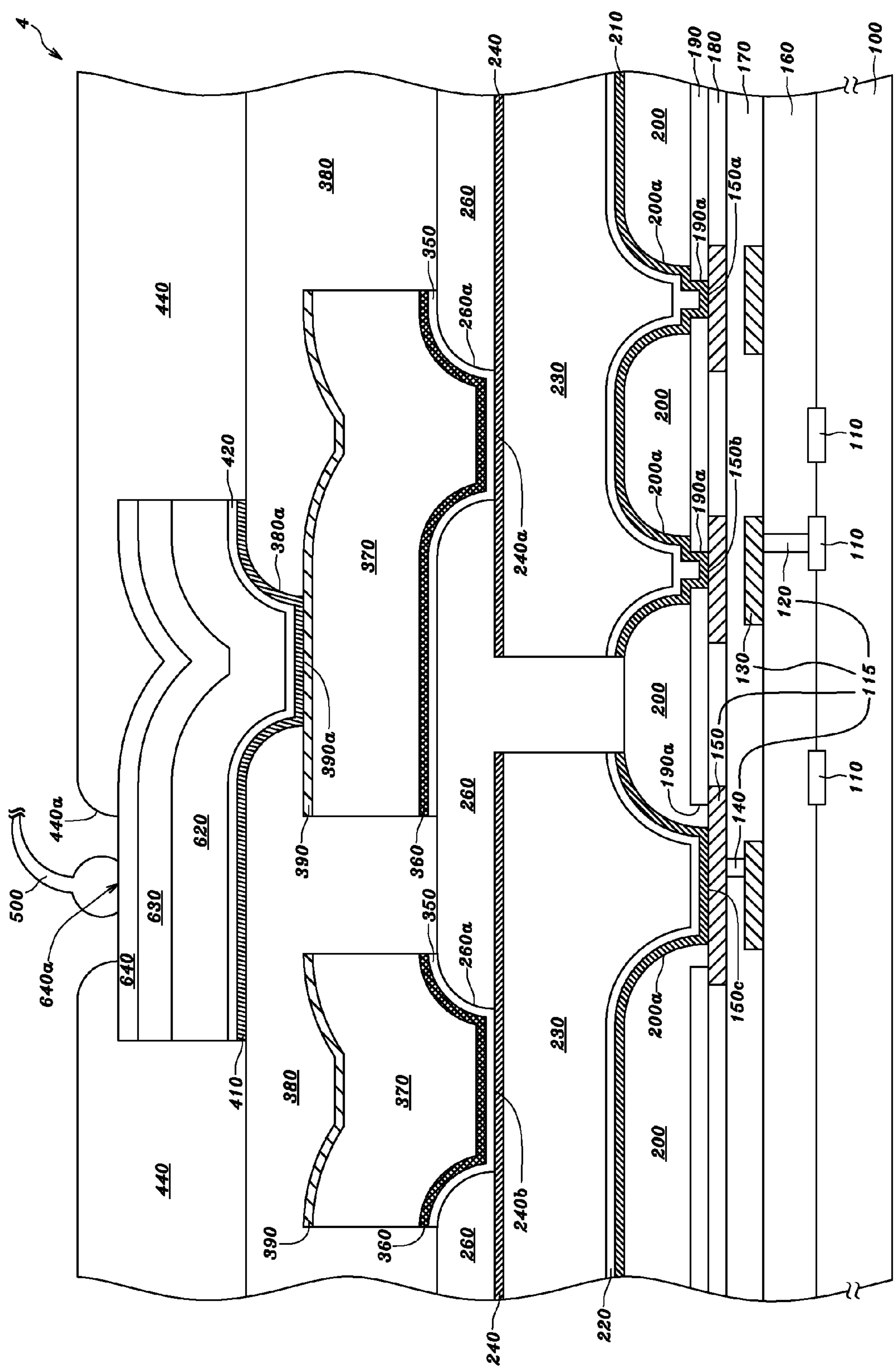

Referring to FIG. 12E, after the polymer layer 440 is formed, the semiconductor wafer 2 can be cut into a plurality of individual semiconductor chips 4 (only one of them is shown) by a dice sawing process.

Next, via a wire-bonding process, a wire 500, made of gold, copper or aluminum, can be ball bonded on the contact point 640*a* of the wirebondable metal layer 640 of the semiconductor chip 4. Alternatively, via a wire-bonding process, the wire 500, made of gold, copper or aluminum, can be wedge bonded on the contact point 640*a* of the wirebondable metal layer 640 of the semiconductor chip 4. By the way, the semiconductor chip 4 can be connected with an external circuit. The external circuit can be a lead frame, another semiconductor chip, a printed circuit board (PCB) comprising a glass fiber as a core, a flexible tape with a polymer layer (such as polyimide) having a thickness of between 30 and 200 micrometers but without any polymer layer including glass fiber, a ceramic substrate comprising a ceramic material as insulating layers between circuit layers, a glass substrate having circuit layers made of Indium Tin Oxide (ITO), or a discrete passive device, such as an inductor, a capacitor, a resistor or a filter.

Figure 12F:
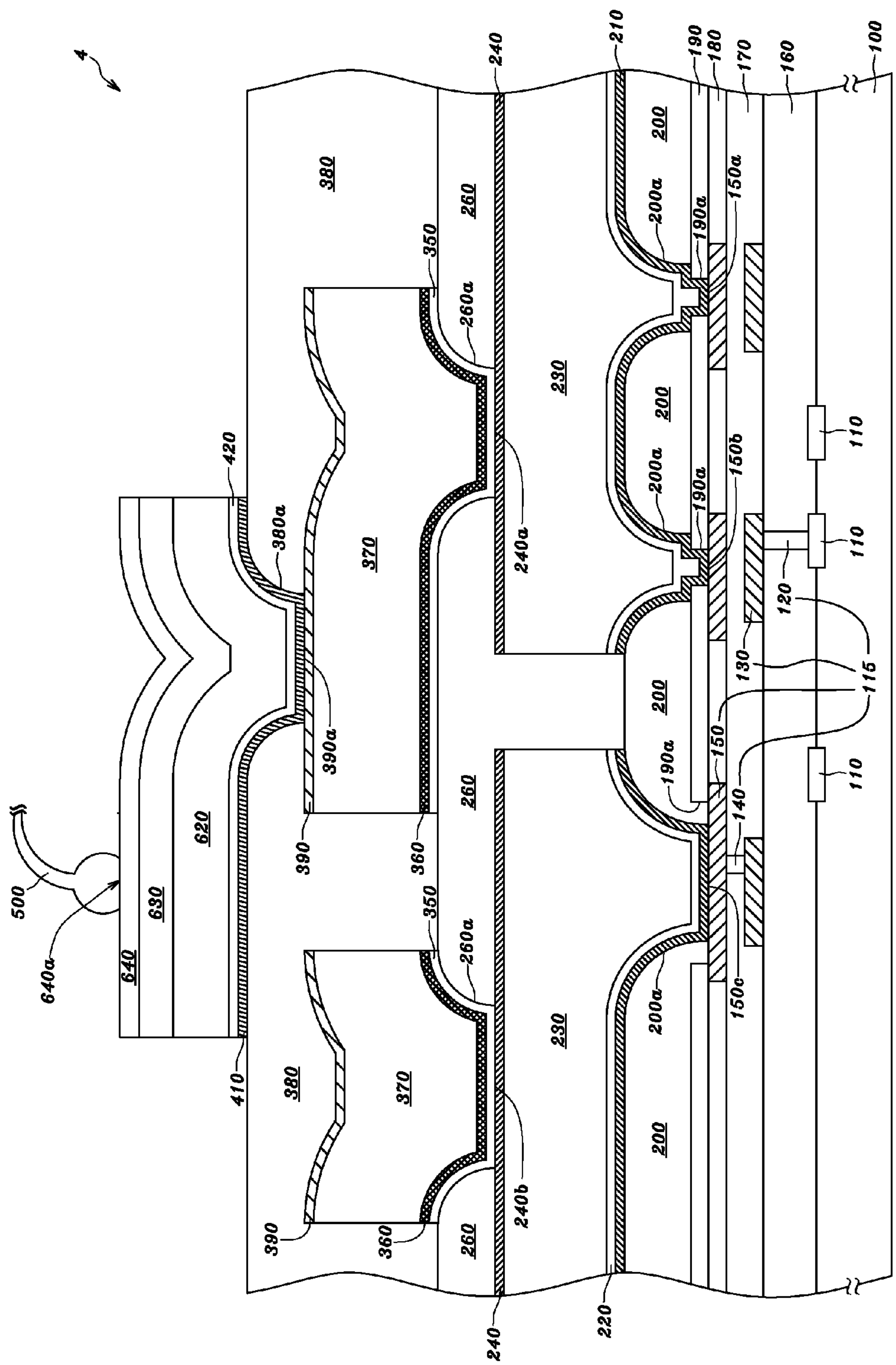
FIGS. 12F and 12L are cross-sectional views showing a semiconductor chip with third thick metal layers and a wirebonded wire bonded to the topmost thick metal layer.

Alternatively, referring to FIG. 12F, the step of forming the polymer layer 440 as shown in FIG. 12D can be omitted, that is, after performing the above-mentioned step as shown in FIG. 12C, the step illustrated in FIG. 12E can be performed without the polymer layer 440 formed on the wirebondable metal layer 640 and on the polymer layer 380.

Figure 12G:
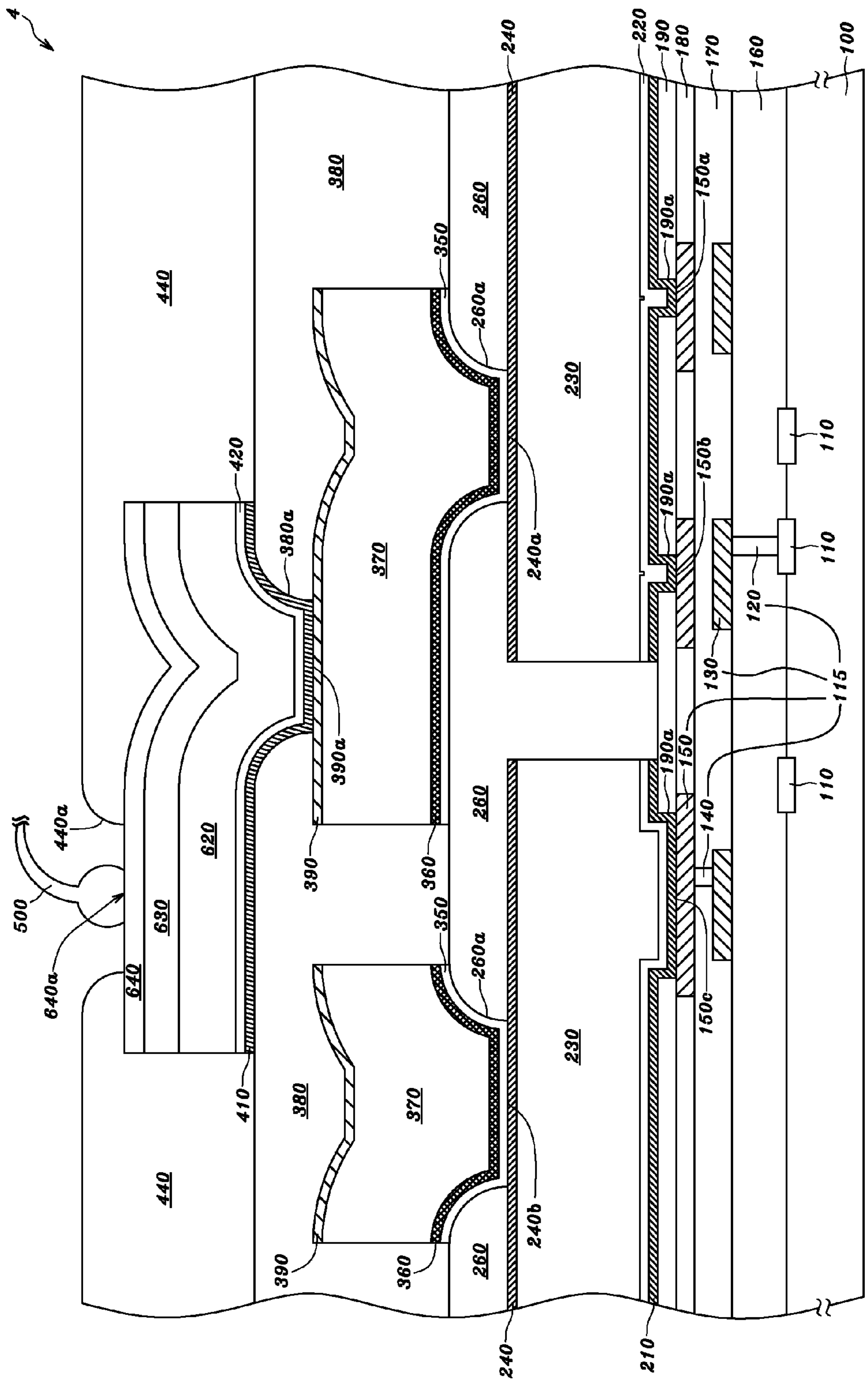

Alternatively, referring to FIG. 12G, the step of forming the polymer layer 200 as illustrated in FIG. 3 can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by performing the above-mentioned steps as shown in FIGS. 9A-9F, followed by performing the above-mentioned steps as shown in FIGS. 12A-12E. The process of forming the adhesion/barrier layer 210 shown in FIG. 12G can be referred to as the process of forming the adhesion/barrier layer 210 as illustrated in FIG. 4A. The process of forming the seed layer 220 shown in FIG. 12G can be referred to as the process of forming the seed layer 220 as illustrated in FIG. 4A. The process of forming the polymer layer 260 shown in FIG. 12G can be referred to as the process of forming the polymer layer 260 as illustrated in FIG. 4F.

Figure 12H:
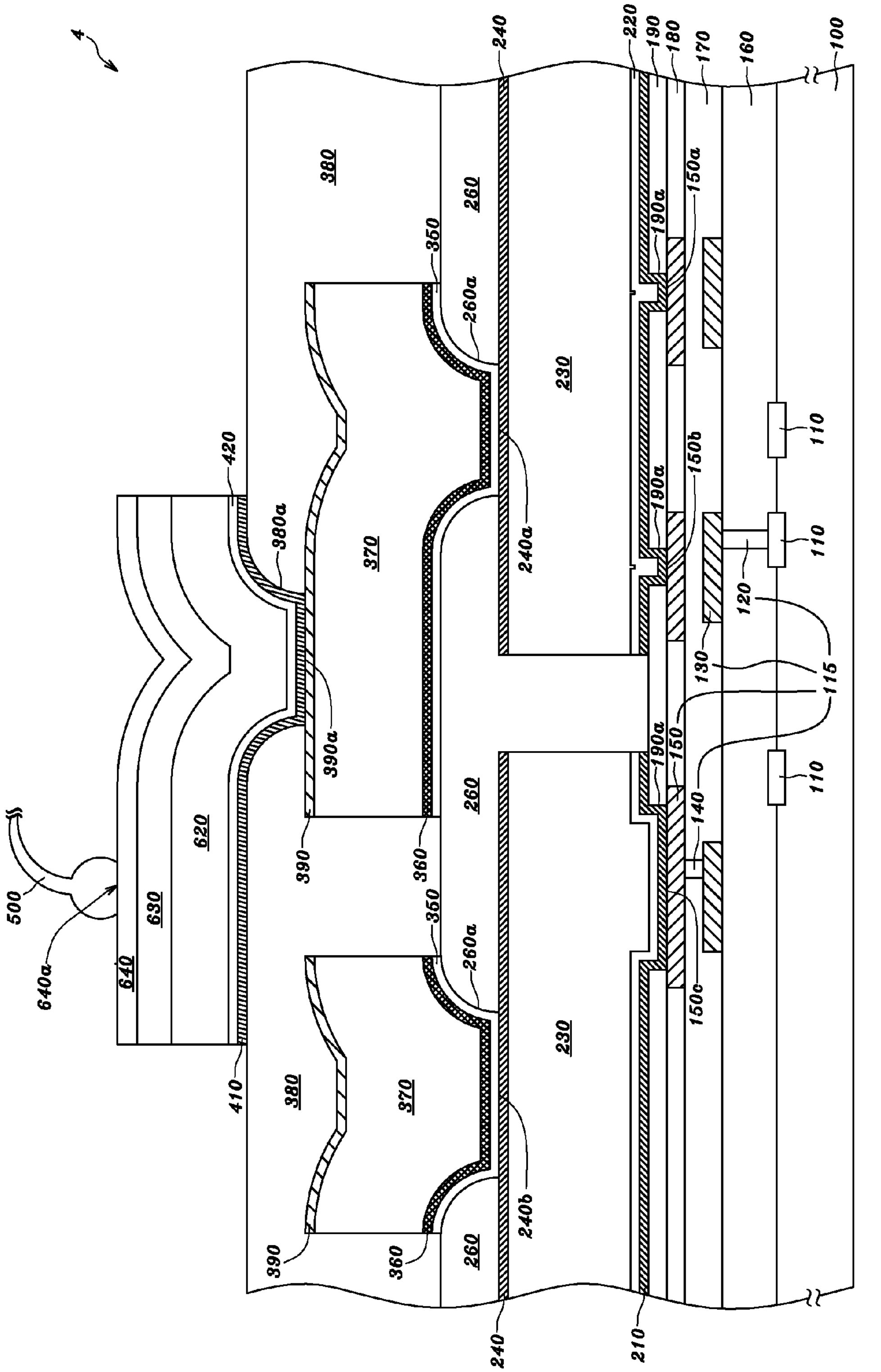

Alternatively, referring to FIG. 12H, the step of forming the polymer layer 200 as shown in FIG. 3 and the step of forming the polymer layer 440 as shown in FIG. 12D can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by performing the above-mentioned steps as shown in FIGS. 9A-9F, followed by performing the above-mentioned steps as shown in FIGS. 12A-12C, followed by performing the above-mentioned step as shown in FIG. 12E without the polymer layer 440 formed on the wirebondable metal layer 640 and on the polymer layer 380. The process of forming the adhesion/barrier layer 210 shown in FIG. 12H can be referred to as the process of forming the adhesion/barrier layer 210 as illustrated in FIG. 4A. The process of forming the seed layer 220 shown in FIG. 12H can be referred to as the process of forming the seed layer 220 as illustrated in FIG. 4A. The process of forming the polymer layer 260 shown in FIG. 12H can be referred to as the process of forming the polymer layer 260 as illustrated in FIG. 4F.

Figure 12I:
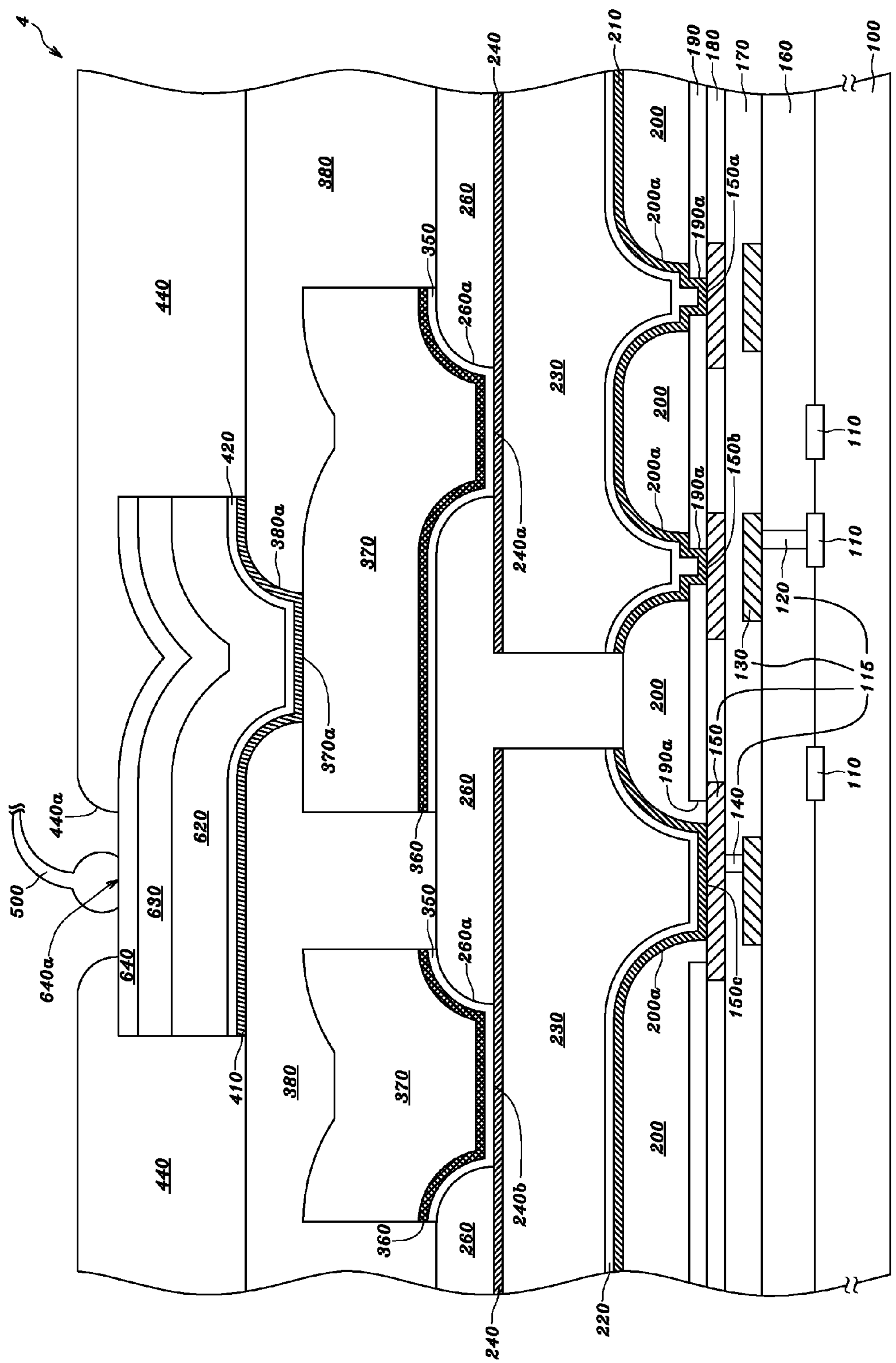

Alternatively, referring to FIG. 12I, the step of forming the barrier layer 390 shown in FIG. 9A can be omitted, that is, after the step shown in FIG. 8B, the copper layer 370 is electroplated or electroless plated on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned step as shown in FIG. 9F, followed by performing the above-mentioned steps as shown in FIGS. 12A-12E. The process of forming the polymer layer 380 shown in FIG. 12I can be referred to as the process of forming the polymer layer 380 as illustrated in FIG. 9D. The process of forming the adhesion/barrier layer 410 shown in FIG. 12I can be referred to as the process of forming the adhesion/barrier layer 410 as illustrated in FIG. 9E. The process of forming the seed layer 420 shown in FIG. 12I can be referred to as the process of forming the seed layer 420 as illustrated in FIG. 9E.

Figure 12J:
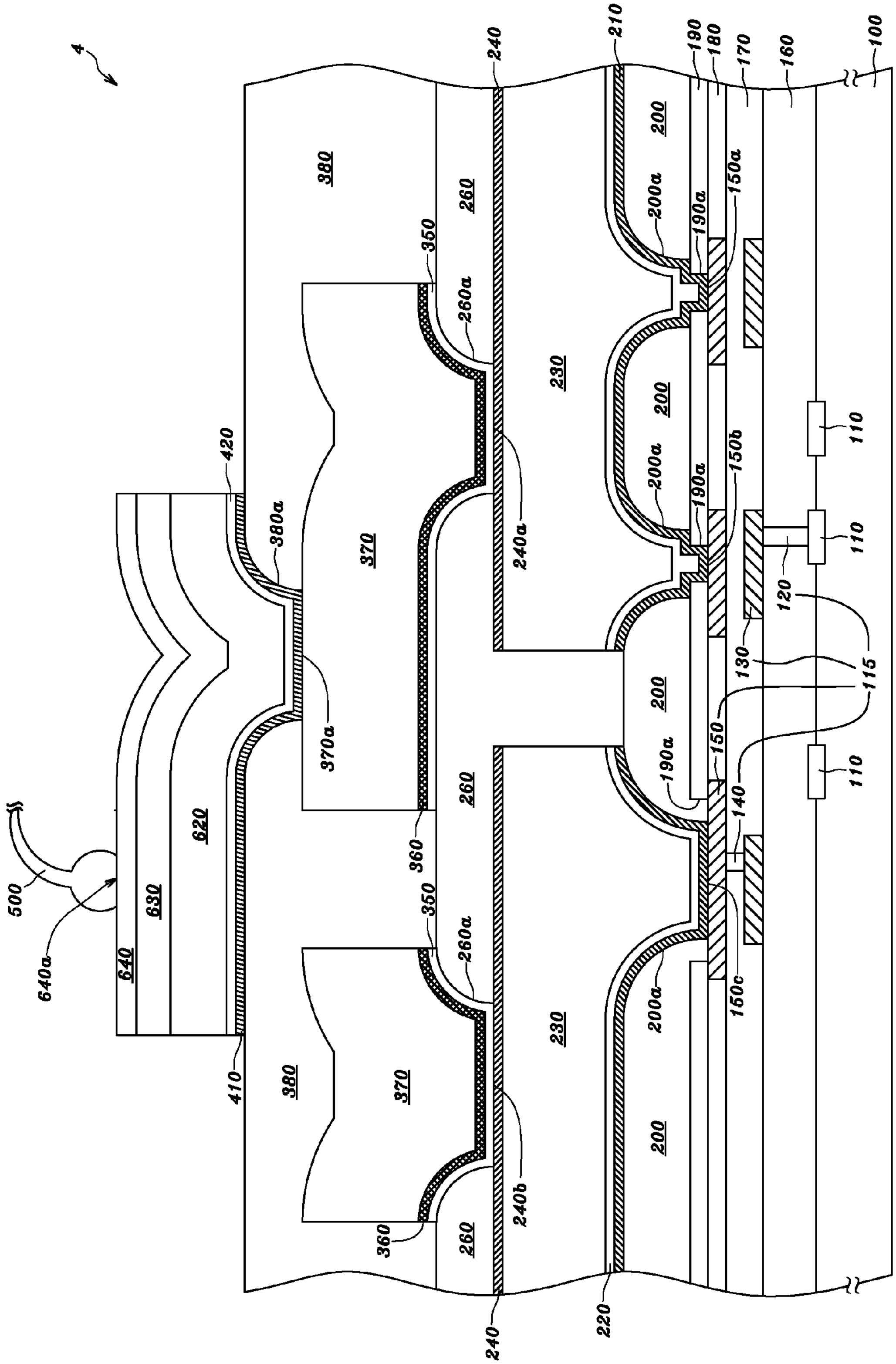

Alternatively, referring to FIG. 12J, the step of forming the barrier layer 390 shown in FIG. 9A and the step of forming the polymer layer 440 shown in FIG. 12D can be omitted, that is, that is, after the step shown in FIG. 8B, the copper layer 370 can be electroplated or electroless plated on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned step as shown in FIG. 9F, followed by performing the above-mentioned steps as shown in FIGS. 12A-12C, followed by performing the above-mentioned step as shown in FIG. 12E without the polymer layer 440 formed on the wirebondable metal layer 640 and on the polymer layer 380. The process of forming the polymer layer 380 shown in FIG. 12J can be referred to as the process of forming the polymer layer 380 as illustrated in FIG. 9D. The process of forming the adhesion/barrier layer 410 shown in FIG. 12J can be referred to as the process of forming the adhesion/barrier layer 410 as illustrated in FIG. 9E. The process of forming the seed layer 420 shown in FIG. 12J can be referred to as the process of forming the seed layer 420 as illustrated in FIG. 9E.

Figure 12K:
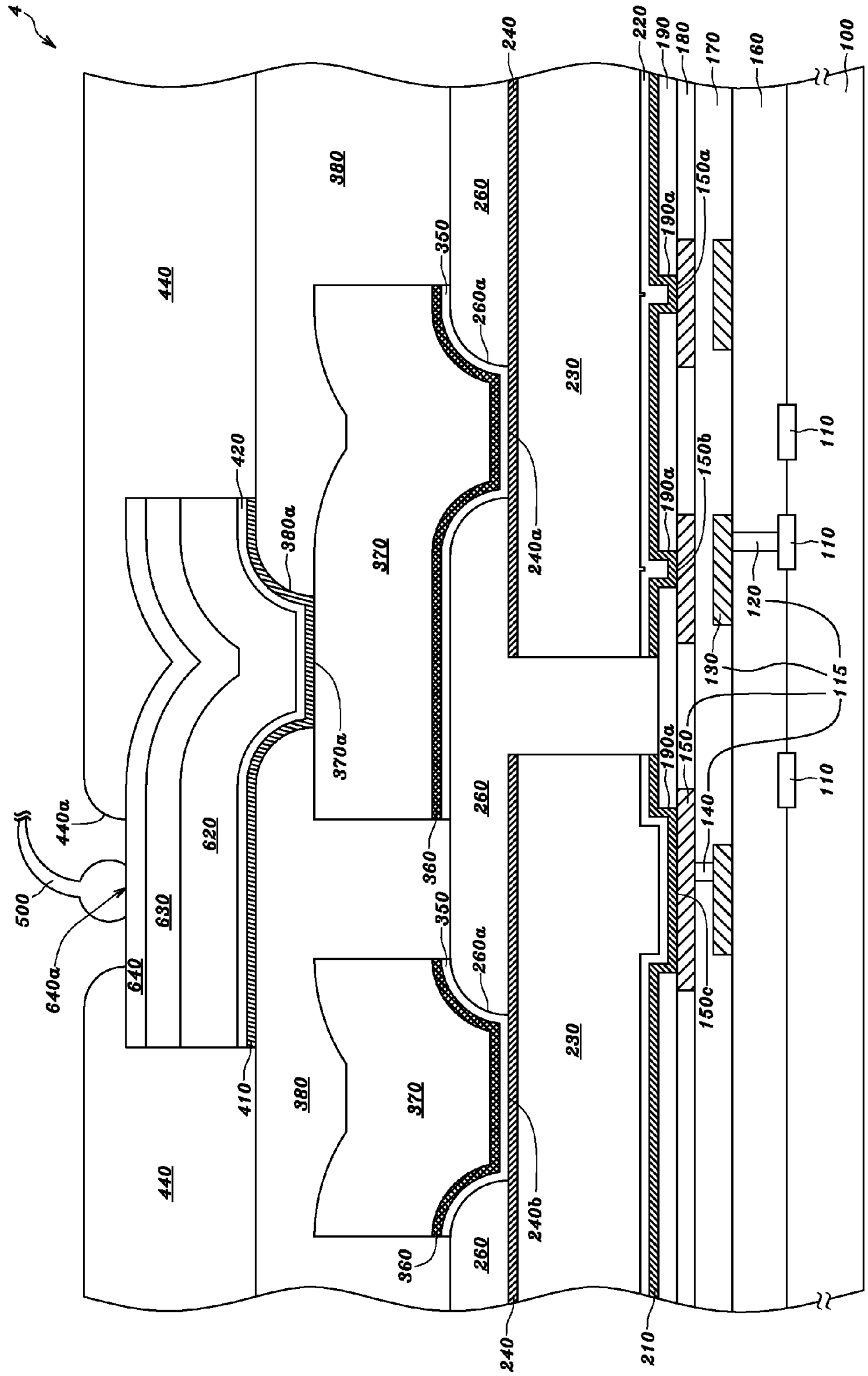

Alternatively, referring to FIG. 12K, the step of forming the polymer layer 200 shown in FIG. 3 and the step of forming the barrier layer 390 shown in FIG. 9A can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by electroplating or electroless plating the copper layer 370 on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned step as shown in FIG. 9F, followed by performing the above-mentioned steps as shown in FIGS. 12A-12E. The process of forming the adhesion/barrier layer 210 shown in FIG. 12K can be referred to as the process of forming the adhesion/barrier layer 210 as illustrated in FIG. 4A. The process of forming the seed layer 220 shown in FIG. 12K can be referred to as the process of forming the seed layer 220 as illustrated in FIG. 4A. The process of forming the polymer layer 260 shown in FIG. 12K can be referred to as the process of forming the polymer layer 260 as illustrated in FIG. 4F. The process of forming the polymer layer 380 shown in FIG. 12K can be referred to as the process of forming the polymer layer 380 as illustrated in FIG. 9D. The process of forming the adhesion/barrier layer 410 shown in FIG. 12K can be referred to as the process of forming the adhesion/barrier layer 410 as illustrated in FIG. 9E. The process of forming the seed layer 420 shown in FIG. 12K can be referred to as the process of forming the seed layer 420 as illustrated in FIG. 9E.

Figure 12L:
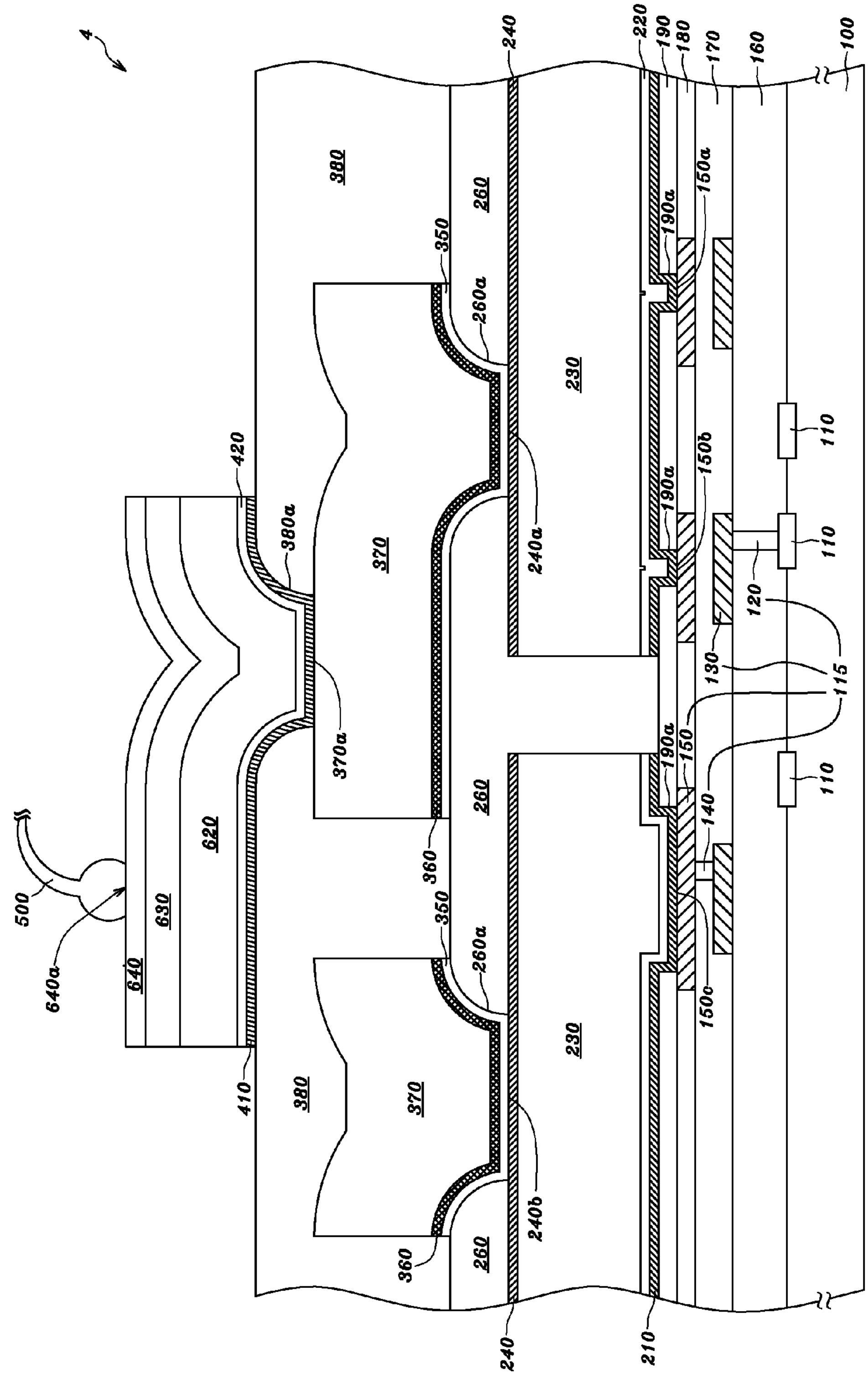

Alternatively, referring to FIG. 12L, the step of forming the polymer layer 200 shown in FIG. 3, the step of forming the barrier layer 390 shown in FIG. 9A and the step of forming the polymer layer 440 shown in FIG. 12D can be omitted, that is, the adhesion/barrier layer 210 can be formed on the passivation layer 190 and on the contact points 150*a*, 150*b* and 150*c* exposed by the openings 190*a*, followed by forming the seed layer 220 on the adhesion/barrier layer 210, followed by performing the above-mentioned steps as shown in FIGS. 4B-4E, followed by forming the polymer layer 260 on the barrier layer 240, on the passivation layer 190 and in the gap between the neighboring metal traces provided by the adhesion/barrier 210, the seed layer 220, the copper layer 230 and the barrier layer 240, followed by performing the above-mentioned steps as shown in FIGS. 8A-8B, followed by electroplating or electroless plating the copper layer 370 on the seed layer 360 exposed by the openings 50*a* in the photoresist layer 50, without forming the barrier layer 390 shown in FIG. 9A on the copper layer 370, followed by performing the above-mentioned steps as shown in FIGS. 9B-9C, followed by forming the polymer layer 380 on the copper layer 370, on the polymer layer 260 and in the gap between neighboring metal traces provided by the adhesion/barrier 350, the seed layer 360 and the copper layer 370, wherein the opening 380*a* in the polymer layer 380 exposes a contact point 370*a* of the copper layer 370, followed by forming the adhesion/barrier layer 410 on the polymer layer 380 and on the contact point 370*a* exposed by the opening 380*a*, followed by forming the seed layer 420 shown in FIG. 9E on the adhesion/barrier layer 410, followed by performing the above-mentioned step as shown in FIG. 9F, followed by performing the above-mentioned steps as shown in FIGS. 12A-12C, followed by performing the above-mentioned step as shown in FIG. 12E without the polymer layer 440 formed on the gold layer 940 and on the polymer layer 380. The process of forming the adhesion/barrier layer 210 shown in FIG. 12L can be referred to as the process of forming the adhesion/barrier layer 210 as illustrated in FIG. 4A. The process of forming the seed layer 220 shown in FIG. 12L can be referred to as the process of forming the seed layer 220 as illustrated in FIG. 4A. The process of forming the polymer layer 260 shown in FIG. 12L can be referred to as the process of forming the polymer layer 260 as illustrated in FIG. 4F. The process of forming the polymer layer 380 shown in FIG. 12L can be referred to as the process of forming the polymer layer 380 as illustrated in FIG. 9D. The process of forming the adhesion/barrier layer 410 shown in FIG. 12L can be referred to as the process of forming the adhesion/barrier layer 410 as illustrated in FIG. 9E. The process of forming the seed layer 420 shown in FIG. 12L can be referred to as the process of forming the seed layer 420 as illustrated in FIG. 9E.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:

1. A chip assembly comprising:

a semiconductor chip comprising a silicon substrate, a first dielectric layer over said silicon substrate, a transistor under said first dielectric layer, a first metal layer over said first dielectric layer, a second metal layer over said first metal layer and said first dielectric layer, a second dielectric layer between said first and second metal layers, a passivation layer over said silicon substrate and said second dielectric layer and on said second metal layer, wherein a first opening in said passivation layer is over a first contact point of said second metal layer, and said first contact point is at a bottom of said first opening, and wherein a second opening in said passivation layer is over a second contact point of said second metal layer, and said second contact point is at a bottom of said second opening, a third metal layer over said passivation layer and on said first and second contact points, wherein said first contact point is connected to said second contact point through said third metal layer, wherein said third metal layer comprises a copper layer with a thickness between 3 and 25 micrometers, a first polymer layer on a top surface and a sidewall of said copper layer and over said passivation layer, wherein a third opening in said first polymer layer is over a third contact point of said copper layer, and said third contact point is at a bottom of said third opening and vertically over said passivation layer, wherein said third contact point is connected to said first contact point through said first opening, and wherein said third contact point is connected to said second contact point through said second opening, and a fourth metal layer on said first polymer layer and said third contact point, wherein said fourth metal layer comprises a wirebondable metal layer over said first polymer layer and said third contact point, wherein said fourth metal layer is connected to said third contact point through said third opening; and a wirebonded copper wire bonded to said wirebondable metal layer, wherein a contact between said wirebonded copper wire and said wirebondable metal layer is not vertically over said first, second and third contact points.

2. The chip assembly of claim 1, wherein said passivation layer comprises a topmost nitride layer of said semiconductor chip.

3. The chip assembly of claim 1, wherein said wirebondable metal layer comprises a palladium layer, wherein said wirebonded copper wire is bonded to said palladium layer.

4. The chip assembly of claim 1, wherein said wirebondable metal layer comprises a gold layer, wherein said wirebonded copper wire is bonded to said gold layer.

5. The chip assembly of claim 1, wherein said third metal layer is directly on said passivation layer without any polymer layer therebetween.

6. The chip assembly of claim 1 further comprising a second polymer layer on said fourth metal layer and said first polymer layer, wherein a fourth opening in said second polymer layer is over a fourth contact point of said wirebondable metal layer, and said fourth contact point is at a bottom of said fourth opening, wherein said wirebonded copper wire is bonded to said fourth contact point through said fourth opening.

7. The chip assembly of claim 1, wherein said passivation layer comprises a nitride layer with a thickness between 0.2 and 1.2 micrometers.

8. The chip assembly of claim 1, wherein said third metal layer further comprises a titanium-containing layer, wherein said copper layer is over said titanium-containing layer.

9. The chip assembly of claim 1, wherein said fourth metal layer further comprises a titanium-containing layer, wherein said wirebondable metal layer is further over said titanium-containing layer.

10. A chip assembly comprising:

a semiconductor chip comprising a silicon substrate, a first dielectric layer over said silicon substrate, a transistor under said first dielectric layer, a first metal layer over said first dielectric layer, a second metal layer over said first metal layer and said first dielectric layer, a second dielectric layer between said first and second metal layers, a passivation layer over said silicon substrate and said second dielectric layer and on said second metal layer, wherein a first opening in said passivation layer is over a first contact point of said second metal layer, and said first contact point is at a bottom of said first opening, and wherein a second opening in said passivation layer is over a second contact point of said second metal layer, and said second contact point is at a bottom of said second opening, a third metal layer over said passivation layer and on said first and second contact points, wherein said first contact point is connected to said second contact point through said third metal layer, wherein said third metal layer comprises a copper layer with a thickness between 3 and 25 micrometers, a first polymer layer on a top surface and a sidewall of said copper layer and over said passivation layer, wherein a third opening in said first polymer layer is over a third contact point of said copper layer, and said third contact point is at a bottom of said third opening and is not vertically over said first and second contact points, wherein said third contact point is connected to said first contact point through said first opening, and wherein said third contact point is connected to said second contact point through said second opening, a fourth metal layer on said first polymer layer and said third contact point, wherein said fourth metal layer comprises a wirebondable metal layer over said first polymer layer and said third contact point, wherein said fourth metal layer is connected to said third metal layer through said third opening, and a second polymer layer on said fourth metal layer and said first polymer layer, wherein a fourth opening in said second polymer layer is over a fourth contact point of said wirebondable metal layer, and said fourth contact point is at a bottom of said fourth opening, wherein said fourth contact point is not vertically over said third contact point; and a wirebonded copper wire bonded to said fourth contact point through said fourth opening, wherein a contact between said wirebonded copper wire and said wirebondable metal layer is not vertically over said first, second and third contact points.

11. The chip assembly of claim 10, wherein said passivation layer comprises a topmost nitride layer of said semiconductor chip.

12. The chip assembly of claim 10, wherein said third metal layer is directly on said passivation layer without any polymer layer therebetween.

13. The chip assembly of claim 10, wherein said passivation layer comprises a nitride layer with a thickness between 0.2 and 1.2 micrometers.

14. The chip assembly of claim 10, wherein said wirebondable metal layer comprises a gold layer, wherein said wirebonded copper wire is bonded to said gold layer.

15. The chip assembly of claim 10, wherein said fourth metal layer further comprises a titanium-containing layer, wherein said wirebondable metal layer is further over said titanium-containing layer.

16. A chip assembly comprising:

a semiconductor chip comprising a silicon substrate, a first dielectric layer over said silicon substrate, a transistor under said first dielectric layer, a first metal layer over said first dielectric layer, a second metal layer over said first metal layer and said first dielectric layer, a second dielectric layer between said first and second metal layers, a passivation layer over said silicon substrate and said second dielectric layer and on said second metal layer, wherein said passivation layer comprises a nitride layer, wherein a first opening in said passivation layer is over a first contact point of said second metal layer, and said first contact point is at a bottom of said first opening, and wherein a second opening in said passivation layer is over a second contact point of said second metal layer, and said second contact point is at a bottom of said second opening, a third metal layer over said passivation layer and on said first and second contact points, wherein said first contact point is connected to said second contact point through said third metal layer, wherein said third metal layer comprises a copper layer with a thickness between 3 and 25 micrometers over said passivation layer and said first and second contact points, and a nickel layer with a thickness between 0.1 and 5 micrometers on said copper layer, a first polymer layer on a top surface of said nickel layer, on a sidewall of said copper layer and over said passivation layer, wherein a third opening in said first polymer layer is over a third contact point of said nickel layer, and said third contact point is at a bottom of said third opening and vertically over said passivation layer, wherein said third contact point is connected to said first contact point through said first opening, and wherein said third contact point is connected to said second contact point through said second opening, and a fourth metal layer on said first polymer layer and said third contact point, wherein said fourth metal layer comprises a wirebondable metal layer over said first polymer layer and said third contact point, wherein said fourth metal layer is connected to said third contact point through said third opening; and a wirebonded copper wire bonded to said wirebondable metal layer, wherein a contact between said wirebonded copper wire and said wirebondable metal layer is not vertically over said first, second and third contact points.

17. The chip assembly of claim 16, wherein said third metal layer is directly on said passivation layer without any polymer layer therebetween.

18. The chip assembly of claim 16 further comprising a second polymer layer with a thickness between 3 and 25 micrometers on said wirebondable metal layer and said first polymer layer, wherein said wirebonded copper wire is bonded to said wirebondable metal layer through a fourth opening in said second polymer layer.

19. The chip assembly of claim 16, wherein said third metal layer further comprises a titanium-containing layer, wherein said copper layer is further over said titanium-containing layer.

20. The chip assembly of claim 16, wherein said fourth metal layer further comprises a titanium-containing layer, wherein said wirebondable metal layer is further over said titanium-containing layer.

21. A chip assembly comprising:

a semiconductor chip comprising a silicon substrate, a first dielectric layer over said silicon substrate, a transistor under said first dielectric layer, a first metal layer over said first dielectric layer, a second metal layer over said first metal layer and said first dielectric layer, a second dielectric layer between said first and second metal layers, a passivation layer over said silicon substrate and said second dielectric layer and on said second metal layer, wherein a first opening in said passivation layer is over a first contact point of said second metal layer, and said first contact point is at a bottom of said first opening, and wherein a second opening in said passivation layer is over a second contact point of said second metal layer, and said second contact point is at a bottom of said second opening, a third metal layer on said passivation layer and on said first and second contact points, wherein no polymer layer is between said passivation layer and said third metal layer, wherein said first contact point is connected to said second contact point through said third metal layer, wherein said third metal layer comprises a first adhesion metal layer on said first and second contact points and on said passivation layer and a first copper layer with a thickness between 3 and 25 micrometers over said first adhesion metal layer, wherein said first adhesion metal layer on said first contact point extends to and on said second contact point, a first polymer portion on a sidewall of said first copper layer and over said passivation layer, and a wirebondable metal layer over said third metal layer, wherein said wirebondable metal layer is connected to said third metal layer, wherein no polymer is between said wirebondable metal layer and said third metal layer; and a wirebonded copper wire bonded to said wirebondable metal layer, wherein a contact between said wirebonded copper wire and said wirebondable metal layer is connected to said first contact point through said first opening and connected to said second contact point through said second opening, wherein said contact is not vertically over said first and second contact points, wherein a first portion of said third metal layer is vertically under said contact and between a second portion, vertically over said first contact point, of said third metal layer and a third portion, vertically over said second contact point, of said third metal layer.

22. The chip assembly of claim 21, wherein said passivation layer comprises a nitride layer.

23. The chip assembly of claim 21, wherein said wirebondable metal layer comprises a palladium layer, wherein said wirebonded copper wire is bonded to said palladium layer.

24. The chip assembly of claim 21, wherein said wirebondable metal layer comprises a gold layer, wherein said wirebonded copper wire is bonded to said gold layer.

25. The chip assembly of claim 21, wherein said first metal layer comprises a second copper layer and a second adhesion metal layer on a bottom surface and a sidewall of said second copper layer.

26. The chip assembly of claim 21, wherein said second metal layer comprises an aluminum-alloy layer.

27. The chip assembly of claim 21, wherein no opening in said passivation layer is vertically under said contact.

28. The chip assembly of claim 21, wherein said wirebondable metal layer contacts a top surface of said first copper layer and is a single metal layer having a thickness between 0.01 and 2 micrometers.

29. The chip assembly of claim 21, wherein said semiconductor chip further comprises a fourth metal layer over said third metal layer, wherein said wirebondable metal layer is further over said fourth metal layer.

30. The chip assembly of claim 29, wherein said fourth metal layer comprises titanium.

31. The chip assembly of claim 21, wherein said wirebondable metal layer comprises a platinum layer, wherein said wirebonded copper wire is bonded to said platinum layer.

32. The chip assembly of claim 21, wherein said third metal layer further comprises a nickel layer on said first copper layer.

33. The chip assembly of claim 21, wherein said first opening has a width between 0.5 and 20 micrometers.

34. The chip assembly of claim 21, wherein said contact is further vertically over said transistor.

35. The chip assembly of claim 21, wherein said thickness of said first copper layer is between 10 and 20 micrometers.

36. The chip assembly of claim 21, wherein said semiconductor chip further comprises a second polymer portion on said wirebondable metal layer and over said third metal layer, wherein a third opening in said second polymer portion is over a third contact point of said wirebondable metal layer, and said third contact point is at a bottom of said third opening, wherein said wirebonded copper wire is bonded to said third contact point through said third opening.

37. The chip assembly of claim 21, wherein said first copper layer has a top surface with a first region vertically under said wirebondable metal layer and a second region not vertically under said wirebondable metal layer.

* * * * *